(12) United States Patent
Aoki

(10) Patent No.: US 11,774,864 B2
(45) Date of Patent: Oct. 3, 2023

(54) CARRIER DEVICE, EXPOSURE APPARATUS, EXPOSURE METHOD, MANUFACTURING METHOD OF FLAT-PANEL DISPLAY, DEVICE MANUFACTURING METHOD, AND CARRYING METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 209 days.

(21) Appl. No.: 17/178,940

(22) Filed: Feb. 18, 2021

(65) Prior Publication Data

US 2021/0173314 A1 Jun. 10, 2021

Related U.S. Application Data

(63) Continuation of application No. 16/336,134, filed as application No. PCT/JP2017/035463 on Sep. 29, 2017, now abandoned.

(30) Foreign Application Priority Data

Sep. 30, 2016 (JP) ................................. 2016-194441

(51) Int. Cl.
*G03F 7/00* (2006.01)

(52) U.S. Cl.
CPC ............................... *G03F 7/70716* (2013.01)

(58) Field of Classification Search
CPC ...... G03F 7/70716; G03F 7/7075; G03F 7/20; G03F 7/70733; H01L 21/677; H01L 21/68

See application file for complete search history.

(56) References Cited

U.S. PATENT DOCUMENTS

| 5,729,331 A | 3/1998 | Tanaka et al. |
| 6,516,681 B1 | 2/2003 | Pierrot et al. |

(Continued)

FOREIGN PATENT DOCUMENTS

| CN | 101611470 A | 12/2009 |
| CN | 102483578 A | 5/2012 |

(Continued)

OTHER PUBLICATIONS

Dec. 12, 2017 International Search Report issued in International Patent Application No. PCT/JP2017/035463.

(Continued)

*Primary Examiner* — Hung V Nguyen
(74) *Attorney, Agent, or Firm* — Oliff PLC

(57) ABSTRACT

A carrier device that carries a substrate to a noncontact holder that is configured to support the substrate in a noncontact manner is equipped with: holding pads that hold a part of the substrate at a first position located above the noncontact holder; a drive section that moves downward the holding pads holding the substrate so that the substrate is supported in a noncontact manner by the noncontact holder; and adsorption pads that hold the substrate supported in a noncontact manner by the noncontact holder, after the substrate held by the holding pads is moved by the drive section, wherein the drive section moves the holding pads from the first position to a second position where the substrate can be delivered to the adsorption pads.

34 Claims, 99 Drawing Sheets

(56) References Cited

U.S. PATENT DOCUMENTS

| | | | |
|---|---|---|---|
| 6,552,775 B1 | 4/2003 | Yanagihara et al. | |
| 8,444,126 B2 * | 5/2013 | Siebert | H01L 21/68 269/21 |
| 8,970,820 B2 * | 3/2015 | Shibazaki | H01L 21/67748 355/72 |
| 11,520,242 B2 * | 12/2022 | Aoki | H01L 21/682 |
| 2003/0178134 A1 | 9/2003 | Muramoto et al. | |
| 2008/0017322 A1 | 1/2008 | Mitsumoto et al. | |
| 2008/0030702 A1 | 2/2008 | Kawamura | |
| 2008/0094592 A1 | 4/2008 | Shibazaki | |
| 2010/0018950 A1 | 1/2010 | Aoki et al. | |
| 2010/0266961 A1 * | 10/2010 | Kawamura | H01L 21/682 430/319 |
| 2011/0042874 A1 | 2/2011 | Aoki et al. | |
| 2011/0053092 A1 | 3/2011 | Aoki | |
| 2014/0158303 A1 * | 6/2014 | Hirakawa | H01L 21/677 156/499 |

FOREIGN PATENT DOCUMENTS

| | | |
|---|---|---|
| CN | 105954982 A | 9/2016 |
| JP | 2006-330534 A | 12/2006 |
| JP | 2011-044713 A | 3/2011 |
| JP | 2012-256027 A | 12/2012 |
| TW | 200527493 A | 8/2005 |
| TW | 200813524 A | 3/2008 |
| TW | 201126641 A | 8/2011 |
| WO | 2011/021711 A1 | 2/2011 |
| WO | 2013/031222 A1 | 3/2013 |

OTHER PUBLICATIONS

Dec. 12, 2017 Written Opinion of The International Searching Authority issued in International Patent Application No. PCT/JP2017/035463.
Aug. 20, 2020 Office Action Issued in U.S. Appl. No. 16/336,134.
Jul. 12, 2021 Office Action issued in Taiwanese Patent Application No. 106133828.
Dec. 12, 2017 Search Report issued in International Patent Application No. PCT/JP2017/035470.
Dec. 12, 2017 Written Opinion issued in International Patent Application No. PCT/JP2017/035470.
Jan. 8, 2020 Restriction Requirement issued in U.S. Appl. No. 16/336,260.
Jun. 2, 2020 Office Action issued in U.S. Appl. No. 16/336,260.
Sep. 29, 2021 Office Action issued in Taiwanese Patent Application No. 106133819.
Dec. 30, 2021 Office Action issued in U.S. Appl. No. 17/109,443.
Sep. 8, 2022 Notice of Allowance issued in U.S. Appl. No. 17/109,443.
Apr. 6, 2023 Office Action issued in Chinese Patent Application No. 202110485378.5.

* cited by examiner

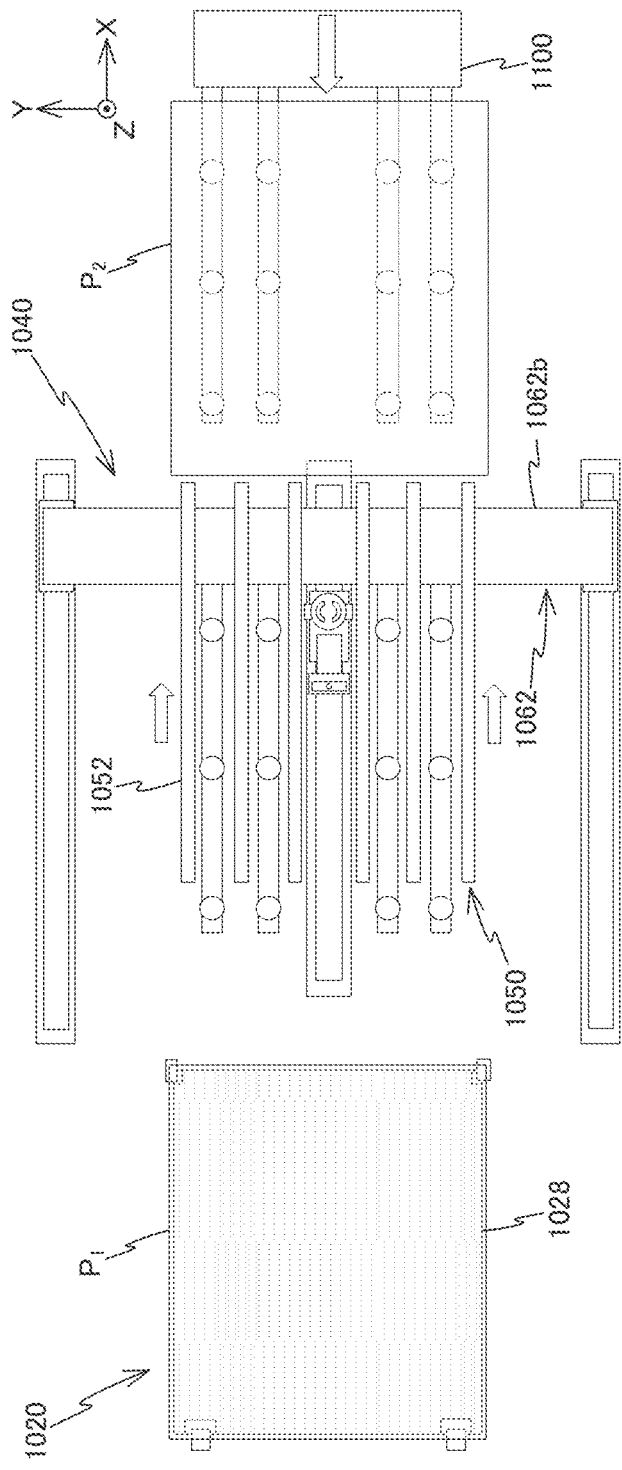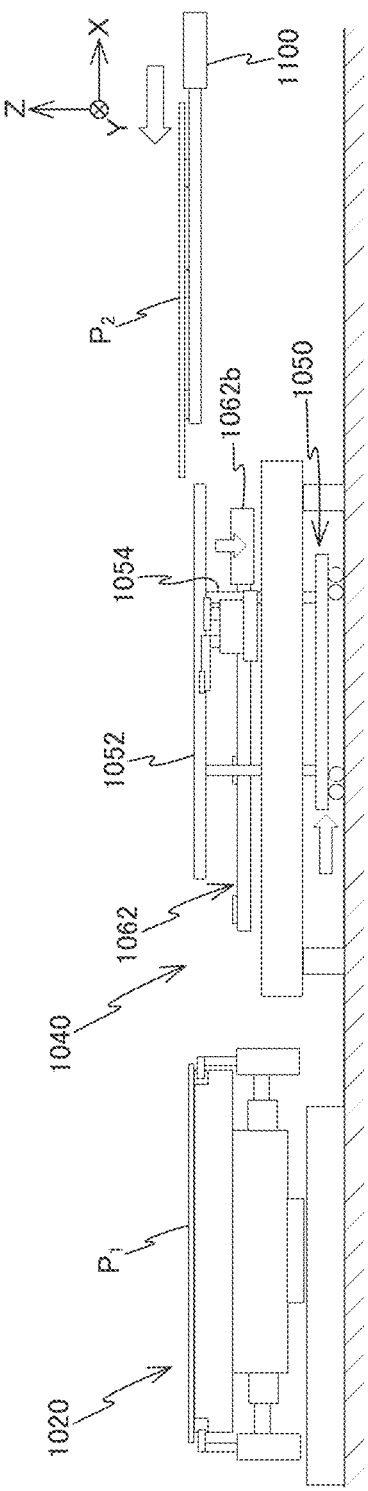

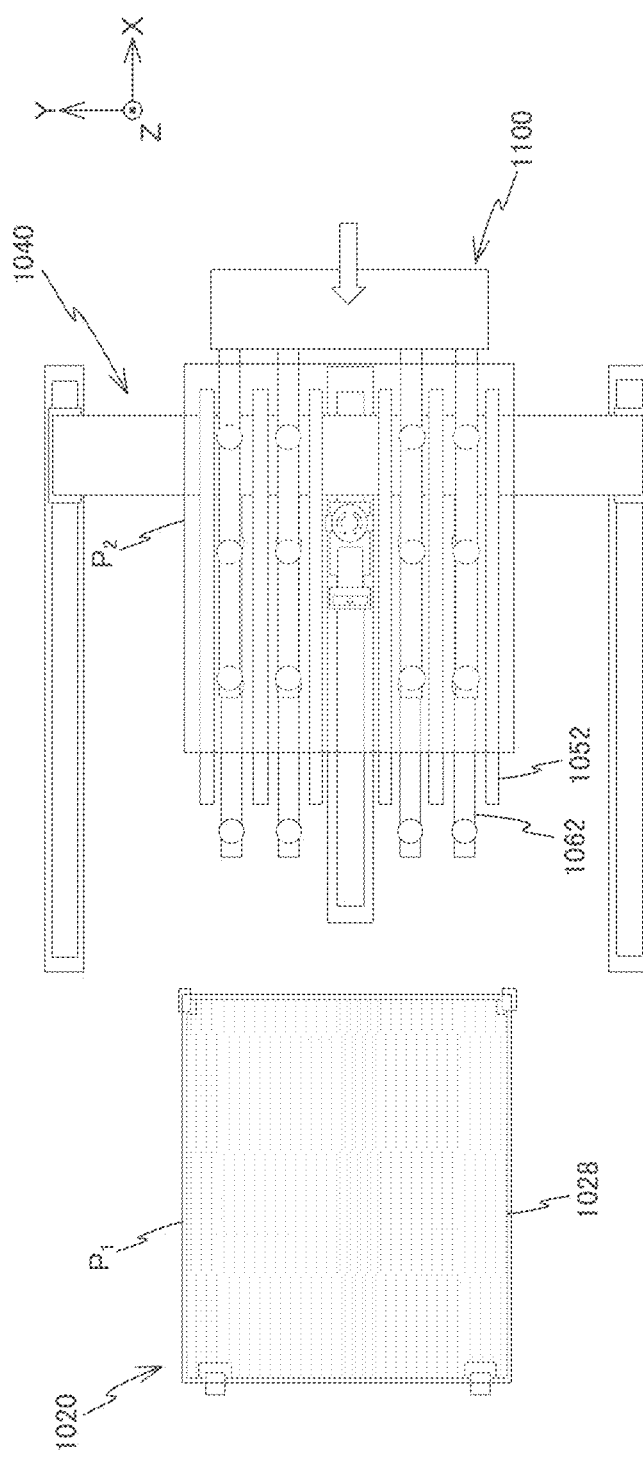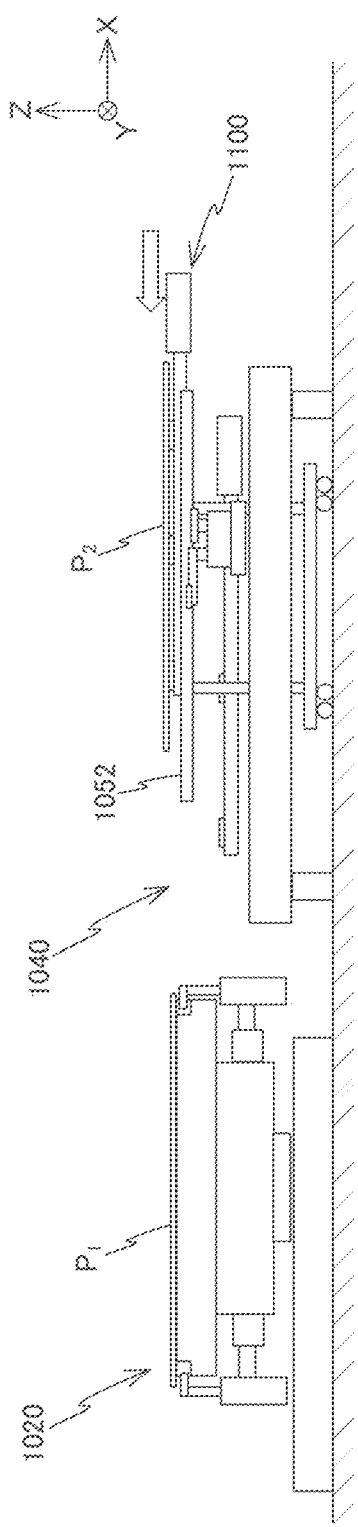
Fig. 32a
Fig. 32b

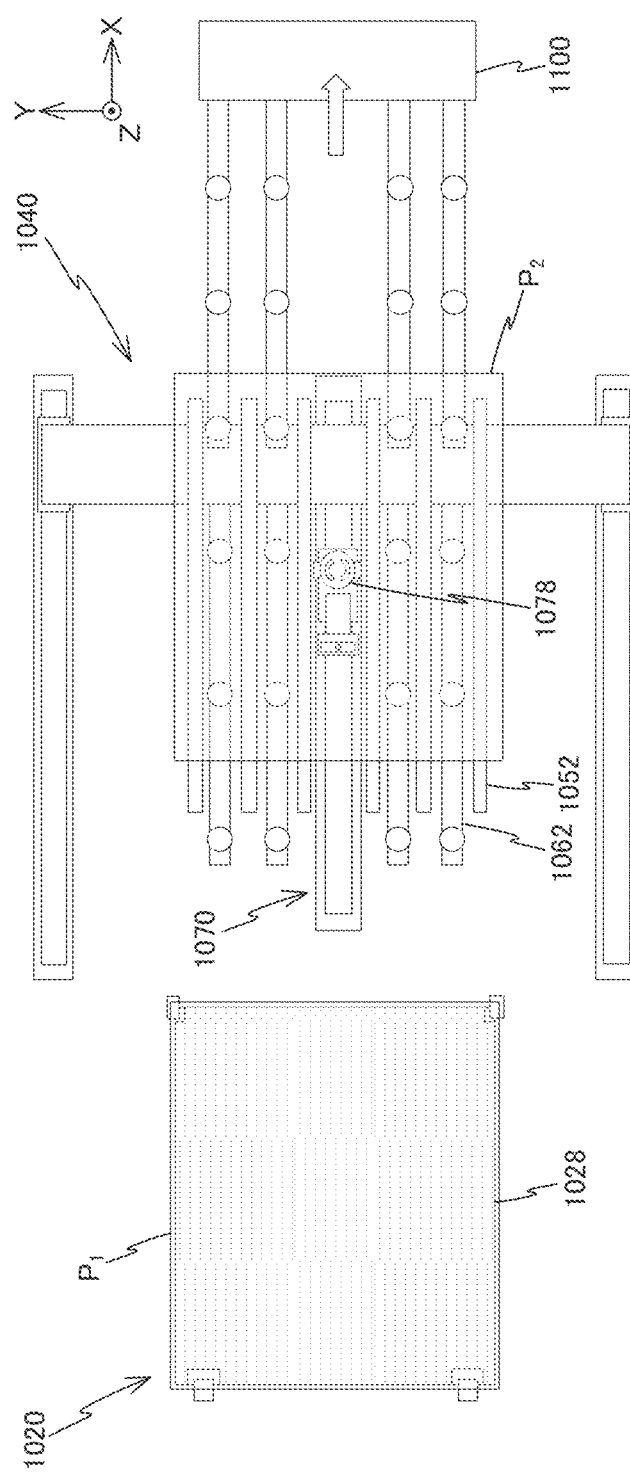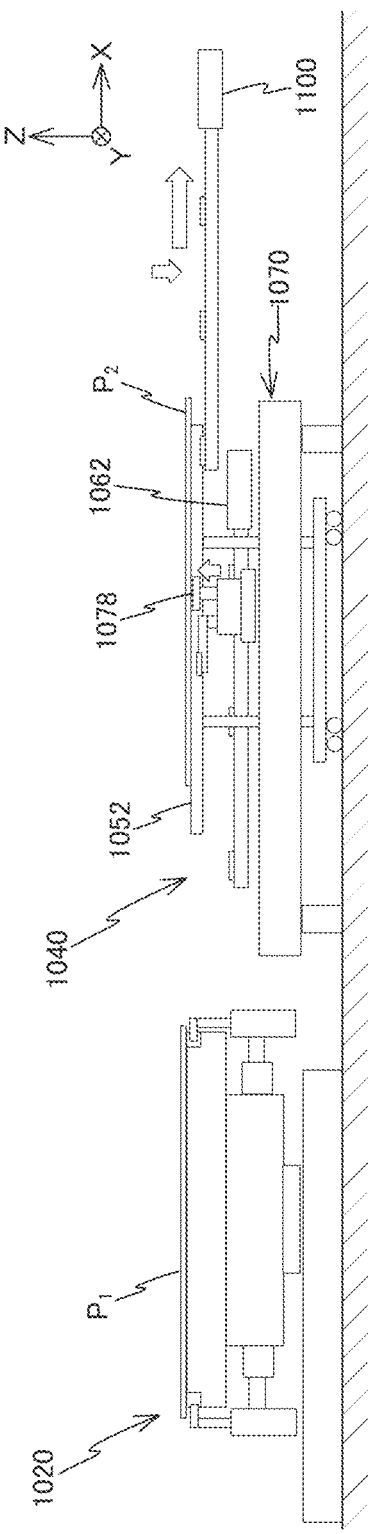
Fig. 33a
Fig. 33b

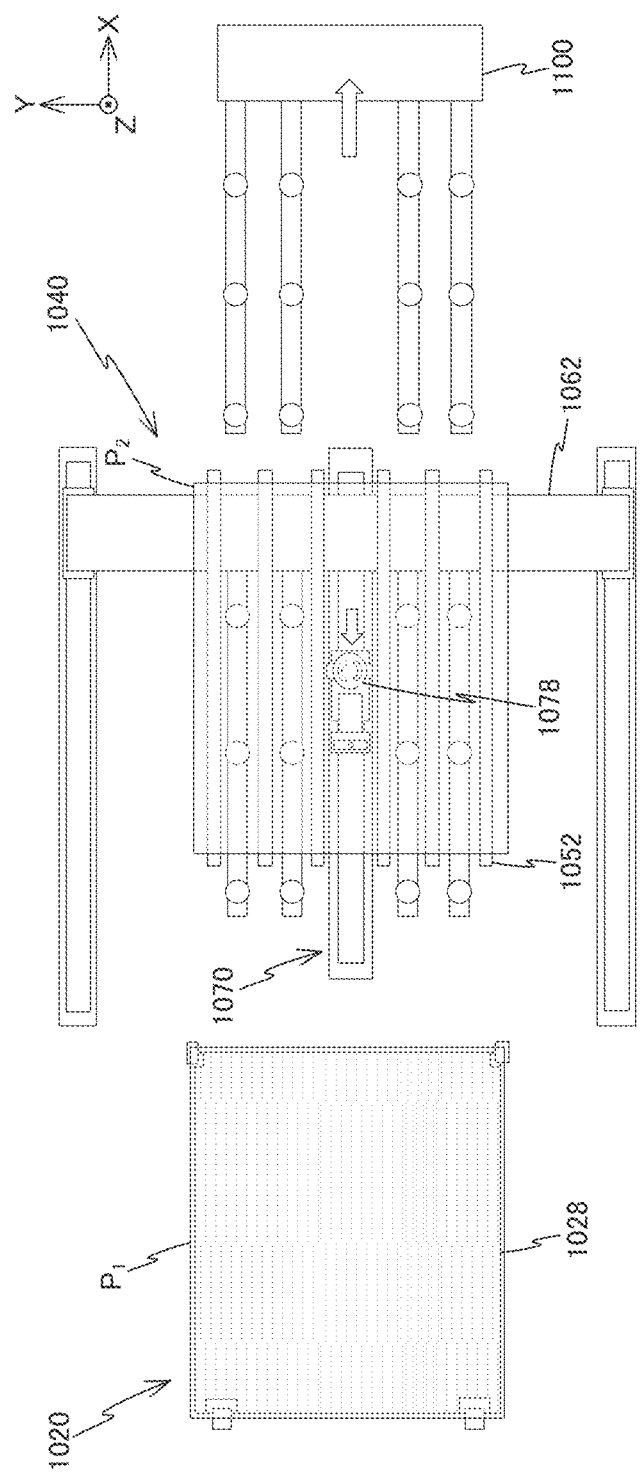
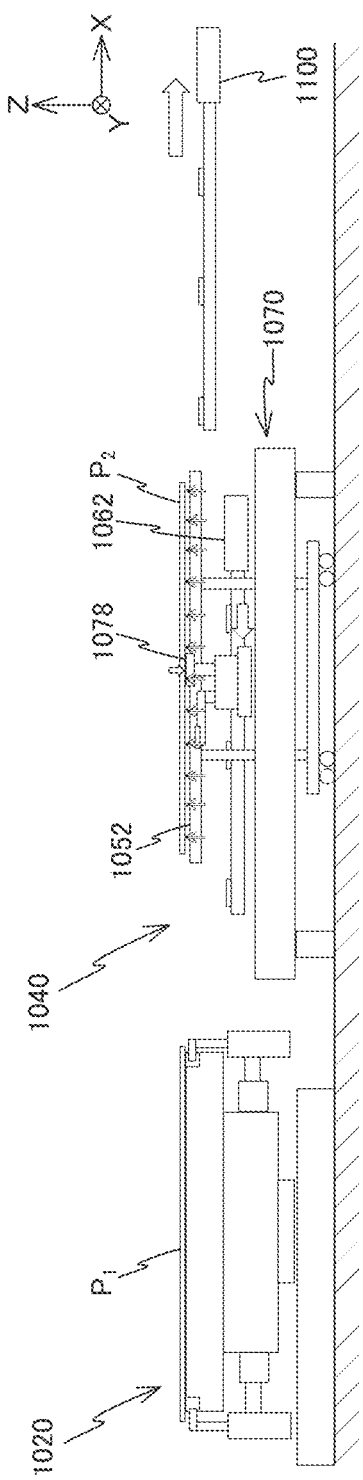
Fig. 34a
Fig. 34b

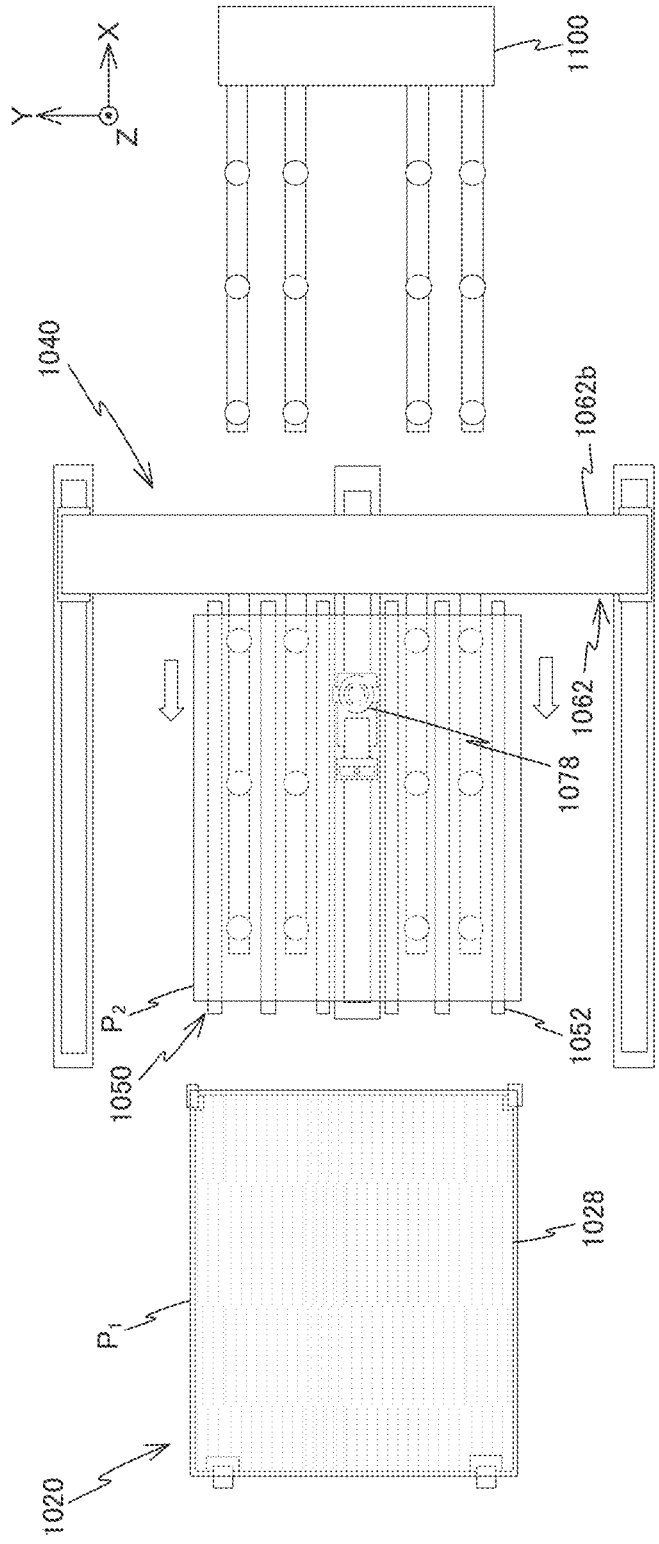
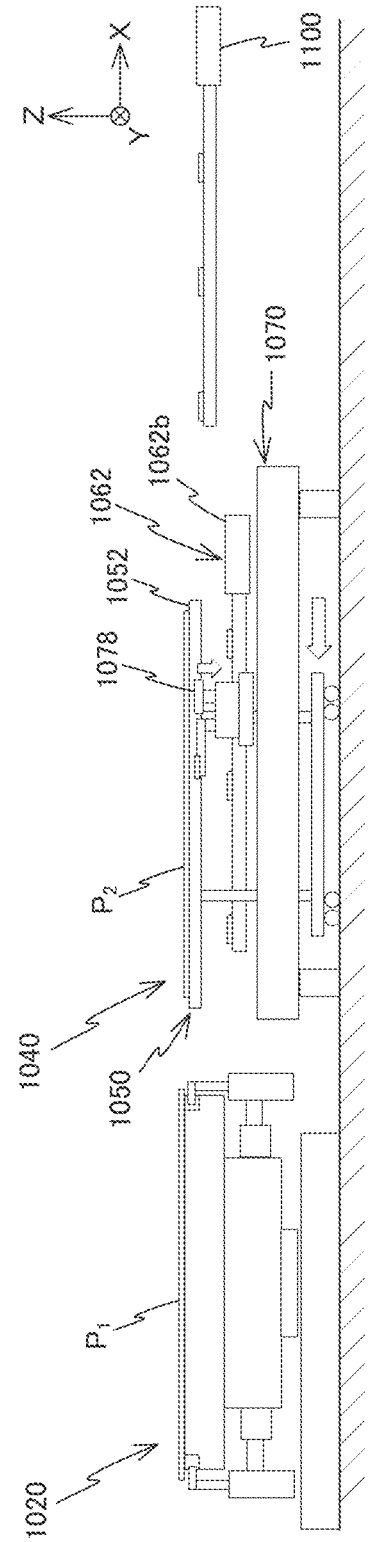
Fig. 35a
Fig. 35b

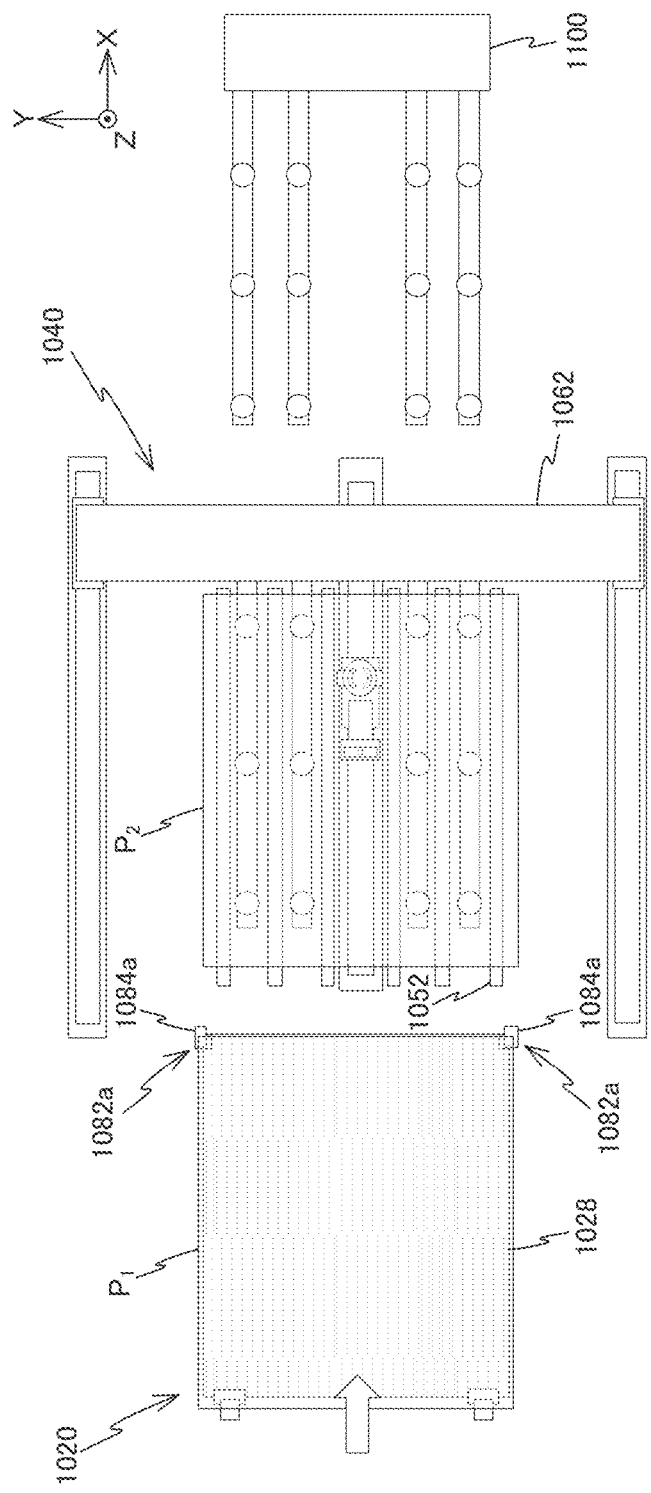
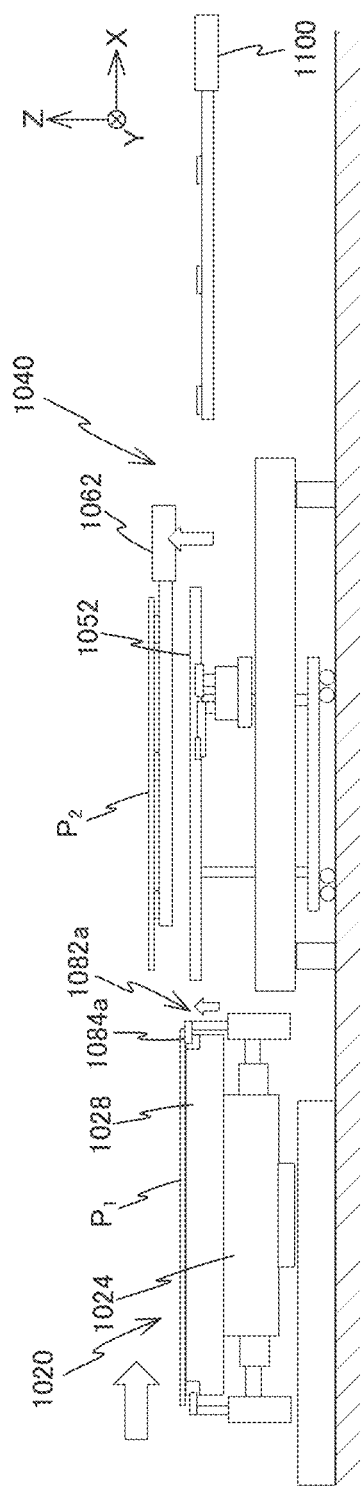
Fig. 36a
Fig. 36b

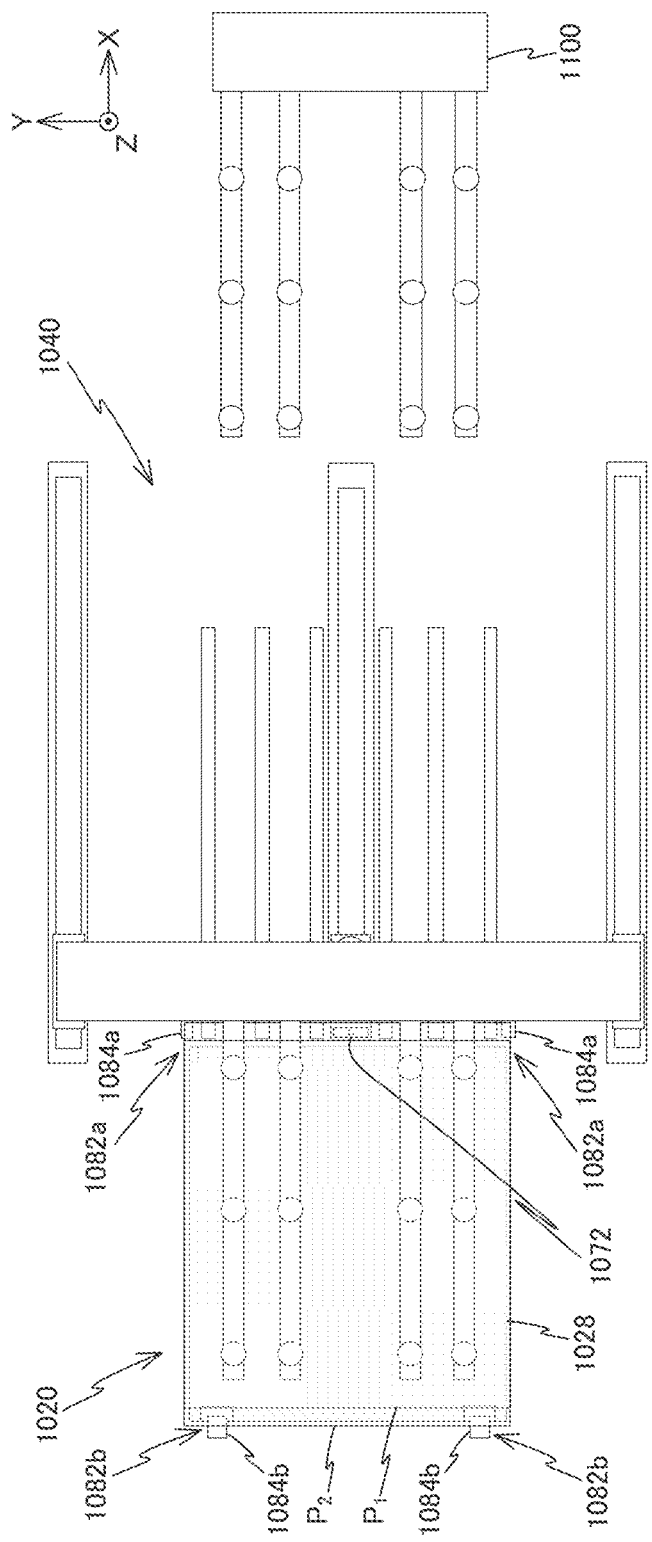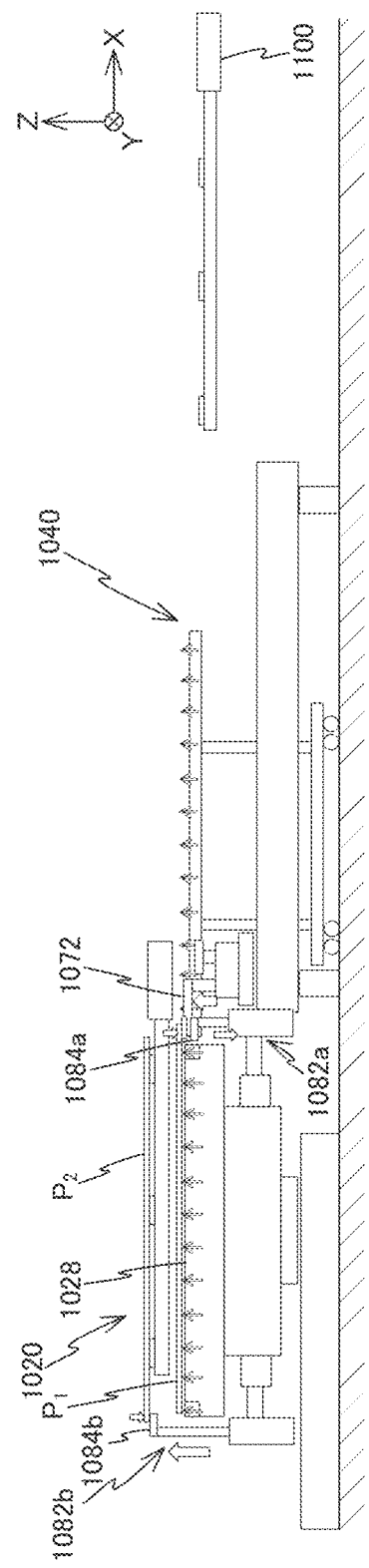

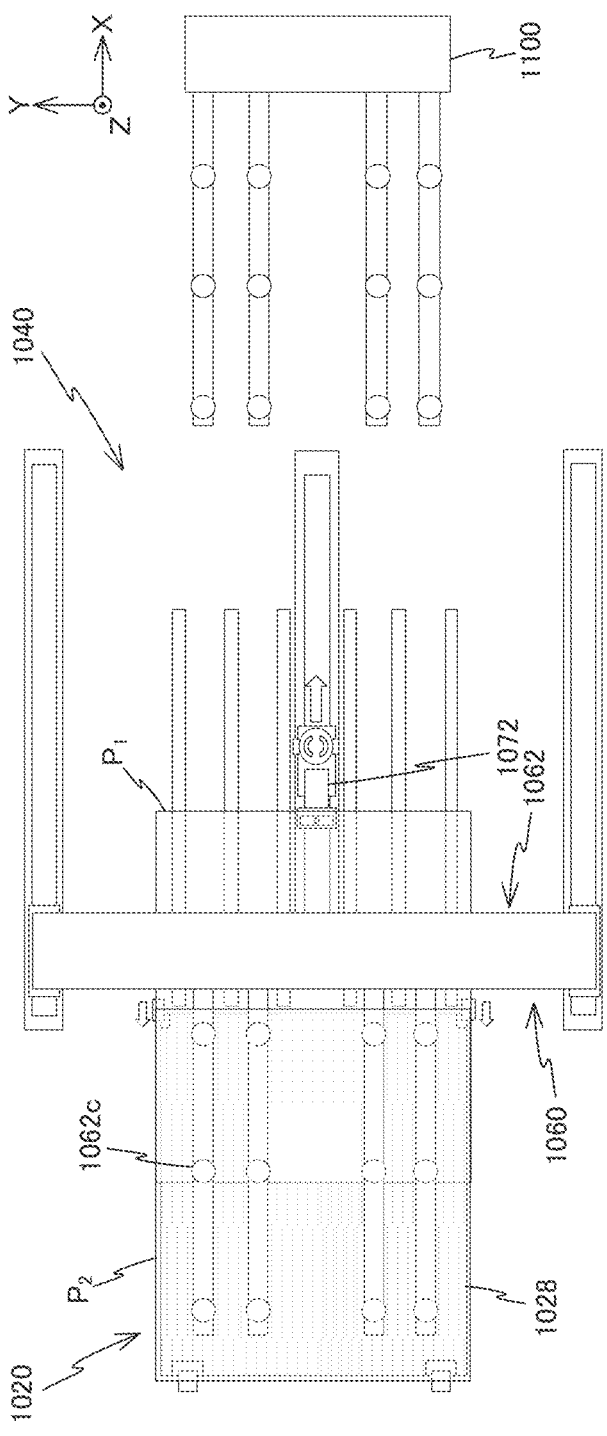
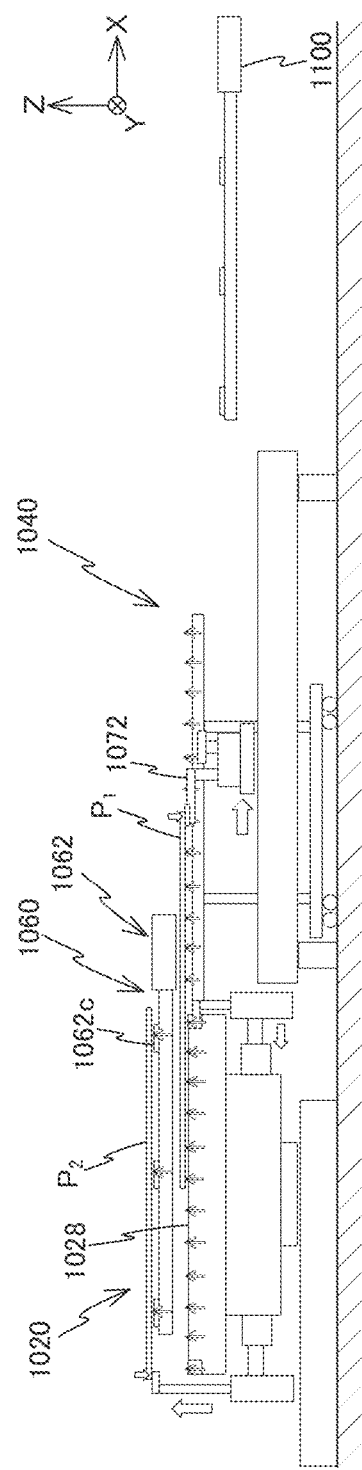

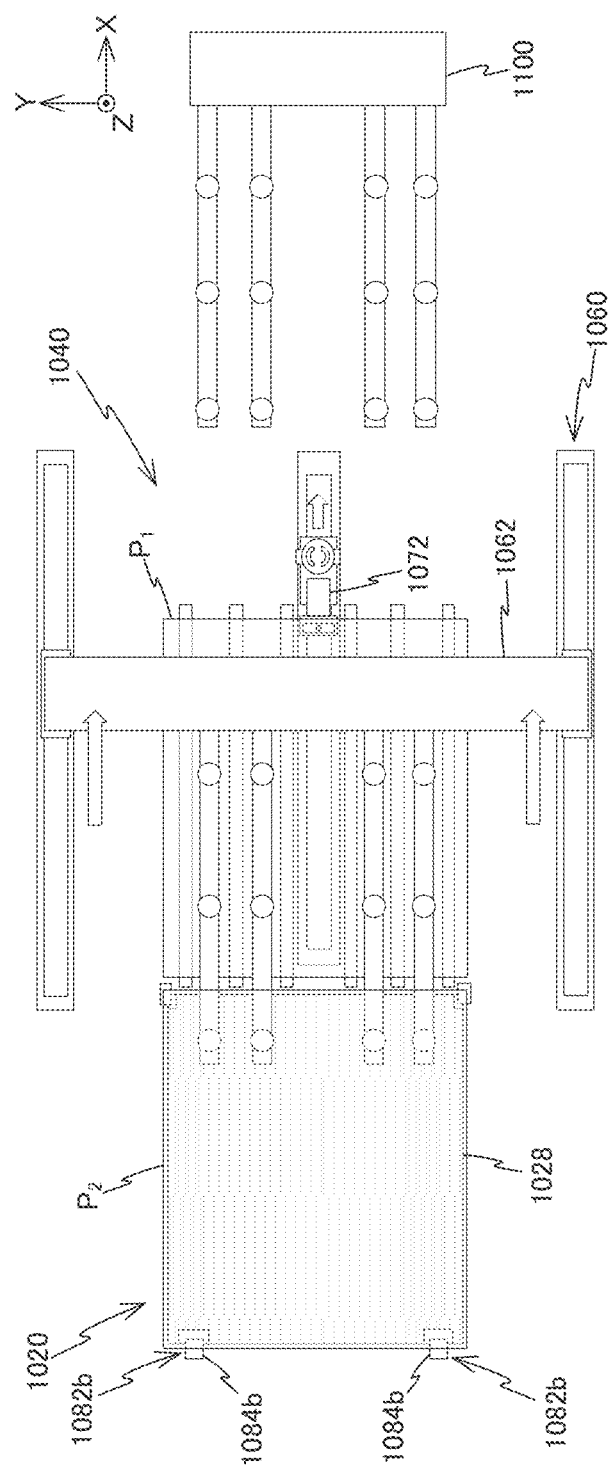
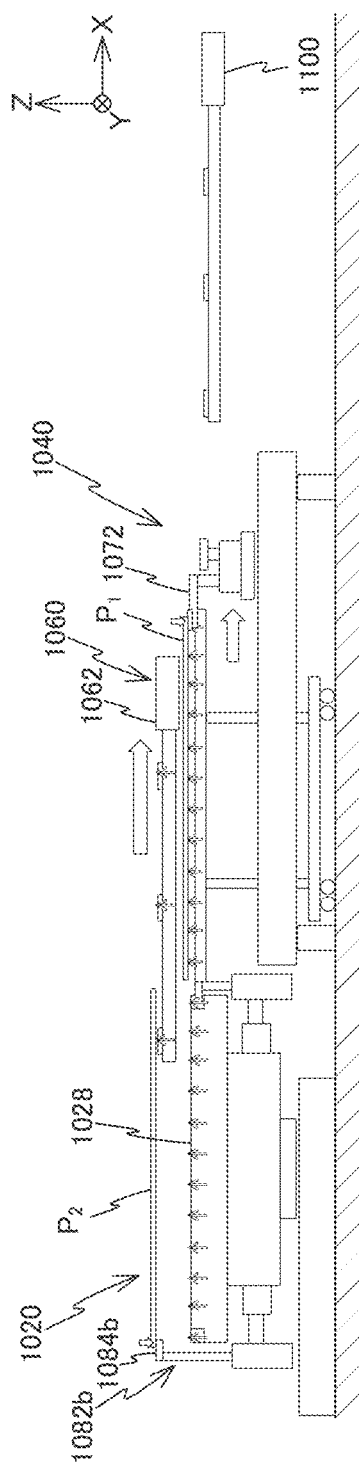
Fig. 41a
Fig. 41b

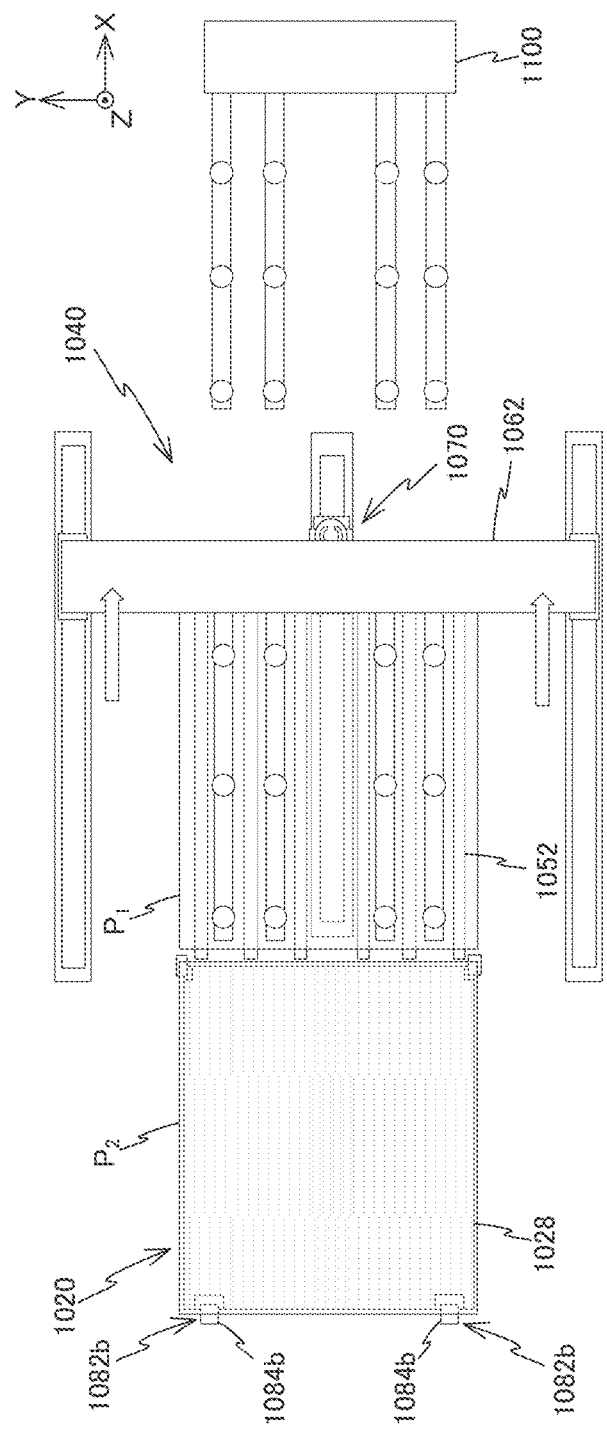
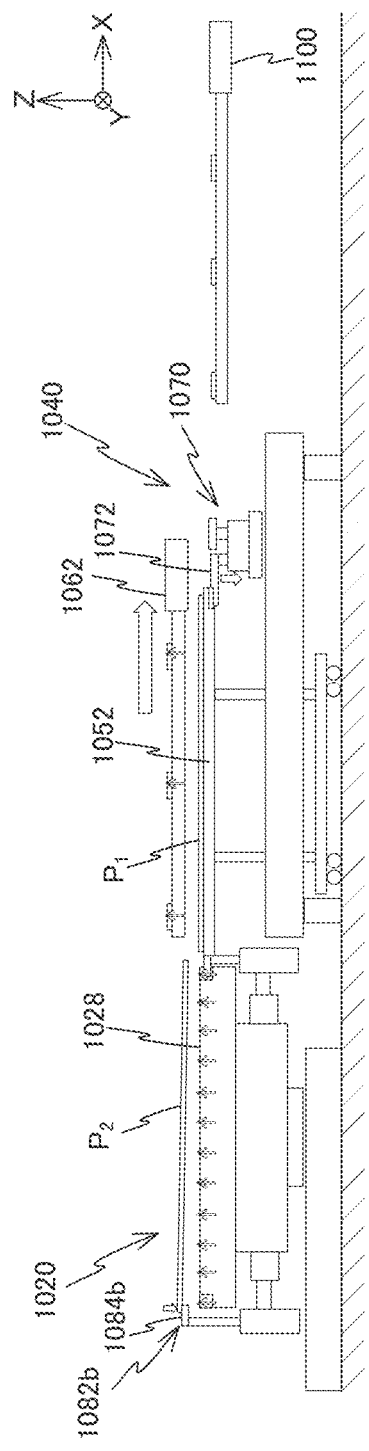
Fig. 42a
Fig. 42b

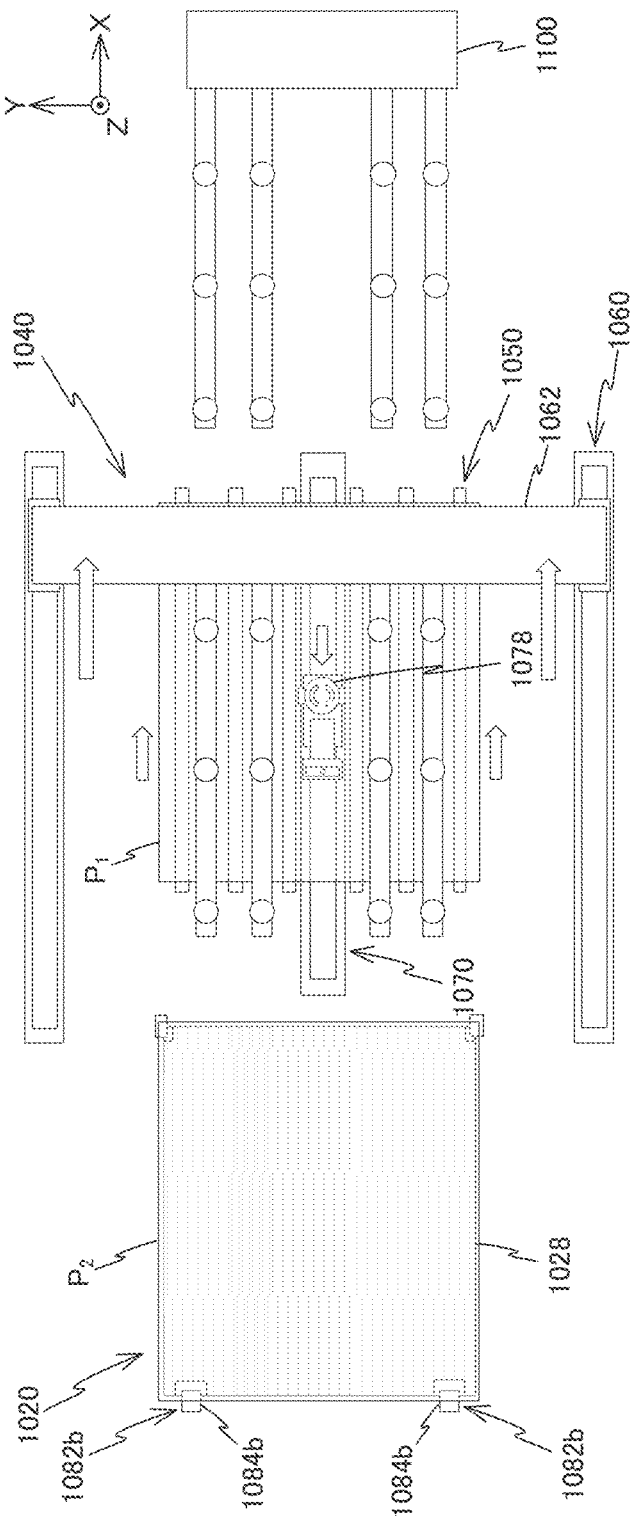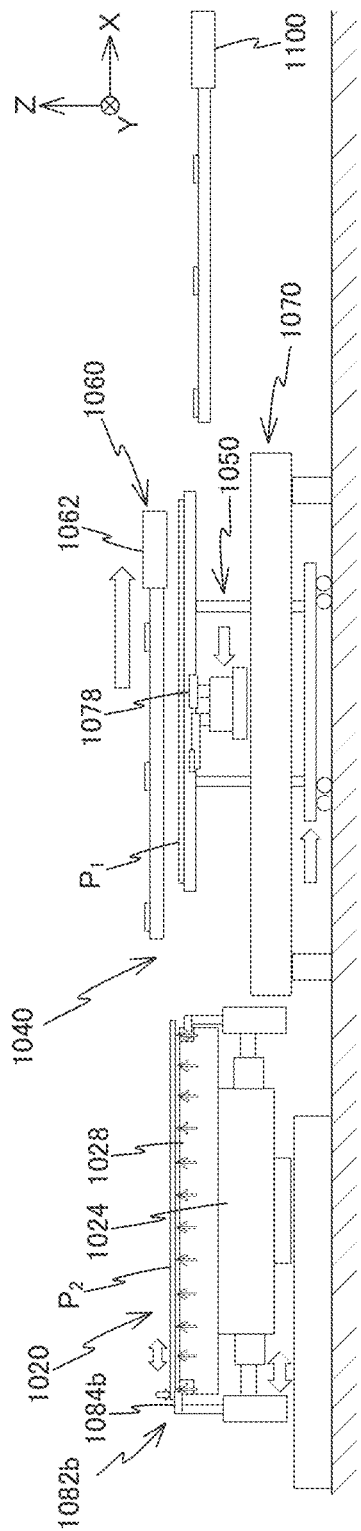

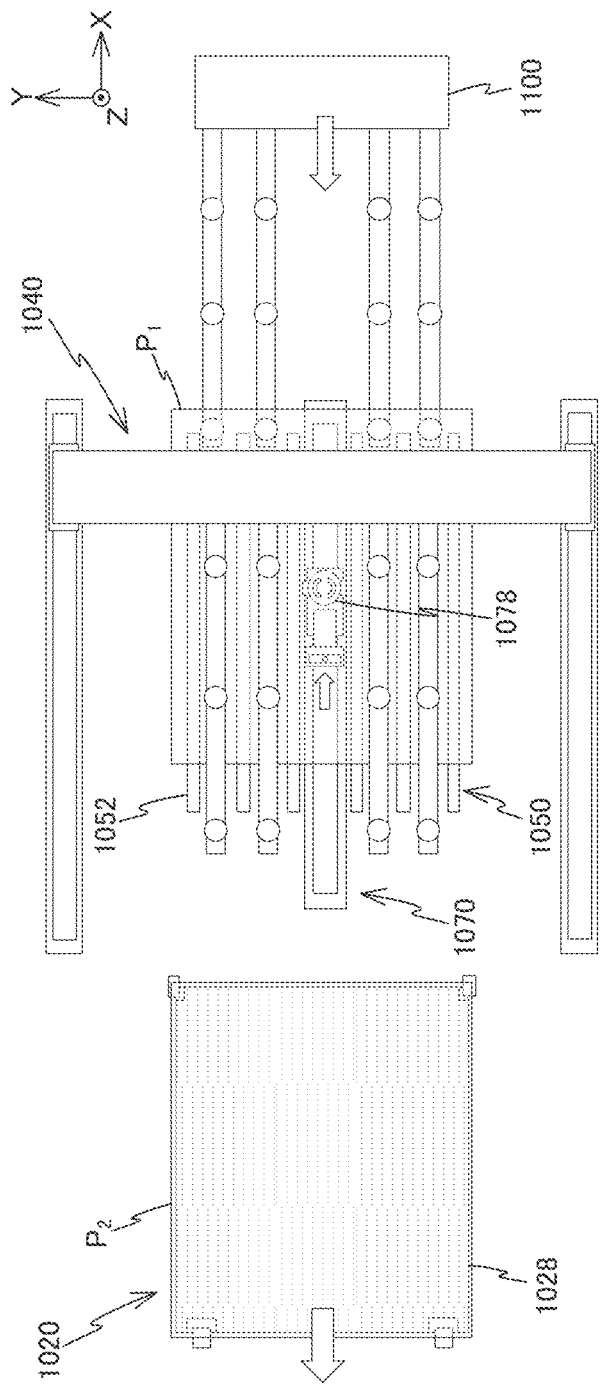
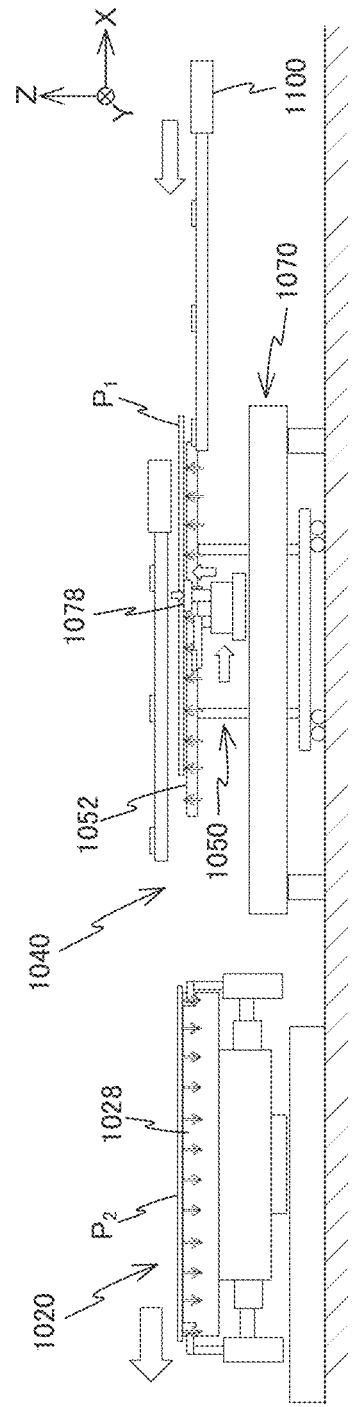
Fig. 44a
Fig. 44b

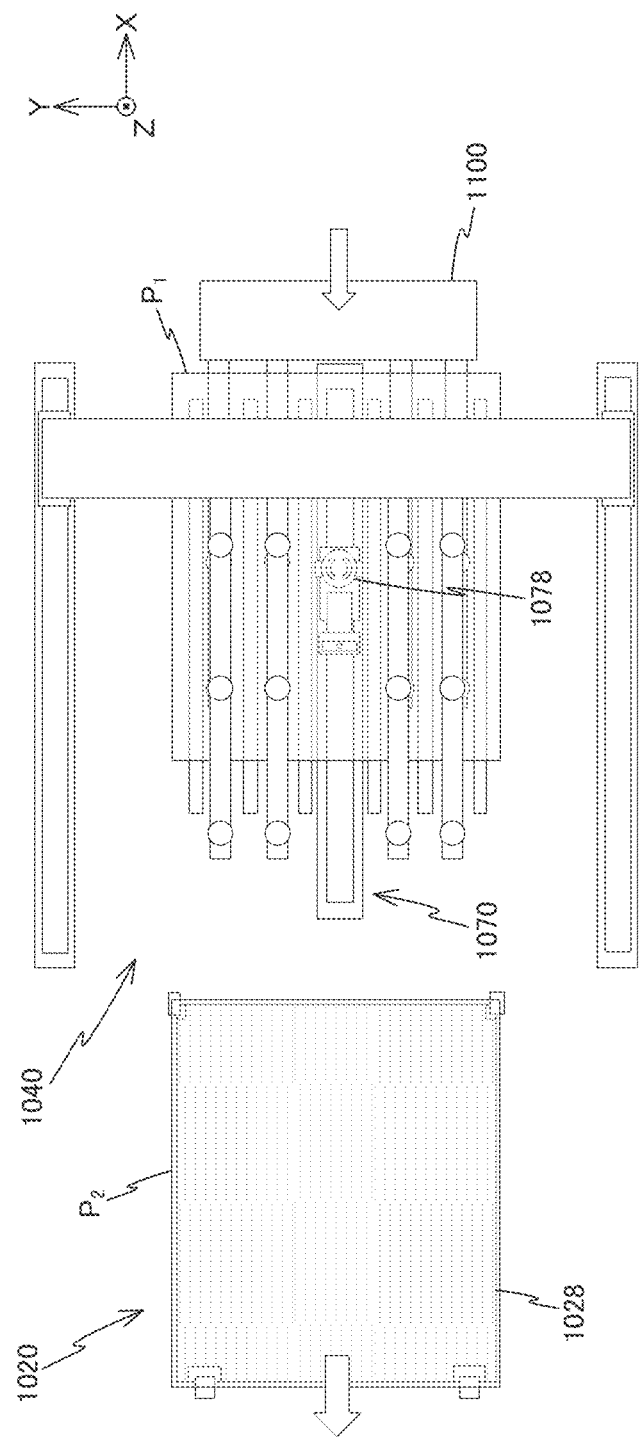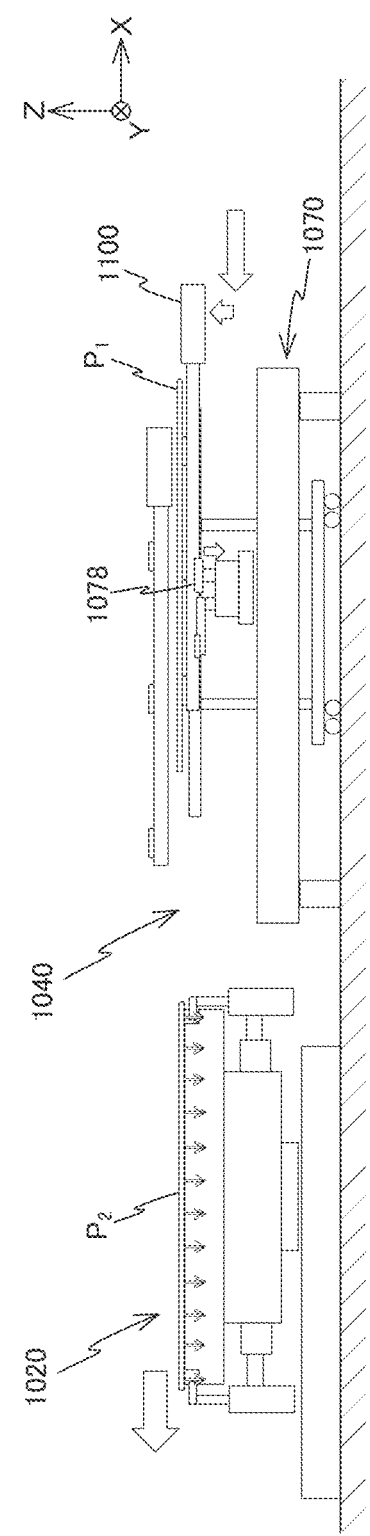
Fig. 45a
Fig. 45b

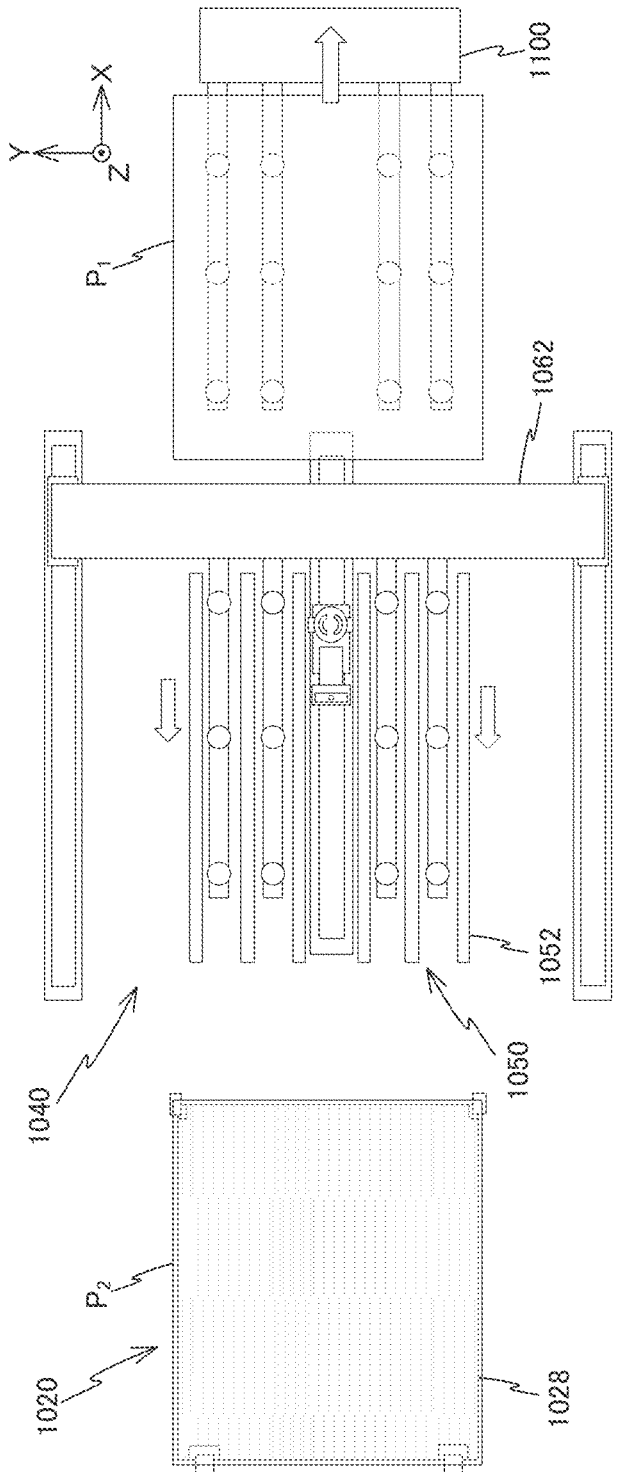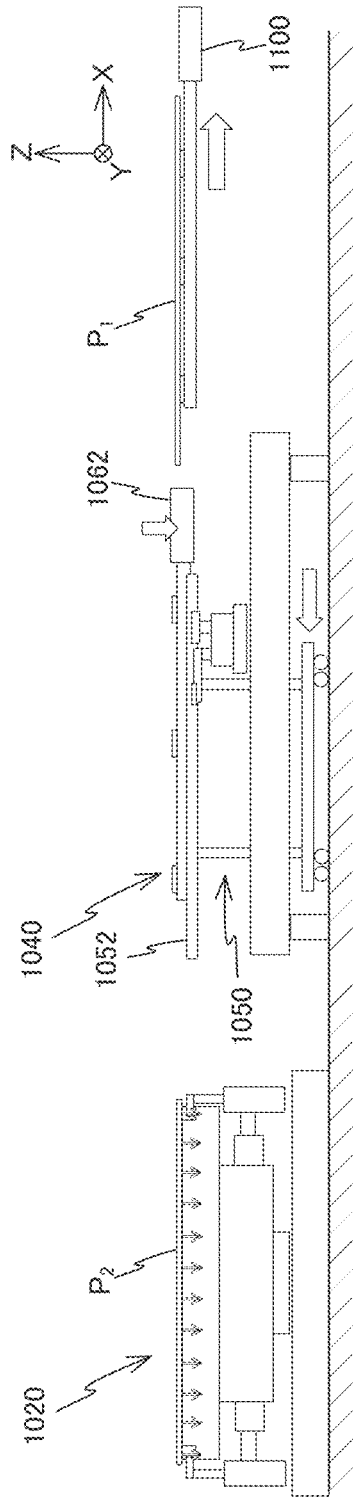
Fig. 46a
Fig. 46b

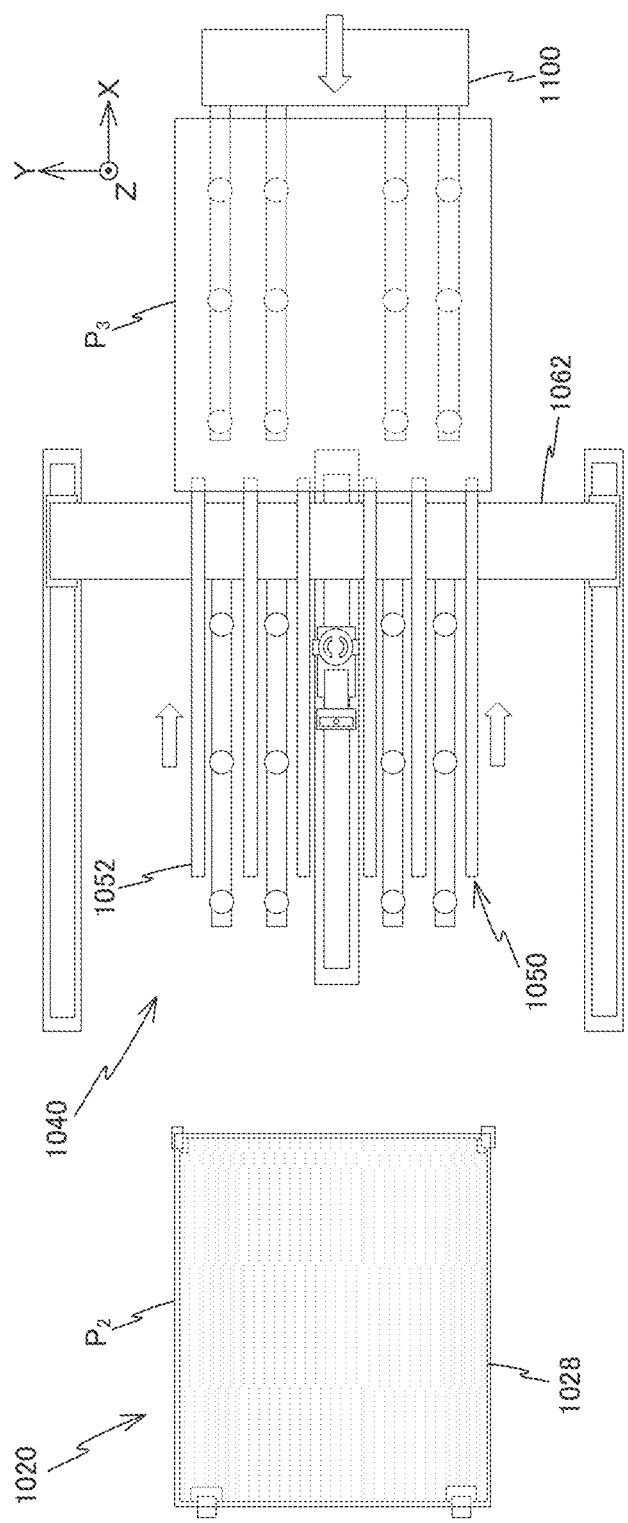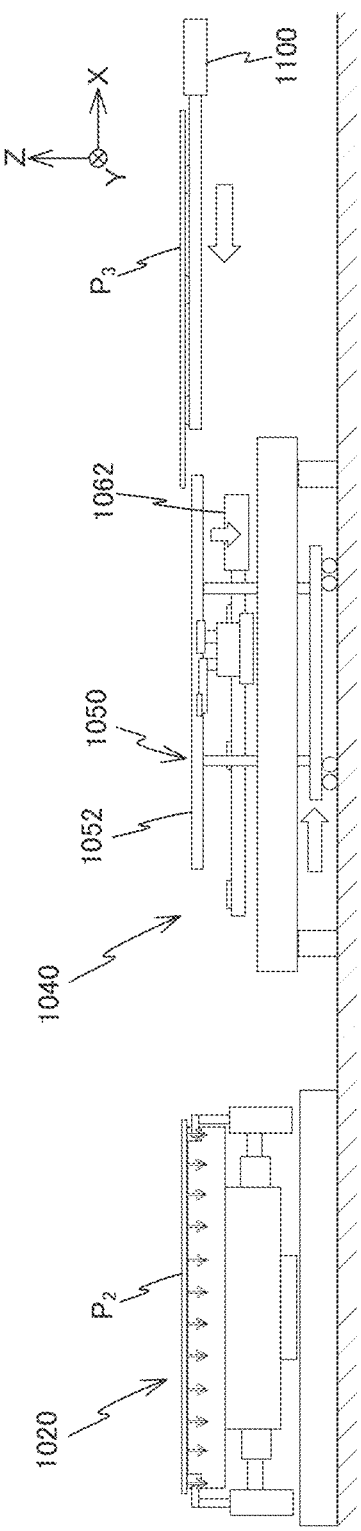

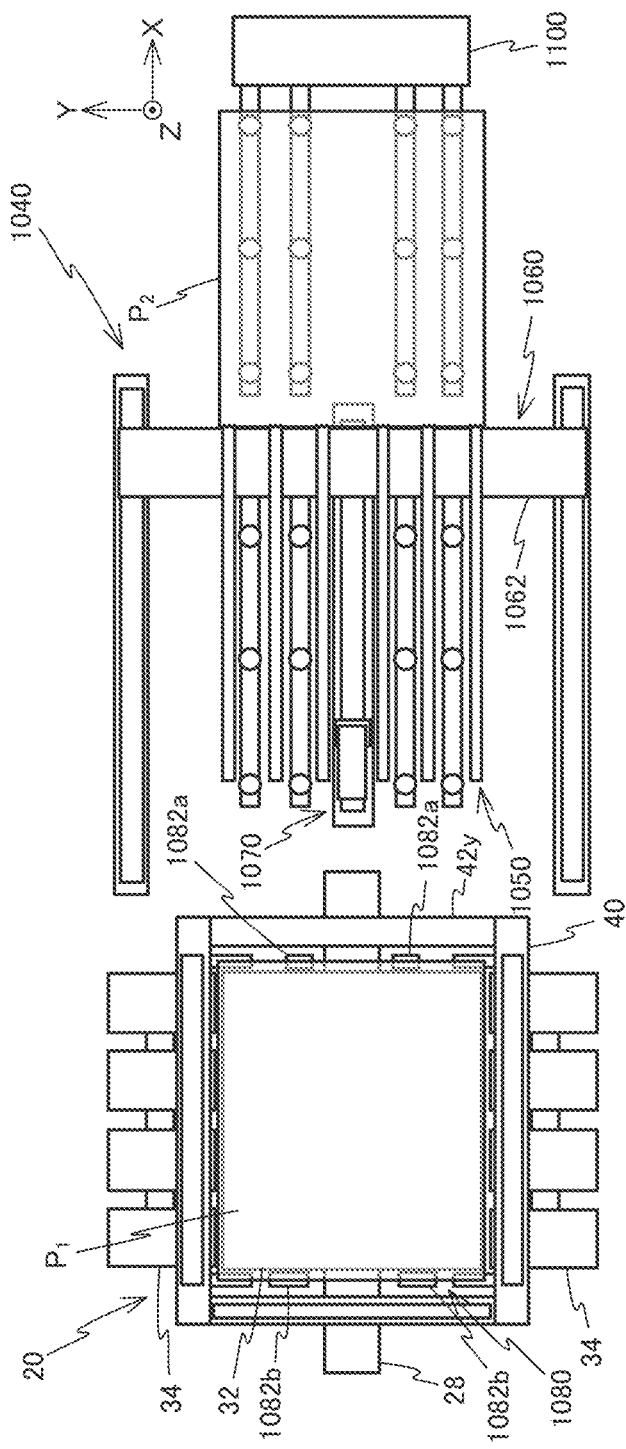
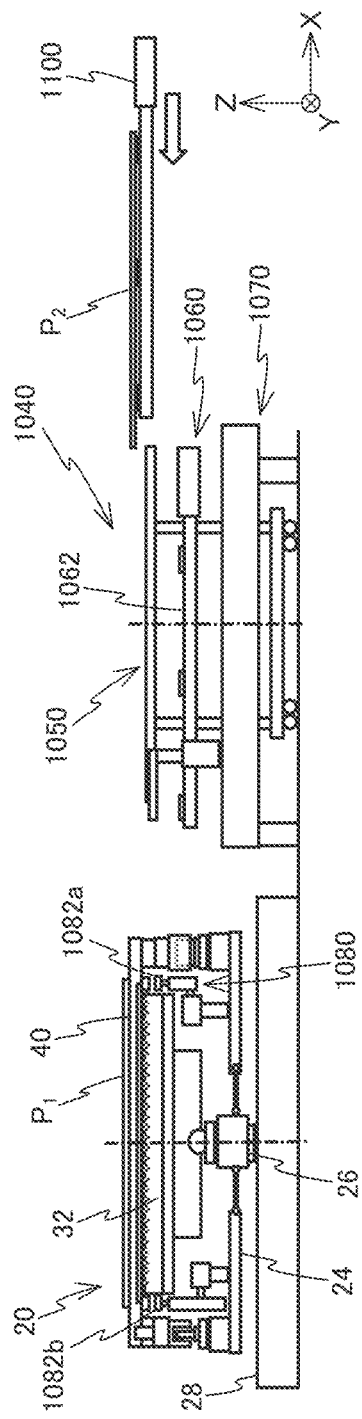
Fig. 49a
Fig. 49b

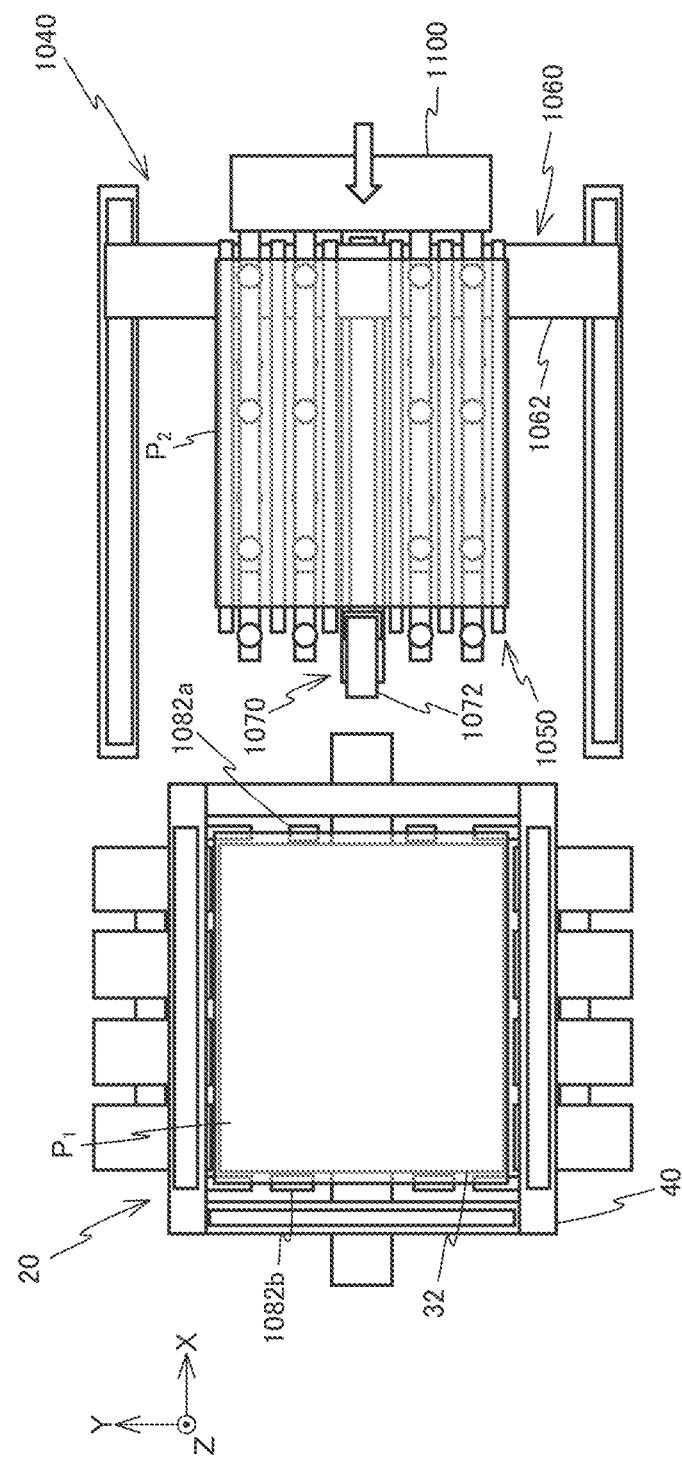
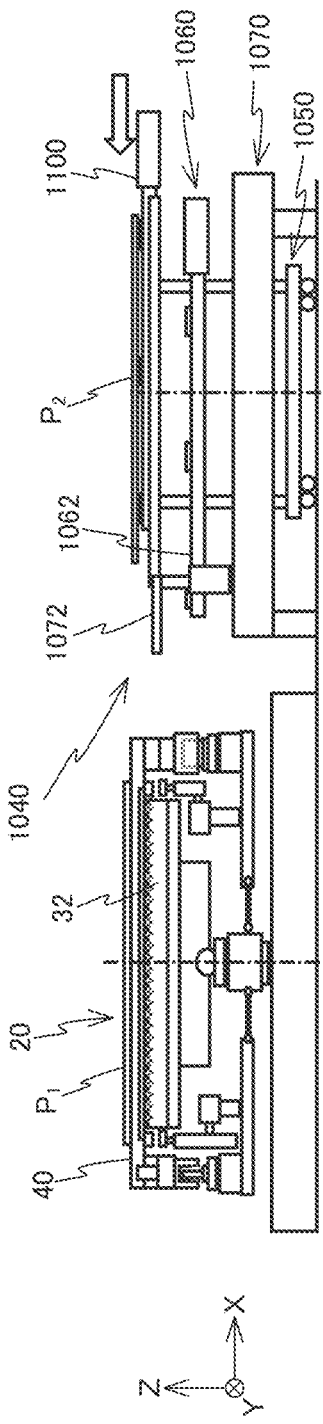
Fig. 50a
Fig. 50b

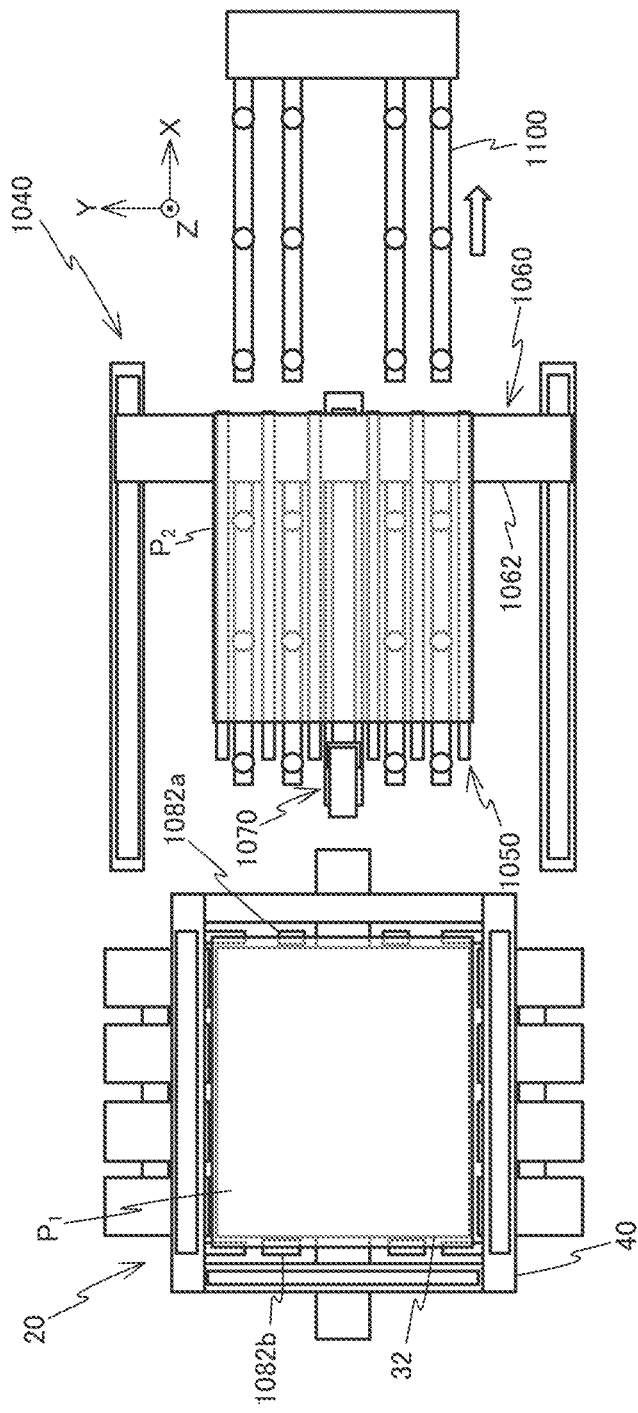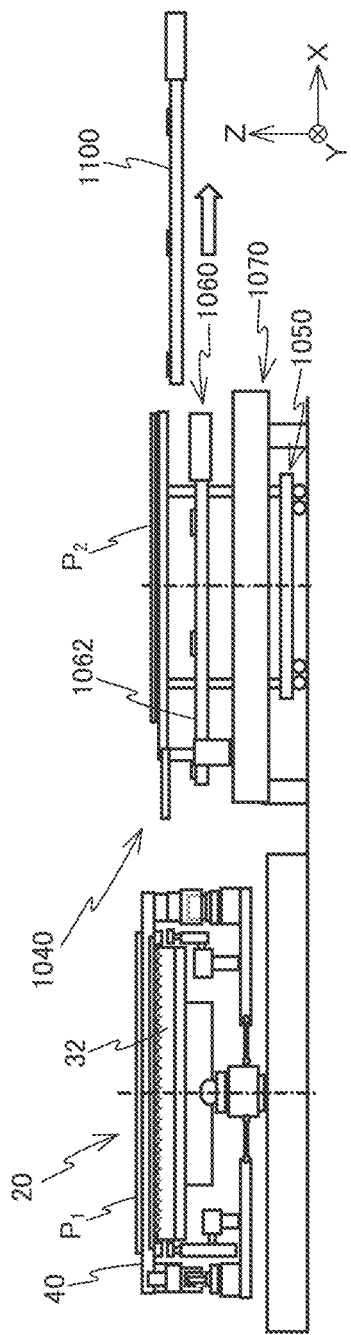
Fig. 51a
Fig. 51b

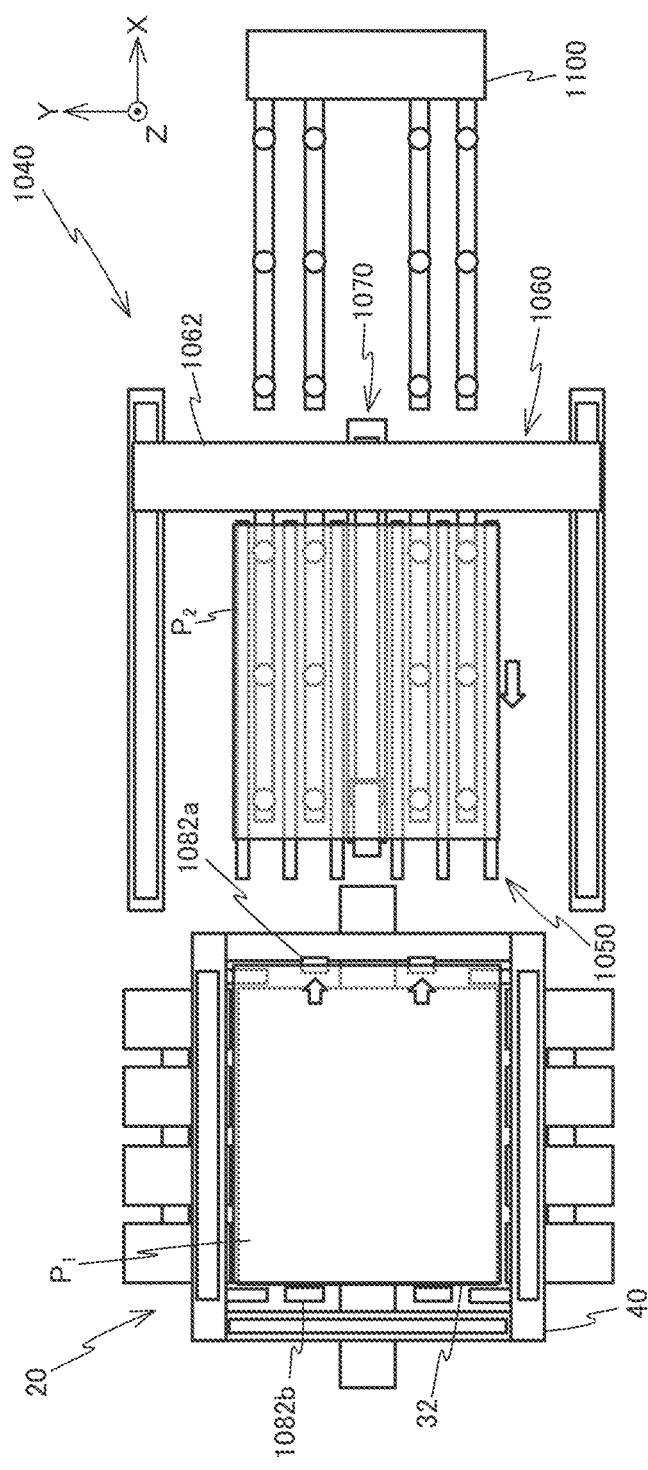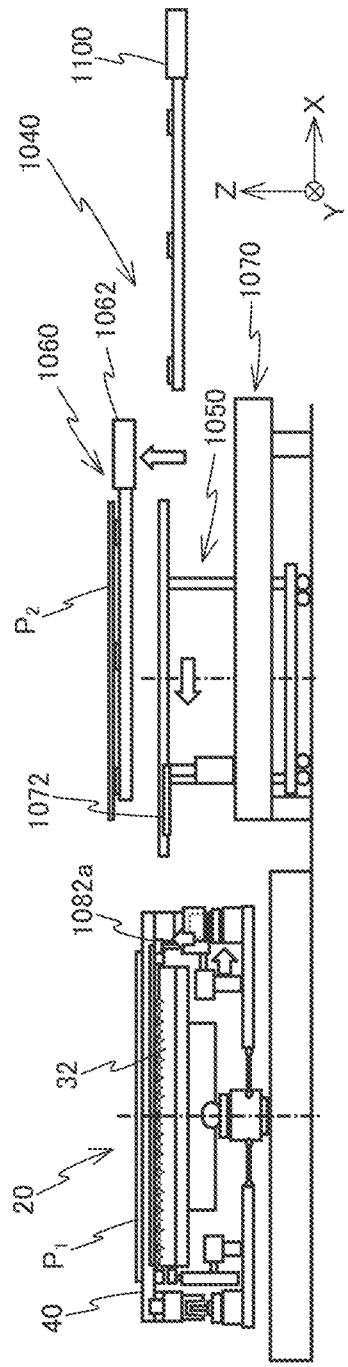
Fig. 52a
Fig. 52b

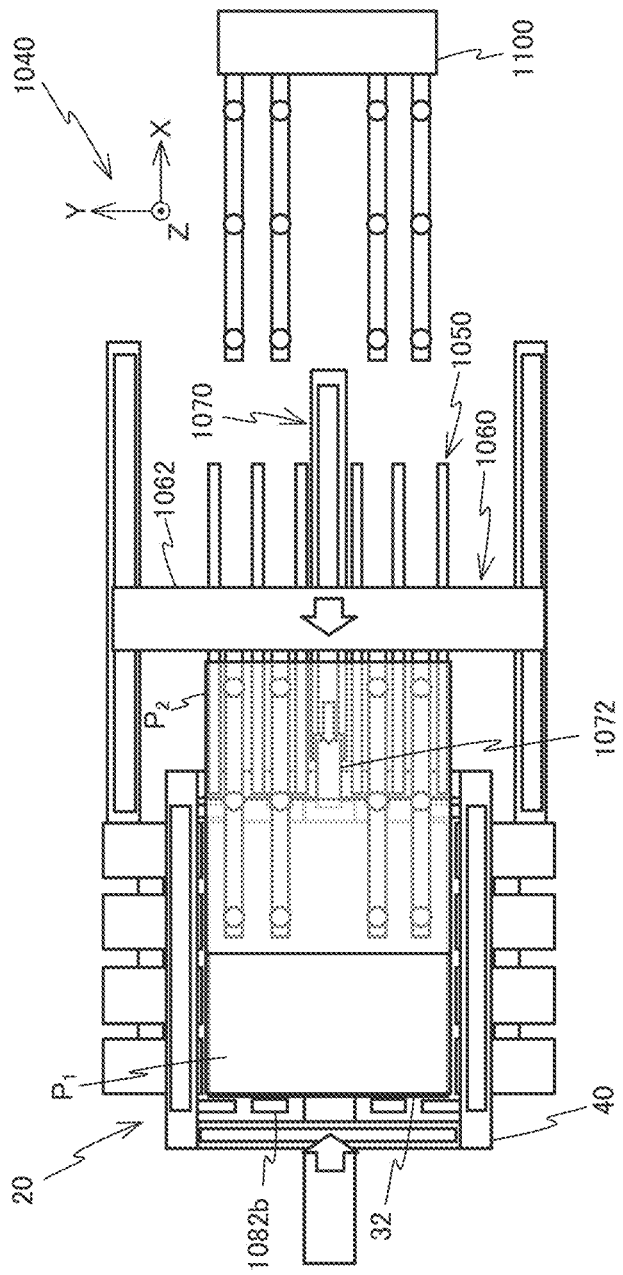

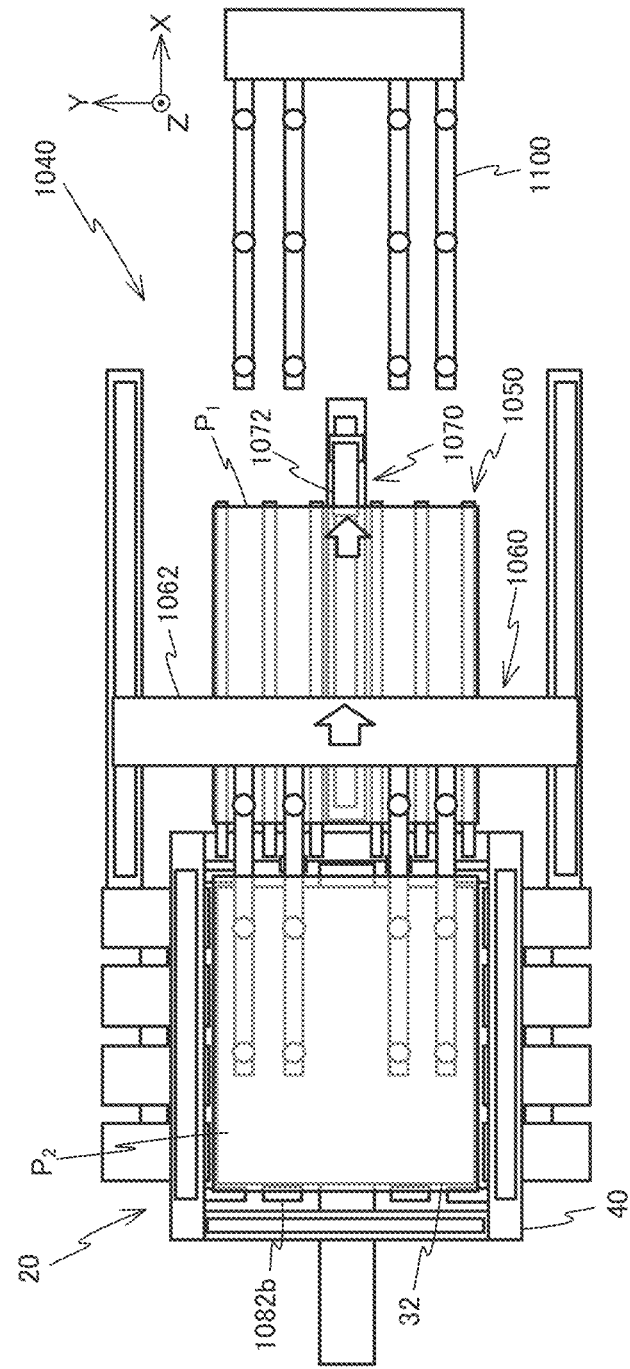
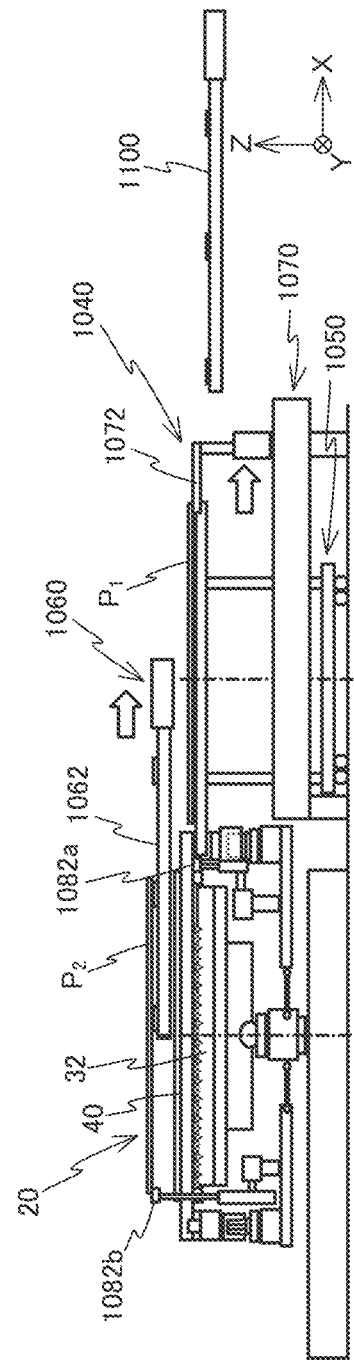
Fig. 55a
Fig. 55b

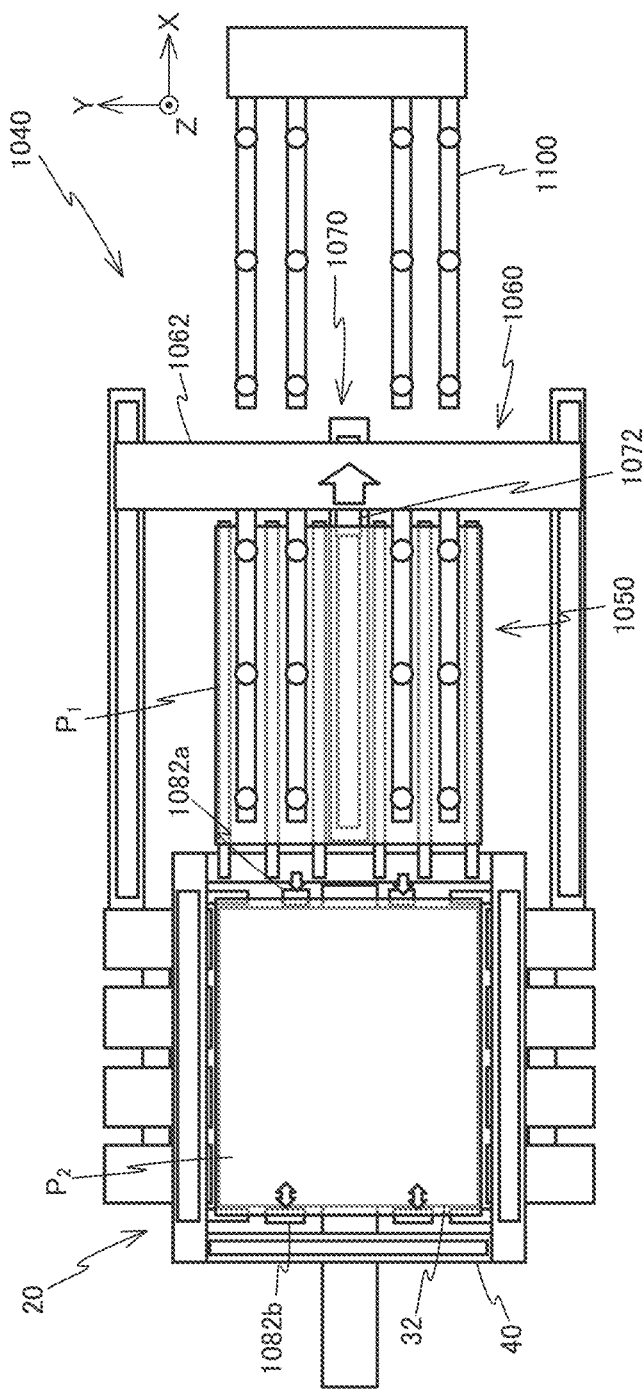
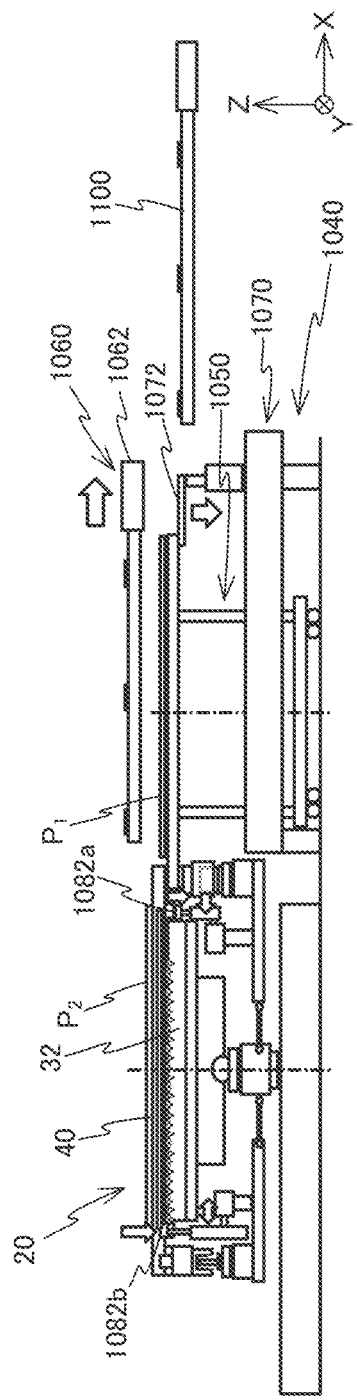
Fig. 56a
Fig. 56b

CARRIER DEVICE, EXPOSURE APPARATUS, EXPOSURE METHOD, MANUFACTURING METHOD OF FLAT-PANEL DISPLAY, DEVICE MANUFACTURING METHOD, AND CARRYING METHOD

This is a continuation of U.S. patent application Ser. No. 16/336,134 filed Aug. 23, 2019 (now abandoned), which is the U.S. National Stage of International Application No. PCT/JP2017/035463 filed Sep. 29, 2017, which claims priority from Japanese Application No. 2016-194441 filed in Japan on Sep. 30, 2016. The entire contents of each of the above-identified applications is incorporated herein by reference.

TECHNICAL FIELD

The present invention relates to carrier devices, exposure apparatuses, exposure methods, manufacturing methods of flat-panel displays, device manufacturing methods, and carrying methods, and more particularly to a carrier device and a carrying method for carrying objects, an exposure apparatus equipped with the carrier device, an exposure method making use of the carrying method, and a manufacturing method of flat-panel displays or a device manufacturing method using the exposure apparatus.

BACKGROUND ART

Conventionally, in a lithography process for manufacturing electronic devices (micro devices) such as liquid crystal display devices and semiconductor devices (integrated circuits and the like), used are exposure apparatuses such as an exposure apparatus of a step-and-scan method (a so-called scanning stepper (which is also called a scanner)) that, while synchronously moving a mask or a reticle (hereinafter, generically referred to as a "mask") and a glass plate or a wafer (hereinafter, generically referred to as a "substrate") along a predetermined scanning direction, transfers a pattern formed on the mask onto the substrate using an energy beam.

As this type of exposure apparatuses, an exposure apparatus is known that carries out a glass substrate that has been exposed on a substrate stage device using a substrate exchange device, and then carries in another glass substrate onto the substrate stage device using the substrate exchange device, and thereby sequentially exchanges the glass substrate to be held by the substrate stage device and performs the exposure processing with respect to a plurality of glass substrates in order (e.g., refer to PTL 1).

Here, in the case of exposing a plurality of glass substrates, it is preferable to swiftly exchange a glass substrate on the substrate stage device also for improvement of the entire throughput.

CITATION LIST

Patent Literature

[PTL 1] U.S. Patent Application Publication No. 2010/0266961

SUMMARY OF THE INVENTION

According to a first aspect of the present invention, there is provided a carrier device that carries an object to a support section configured to support the object in a noncontact manner, the device comprising: a first holding section that holds a part of the object at a first position located above the support section; a drive section that moves downward the first holding section holding the object so that the object is supported in a noncontact manner by the support section; and a second holding section that holds the object supported in a noncontact manner by the support section, after the object held by the first holding section is moved by the drive section, wherein the drive section moves the first holding section from the first position to a second position where the first holding section can deliver the object to the second holding section.

According to a second aspect of the present invention, there is provided an exposure apparatus, comprising: the carrier device related to the first aspect; and a pattern forming device that forms a predetermined pattern on the object using an energy beam.

According to a third aspect of the present invention, there is provided a manufacturing method of a flat-panel display, comprising: exposing an object using the exposure apparatus related to the second aspect; and developing the object that has been exposed.

According to a fourth aspect of the present invention, there is provided a device manufacturing method, comprising: exposing an object using the exposure apparatus related to the second aspect; and developing the object that has been exposed.

According to a fifth aspect of the present invention, there is provided a carrying method of carrying an object to a support section for supporting the object in a noncontact manner, the method comprising: moving a first holding section that holds a part of the object at a first position located above the support section so that the object is supported in a noncontact manner by the support section; and holding the object, that is supported in a noncontact manner by the support section by the moving, with a second holding section, wherein in the moving, the object is moved from the first position to a second position where the object can be delivered to the second holding section.

According to a sixth aspect of the present invention, there is provided an exposure method, comprising: carrying the object to the support section with the carrying method related to the fifth aspect; and exposing the object that has been carried to the support section.

BRIEF DESCRIPTION OF DRAWINGS

FIGS. 31*a* and 31*b* are a plan view and a side view of the liquid crystal exposure apparatus, respectively, used to explain a substrate exchange operation (No. 1).

FIGS. 32*a* and 32*b* are a plan view and a side view of the liquid crystal exposure apparatus, respectively, used to explain a substrate exchange operation (No. 2).

FIGS. 33*a* and 33*b* are a plan view and a side view of the liquid crystal exposure apparatus, respectively, used to explain a substrate exchange operation (No. 3).

FIGS. 34*a* and 34*b* are a plan view and a side view of the liquid crystal exposure apparatus, respectively, used to explain a substrate exchange operation (No. 4).

FIGS. 35*a* and 35*b* are a plan view and a side view of the liquid crystal exposure apparatus, respectively, used to explain a substrate exchange operation (No. 5).

FIGS. 36*a* and 36*b* are a plan view and a side view of the liquid crystal exposure apparatus, respectively, used to explain a substrate exchange operation (No. 6).

FIGS. 39*a* and 39*b* are a plan view and a side view of the liquid crystal exposure apparatus, respectively, used to explain a substrate exchange operation (No. 9).

FIGS. 40*a* and 40*b* are a plan view and a side view of the liquid crystal exposure apparatus, respectively, used to explain a substrate exchange operation (No. 10).

FIGS. 41*a* and 41*b* are a plan view and a side view of the liquid crystal exposure apparatus, respectively, used to explain a substrate exchange operation (No. 11).

FIGS. 42*a* and 42*b* are a plan view and a side view of the liquid crystal exposure apparatus, respectively, used to explain a substrate exchange operation (No. 12).

FIGS. 43*a* and 43*b* are a plan view and a side view of the liquid crystal exposure apparatus, respectively, used to explain a substrate exchange operation (No. 13).

FIGS. 44*a* and 44*b* are a plan view and a side view of the liquid crystal exposure apparatus, respectively, used to explain a substrate exchange operation (No. 14).

FIGS. 45*a* and 45*b* are a plan view and a side view of the liquid crystal exposure apparatus, respectively, used to explain a substrate exchange operation (No. 15).

FIGS. 46*a* and 46*b* are a plan view and a side view of the liquid crystal exposure apparatus, respectively, used to explain a substrate exchange operation (No. 16).

FIGS. 47*a* and 47*b* are a plan view and a side view of the liquid crystal exposure apparatus, respectively, used to explain a substrate exchange operation (No. 17).

FIGS. 49*a* and 49*b* are views (No. 1) used to explain a fourth embodiment.

FIGS. 50*a* and 50*b* are views (No. 2) used to explain the fourth embodiment.

FIGS. 51*a* and 51*b* are views (No. 3) used to explain the fourth embodiment.

FIGS. 52*a* and 52*b* are views (No. 4) used to explain the fourth embodiment.

FIGS. 53*a* and 53*b* are views (No. 5) used to explain the fourth embodiment.

FIGS. 55*a* and 55*b* are views (No. 7) used to explain the fourth embodiment.

FIGS. 56*a* and 56*b* are views (No. 8) used to explain the fourth embodiment.

DESCRIPTION OF EMBODIMENTS

First Embodiment

A first embodiment will be described below, using FIGS. 1 to 9*b*.

Figure 1:
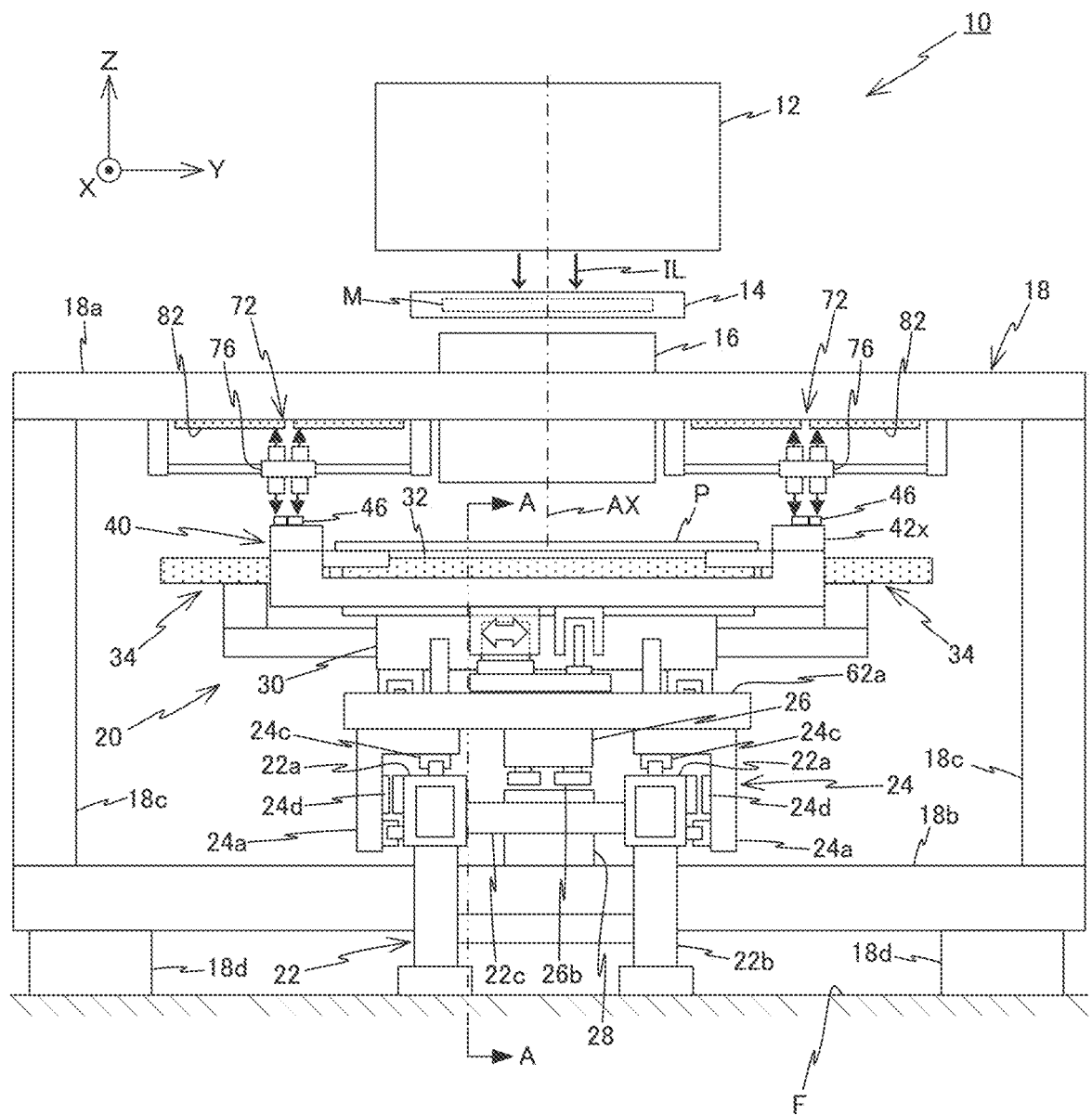
FIG. 1 is a view schematically showing a configuration of a liquid crystal exposure apparatus related a first embodiment.

FIG. 1 schematically shows the configuration of a liquid crystal exposure apparatus 10 related to the first embodiment. Liquid crystal exposure apparatus 10 is a projection exposure apparatus of a step-and-scan method, which is a so-called scanner, with a rectangular (square) glass substrate P (hereinafter, simply referred to as a substrate P) used in, for example, a liquid crystal display device (a flat-panel display) or the like, serving as an exposure target object.

Liquid crystal exposure apparatus 10 has: an illumination system 12; a mask stage 14 to hold a mask M on which patterns such as a circuit pattern are formed; a projection optical system 16; an apparatus main body 18; a substrate stage device 20 to hold substrate P whose surface (a surface facing the +Z side in FIG. 1) is coated with resist (sensitive agent); a control system thereof; and the like. Hereinafter, the explanation is given assuming that a direction in which mask M and substrate P are each scanned relative to projection optical system 16 at the time of exposure is an X-axis direction, a direction orthogonal to the X-axis within a horizontal plane is a Y-axis direction, and a direction orthogonal to the X-axis and the Y-axis is a Z-axis direction.

Further, the explanation is given assuming that rotation directions around the X-axis, the Y-axis and the Z-axis are a θx direction, a θy direction and a θz direction, respectively.

Illumination system 12 is configured similarly to an illumination system disclosed in, for example, U.S. Pat. No. 5,729,331 and the like. That is, illumination system 12 irradiates mask M with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated). As illumination light IL, light such as, for example, an i-line (with wavelength of 365 nm), a g-line (with wavelength of 436 nm), and an h-line (with wavelength of 405 nm) (or synthetic light of the i-line, the g-line and the h-line described above) is used.

Mask stage 14 holds mask M of a light-transmitting type. Main controller 50 (see FIG. 6) drives mask stage 14 (i.e. mask M) with a predetermined long stroke relative to illumination system 12 (illumination light IL) in the X-axis direction (the scan direction), and also finely drives mask stage 14 in the Y-axis direction and the θz direction, via a mask stage drive system 52 (see FIG. 6) including, for example, a linear motor. Position information of mask stage 14 within the horizontal plane is obtained by a mask stage position measurement system 54 (see FIG. 6) including, for example, a laser interferometer.

Projection optical system 16 is disposed below mask stage 14. Projection optical system 16 is a so-called multi-lens type projection optical system having a configuration similar to a projection optical system disclosed in, for example, U.S. Pat. No. 6,552,775 and the like, and projection optical system 16 is equipped with a plurality of optical systems that are, for example, both-side telecentric and form erected normal images. An optical axis AX of illumination light IL projected on substrate P from projection optical system 16 is substantially parallel to the Z-axis.

In liquid crystal exposure apparatus 10, when mask M located in a predetermined illumination area is illuminated with illumination light IL from illumination system 12, by illumination light IL that has passed through mask M, a projected image of a pattern (a partial image of the pattern) of mask M within the illumination area is formed on an exposure area on substrate P, via projection optical system 16. Then, mask M is moved relative to the illumination area (illumination light IL) in the scanning direction and also substrate P is moved relative to the exposure area (illumination light IL) in the scanning direction, and thereby the scanning exposure of one shot area on substrate P is performed and the pattern formed on mask M (the entire pattern corresponding to the scanning range of mask M) is transferred onto the shot area. Here, the illumination area on mask M and the exposure area (an irradiation area of the illumination light) on substrate P are in a relationship optically conjugate with each other by projection optical system 16.

Apparatus main body 18 is a section to support mask stage 14 and projection optical system 16 described above, and is installed on a floor F of a clean room via a plurality of vibration isolating devices 18d. Apparatus main body 18 is configured similarly to an apparatus main body as disclosed in, for example, U.S. Patent Application Publication No. 2008/0030702, and apparatus main body 18 has: an upper mount section 18a (which is also referred to as an optical surface plate or the like) that supports projection optical system 16 described above; a pair of lower mount sections 18b (one of which is not illustrated in FIG. 1 because the pair of lower mount sections 18b overlap in a depth direction of the paper surface; see FIG. 2); and a pair of middle mount sections 18c.

Substrate stage device 20 is a section that performs the high accuracy positioning of substrate P relative to projection optical system 16 (illumination light IL), and substrate stage device 20 drives substrate P with a predetermined long stroke along the horizontal plane (the X-axis direction and the Y-axis direction), and also finely drives substrate P in directions of six degrees of freedom. Substrate stage device 20 is equipped with a base frame 22, a coarse movement stage 24, a weight cancelling device 26, an X guide bar 28, a substrate table 30, a noncontact holder 32, a pair of auxiliary tables 34, a substrate carrier 40 and the like.

Base frame 22 is equipped with a pair of X beams 22a. X beam 22a is made up of a member with a rectangular YZ cross-sectional shape extending in the X-axis direction. The pair of X beams 22a are disposed at a predetermined spacing in the Y-axis direction, and are each installed on floor F via leg sections 22b, in a state of being physically separated (vibrationally isolated) from apparatus main body 18. Each of the pair of X beams 22a and each of leg sections 22b are integrally connected by a connecting member 22C.

Coarse movement stage 24 is a section for driving substrate P with a long stroke in the X-axis direction, and is equipped with a pair of X carriages 24a, correspondingly to the pair of X beams 22a described above. X carriage 24a is formed into an inversed L-like YZ cross-sectional shape, and is placed on the corresponding X beam 22a via a plurality of mechanical linear guide devices 24c.

Figure 2:
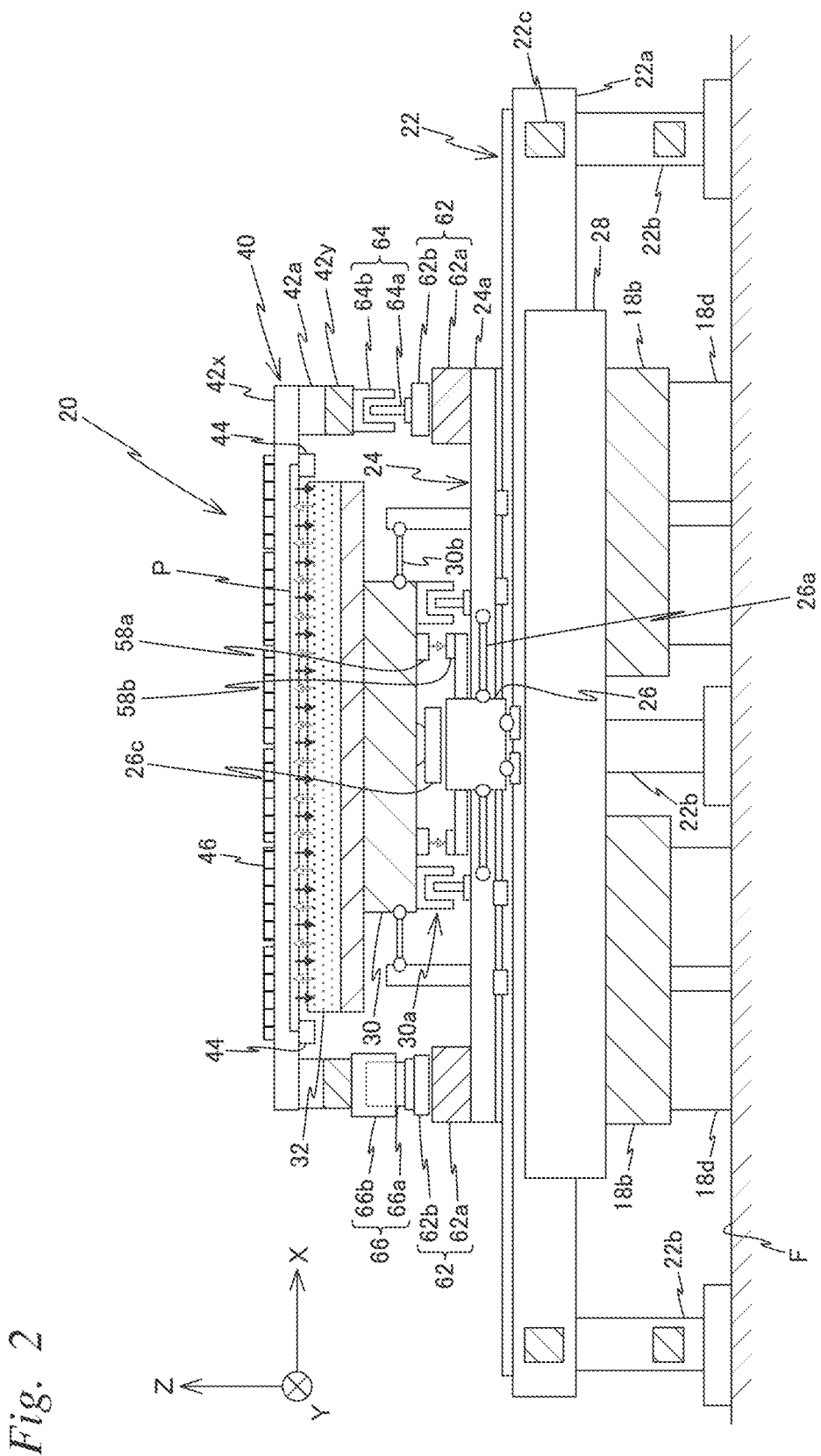
FIG. 2 is a cross-sectional view taken along the line A-A shown in FIG. 1.

The pair of X carriages 24a are synchronously driven with a predetermined long stroke in the X-axis direction (about 1 to 1.5 time the length of substrate P in the X-axis direction) along the respectively corresponding X beams 22a, by main controller 50 (see FIG. 6) via an X linear actuator that is a part of a substrate table drive system 56 (see FIG. 6) for driving substrate table 30. The type of the X linear actuator for driving X carriage 24a can be changed as needed. In FIG. 2, for example, a linear motor 24d including a mover that X carriage 24a has and a stator that the corresponding X beam 22a has is used, but this is not intended to be limiting, and for example, a feed screw (ball screw) device or the like may be used.

Further, as illustrated in FIG. 2, coarse movement stage 24 has a pair of Y stators 62a. Y stator 62a is made up of a member extending in the Y-axis direction (see FIG. 1). One of Y stators 62a and the other of Y stators 62a bridge on the pair of X carriages 24a, at the +X side end vicinity part of coarse movement stage 24 and at the −X side end vicinity part of coarse movement stage 24a (see FIG. 1), respectively. The functions of Y stators 62a will be described later.

Weight cancelling device 26 is inserted between the pair of X carriages 24a that coarse movement stage 24 has, and supports the empty weight of a system including substrate table 30 and noncontact holder 32, from below. Since the details of weight cancelling device 26 are disclosed in, for example, U.S. Patent Application Publication No. 2010/0018950, the description thereof will be omitted. Weight cancelling device 26 is mechanically connected to coarse movement stage 24, via a plurality of connecting devices 26a (which are also referred to as flexure devices) radially extending from weight cancelling device 26, and weight cancelling device 26 is towed by coarse movement stage 24, thereby being moved integrally with coarse movement stage 24 in the X-axis direction. Note that, although weight cancelling device 26 is to be connected to coarse movement stage 24 via connecting devices 26a radially extending from weight cancelling device 26, a configuration, in which weight cancelling device 26 is connected by connecting devices 26a extending in the X direction in order to be moved only in the X-axis direction, may also be employed.

X guide bar 28 is a section that functions as a surface plate when weight cancelling device 26 is moved. X guide bar 28 is made up of a member extending in the X-axis direction, and as illustrated in FIG. 1, X guide bar 28 is inserted between the pair of X beams 22a that base frame 22 has, and is fixed on the pair of lower mount sections 18b that apparatus main body 18 has. The center in the Y-axis direction of X guide bar 28 substantially coincides with the center in the Y-axis direction of the exposure area generated on substrate P by illumination light IL. The upper surface of X guide bar 28 is set parallel to the XY plane (the horizontal plane). Weight cancelling device 26 described above is placed on X guide bar 28 in a noncontact state, for example, via air bearings 26b. When coarse movement stage 24 is moved in the X-axis direction on base frame 22, weight cancelling device 26 is moved in the X-axis direction on X guide bar 28.

Substrate table 30 is made up of a plate-like (or box-like) member having a rectangular shape in planar view with the X-axis direction serving as a longitudinal direction, and as illustrated in FIG. 2, is supported in a noncontact manner from below by weight cancelling device 26 in a state where the center part is freely oscillated with respect to the XY plane via a spherical bearing device 26c. Further, as illustrated in FIG. 1, the pair of auxiliary tables 34 (not illustrated in FIG. 2) are connected to substrate table 30. The functions of the pair of auxiliary tables 34 will be described later.

Referring back to FIG. 2, substrate table 30 is finely driven as needed relative to coarse movement stage 24, in directions intersecting the horizontal plane (the XY plane), i.e., the Z-axis direction, the θx direction and the θy direction (hereinafter, referred to as Z-tilt directions), by a plurality of linear motors 30a (e.g. voice coil motors) that are a part of substrate table drive system 56 (see FIG. 6) and include stators that coarse movement stage 24 has and movers that substrate table 30 itself has.

Substrate table 30 is mechanically connected to coarse movement stage 24 via a plurality of connecting devices 30b (flexure devices) radially extending from substrate table 30. Connecting devices 30b include, for example, boll joints, and are arranged so as not to disturb the relative movement of substrate table 30 with a fine stroke with respect to coarse movement stage 24 in the Z-tilt directions. Further, in the case where coarse movement stage 24 is moved with a long stroke in the X-axis direction, substrate table 30 is towed by coarse movement stage 24 via the plurality of connecting devices 30b, and thereby coarse movement stage 24 and substrate table 30 are integrally moved in the X-axis direction. Note that, since substrate table 30 is not moved in the Y-axis direction, substrate table 30 may be connected to coarse movement stage 24 via a plurality of connecting devices 30b parallel to the X-axis direction, instead of connecting devices 30b radially extending toward coarse movement stage 24.

Noncontact holder 32 is made up of a plate-like (or box-like) member having a rectangular shape in planar view with the X-axis direction serving as a longitudinal direction, and supports substrate P from below with its upper surface. Noncontact holder 32 has a function of preventing the sag, wrinkle or the like of substrate P from being generated (of performing flatness correction of substrate P). Noncontact holder 32 is fixed to the upper surface of substrate table 30, and is moved with a long stroke integrally with substrate table 30 described above in the X-axis direction and is also finely moved in the Z-tilt directions.

The length of each of the four sides of the upper surface (the substrate supporting surface) of noncontact holder 32 is set to be substantially the same as (actually, slightly shorter than) the length of each of the four sides of substrate P. Consequently, noncontact holder 32 can support substantially the entirety of substrate P from below, or more specifically, can support an exposure target area on substrate P (an area excluding margin areas that are formed at the end vicinity parts of substrate P) from below.

A pressurized gas supply device and a vacuum suction device (not illustrated) that are installed external to substrate stage device 20 are connected to noncontact holder 32 via piping members such as, for example, tubes. Further, a plurality of minute hole sections that communicate with the piping members referred to above are formed on the upper surface (the substrate placing surface) of noncontact holder 32. Noncontact holder 32 jets pressurized gas (e.g. compressed air) supplied from the pressurized gas supply device described above to the lower surface of substrate P via (apart of) the hole sections, thereby levitating substrate P. Further, together with the jet of the pressurized gas described above, noncontact holder 32 suctions air between the lower surface of substrate P and the substrate supporting surface by a vacuum suction force supplied from the vacuum suction device described above. Accordingly, the load (the preload) acts on substrate P, and the flatness correction of substrate P is performed along the upper surface of noncontact holder 32. However, the relative movement between substrate P and noncontact holder 32 in directions parallel to the horizontal plane is not disturbed because a gap is formed between substrate P and noncontact holder 32.

Substrate carrier 40 is a section that holds substrate P, and moves substrate P relative to illumination light IL (see FIG. 1) in directions of three degrees of freedom within the horizontal plane (the X-axis direction, the Y-axis direction and the θz direction). Substrate carrier 40 is formed into a rectangular frame-like (a picture-frame-like) shape in planar view, and is moved relative to noncontact holder 32 along the XY plane in a state of holding the areas (the margin areas) near the ends (the outer periphery edges) of substrate P. The details of substrate carrier 40 will be described below using FIG. 3.

Figure 3:
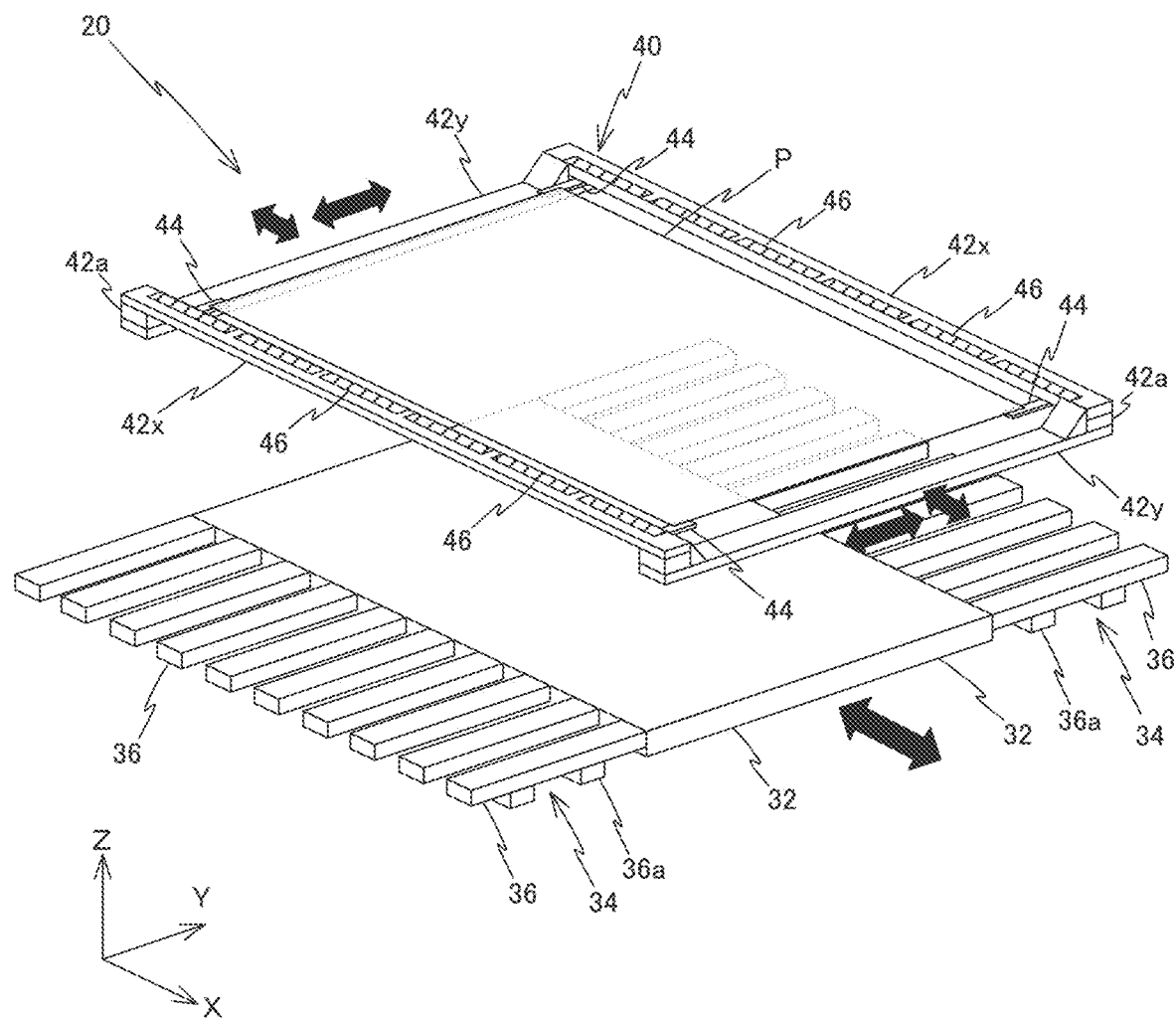
FIG. 3 is a view showing the details of a substrate stage device equipped in the liquid crystal exposure apparatus shown in FIG. 1.

As illustrated in FIG. 3, substrate carrier 40 is equipped with a pair of X frames 42x and a pair of Y frames 42y. The pair of X frames 42x are each made up of a tabular member extending in the X-axis direction, and are disposed at a predetermined spacing in the Y-axis direction (the spacing wider than the size of substrate P and the size of noncontact holder 32 in the Y-axis direction). Further, the pair of Y frames 42y are each made up of a tabular member extending in the Y-axis direction, and are disposed at a predetermined spacing in the X-axis direction (the spacing wider than the size of substrate P and the size of noncontact holder 32 in the X-axis direction).

Y frame 42y on the +X side is connected, via a spacer 42a, to the lower surface of the +X side end vicinity part of each of the pair of X frames 42x. Similarly, Y frame 42y on the −X side is connected, via a spacer 42a, to the lower surface of the −X side end vicinity part of each of the pair of X frames 42x. Accordingly, the height positions (the positions in the Z-axis direction) of the upper surfaces of the pair of Y frames 42y are set lower (on the −Z side) than the height positions of the lower surfaces of the pair of X frames 42x.

Further, a pair of adsorption pads 44 are attached, spaced apart in the X-axis direction, to the lower surface of each of the pair of X frames 42x. Consequently, substrate carrier 40 has, for example, four adsorption pads 44 in total. Adsorption pads 44 are disposed protruding from the surfaces of the pair of X frames 42x facing each other, toward directions opposed to each other (to the inner side of substrate carrier 40). For example, the positions of the four adsorption pads 44 within the horizontal plane (the attached positions with respect to X frames 42x) are set so that the four adsorption pads 44 can support the four corner vicinity parts (the margin areas) of substrate P from below in a state where substrate P is inserted between the pair of X frames 42x. For example, a vacuum suction device (not illustrated) is connected to each of the four adsorption pads 44. Adsorption pads 44 adsorb and hold the lower surface of substrate P by vacuum suction forces supplied from the vacuum suction device descried above. Note that the number of adsorption pads 44 is not limited to four, but can be changed as needed.

Here, as illustrated in FIG. 2, in a state where noncontact holder 32 and substrate carrier 40 are combined, the four corner vicinity parts of substrate P are supported (adsorbed and held) from below by adsorption pads 44 that substrate carrier 40 has, and also the substantially entire surface including the center part of substrate P is supported in a noncontact manner from below by noncontact holder 32. In this state, the +X side end and the −X side end of substrate P protrude from the +X side end and the −X side end of noncontact holder 32, respectively, and for example, the four adsorption pads 44 (a part of which is not illustrated in FIG. 2) adsorb and hold the portions of substrate P protruding from noncontact holder 32. That is, the attached positions of adsorption pads 44 with respect to X frames 42x are set so that adsorption pads 44 are located on the outer side with respect to noncontact holder 32 in the X-axis direction.

Next, a substrate carrier drive system 60 (see FIG. 6) for driving substrate carrier 40 will be described. In the present embodiment, main controller 50 (see FIG. 6) drives substrate carrier 40 with a long stroke relative to noncontact holder 32 in the Y-axis direction and also finely drives substrate carrier 40 in the directions of three degrees of freedom within the horizontal plane, via substrate carrier drive system 60. Further, main controller 50 drives noncontact holder 32 and substrate carrier 40 integrally (synchronously) in the X-axis direction via substrate table drive system 56 described above (see FIG. 6) and substrate carrier drive system 60.

Figure 4:
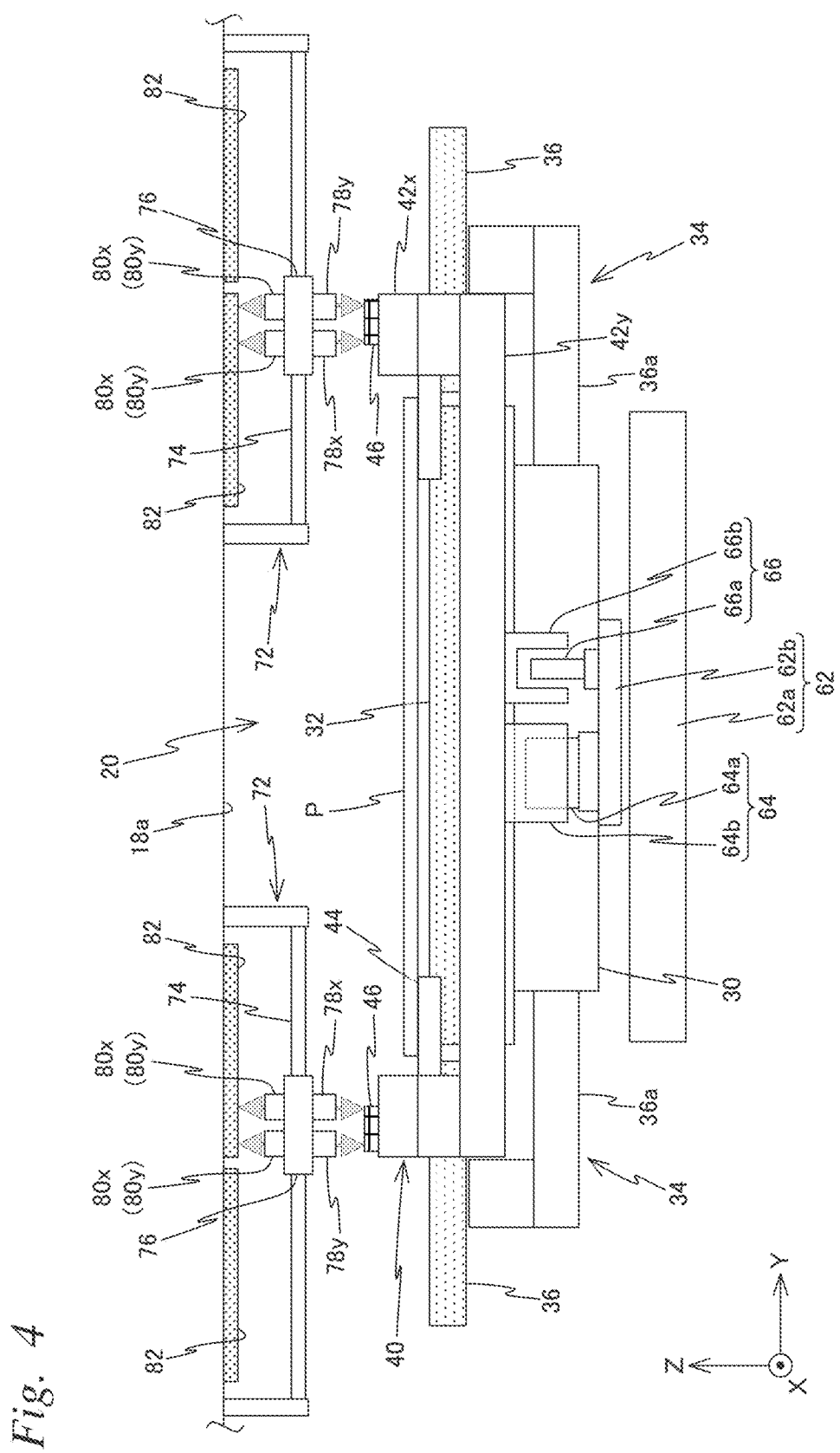
FIG. 4 is a required part enlarged view of the substrate stage device.

As illustrated in FIG. 2, substrate carrier drive system 60 is equipped with a pair of Y linear actuators 62 that include Y stators 62a that coarse movement stage 24 described above has and Y movers 62b that work with Y stators 62a to generate thrust forces in the Y-axis direction. As illustrated in FIG. 4, a Y stator 64a and an X stator 66a are attached to Y mover 62b of each of the pair of Y linear actuators 62.

Y stator 64a works with a Y mover 64b attached to substrate carrier 40 (the lower surface of Y frame 42y), to configure a Y voice coil motor 64 that applies a thrust force in the Y-axis direction to substrate carrier 40. Further, X stator 66a works with an X mover 66b attached to substrate carrier 40 (the lower surface of Y frame 42y), to configure an X voice coil motor 66 that applies a thrust force in the X-axis direction to substrate carrier 40. In this manner, substrate stage device 20 has one each of Y voice coil motor 64 and X voice coil motor 66 on each of the +X side and the −X side of substrate carrier 40.

Here, on the +X side and the −X side of substrate carrier 40, Y voice coil motors 64 and X voice coil motors 66 are each disposed point-symmetric with respect to the gravity center position of substrate P. Consequently, when causing the thrust force in the X-axis direction to act on substrate carrier 40 using X voice coil motor 66 on the +X side of substrate carrier 40 and X voice coil motor 66 on the −X side of substrate carrier 40, the effect similar to that of causing the thrust force in parallel to the X-axis direction to act on the gravity center position of substrate P can be obtained, that is, the moment in the θz direction can be suppressed from acting on substrate carrier 40 (substrate P). Note that, since a pair of Y voice coil motors 64 are disposed with the gravity center (line) of substrate P in the X-axis direction in between, the moment in the θz direction does not act on substrate carrier 40.

Substrate carrier 40 is finely driven relative to coarse movement stage 24 (i.e. noncontact holder 32) in the directions of three degrees of freedom within the horizontal plane, by main controller 50 (FIG. 6) via the pair of Y voice coil motors 64 and the pair of X voice coil motors 66 described above. Further, when coarse movement stage 24 (i.e. noncontact holder 32) is moved with a long stroke in the X-axis direction, main controller 50 applies the thrust force in the X-axis direction to substrate carrier 40 using the pair of X voice coil motors 66 described above so that noncontact holder 32 and substrate carrier 40 are integrally moved with a long stroke in the X-axis direction.

Further, main controller 50 (see FIG. 6) relatively moves substrate carrier 40 with a long stroke with respect to noncontact holder 32 in the Y-axis direction, using the pair of Y linear actuators 62 and the pair of Y voice coil motors 64 described above. More specifically, while moving Y movers 62b of the pair of Y linear actuators 62 in the Y-axis direction, main controller 50 causes the thrust force in the Y-axis direction to act on substrate carrier 40 using Y voice coil motors 64 including Y stators 64a attached to Y movers 62b. Accordingly, substrate carrier 40 is moved with a long stroke independently (separately) from noncontact holder 32 in the Y-axis direction.

In this manner, in substrate stage device 20 of the present embodiment, substrate carrier 40 that holds substrate P is moved with a long stroke integrally with noncontact holder 32 in the X-axis (scanning) direction, whereas substrate carrier 40 is moved with a long stroke independently from noncontact holder 32 in the Y-axis direction. Note that, although the Z-positions of adsorption pads 44 and the Z-position of noncontact holder 32 are partially overlap as can be seen from FIG. 2, there is no risk that adsorption pads 44 and noncontact holder 32 come into contact with each other because it is only the Y-axis direction in which substrate carrier 40 is relatively moved with a long stroke with respect to noncontact holder 32.

Further, in the case where substrate table 30 (i.e. noncontact holder 32) is driven in the Z-tilt directions, substrate P whose flatness has been corrected along noncontact holder 32 changes in attitude together with noncontact holder 32 in the Z-tilt directions, and therefore substrate carrier 40 that adsorbs and holds substrate P changes in attitude together with substrate P in the Z-tilt directions. Note that the attitude of substrate carrier 40 may be prevented from changing, by the elastic deformation of adsorption pads 44.

Referring back to FIG. 1, the pair of auxiliary tables 34 are devices that work with noncontact holder 32 to support the lower surface of substrate P held by substrate carrier 40, when substrate carrier 40 is relatively moved in the Y-axis direction separately from noncontact holder 32. As is described above, substrate carrier 40 is relatively moved with respect to noncontact holder 32 in a state of holding substrate P, and therefore, for example, when substrate carrier 40 is moved toward the +Y direction from the state shown in FIG. 1, the +Y side end vicinity part of substrate P is no longer supported by noncontact holder 32. Therefore, in substrate stage device 20, in order to suppress the bending due to the self-weight of a portion, of substrate P, that is not supported by noncontact holder 32, substrate P is supported from below using one of the pair of auxiliary tables 34. The pair of auxiliary tables 34 have substantially the same structure, except that they are disposed laterally symmetric on the page surface.

As illustrated in FIG. 3, auxiliary table 34 has a plurality of air levitation units 36. Note that a configuration, in which air levitation unit 36 is formed into a bar-like shape extending in the Y-axis direction and the plurality of air levitation units 36 are disposed at a predetermined spacing in the X-axis direction, is employed in the present embodiment, but the shape, the number, the placement and the like of air levitation units 36 are not limited in particular, as far as the bending of substrate P caused by the self-weight can be suppressed. As illustrated in FIG. 4, the plurality of air levitation units 36 are supported from below by arm-like support members 36a protruding from the side surfaces of substrate table 30. A minute gap is formed between the plurality of air levitation units 36 and noncontact holder 32.

The height positions of the upper surfaces of air levitation units 36 are set to be substantially the same as (or slightly lower than) the height position of the upper surface of noncontact holder 32. Air levitation units 36 support substrate P in a noncontact manner by jetting gas (e.g. air) from the upper surfaces of air levitation units 36 to the lower surface of substrate P. Note that, although noncontact holder 32 described above performs the flatness correction of substrate P by causing the preload to act on substrate P, air levitation units 36 only have to suppress the bending of substrate P, and therefore air levitation units 36 should only supply the gas to the lower surface of substrate P and do not have to control in particular the height position of substrate P on air levitation units 36.

Next, a substrate position measurement system for measuring position information of substrate P in the directions of six degrees of freedom will be described. The substrate position measurement system has a Z-tilt position measurement system 58 (see FIG. 6) for obtaining position information of substrate table 30 in directions intersecting the horizontal plane (the position information in the Z-axis direction, and rotation amount information in the θx direction and the θy direction, hereinafter, referred to as "Z-tilt position information"), and a horizontal-in-plane position measurement system 70 (see FIG. 6) for obtaining position information of substrate carrier 40 within the XY plane (the position information in the X-axis direction and the Y-axis direction, and rotation amount information in the θz direction).

As illustrated in FIG. 2, Z-tilt position measurement system 58 (see FIG. 6) includes a plurality (at least three) of laser displacement meters 58a fixed around spherical bearing device 26c on the lower surface of substrate table 30. Laser displacement meter 58a irradiates a target 58b fixed to a housing of weight cancelling device 26, with measurement light, and receives its reflection light, thereby supplying displacement amount information of substrate table 30 in the Z-axis direction at the irradiation point of the measurement light to main controller 50 (see FIG. 6). For example, at least three laser displacement meters 58a are disposed at three locations that do not lie on the same straight line (e.g. positions corresponding to vertexes of a regular triangle), and main controller 50 obtains the Z-tilt position information of substrate table 30 (i.e. substrate P) on the basis of the outputs of the at least three laser displacement meters 58a. Since weight cancelling device 26 is moved along the upper surface of X guide bar 28 (the horizontal plane), main controller 50 can measure the attitude change of substrate table 30 with respect to the horizontal plane regardless of the X-position of substrate table 30.

As illustrated in FIG. 1, horizontal-in-plane position measurement system 70 (see FIG. 6) has a pair of head units 72. One of head units 72 is disposed on the −Y side of projection optical system 16, while the other head unit 72 is disposed on the +Y side of projection optical system 16.

Each of the pair of head units 72 obtains position information of substrate P within the horizontal plane using reflection-type diffraction gratings that substrate carrier 40 has. As illustrated in FIG. 3, correspondingly to the pair head units 72a, a plurality (e.g. six in FIG. 3) of scale plates 46 are pasted on the upper surface of each of the pair of X frames 42x of substrate carrier 40. Scale plate 46 is made up of a member with a band-like shape in planar view extending in the X-axis direction. The length of scale plate 46 in the X-axis direction is shorter, compared to the length of X frame 42x in the X-axis direction, and the plurality of scale plates 46 are arrayed at a predetermined spacing (spaced apart from each other) in the X-axis direction.

Figure 5:
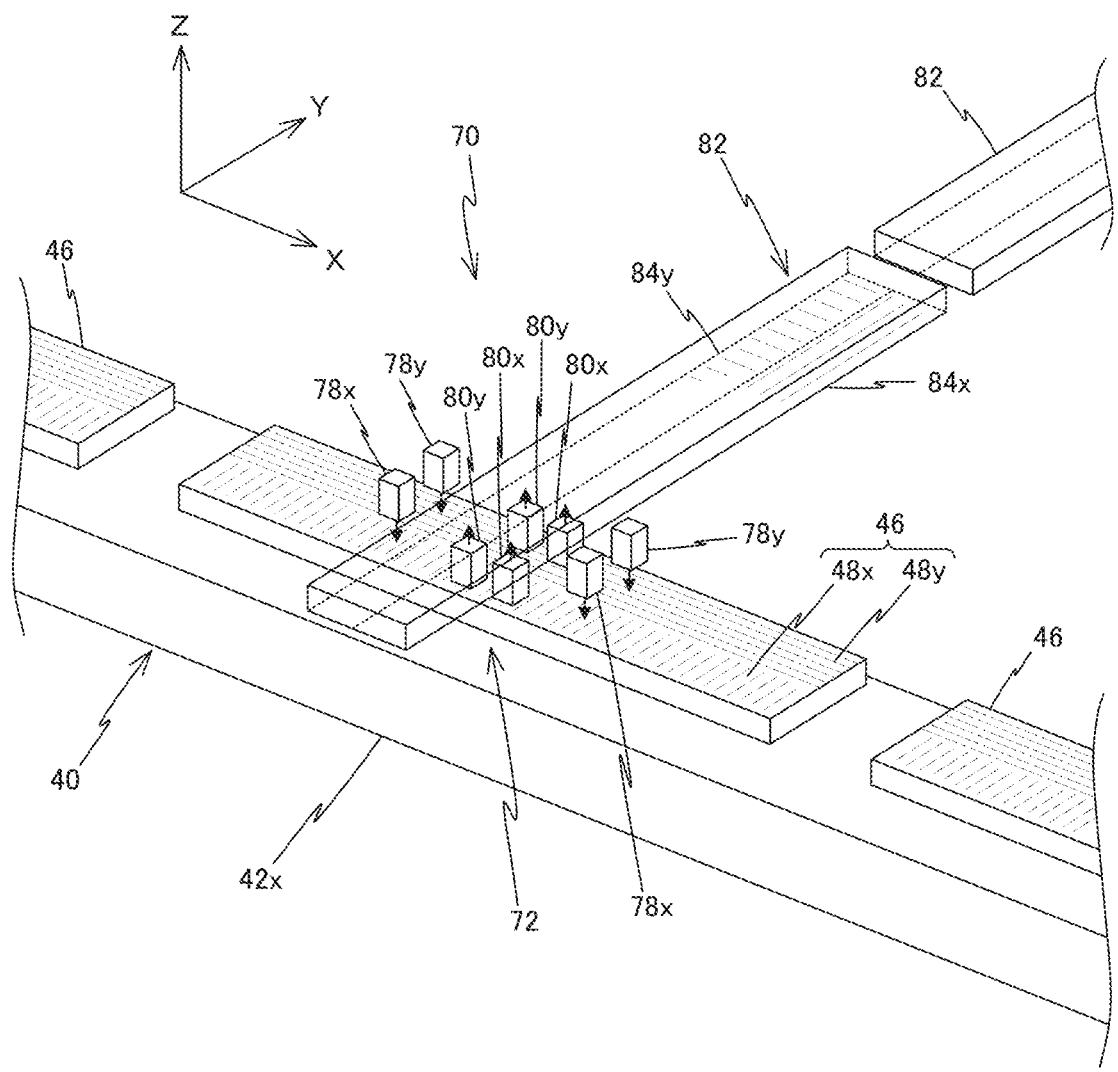
FIG. 5 is a concept view of a substrate position measurement system equipped in the liquid crystal exposure apparatus shown in FIG. 1.

FIG. 5 shows X frame 42x on the −Y side and head unit 72 corresponding thereto. On each of the plurality of scale plates 46 fixed on X frame 42x, an X scale 48x and a Y scale 48y are formed. X scale 48x is formed in the −Y side half area of scale plate 46, while Y scale 48y is formed in the +Y side half area of scale plate 46. X scale 48x has a reflection-type X diffraction grating, and Y scale 48y has a reflection-type Y diffraction grating. Note that in order to facilitate the understanding, a spacing (a pitch) between a plurality of grid lines that form X scale 48x and Y scale 48y is illustrated wider in FIG. 5 than the actual spacing (the actual pitch).

As illustrated in FIG. 4, head unit 72 is equipped with: a Y linear actuator 74; a Y slider 76 that is driven with a predetermined stroke relative to projection optical system 16 (see FIG. 1) in the Y-axis direction, by Y linear actuator 74; and a plurality of measurement heads (X encoder heads 78x and 80x, and Y encoder heads 78y and 80y) that are fixed to Y slider 76. The pair of head units 72 are similarly configured, except that they are configured laterally symmetric on the page surface in FIGS. 1 and 4. Further, the plurality of scale plates 46 fixed on the pair of X frames 42x, respectively, are also configured laterally symmetric in FIGS. 1 and 4.

Y linear actuator 74 is fixed to the lower surface of upper mount section 18a that apparatus main body 18 has. Y linear actuator 74 is equipped with a linear guide that straightly guides Y slider 76 in the Y-axis direction, and a drive system that applies a thrust force to Y slider 76. The type of the linear guide is not particularly limited, but an air bearing with a high repetitive reproducibility is suitable. Further, the type of the drive system is not particularly limited, and a linear motor, a belt (or wire) drive device or the like can be used.

Figure 6:
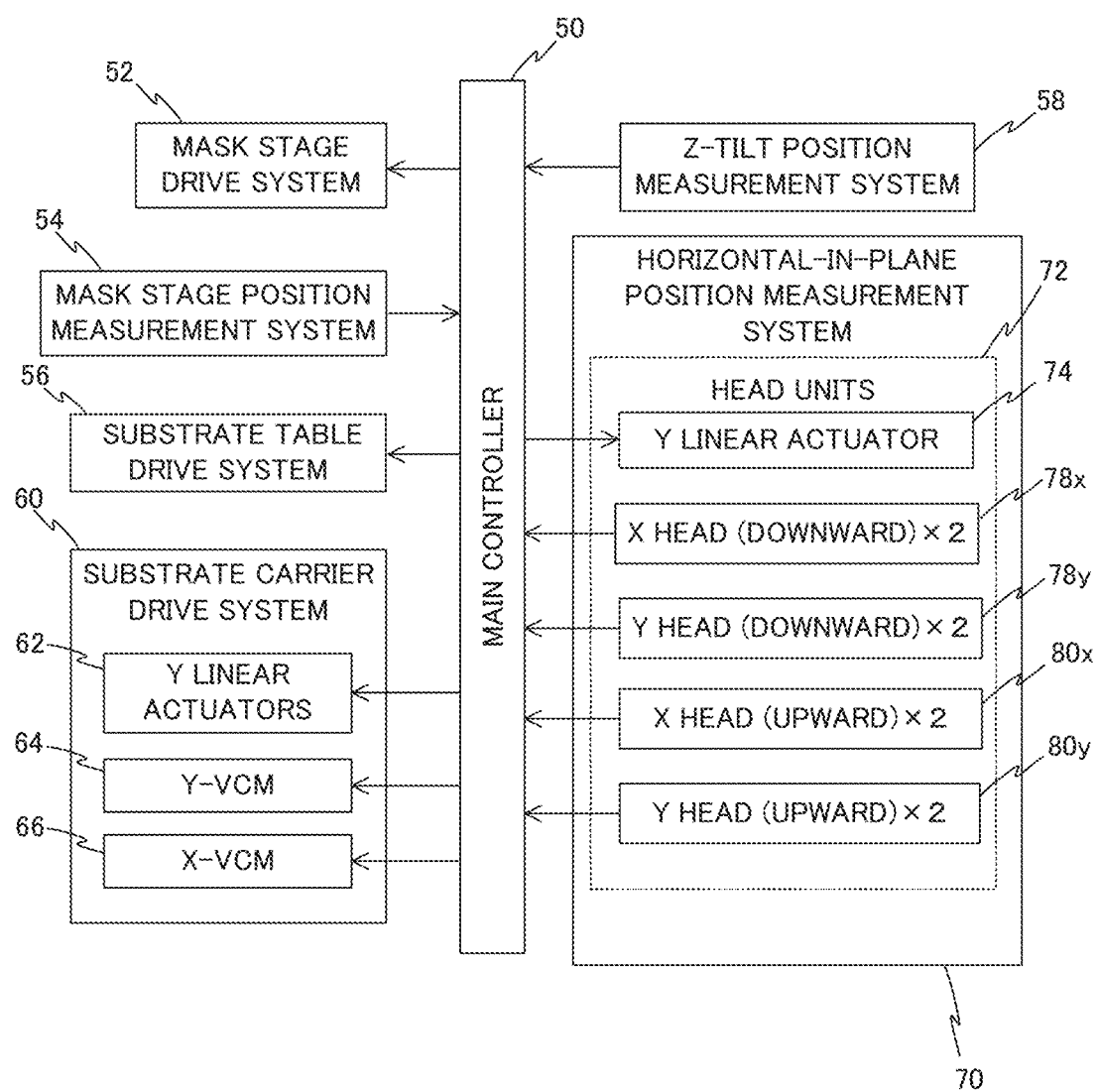
FIG. 6 is a block diagram showing the input/output relationship of a main controller that centrally configures a control system of the liquid crystal exposure apparatus.

Y linear actuator 74 is controlled by main controller 50 (see FIG. 6). The stroke amount of Y slider 76 in the Y-axis direction by Y linear actuator 74 is set equivalent to the stroke amount of substrate P (substrate carrier 40) in the Y-axis direction.

As illustrated in FIG. 5, head unit 72 is equipped with a pair of X encoder heads 78x (hereinafter, referred to as "X heads 78x"), and a pair of Y encoder heads 78y (hereinafter, referred to as "Y heads 78y"). The pair of X heads 78x and the pair of Y heads 78y are each disposed, spaced apart at a predetermined spacing in the X-axis direction.

X heads 78x and Y heads 78y are encoder heads of a so-called diffraction interference method as disclosed in, for example, U.S. Patent Application Publication No. 2008/0094592, and irradiate their corresponding scales (X scale 48x and Y scale 48y) with measurement beams downwardly (toward the −Z direction), and receive beams (returned beams) from the corresponding scales, thereby supplying displacement amount information of substrate carrier 40 to main controller 50 (see FIG. 6).

That is, in horizontal-in-plane position measurement system 70 (see FIG. 6), for example, four X heads 78x in total that the pair of heads units 72 have and X scales 48x that face these X heads 78x configure, for example, four X linear encoder systems for obtaining position information of substrate carrier 40 in the X-axis direction. Similarly, for example, four Y heads 78y in total that the pair of heads units 72 have and Y scales 48y that face these Y heads 78y configure, for example, four Y linear encoder systems for obtaining position information of substrate carrier 40 in the Y-axis direction.

Here, the spacing in the X-axis direction between the pair of X heads 78x and the spacing in the X-axis direction between the pair of Y heads 78y that each of the pair of head units 72 has are each set wider than the spacing between scale plates 46 adjacent to each other. Accordingly, in the X encoder systems and the Y encoder systems, at least one of the pair of X heads 78x constantly faces X scale 48x and also at least one of the pair of Y heads 78y constantly faces Y scale 48y, irrespective of the position of substrate carrier 40 in the X-axis direction.

Specifically, main controller 50 (FIG. 6) obtains X-position information of substrate carrier 40 on the basis of the average value of the outputs of the pair of X heads 78x in a state where the pair X heads 78x both face X scale 48x. Further, main controller 50 obtains the X-position information of substrate carrier 40 on the basis of only the output of one X head 78x of the pair of X heads 78x in a state where only the one X head 78x faces X scale 48x. Consequently, the X encoder systems can supply the position information of substrate carrier 40 to main controller 50 without interruption. The same can be said for the Y encoder systems.

Here, since substrate carrier 40 of the present embodiment is movable with a predetermined long stroke also in the Y-axis direction as is described above, main controller 50 (see FIG. 6) drives Y slider 76 (see FIG. 4) of each of the pair of head units 72 in the Y-axis direction, via Y linear actuator 74 (see FIG. 4), to follow substrate carrier 40, depending on the position of substrate carrier 40 in the Y-axis direction, so that respective facing states between X heads 78x and Y heads 78y and scales 48x and 48y respectively corresponding thereto are maintained. Main controller 50 comprehensively obtains position information of substrate carrier 40 within the horizontal plane, by using together the displacement amount (the position information) in the Y-axis direction of Y sliders 76 (i.e. each of heads 78x and 78y) and the output from each of heads 78x and 78y.

The position (displacement amount) information of Y sliders 76 (see FIG. 4) within the horizontal plane is obtained by encoder systems with the measurement accuracy equivalent to that of the encoder systems using X heads 78x and Y heads 78y described above. As can be seen from FIGS. 4 and 5, Y slider 76 has a pair of X encoder heads 80x (hereinafter, referred to as "X heads 80x") and a pair of Y encoder heads 80y (hereinafter, referred to as "Y heads 80y"). The pair of X heads 80x and the pair of Y heads 80y are each disposed at a predetermined spacing in the Y-axis direction.

Main controller 50 (see FIG. 6) obtains position information of Y sliders 76 within the horizontal plane using a plurality of scale plates 82 fixed to the lower surface of upper mount section 18a of apparatus main body 18 (see FIG. 1 for each of them). Scale plate 82 is made up of a member with a band-like shape in planar view extending in the Y-axis direction. In the present embodiment, for example, two scale plates 82 are disposed at a predetermined spacing (spaced apart from each other) in the Y-axis direction, above each of the pair of head units 72.

As illustrated in FIG. 5, in a +X side area on the lower surface of scale plate 82, an X scale 84x is formed facing the pair of X heads 80x described above, and in a −X side area on the lower surface of scale plate 82, a Y scale 84y is formed facing the pair of Y heads 80y described above. X scale 84x and Y scale 84y are light-reflection-type diffraction gratings having the configurations substantially similar to those of X scale 48x and Y scale 48y formed on scale plate 46 described above. Further, X head 80x and Y head 80y are encoder heads of a diffraction interference method having the configurations similar to those of X head 78x and Y head 78y (the downward heads) described above.

The pair of X heads 80x and the pair of Y heads 80y irradiate their corresponding scales (X scale 84x and Y scale 84y) with measurement beams upwardly (toward the +Z direction), and receive the beams from the corresponding scales, thereby supplying displacement amount information of Y slider 76 (see FIG. 4) within the horizontal plane to main controller 50 (see FIG. 6). The spacing in the Y-axis direction between the pair of X heads 80x and the spacing in the Y-axis direction between the pair of Y heads 80y are each set wider than the spacing between scale plates 82 adjacent to each other. Accordingly, at least one of the pair of X heads 80x constantly faces X scale 84x and also at least one of the pair of Y heads 80y constantly faces Y scale 84y, irrespective of the position of Y slider 76 in the Y-axis direction. Consequently, the position information of Y slider 76 can be supplied to main controller 50 (see FIG. 6) without interruption.

In FIG. 6, a block diagram is illustrated that shows the input/output relationship of main controller 50 that centrally configures the control system of liquid crystal exposure apparatus 10 (see FIG. 1) and performs the overall control of each of the constituents. Main controller 50 includes a workstation (or a microcomputer) and the like, and performs the overall control of each of the constituents of liquid crystal exposure apparatus 10.

In liquid crystal exposure apparatus 10 (see FIG. 1) configured as described above, under the control of main controller 50 (see FIG. 6), mask M is loaded onto mask stage 14 by a mask loader (not illustrated) and also substrate P is loaded onto substrate stage device 20 (substrate carrier 40 and noncontact holder 32) by a substrate loader (not illustrated). After that, main controller 50 implements alignment measurement using an alignment detection system (not illustrated), and focus mapping using an autofocus sensor (not illustrated) (a surface position measurement system of substrate P), and after the alignment measurement and the focus mapping are finished, the exposure operations of a step-and-scan method are sequentially performed with respect to a plurality of shot areas set on substrate P.

Next, an example of operations of substrate stage device 20 at the time of exposure operations will be described using FIGS. 7a to 9b. Note that, in the description below, the case where four shot areas are set on one substrate P (the so-called case of preparing four areas) will be described, but the number and the placement of the shot areas set on one substrate P can be changed as needed. In the present embodiment, as an example, the description will be made assuming that the exposure processing is performed from a first shot area S1 set on the −Y side and on the +X side of substrate P. Further, in order to avoid the intricacy of the drawings, a part of elements that substrate stage device 20 has is omitted in FIGS. 7a to 9b.

Figure 7A:
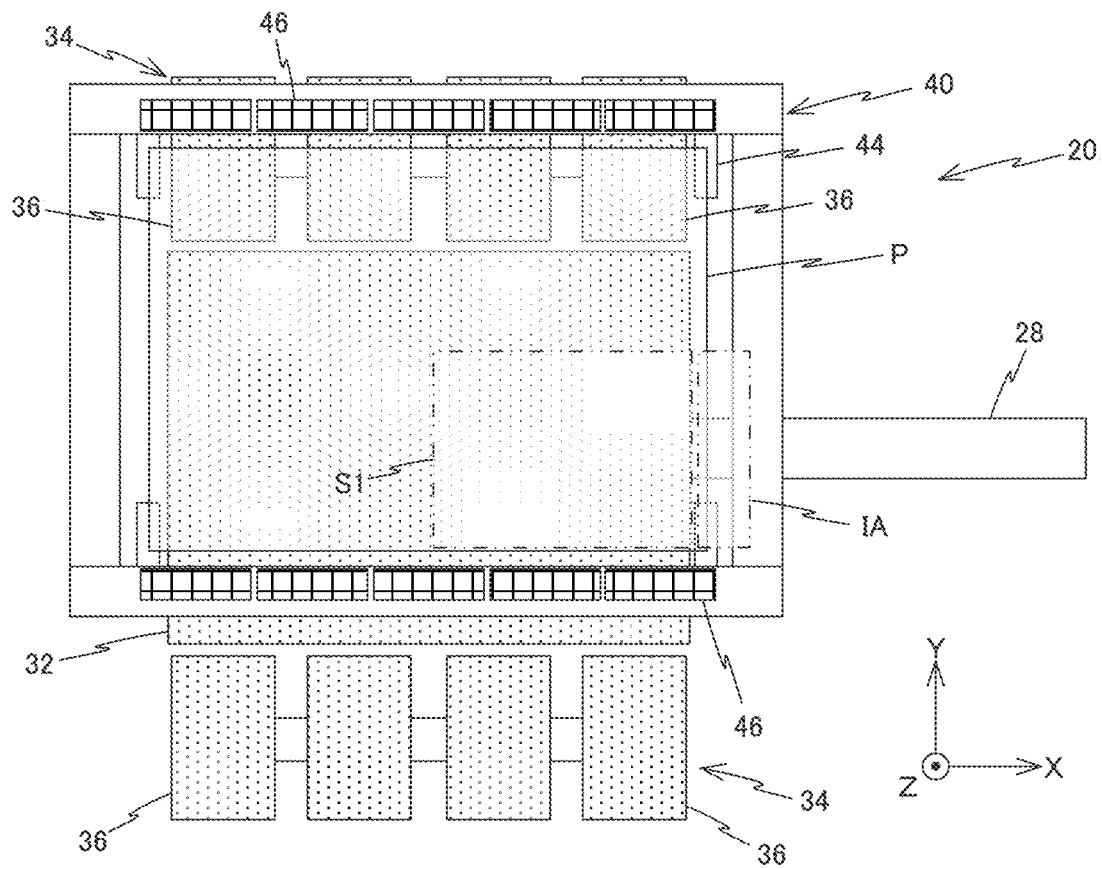
FIGS. 7a and 7b are views (a plan view and a front view, respectively) used to explain an operation (No. 1) of the substrate stage device at the time of exposure operations.
Figure 7B:
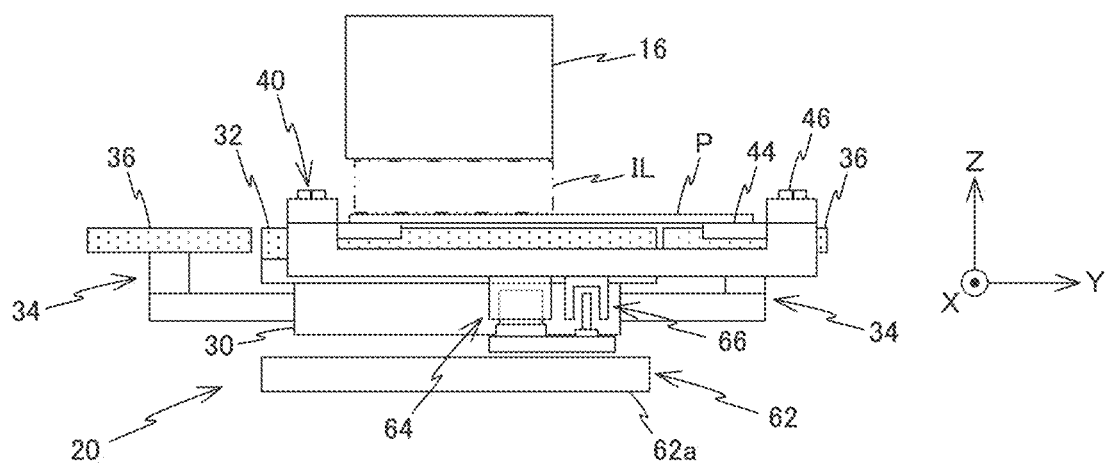

FIGS. 7a and 7b show a plan view and a front view, respectively, of substrate stage device 20 in a state where operations such as an alignment operation have been completed and preparation of the exposure operation with respect to the first shot area S1 is finished. In substrate stage device 20, as illustrated in FIG. 7a, the positioning of substrate P is performed on the basis of the output of horizontal-in-plane position measurement system 70 (see FIG. 6) so that the +X side end of the first shot area S1 is slightly located on the further −X side than exposure area IA to be formed on substrate P by illumination light IL from projection optical system 16 (see FIG. 7b for each of them) being irradiated (however, in the state shown in FIG. 7a, illumination light IL has not yet been irradiated on substrate P).

Further, since the center of exposure area IA and the center of X guide bar 28 (i.e. noncontact holder 32) substantially coincide with each other in the Y-axis direction, the +Y side end vicinity part of substrate P held by substrate carrier 40 protrudes from noncontact holder 32. The protruding portion of substrate P is supported from below by auxiliary table 34 disposed on the +Y side of noncontact holder 32. At this time, although the flatness correction by noncontact holder 32 is not performed with respect to the +Y side end vicinity part of substrate P, the exposure accuracy is not affected because the flatness corrected state is maintained for an area including the first shot area S1 serving as an exposure target.

Figure 8A:
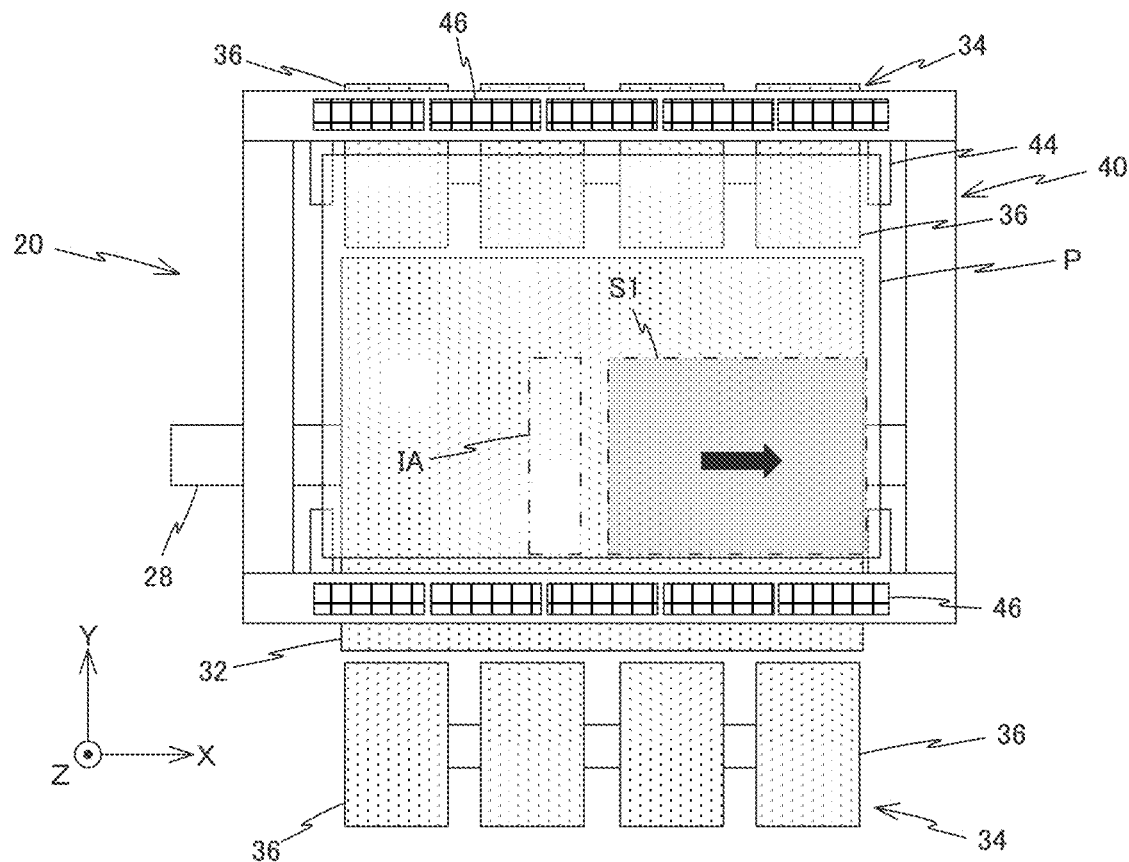
FIGS. 8*a* and 8*b* are views (a plan view and a front view, respectively) used to explain an operation (No. 2) of the substrate stage device at the time of exposure operations.
Figure 8B:
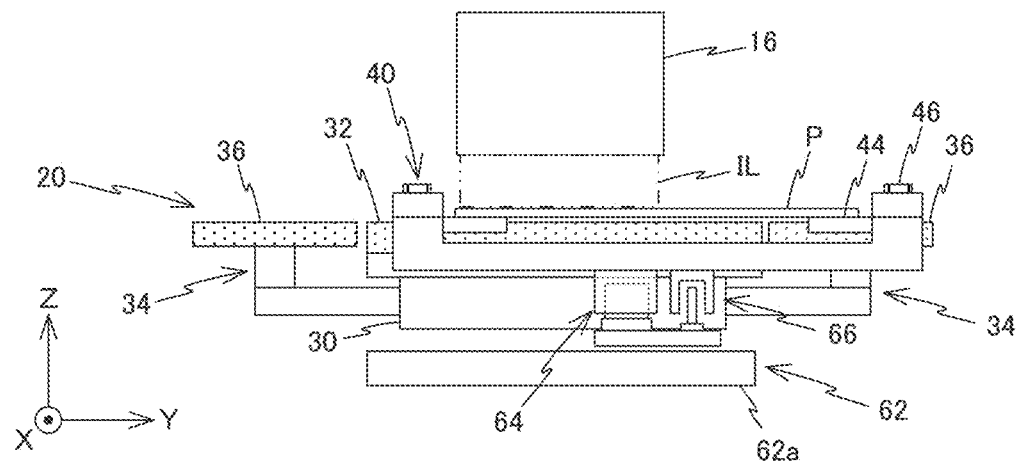

Subsequently, from the state as shown in FIGS. 7a and 7b, substrate carrier 40 and noncontact holder 32 are integrally (synchronously) driven (accelerated, driven at the constant speed, and decelerated) toward the +X direction on X guide bar 28 (see a black arrow in FIG. 8a), synchronously with mask M (see FIG. 1), on the basis of the output of horizontal-in-plane position measurement system 70 (see FIG. 6), as illustrated in FIGS. 8a and 8b. While substrate carrier 40 and noncontact holder 32 are driven at the constant speed in the X-axis direction, substrate P is irradiated with illumination light IL that has passed through mask M (see FIG. 1) and projection optical system 16 (see FIG. 8b for each of illumination light IL and projection optical system 16), and thereby a mask pattern that mask M has is transferred onto the first shot area S1. At this time, substrate carrier 40 is finely driven as needed relative to noncontact holder 32 in the directions of three degrees of freedom within the horizontal plane, in accordance with the result of the alignment measurement, and noncontact holder 32 is finely driven as needed in the Z-tilt directions in accordance with the result of the focus mapping described above.

Here, in horizontal-in-plane position measurement system 70 (see FIG. 6), when substrate carrier 40 and noncontact holder 32 are driven in the X-axis direction (toward the +X direction in FIG. 8a), Y sliders 76 that the pair of head units 72 respectively have (see FIG. 4 for each of them) are in a static state (however, head units 72 do not have to be strictly in a static state, and at least a part of the heads that head units 72 have only have to face scale plate 46 in the Y-axis direction).

Figure 9A:
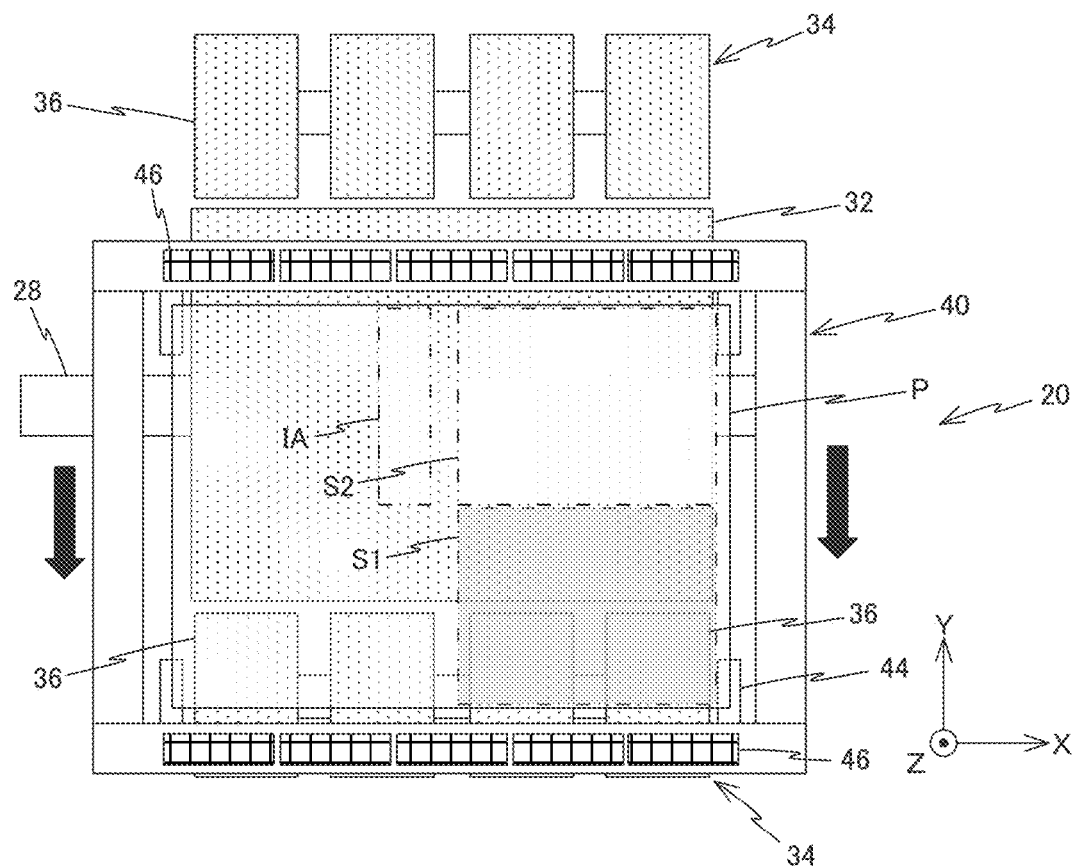
FIGS. 9*a* and 9*b* are views (a plan view and a front view, respectively) used to explain an operation (No. 3) of the substrate stage device at the time of exposure operations.
Figure 9B:
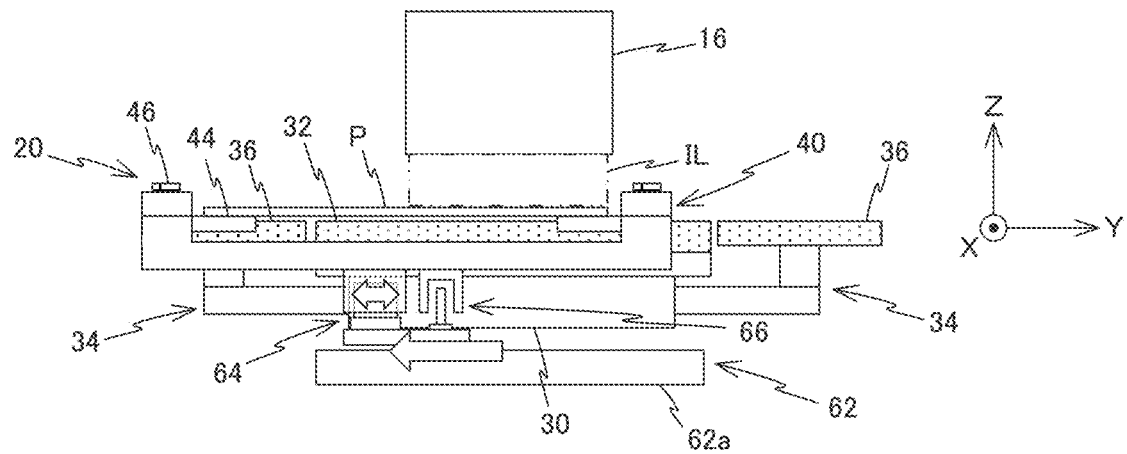

When the transfer of the mask pattern onto the first shot area S1 on substrate P has been completed, in substrate stage device 20, as illustrated in FIGS. 9a and 9b, for the exposure operation with respect to a second shot area S2 set on the +Y side of the first shot area S1, substrate carrier 40 is driven (Y-step driven) relative to noncontact holder 32 by a predetermined distance toward the −Y direction (a distance that is substantially a half of the width direction size of substrate P) (see black arrows in FIG. 9a), on the basis of the output of horizontal-in-plane position measurement system (see FIG. 6). By the foregoing Y-step operation of substrate carrier 40, the −Y side end vicinity part of substrate P held by substrate carrier 40 is supported from below by auxiliary table 34 disposed on the −Y side of noncontact holder 32.

Further, in horizontal-in-plane position measurement system 70 (see FIG. 6), when substrate carrier 40 described above is driven in the Y-axis direction, Y slider 76 that each of the pair of head units 72 has (see FIG. 4 for each of them) is driven in the Y-axis direction synchronously with substrate carrier 40 (however, their velocities need not strictly be coincide with each other).

Then, although not illustrated, substrate carrier 40 and noncontact holder 32 are driven toward the −X direction, synchronously with mask M (see FIG. 1), and thereby the scanning exposure with respect to the second shot area S2 is performed. Further, the Y-step operation of substrate carrier 40 and the constant speed movement of substrate carrier and noncontact holder 32 in the X-axis direction in synchronization with mask M are repeated as needed, and thereby the scanning exposure operations with respect to all the shot areas set on substrate P are sequentially performed.

According to substrate stage device 20 described so far that liquid crystal exposure apparatus 10 related to the present first embodiment has, when the high accuracy positioning of substrate P within the XY plane is performed, substrate carrier 40 with a frame-like shape that holds only the outer periphery edges of substrate P is driven in the directions of three degrees of freedom within the horizontal plane. Therefore, a driving target object (substrate carrier 40 in the present embodiment) is lightweight, compared with, for example, the case of performing the high accuracy positioning of substrate P by driving a substrate holder that adsorbs and holds the entire lower surface of substrate P in the directions of three degrees of freedom within the horizontal plane, and thus the position controllability is improved. Further, the actuators for driving (Y voice coil motors 64 and X voice coil motors 66 in the present embodiment) can be downsized.

Further, since horizontal-in-plane position measurement system 70 for obtaining position information of substrate P within the XY plane includes the encoder systems, the influence by air fluctuation can be reduced, compared with, for example, conventional interferometer systems. Consequently, the positioning accuracy of substrate P is improved. In addition, since the influence by air fluctuation is small, a partial air-conditioning facility that is essential in the case of using the conventional interferometer systems can be omitted, which allows the cost to be reduced.

Figure 10A:
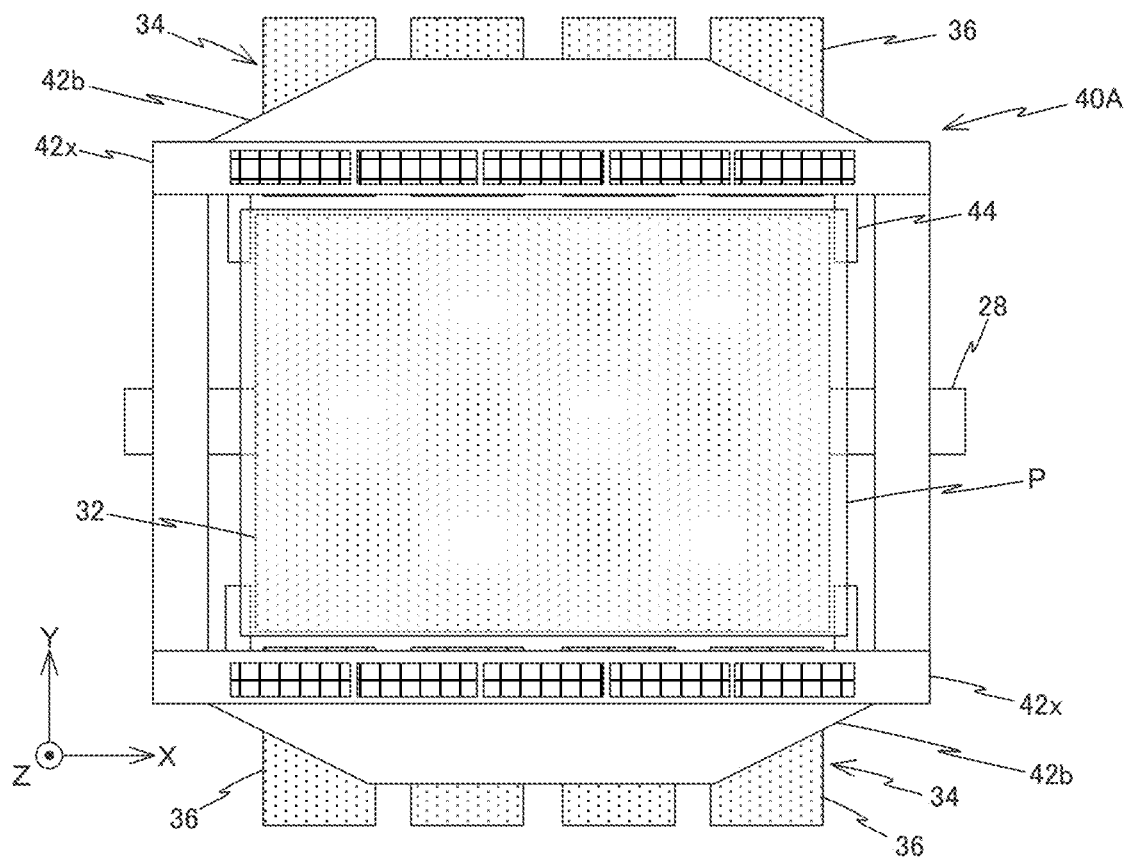
FIGS. 10*a* and 10*b* are views (a plan view and a front view, respectively) showing a substrate carrier related to a first modified example of the first embodiment.
Figure 10B:
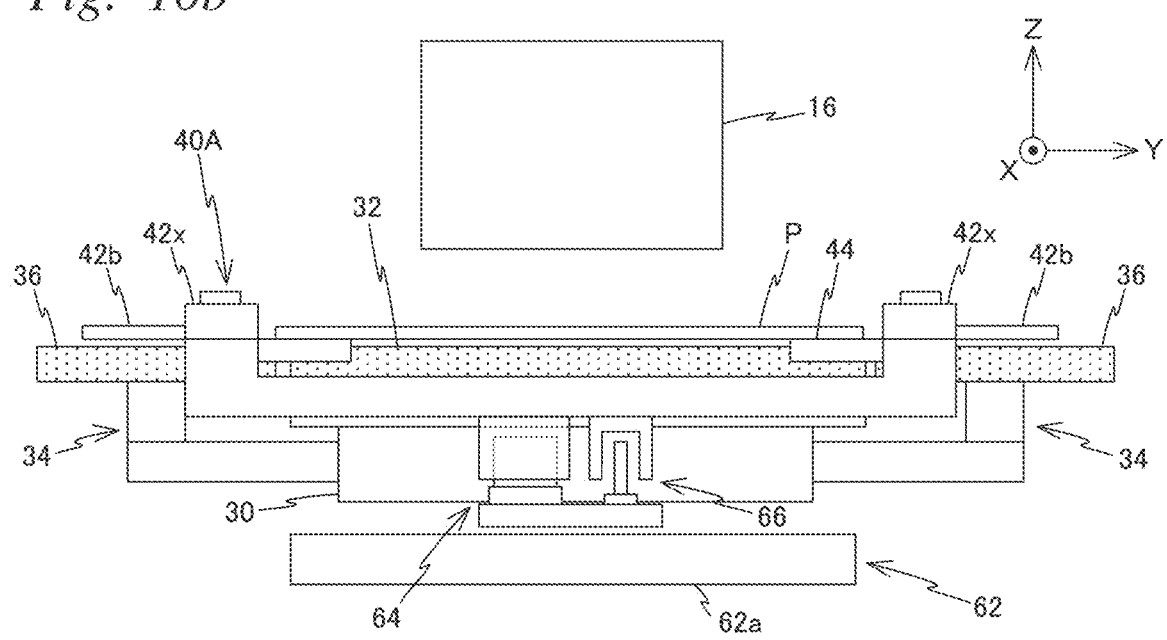

Note that the configuration described in the present first embodiment is an example, and can be modified as needed. For example, in a substrate carrier 40A related to a first modified example as shown in FIGS. 10a and 10b, a plate member 42b that is auxiliary is connected to the outer side surface of each of the pair of X frames 42x. Plate members 42b are disposed substantially parallel to the XY plane and the lower surfaces of plate members 42b face the upper surfaces of air levitation units 36 via a predetermined spacing, as illustrated in FIG. 10b. The plurality of air levitation units 36 jet the gas to the lower surfaces of plate members 42b, thereby causing a force (a lift force) toward the +Z direction (upwardly in the gravity direction) to act on substrate carrier 40A. Since, in substrate carrier 40A related to the present first modified example, plate members 42b are constantly supported from below by the plurality of air levitation units 36, it is possible to prevent X frames 42x and noncontact holder 32 (or air levitation units 36) from coming into contact with each other when substrate carrier 40A is relatively moved with respect to noncontact holder 32 in the Y-axis direction, even if the difference in level (the difference in the height position in the Z-axis direction) is formed between noncontact holder 32 and the plurality of air levitation units 36.

Figure 11:
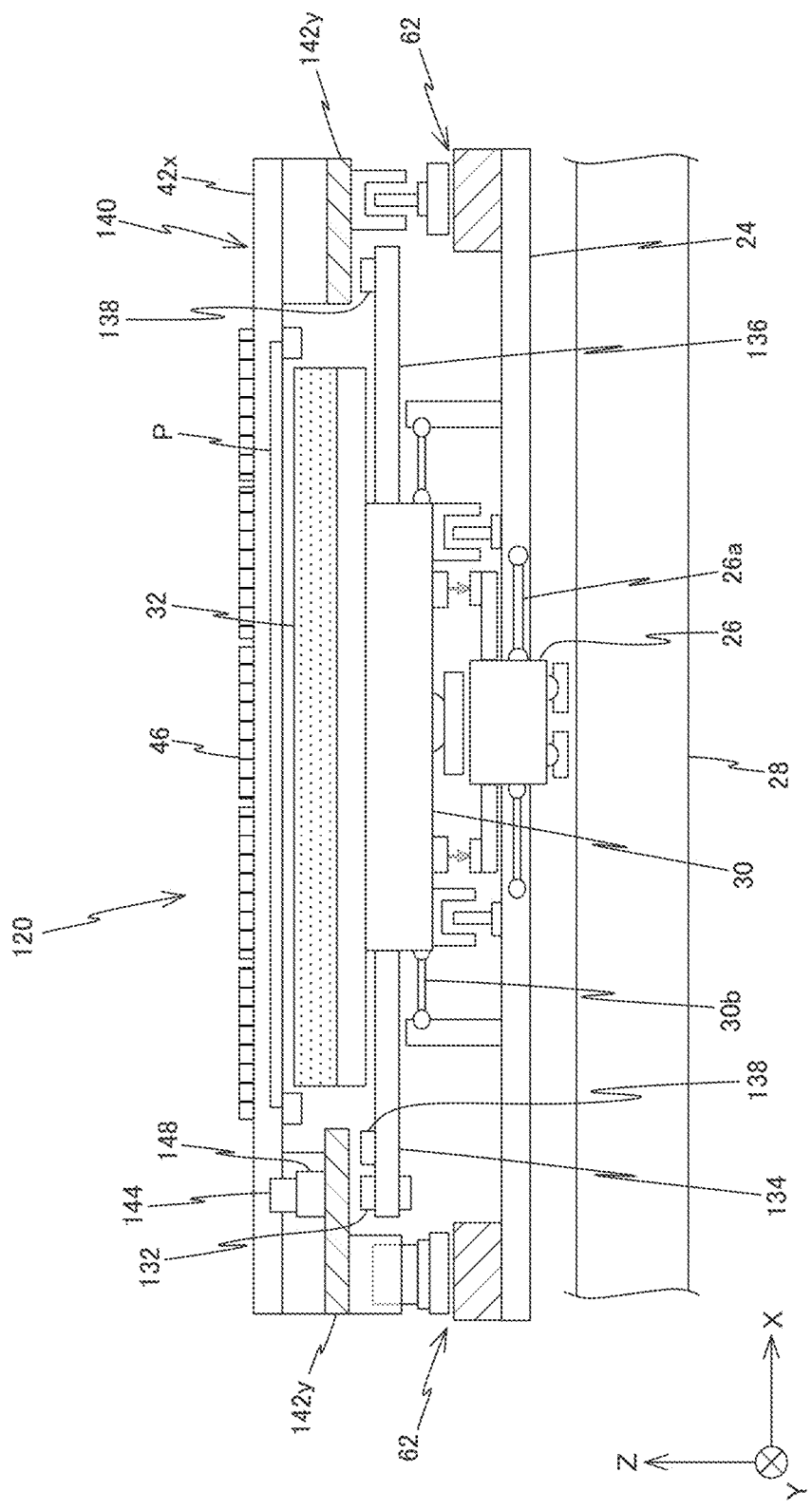
FIG. 11 is a view showing a substrate stage device related to a second modified example of the first embodiment.
Figure 12A:
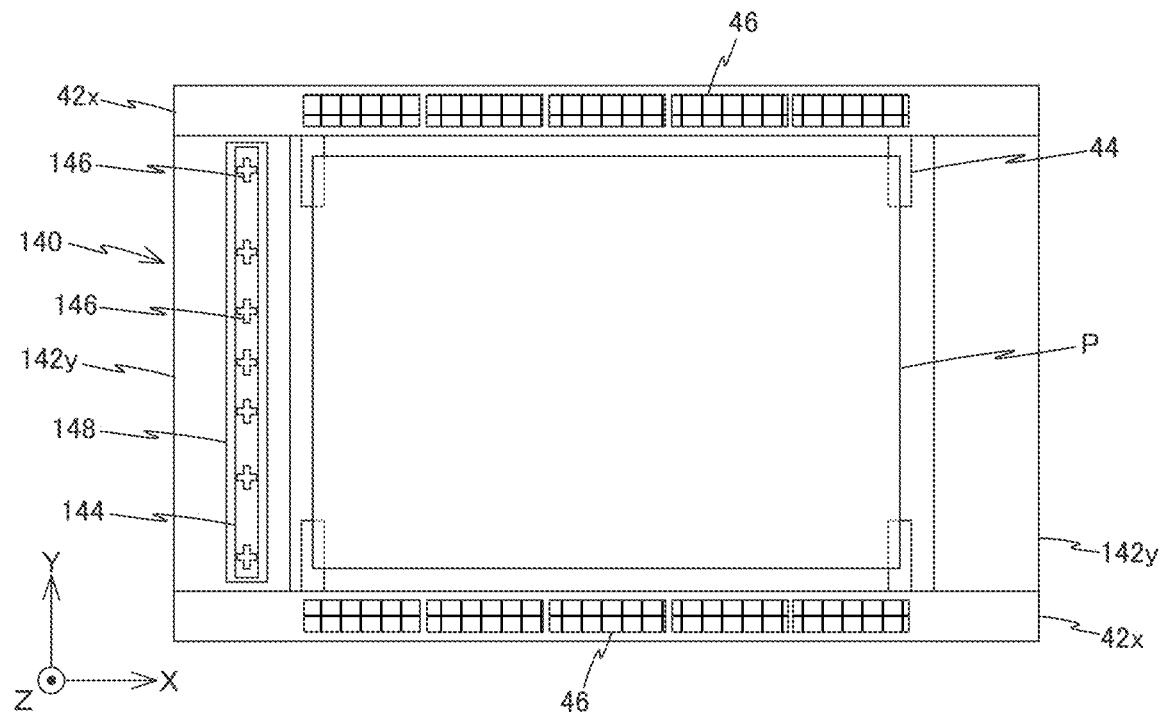
FIG. 12*a* is a plan view of a substrate carrier related to the second modified example.
Figure 12B:
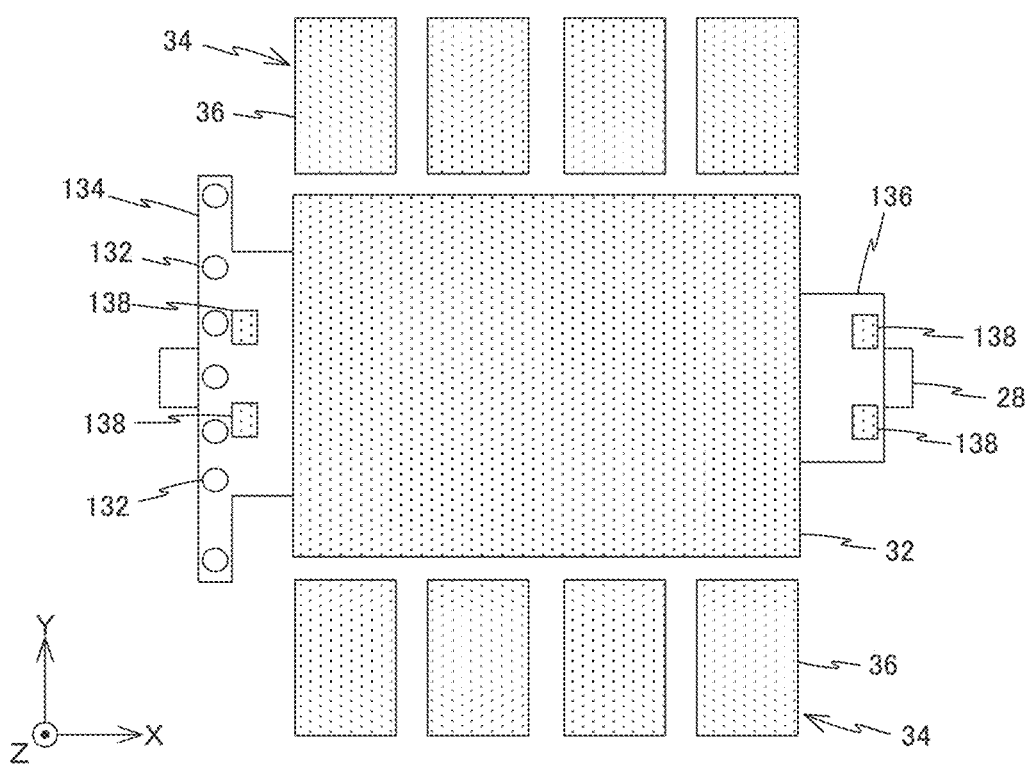
FIG. 12*b* is a plan view of a substrate table related to the second modified example.

Further, for example, like a substrate stage device 120 related to a second modified example as shown in FIG. 11, a reference index plate 144 may be attached to a substrate carrier 140 and mark measurement sensors 132 may be attached to substrate table 30. As illustrated in FIG. 12a, a plurality of reference marks 146 are formed at reference index plate 144, spaced apart from each other in the Y-axis direction. Reference index plate 144 is fixed, via a raising member 148, to the upper surface of a Y frame 142y on the −X side of substrate carrier 140 so that the Z-positions of the plurality of reference marks 146 are substantially the same as the Z-position of the surface of substrate P (see FIG. 11). Referring back to FIG. 11, the plurality of mark measurement sensors 132 are attached to a tabular member 134 with a T-like shape in planar view (see FIG. 12b) that is formed protruding from the side surface on the −X side of substrate table 30. As illustrated in FIG. 12b, the plurality of mark measurement sensors 132 are disposed, spaced apart from each other in the Y-axis direction, correspondingly to the plurality of reference marks 146 described above (i.e., so that the plurality of mark measurement sensors 132 overlap with the plurality of reference marks 146 in a vertical direction).

In the present second modified example, calibration related to, for example, the optical properties (such as, for example, scaling, shift and rotation) of projection optical system 16 (see FIG. 1) is performed using the plurality of reference marks 146 and the plurality of mark measurement sensors 132 corresponding thereto. The calibration method is substantially the same as a calibration method disclosed in, for example, Japanese Patent Application Publication No. 2006-330534, and therefore the description thereof will be omitted. In the present second modified example, since substrate table 30, which is mechanically separated from substrate carrier 140 having reference marks 146, has mark measurement sensors 132, the wiring and the like are not necessary for substrate carrier 140 itself, which allows the weight of substrate carrier 140 to be reduced.

Further, Y frame 142y of substrate carrier 140 related to the present second modified example is formed wider, compared to that of the first embodiment described above. Then, as illustrated in FIG. 12b, on each of the upper surface of tabular member 134 described above and the upper surface of a tabular member 136 formed protruding from the side surface on the +X side of substrate table 30, for example, two air bearings 138 that are spaced apart in the Y-axis direction are attached. As illustrated in FIG. 11, for example, the two air bearings 138 on the +X side face the lower surface of Y frame 142y on the +X side of substrate carrier 140, and for example, the two air bearings 138 on the −X side face the lower surface of Y frame 142y on the −X side of substrate carrier 140. Air bearings 138 jet the pressurized gas to the lower surfaces of the facing Y frames 142y, thereby supporting substrate carrier 140 in a noncontact manner via a predetermined gap. Accordingly, the bending of substrate carrier 140 is suppressed. Note that air bearings 138 may be attached to the substrate carrier 140 side so as to face the upper surfaces of tabular members 134 and 136 described above. Further, for example, substrate carrier 140 may be magnetically levitated using magnets, instead of air bearings 138, or a buoyancy force may be caused to act using actuators such as voice coil motors.

Figure 13A:
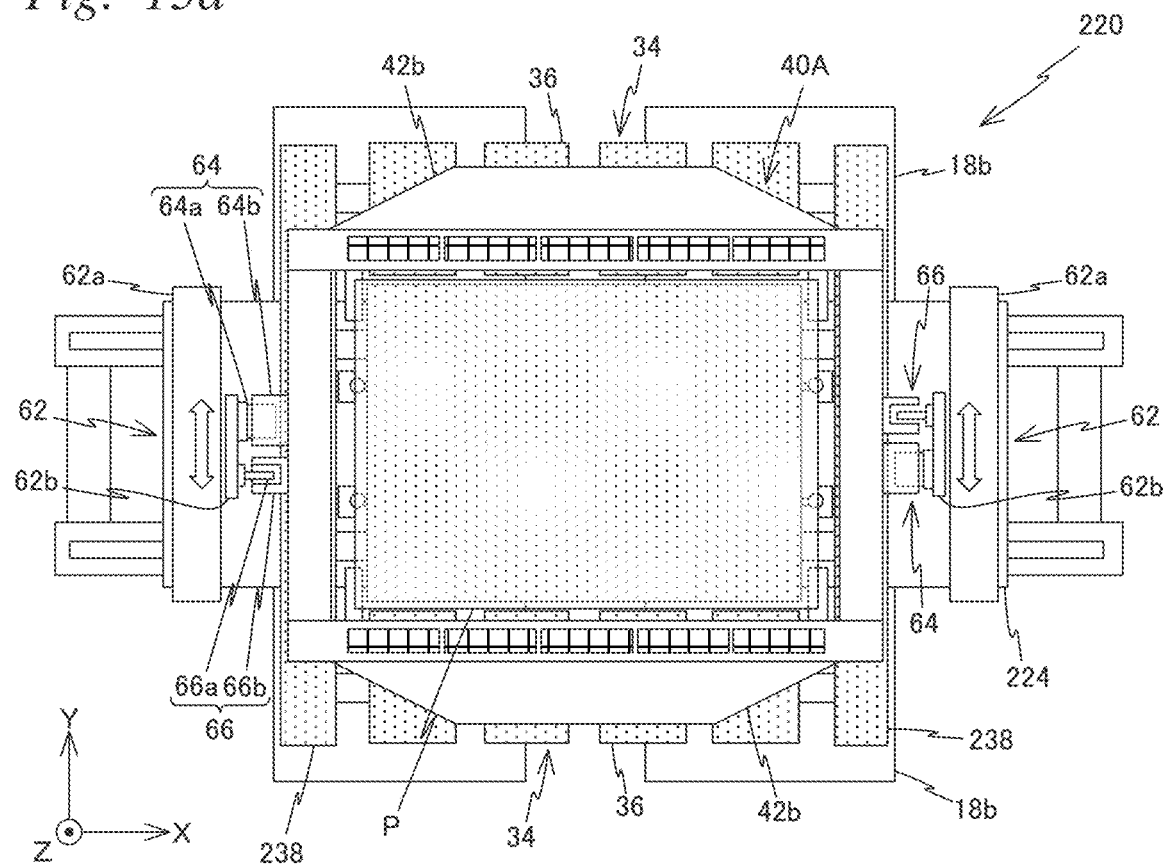
FIGS. 13*a* and 13*b* are views (a plan view and a cross-sectional view, respectively) showing a substrate stage device related to a third modified example of the first embodiment.
Figure 13B:
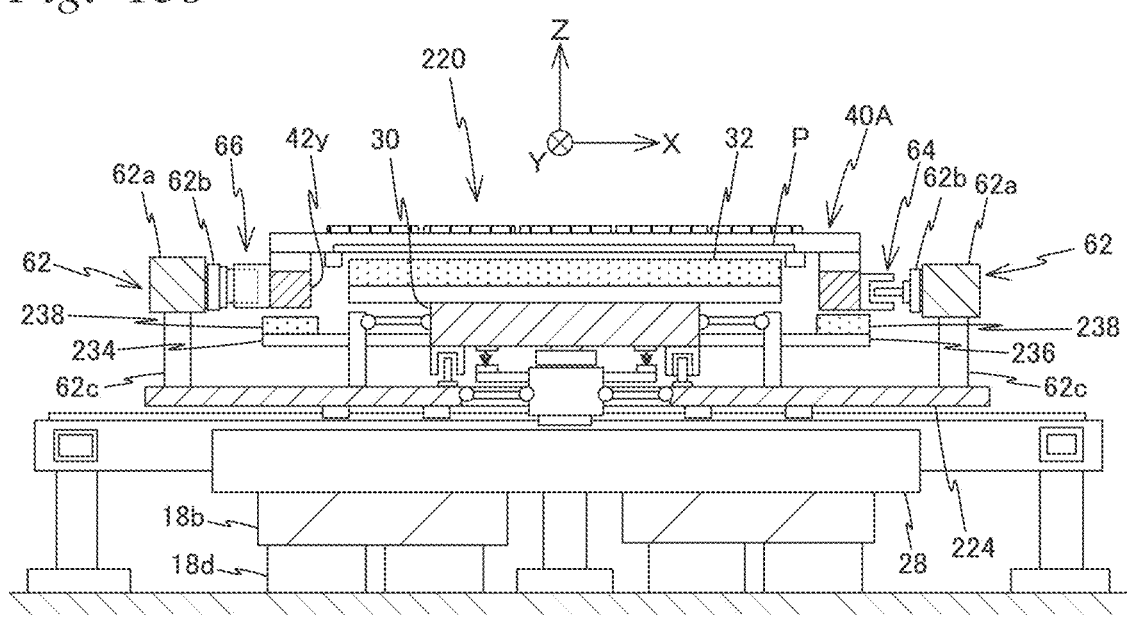

Further, like a substrate stage device 220 related to a third modified example as shown in FIGS. 13a and 13b, the Z-positions of Y linear actuators 62, Y voice coil motors 64 and X voice coil motors 66 may be set to be the same as the Z-position of substrate carrier 40A. That is, in substrate stage device 220, Y movers 64b of Y voice coil motors 64 and X movers 66b of X voice coil motors 66 are fixed to the side surfaces of Y frames 42y of substrate carrier 40A. Further, Y stators 62a of Y linear actuators 62 for driving in the Y-axis direction Y movers 62b, to which Y stators 64a of Y voice coil motors 64 and X stators 66a of X voice coil motors 66 are attached, are attached on a coarse movement stage 224 via support columns 62c, so that the Z-positions of Y stators 62a are the same as the Z-position of substrate carrier 40A.

Further, substrate carrier 40A of the present third modified example has a pair of auxiliary plate members 42b that are supported from below by the plurality of air levitation units 36, which is similar to the first modified example described above (see FIGS. 10a and 10b). Further, As illustrated in FIG. 13b, tabular members 234 and 236 protrude from the side surface on the −X side and the side surface on the +X side, respectively, of substrate table 30, and air levitation units 238 each extending in the Y-axis direction are fixed on tabular members 234 and 236, which is similar to the second modified example described above (see FIGS. 11 to 12b). The height positions of the upper surfaces of air levitation units 238 are set lower, compared to the height positions of air levitation units 36. In substrate carrier 40A, Y frames 42y are constantly (irrespective of the position in the Y-axis direction) supported in a noncontact manner from below by air levitation units 238. In other words, substrate carrier 40A is placed on a pair of air levitation units 238. Accordingly, the bending of substrate carrier 40A is suppressed.

Second Embodiment

Next, a liquid crystal exposure apparatus related to a second embodiment will be described using FIGS. 14 to 20b. Since the configuration of the liquid crystal exposure apparatus related to the second embodiment is the same as that in the first embodiment described above, except that the configuration of a substrate stage device 420 is different. Therefore, only the differences will be described below, and elements that have the same configurations and functions as those in the first embodiment described above will be provided with the same reference signs as those in the first embodiment described above, and the description thereof will be omitted.

In substrate stage device 20 (see the drawings such as FIG. 1) of the first embodiment described above, substrate carrier 40 that holds substrate P is configured to be moved with a long stroke integrally with noncontact holder 32 in the scan direction and to be moved with a long stroke separately from noncontact holder 32 in the non-scan direction, whereas in substrate stage device 420 in the present second embodiment, inversely to the first embodiment described above, a substrate carrier 440 that holds substrate P is moved with a long stroke integrally with noncontact holder 32 in the non-scan direction and is moved with a long stroke separately from noncontact holder 32 in the scan direction, which is different from the first embodiment described above. That is, substrate stage device 420 related to the present second embodiment is configured, as a whole, like substrate stage device 20 related to the first embodiment described above being rotated around the Z-axis, for example, at a 90 degree angle. Note that the longitudinal direction of substrate P is substantially parallel to the X-axis, which is similar to the first embodiment described above.

Figure 14:
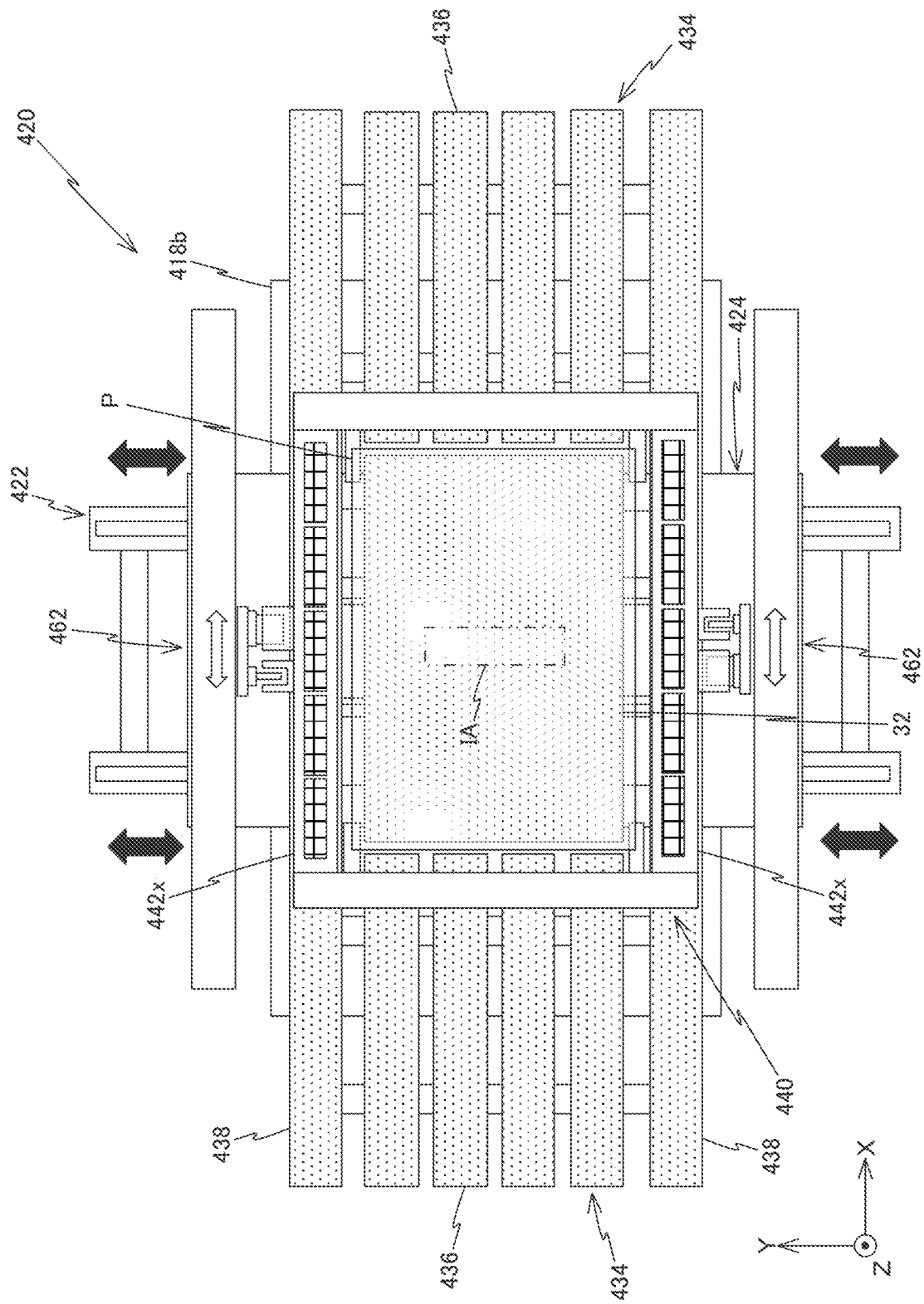
FIG. 14 is a view showing a substrate stage device related to a second embodiment.

The details of substrate stage device 420 will be described below. As illustrated in FIG. 14, substrate stage device 420 is equipped with: a base frame 422; a coarse movement stage 424; weight cancelling device 26 (not illustrated in FIG. 14; see the drawings such as FIG. 15a); a Y guide bar 428 (not illustrated in FIG. 14; see the drawings such as FIG. 15a); substrate table 30 (not illustrated in FIG. 14; see the drawings such as FIG. 17a); noncontact holder 32; a pair of auxiliary tables 434; substrate carrier 440; and the like. Since base frame 422, coarse movement stage 424, Y guide bar 428, the pair of auxiliary tables 434 and substrate carrier 440 referred to above are members that function similarly to base frame 22, coarse movement stage 24, X guide bar 28, the pair of auxiliary tables 34 and substrate carrier 40 (see FIGS. 1 and 2), those members will be briefly described below. Note that weight cancelling device 26, substrate table 30 and noncontact holder 32 are substantially the same as those in the first embodiment described above, respectively.

Figure 15A:
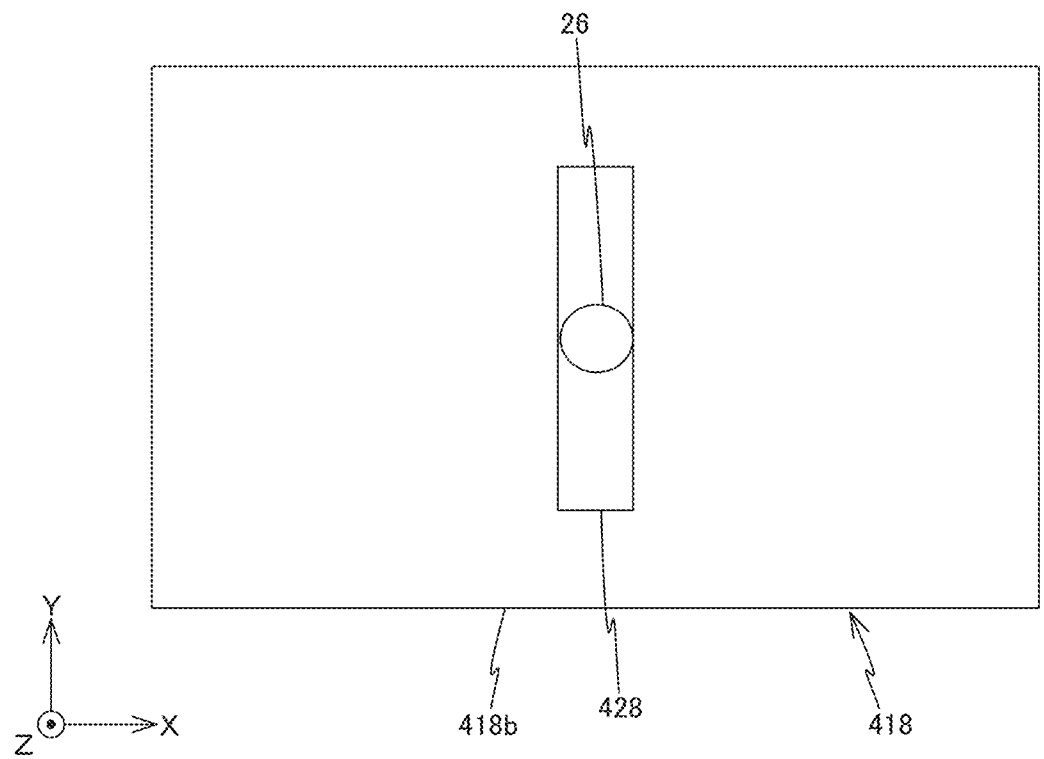
FIGS. 15*a* and 15*b* are views (a plan view and aside view, respectively) showing a Y guide bar, a weight-cancelling device and the like that the substrate stage device shown in FIG. 14 has.
Figure 15B:
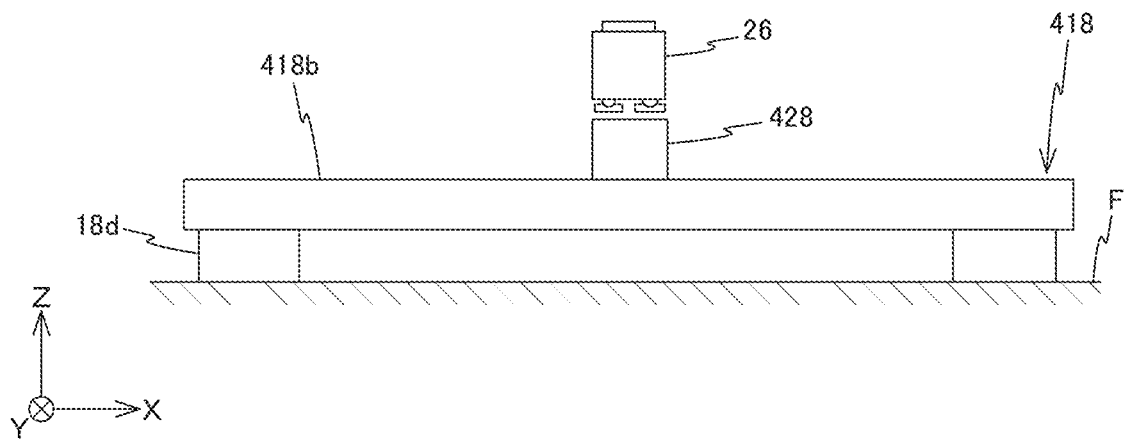
Figure 16A:
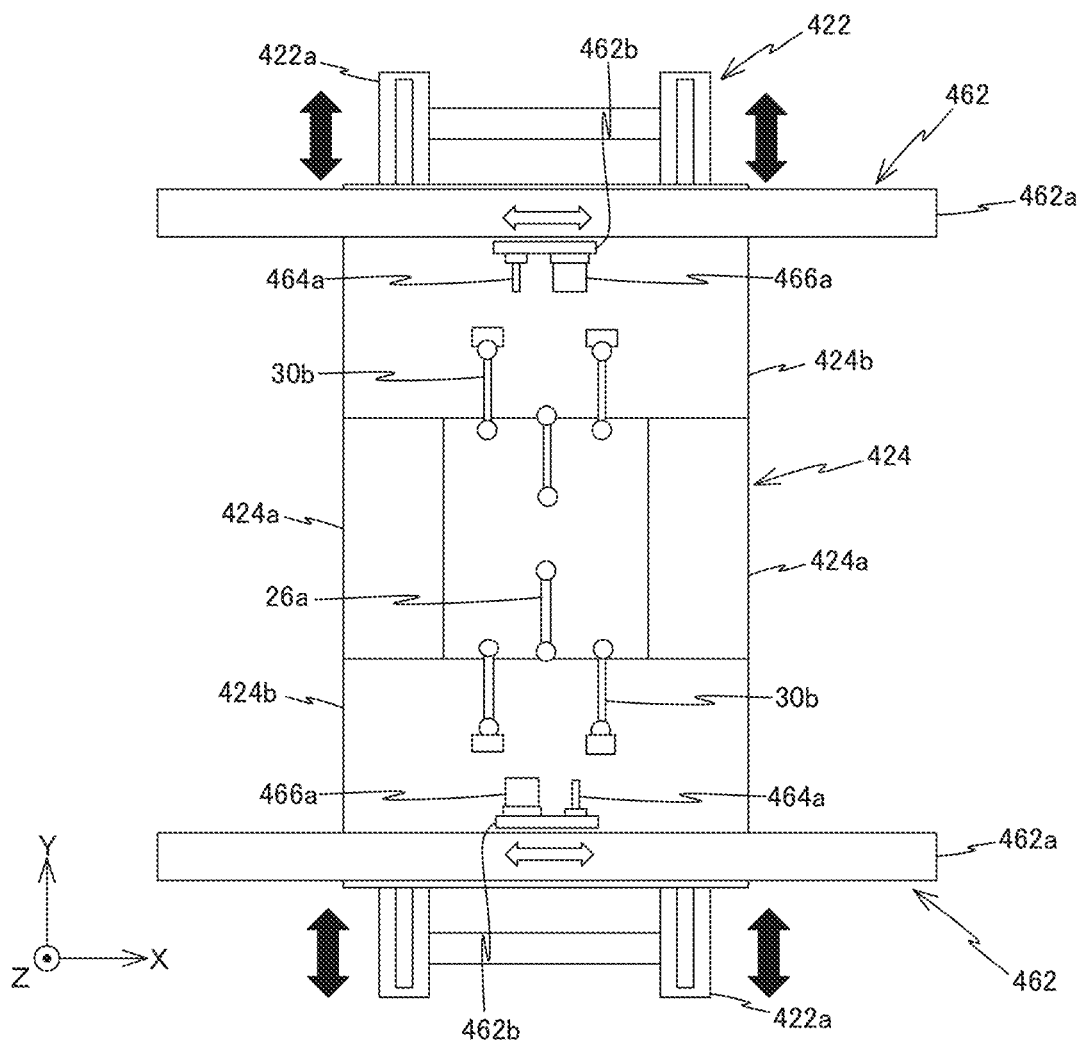
FIGS. 16*a* and 16*b* are views (a plan view and aside view, respectively) showing a base frame, a coarse movement stage and the like that the substrate stage device shown in FIG. 14 has.
Figure 16B:
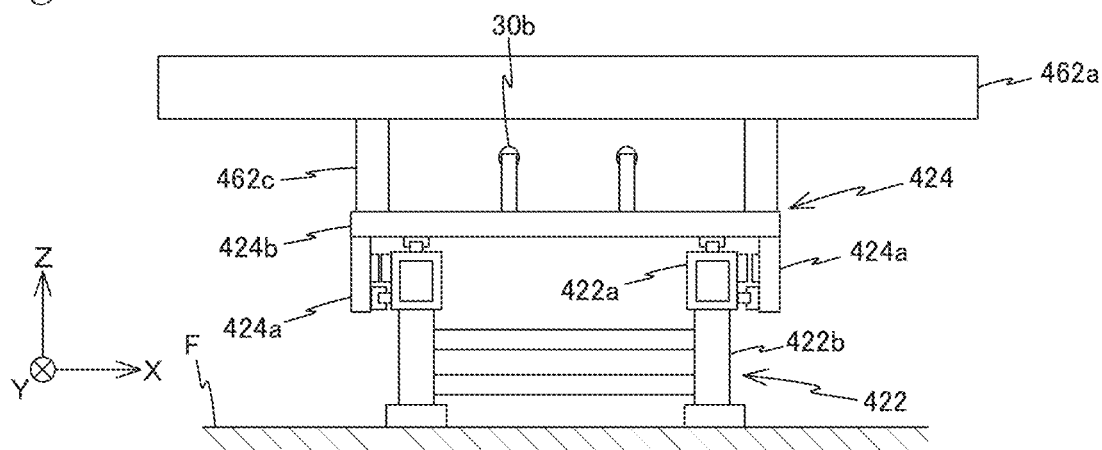

As illustrated in FIGS. 15a and 15b, in the present second embodiment, a lower mount section 418b that is a part of an apparatus main body 418 installed on floor F via vibration isolating devices 18d is made up of one plate-like member, and Y guide bar 428 is fixed to the upper surface of lower mount section 418b. On Y guide bar 428, weight cancelling device 26 is placed. Further, as illustrated in FIGS. 16a and 16b, base frame 422 has a pair of Y beams 422a installed on floor F via leg sections 422b, and coarse movement stage 424 is placed movable with a predetermined long stroke in the Y-axis direction on base fame 422. In the present second embodiment, coarse movement stage 424 has a pair of Y tables 424b that connect the +Y-side end vicinities of a pair of Y carriages 424a and connect the −Y-side end vicinities of the pair of Y carriages 424a, respectively. One ends of connecting devices 26a for towing weight cancelling device 26 (see the drawings such as FIG. 15a) and one ends of connecting devices 30b for towing substrate table 30 (see the drawings such as FIG. 17b) are connected to Y tables 424b. Further, X stators 462a are fixed to the pair of Y tables 424b via support columns 462c. X stators 462a configure X linear actuators 462 together with X movers 462b. And, a Y stator 464a and an X stator 466a are attached to X mover 462b.

Figure 17A:
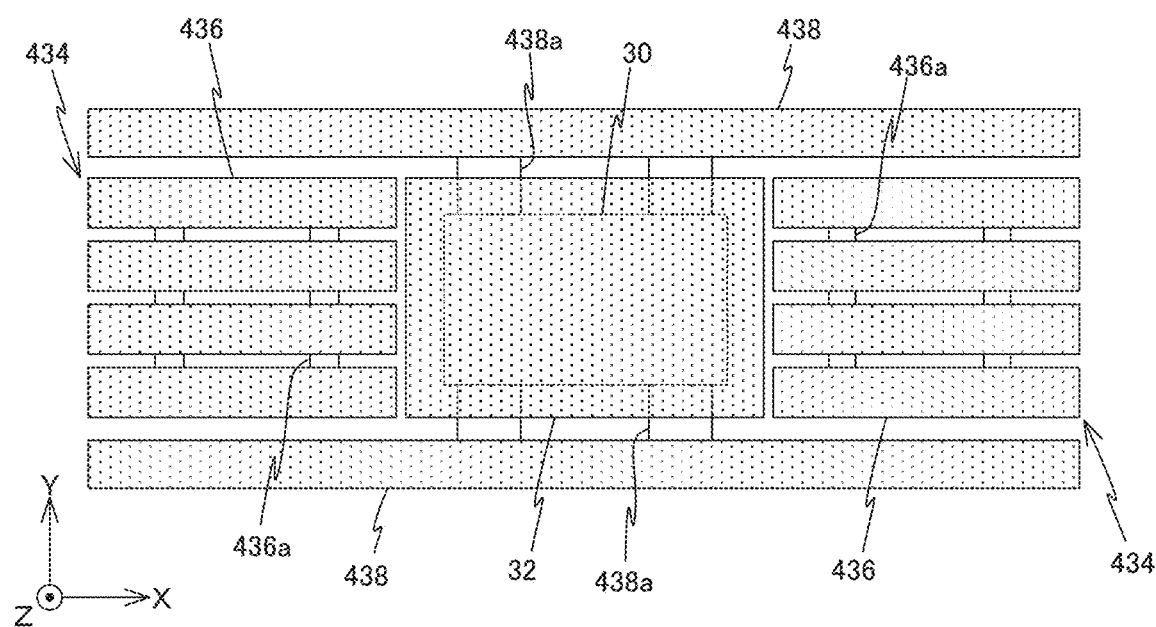
FIGS. 17*a* and 17*b* are views (a plan view and aside view, respectively) showing a noncontact holder, auxiliary tables and the like that the substrate stage device shown in FIG. 14 has.
Figure 17B:
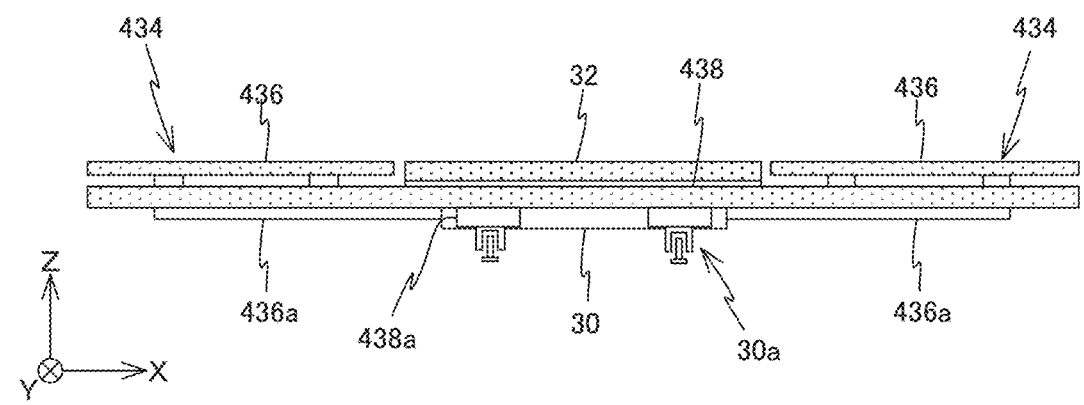

As illustrated in FIGS. 17a and 17b, substrate table 30 and noncontact holder 32 are each made up of a plate-like (or box-like) member having a rectangular shape in planar view with the X-axis direction serving as a longitudinal direction, which is similar to the first embodiment described above. Each of the pair of auxiliary tables 434 has a plurality of air levitation units 436 that are supported from below by arm-like support members 436a that protrude from the side surfaces of substrate table 30. Air levitation unit 436 is made up of a member extending in the X-axis direction, which is different from the first embodiment described above (see the drawings such as FIG. 3). Further, a pair of air levitation units 438 are connected to substrate table 30 via support members 438a. Air levitation unit 438 functions similarly to air levitation unit 238 of the third modified example described above (see FIGS. 13a and 13b), except that air levitation unit 438 extends in the X-axis direction. That is, the pair of air levitation units 438 support a pair of X frames 442x that substrate carrier 440 has, from below in a noncontact manner, as illustrated in FIG. 14.

Figure 18A:
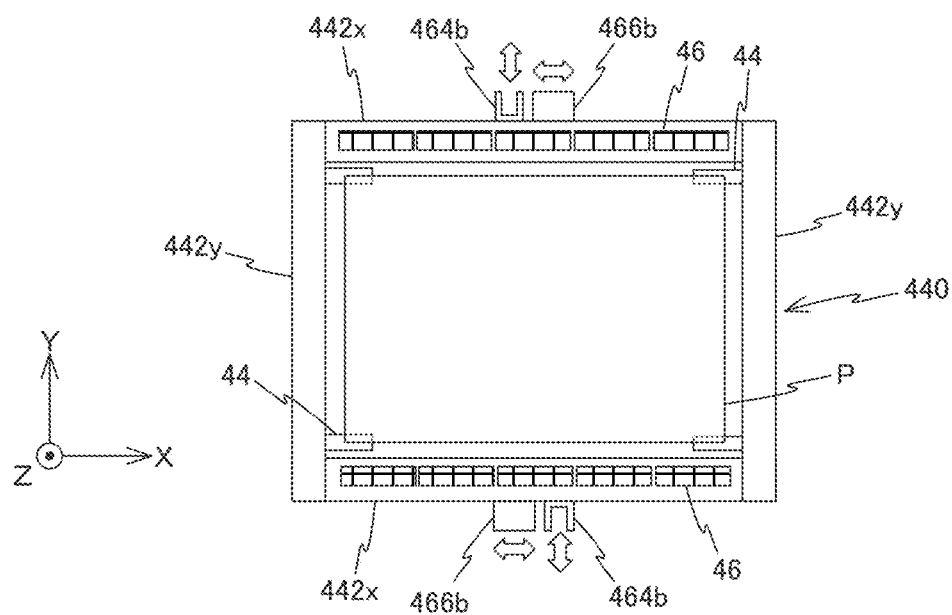
FIGS. 18*a* and 18*b* are views (a plan view and aside view, respectively) showing a substrate carrier and the like that the substrate stage device shown in FIG. 14 has.
Figure 18B:
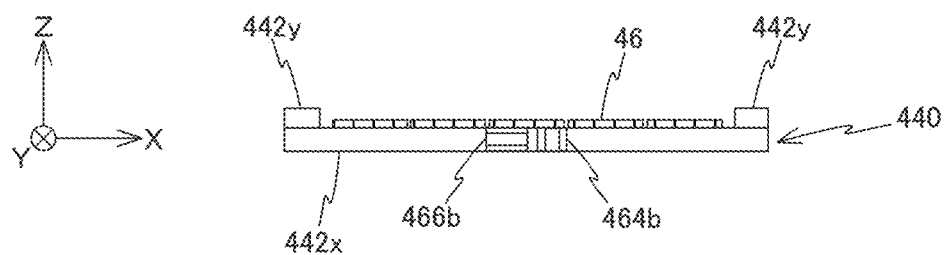

As illustrated in FIGS. 18a and 18b, substrate carrier 440 is made up of a rectangular frame-like (a picture-frame-like) member, which is similar to the first embodiment descried above (see the drawings such as FIG. 3), and has the pair of X frames 442x and a pair of Y frames 442y. Y frames 42y are attached to the lower surface sides of X frames 42x (see FIG. 3) in substrate carrier 40 of the first embodiment described above, whereas Y frames 442y are attached to the upper surface sides of X frames 442x in substrate carrier 440 of the present second embodiment. Accordingly, the contact between Y frames 442y and air levitation units 438 that auxiliary tables 434 have (see FIG. 14 for each of them) is avoided. Further, a plurality of adsorption pads 44 are attached to the lower surfaces of Y frames 442y. A plurality of scale plates 46 are attached to each of the pair of X frames 442x, which is the same as the first embodiment described above. Further, on the side surface of each of the pair of X frames 442x, attached are a Y mover 464b and an X mover 466b that configure a Y voice coil motor 464 and an X voice coil motor 466 (see FIG. 20a for each of them), respectively, together with Y stator 464a and X stator 466a described above (see FIG. 16a for each of them). Since a position measurement system of substrate carrier 440 is the same as that in the first embodiment described above, the description thereof will be omitted.

Figure 19A:
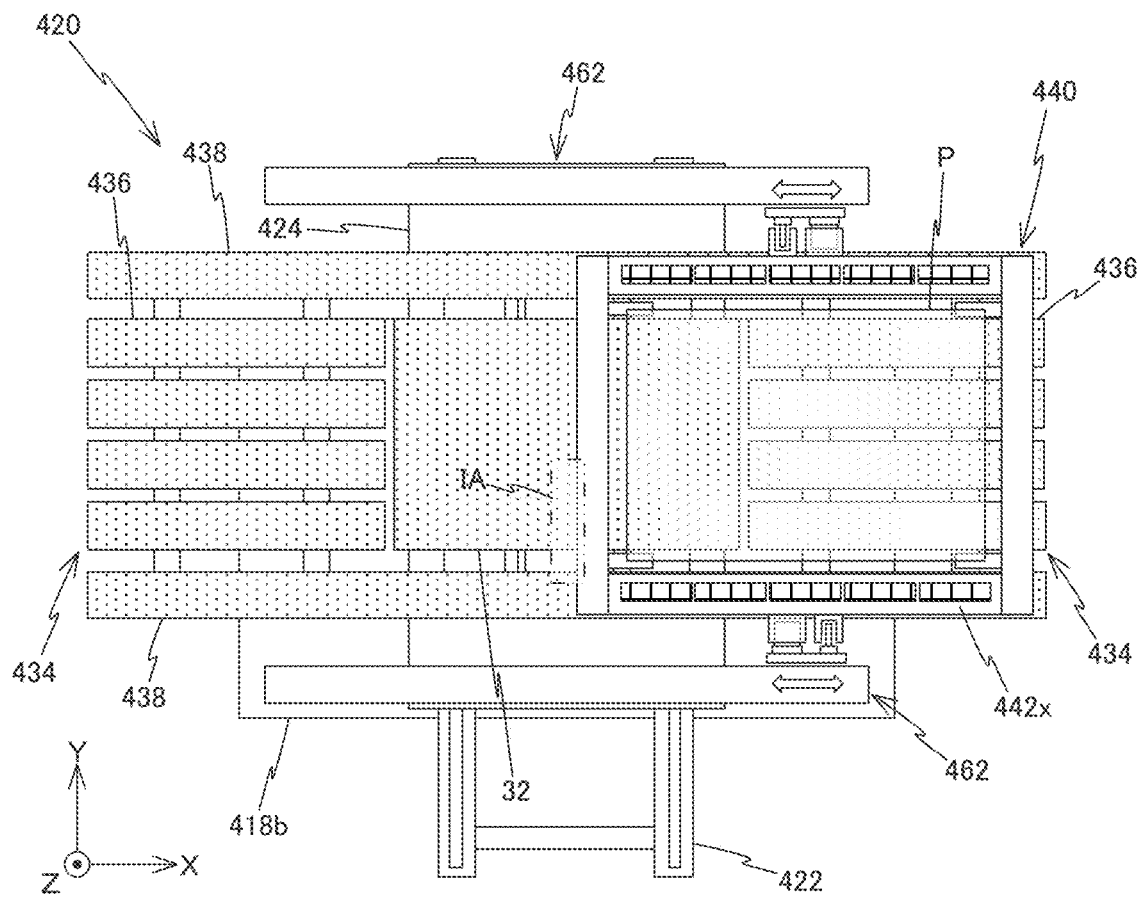
FIGS. 19*a* and 19*b* are views (a plan view and aside view, respectively) used to explain operations at the time of scan exposure of the substrate stage device related to the second embodiment.
Figure 19B:
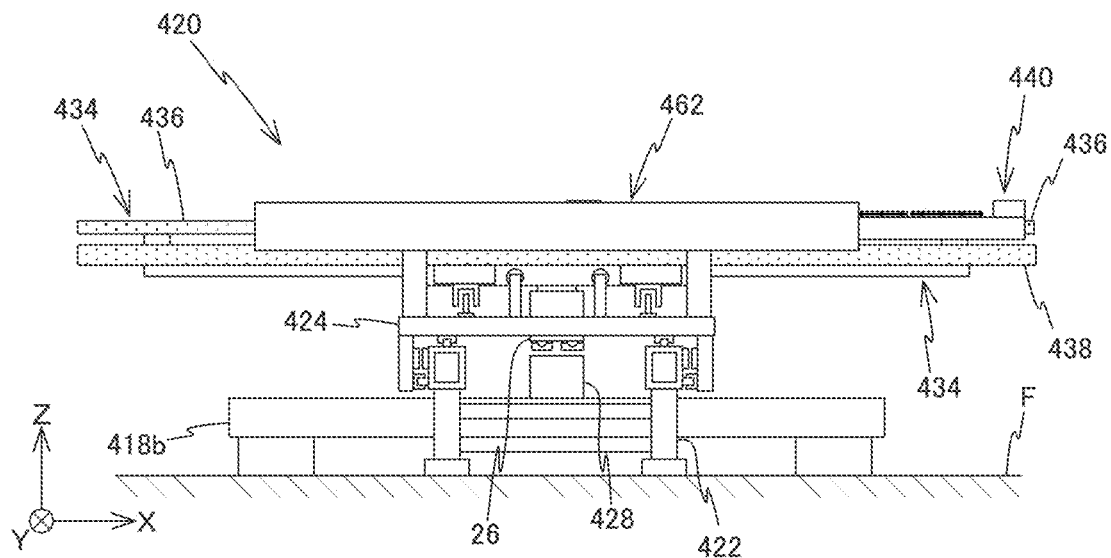

As illustrated in FIGS. 19a and 19b, main controller 50 performs the positioning of substrate P relative to exposure area IA in the X-axis direction by driving only substrate carrier 440 in the X-axis direction. An area, which is not supported by noncontact holder 32, of substrate P is supported by either one of the pair of auxiliary tables 434. In exposure operations in the present second embodiment, since only substrate carrier 440 is driven with a long stroke relative to exposure area IA in the X-axis direction, substrate P passes through a space above noncontact holder 32 (in a state where a predetermined gap is formed in between). Noncontact holder 32 performs the flatness correction of substrate P passing through the space above, in a noncontact manner.

Figure 20A:
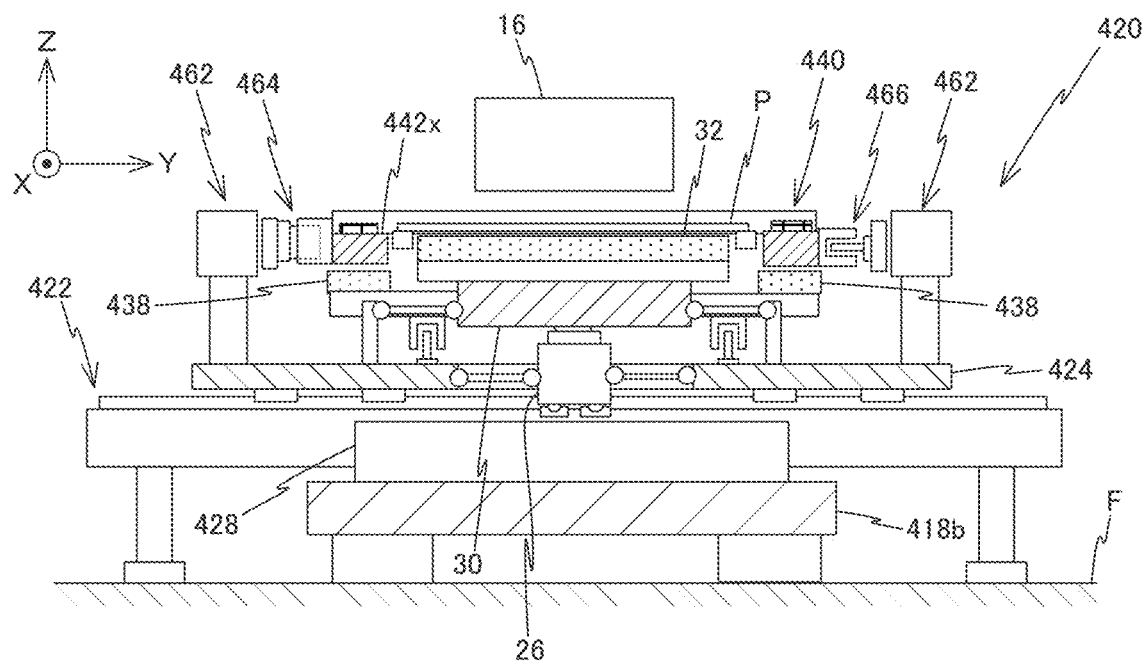
FIGS. 20*a* and 20*b* are views (No. 1 and No. 2) used to explain a Y-step operation of the substrate stage device related to the second embodiment.
Figure 20B:
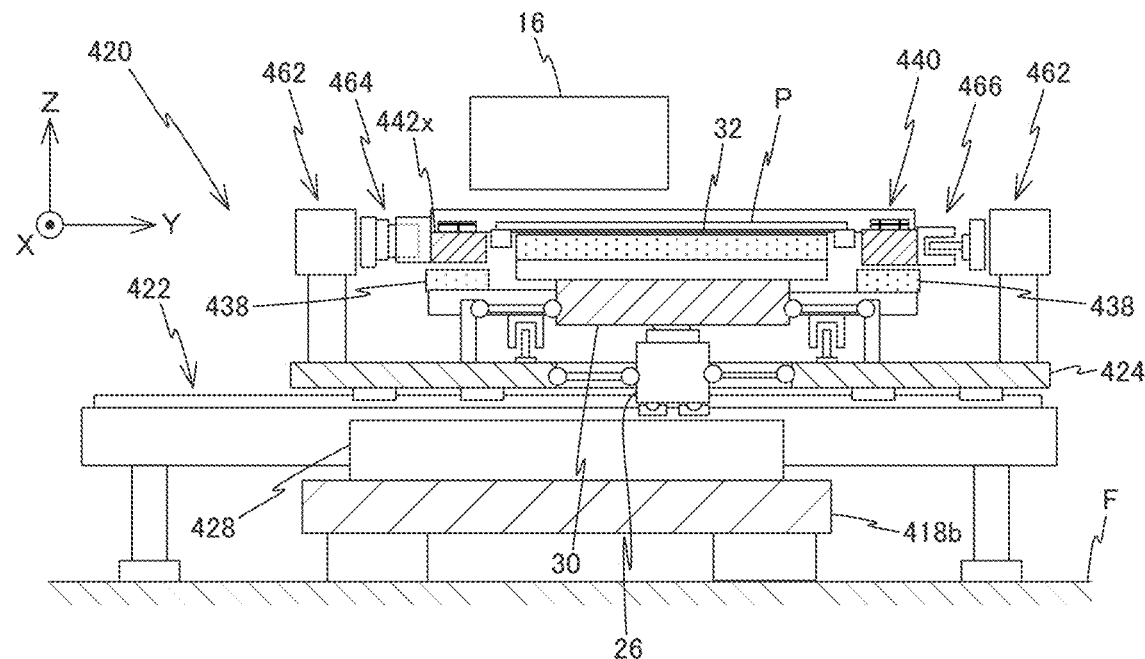
Figure 21:
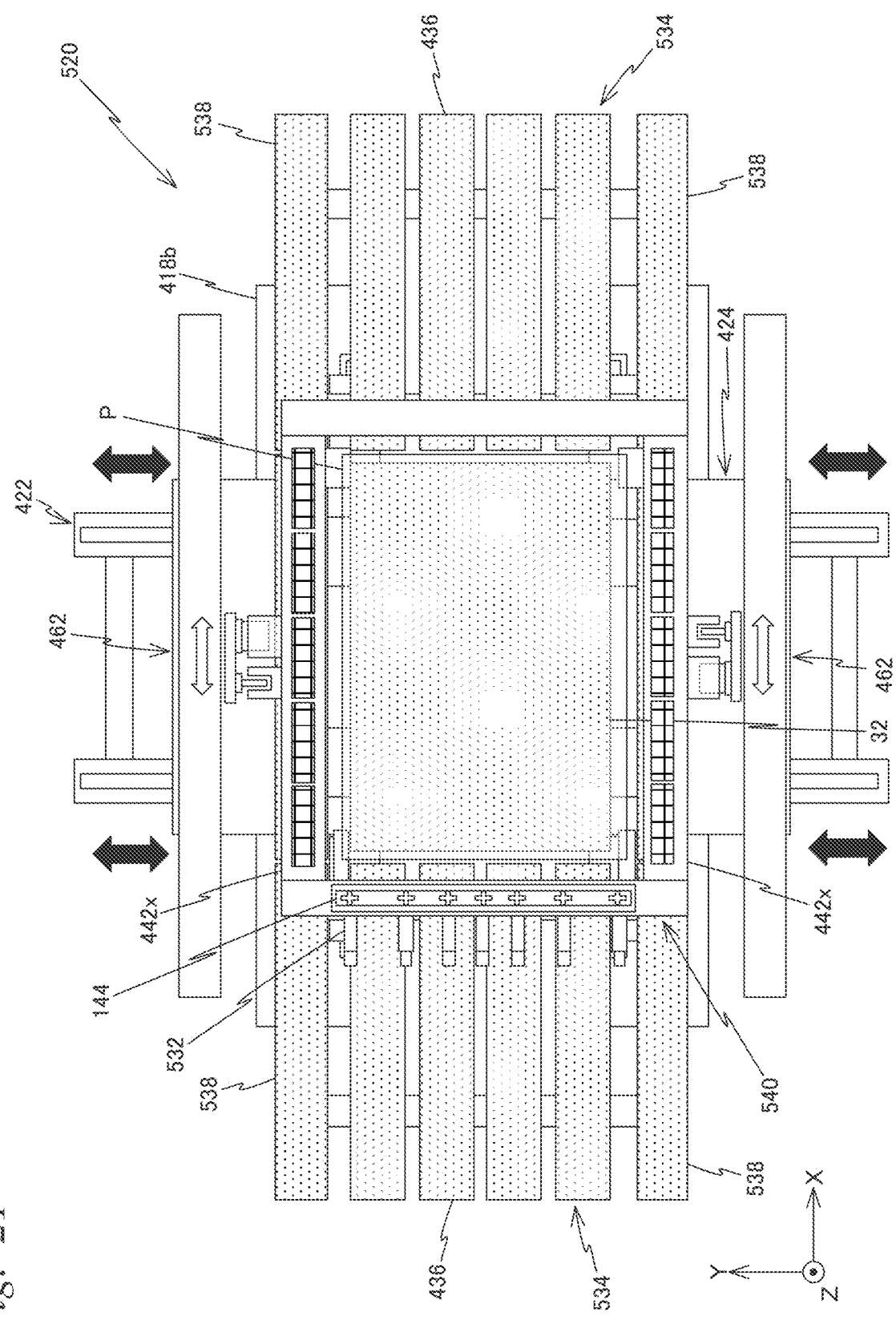
FIG. 21 is a view showing a substrate stage device related to a modified example (a fourth modified example) of the second embodiment.

Further, as illustrated in FIGS. 20a and 20b, main controller 50 performs the positioning of substrate P relative to projection optical system 16 (i.e. exposure area IA (see FIG. 19a)) in the Y-axis direction, by driving coarse movement stage 424 and noncontact holder 32 with a predetermined long stroke in the Y-axis direction and also moving substrate carrier 440 integrally with coarse movement stage 424 in the Y-axis direction.

According to the second embodiment described so far, since only substrate carrier 440 is driven in the scanning direction at the time of scanning exposure, the vibration can be suppressed from being generated, compared to the first embodiment described above (see the drawings such as FIG. 8a) in which noncontact holder 32 and the pair of auxiliary tables 34 also need to be driven in the scan direction, and therefore the high accuracy exposure operations can be performed. Since weight cancelling device 26 is moved only at the time of the Y-step operation, the size of Y guide bar 428 in the longitudinal direction is shorter, compared to that of X guide bar 28 in the first embodiment described above. Further, since weight cancelling device 26 is in a static state at the time of exposure operations, the flatness degree of the guide surface of Y guide bar 428 serving as a surface plate for weight cancelling device 26 may be rough, compared to the first embodiment described above.

Note that the configuration described in the present second embodiment is an example, and can be modified as needed. For example, as in a substrate stage device 520 related to a modified example of the second embodiment (a fourth modified example) as shown in FIGS. 21 to 26b, a pair of auxiliary tables 534 may be physically separated from substrate table 30 (see FIG. 24a). With regard to the fourth modified example, only the differences from the second embodiment described above will be described below, and common elements will be provided with the same reference signs as those in the second embodiment described above, and the description thereof will be omitted.

Figure 22A:
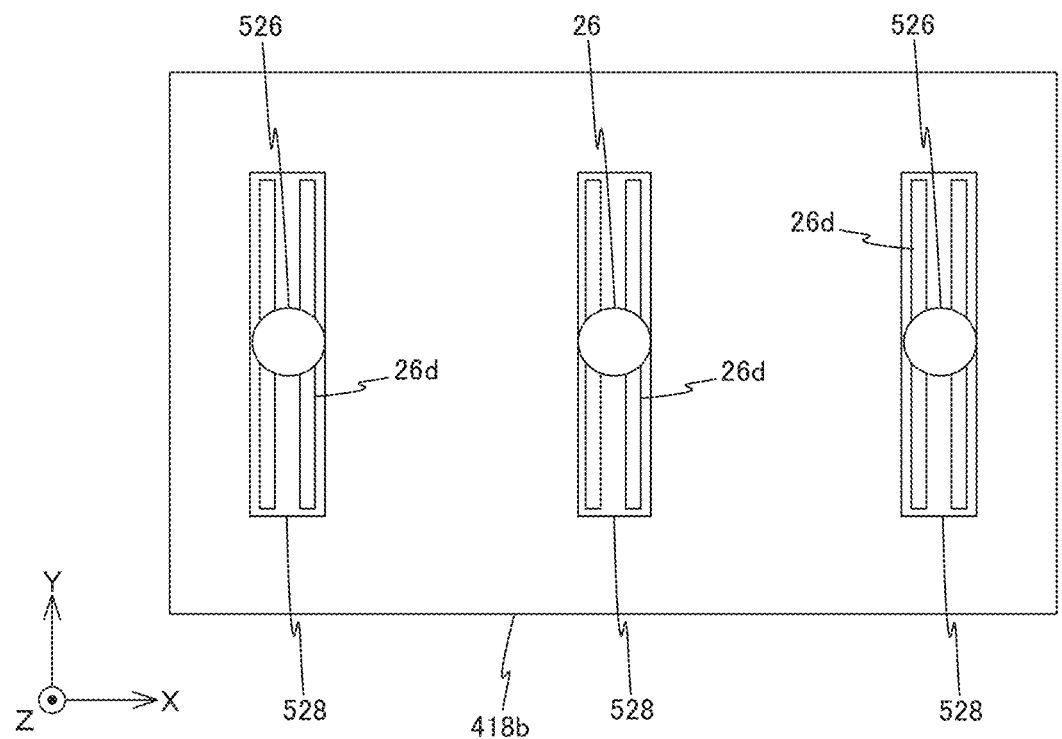
FIGS. 22*a* and 22*b* are views (a plan view and a side view, respectively) showing Y guide bars, a weight-cancelling device and the like that the substrate stage device shown in FIG. 21 has.
Figure 22B:
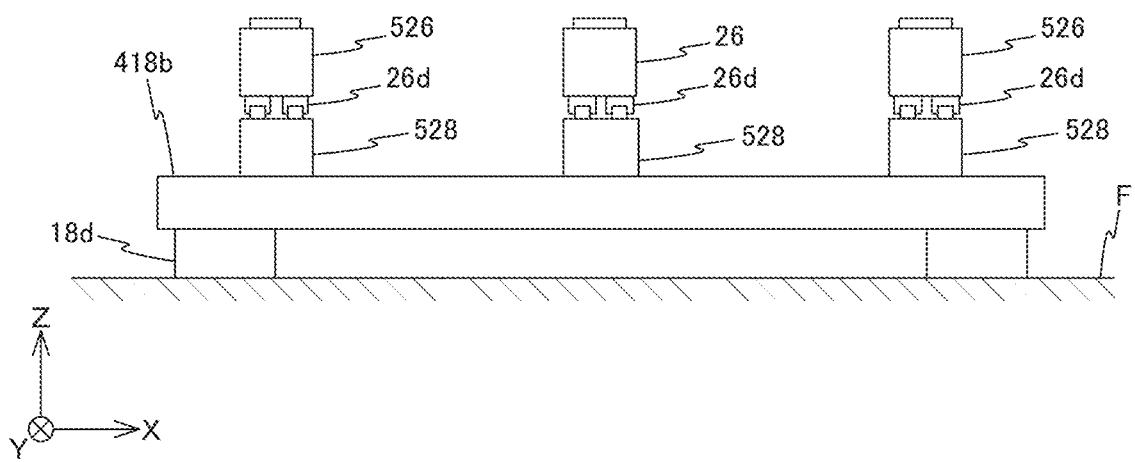

As illustrated in FIGS. 22a and 22b, for example, three Y guide bars 528 are fixed, at a predetermined spacing in the X-axis direction, on lower mount section 418b. Y guide bar 528 is formed with a size and a shape similar to those of Y guide bar 428 (see the drawings such as FIG. 15a) in the second embodiment described above. In the present fourth modified example, however, weight cancelling device 26 is placed on Y guide bar 528 via a mechanical linear guide device 26d, and therefore the flatness degree of the upper surface of Y guide bar 528 is rough, compared to that of Y guide bar 428 related to the second embodiment described above. Further, a Z actuator 526 is placed on Y guide bars 528 on the +X side and the −X side via Y linear guide device 26d.

Figure 23A:
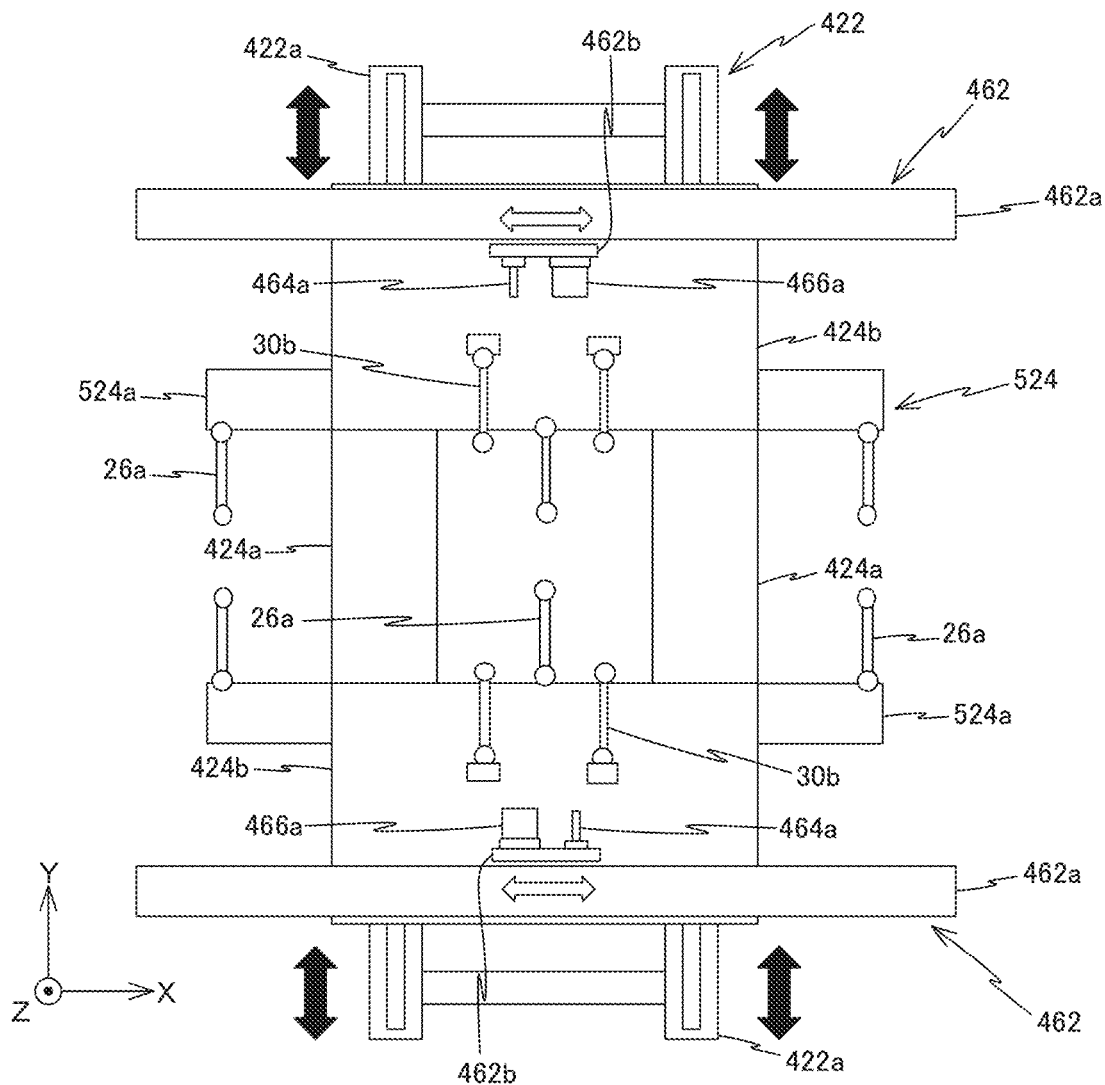
FIGS. 23*a* and 23*b* are views (a plan view and a side view, respectively) showing a base frame, a coarse movement stage and the like that the substrate stage device shown in FIG. 21 has.
Figure 23B:
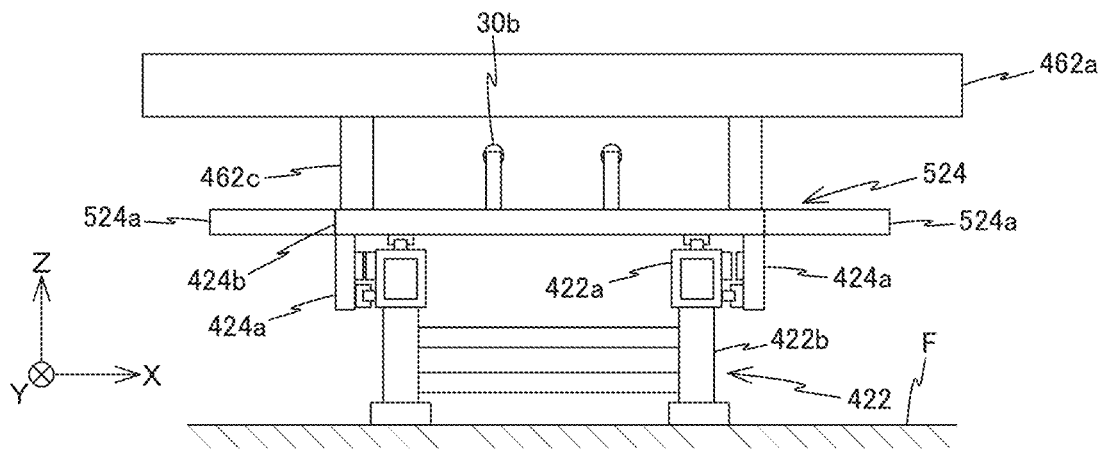

Further, as illustrated in FIGS. 23a and 23b, to each of a pair of Y tables 424b that a coarse movement stage 524 has, a pair of plate-like members 524a are connected protruding toward the +X direction and the −X direction. One ends of connecting devices 26a for towing Z actuators 526 described above (see the drawings such as FIG. 22b) are connected to plate-like members 524a. That is, in the present fourth modified example, for example, two Z actuators 526 (see the drawings such as FIG. 22b for each of them) are towed by coarse movement stage 524 in a similar manner to weight cancelling device 26 (integrally with weight cancelling device 26).

Figure 24A:
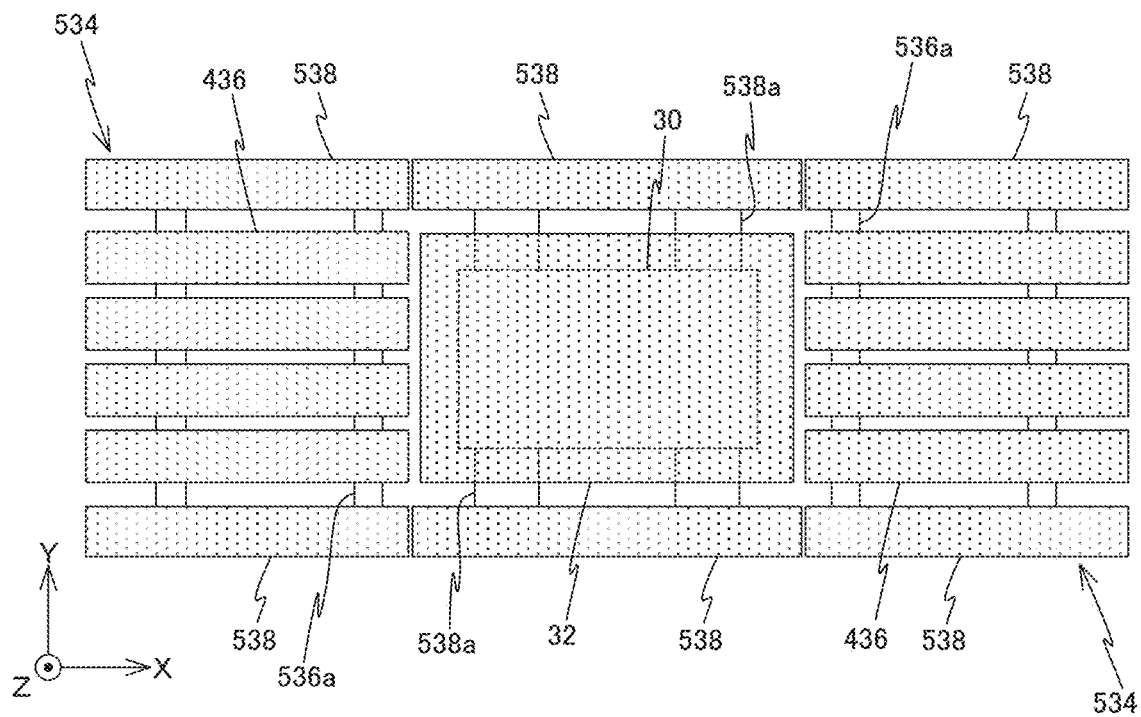
FIGS. 24*a* and 24*b* are views (a plan view and a side view, respectively) showing a noncontact holder, auxiliary tables and the like that the substrate stage device shown in FIG. 21 has.
Figure 24B:
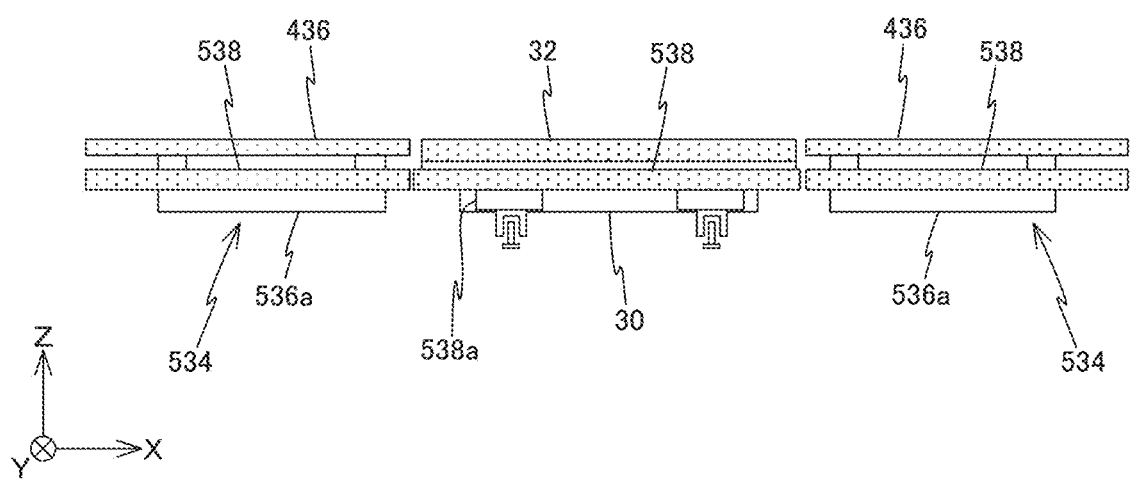

As illustrated in FIGS. 24a and 24b, each of the pair of auxiliary tables 534 has a plurality (e.g. four in FIG. 24a) of air levitation units 436. Similarly to the second embodiment described above, the plurality of air levitation units 436 support from below a portion, of substrate P, that is not supported by noncontact holder 32. Further, auxiliary table 534 has a pair of air levitation units 538. In auxiliary table 534, the plurality of air levitation units 436 and the pair of air levitation units 538 are integrally placed on a base member 536a. Auxiliary table 534 on the +X side is supported from below by Z actuator 526 (see the drawings such as FIG. 22b) on the +X side described above, while auxiliary table 534 on the −X side is supported from below by Z actuator 526 (see the drawings such as FIG. 22b) on the −X side described above (see FIG. 26b). A pair of air levitation units 538 are also fixed to substrate table 30 via support members 538a. Note that air levitation unit 438 of the second embodiment described above is formed with a length enough to cover the entire movement range of substrate carrier 440 (about three times the length of substrate P) in the X-axis direction (see FIG. 14 for each of them), whereas air levitation unit 538 of the present modified example is formed with a length that is about the same as the length of the other air levitation unit 436 (about the same as the length of substrate P).

Similarly to the second embodiment described above, also in the present fourth modified example, X frames 442x of substrate carrier 540 (see FIG. 21 for each of them) are supported from below, as needed, by the plurality of air levitation units 538 (air levitation units 538 that auxiliary tables 534 have and air levitation units 538 that substrate 30 has).

Figure 25A:
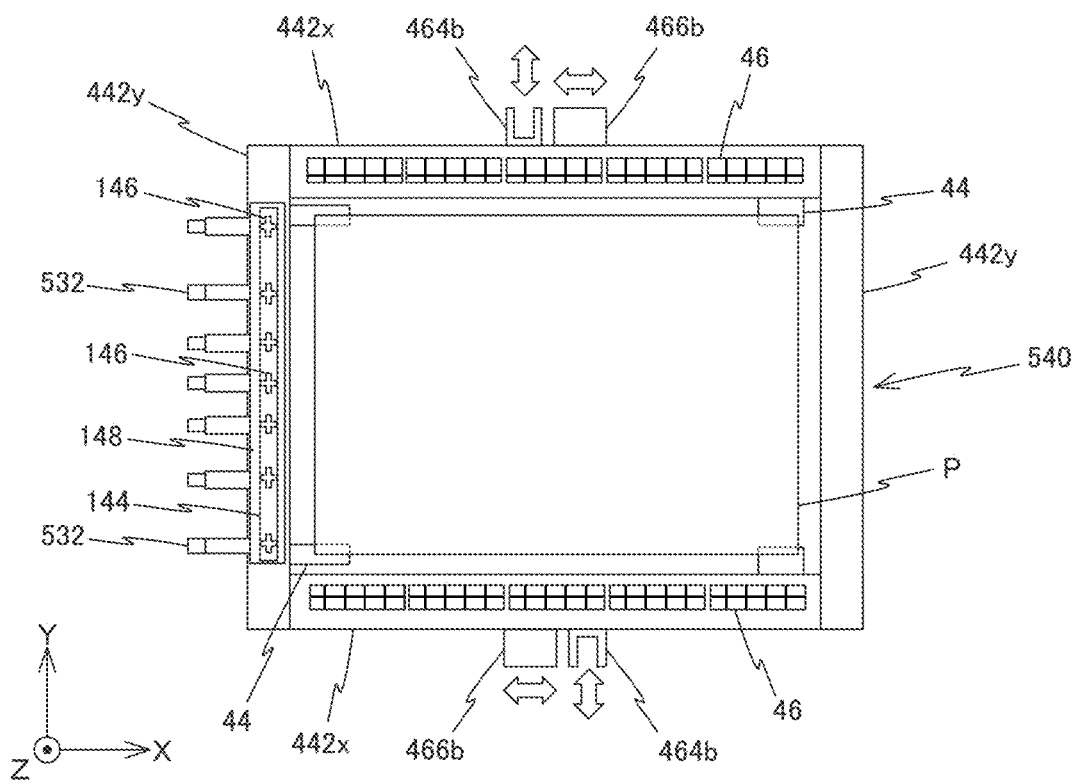
FIGS. 25*a* and 25*b* are views (a plan view and a side view, respectively) showing a substrate carrier and the like that the substrate stage device shown in FIG. 21 has.
Figure 25B:
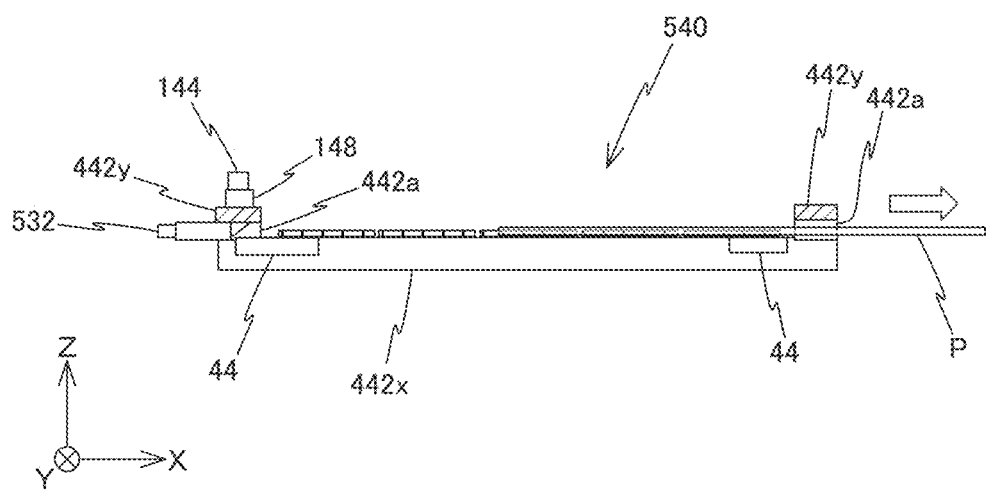

As illustrated in FIGS. 25a and 25b, in substrate carrier 540, Y frames 442y are fixed on X frames 442x via spacers 442a (not illustrated in FIG. 25a because spacers 442a are hidden behind Y frames 442y). Further, a pair of adsorption pads 44 on the −X side are attached to the lower surface of Y frame 442y on the −X side, whereas a pair of adsorption pads 44 on the +X side are formed protruding from the inner side surfaces of X frames 442x. Accordingly, in substrate carrier 540 of the present modified example, the carry-out of substrate P from substrate carrier 540 can be performed, by moving substrate P, from the state as shown in FIG. 25a, toward the +X direction and causing substrate P to pass below Y frame 442y on the +X side as illustrated in FIG. 25b. Also, the carry-in of substrate P to substrate carrier 540 can be performed, by moving substrate P toward the −X direction.

Further, reference index plate 144, at which the plurality of reference marks 146 are formed, is fixed on Y frame 442y on the −X side via raising member 148, which is similar to the second modified example (see FIG. 12a) of the first embodiment described above. And, correspondingly to the plurality of reference marks 146, a plurality of mark measurement sensors 532 are attached to the lower surface of Y frame 442y on the −X side. That is, reference index plate 144 and mark measurement sensors 132 are separately provided in the second modified example described above (see FIG. 11), whereas reference index plate 144 and mark measurement sensors 532 are integrally provided at substrate carrier 540 in the present modified example. Since the calibration using reference index plate 144 is the same as the second modified example described above, the description thereof will be omitted.

Figure 26A:
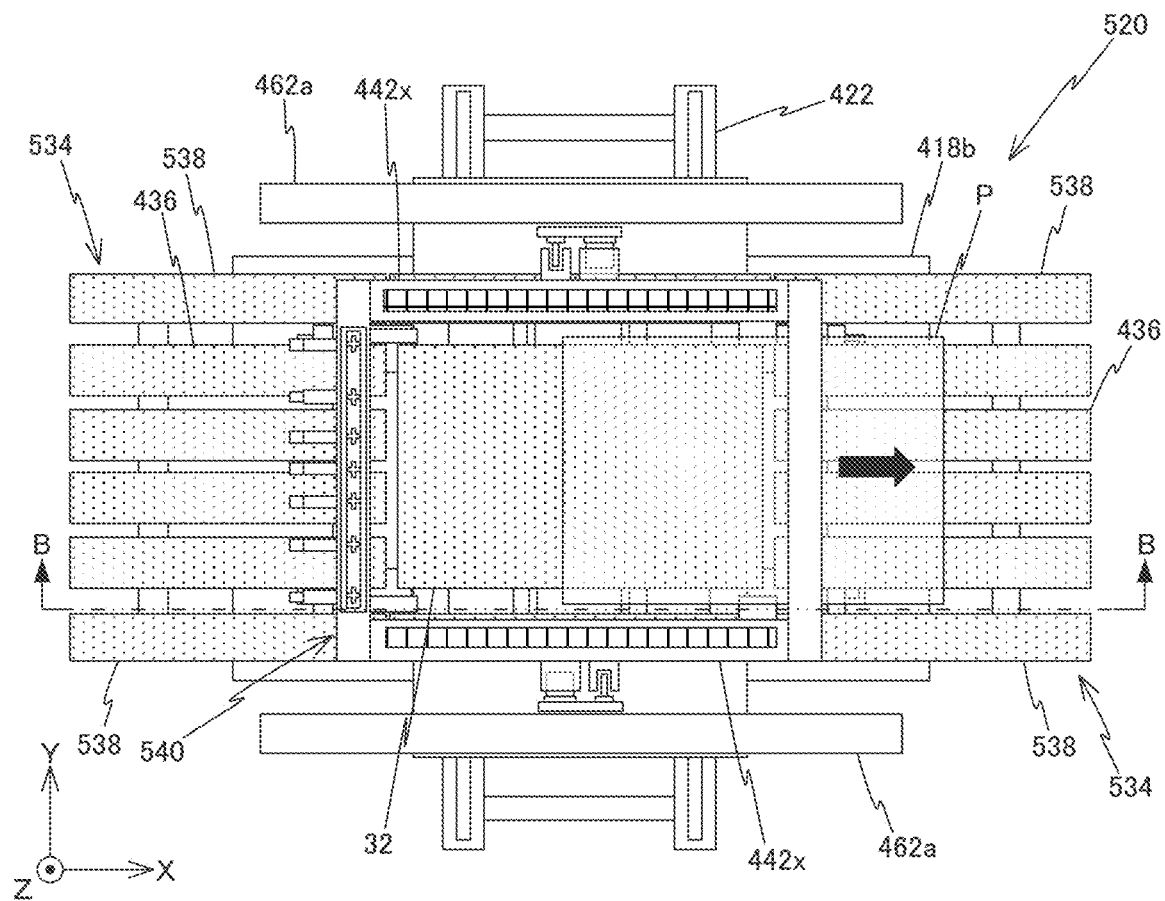
FIG. 26*a* is a view used to explain operations of the substrate stage device related to the fourth modified example at the substrate carrying-out time.
Figure 26B:
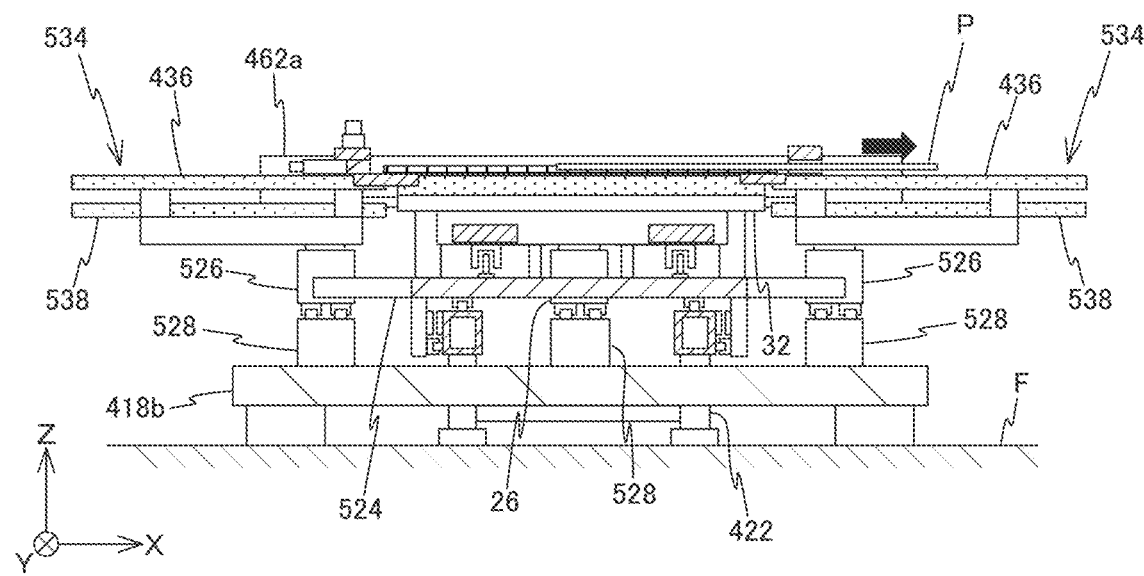
FIG. 26*b* is a cross-sectional view taken along the line B-B shown in FIG. 26*a*.

In FIGS. 26a and 26b, substrate stage device 520 at the time of carry-out operations of substrate P is illustrated. The carry-out of substrate P is performed in a state where substrate carrier 540 is in the center of the movement range in the X-axis direction, i.e., substantially the entirety of substrate P is supported by noncontact holder 32. After the holding by adsorption of substrate P by substrate carrier 540 is released, substrate P is slid and moved toward the +X direction with respect to substrate carrier 540 by a carry-out device (not illustrated). Accordingly, substrate P is delivered (transferred) from noncontact holder 32 onto the plurality of air levitation units 436 that auxiliary table 534 on the +X side has. Note that the carry-out device for sliding substrate P in the X-axis direction may be provided external to substrate stage device 520 (including also an external device of the liquid crystal exposure apparatus), or substrate stage device 520 itself may have the carry-out device.

In substrate stage device 520 (see FIG. 21) related to the fourth modified example described so far, since the pair of auxiliary tables 534 and substrate table 30 (and noncontact holder 32) are physically separated, the Z-tilt position controllability of substrate P is improved by weight reduction of a driving target object. Further, the respective Z-positions of the pair of auxiliary tables 534 can be independently controlled, and therefore, for example, when substrate P is moved (transferred) from noncontact holder 32 onto air levitation units 436 of auxiliary table 534, the contact between the end of substrate P and air levitation units 436 can be avoided by slightly lowering the Z-position of that auxiliary table 534. Further, substrate P can be carried out from (and carried into) substrate carrier 540 by sliding and moving substrate P, and therefore, even in the case where a space above substrate stage device 520 is small, the substrate exchange on substrate carrier 540 can be performed easily.

Note that the configurations of the first embodiment and the second embodiment (including their modified examples) described so far are examples, and can be changed as needed. For example, although in each of the embodiments described above, substrate carrier 40 or the like is formed into a rectangular frame-like shape by, for example, four frame members along the outer periphery edges (four sides) of substrate P (in the first embodiment, a pair of X frames 42x and a pair of Y frames 42y), this is not intended to be limiting as far as the holding by adsorption of substrate P can be reliably performed. And, substrate carrier 40 or the like may be configured of frame members, for example, along a part of the outer periphery edges of substrate P. Specifically, the substrate carrier may be formed into a U-like shape in planar view by, for example, three frame members along three sides of substrate P, or may be formed into an L-like shape in planar view by, for example, two frame members along two adjacent sides of substrate P. Also, the substrate carrier may be formed by, for example, only one frame member along one side of substrate P. Further, the substrate carrier may be configured by a plurality of members which hold portions different from each other of substrate P and whose positions are controlled independently from each other.

Note that as illustrated in FIG. 2 or 13, although Z-tilt position measurement system 58 irradiates target 58b fixed to the housing of weight cancelling device 26 with a measurement beam, using laser displacement meter 58a provided at the lower surface of substrate table 30, and receives the reflected beam, thereby obtaining displacement amount information of substrate table 30 in the Z-axis direction, this is not intended to be limiting. Instead of Z-tilt position measurement system 58, Z sensor heads 78z are disposed at head units 72, along with X heads 78x and Y heads 78y. As Z sensor head 78z, for example, a laser displacement meter is used. In an area, of X frame 42x, in which the scales that face X heads 78x and Y heads 78y are not disposed, a reflection surface is formed by mirror polishing. Z sensor head 78z irradiates the reflection surface with a measurement beam and receives the reflected beam from the reflection surface, thereby obtaining displacement amount information of substrate carrier 40 or 440 in the Z-axis direction at the irradiation point of the measurement beam. Note that the type of Z sensor head 78z is not particularly limited, as far as Z sensor head 78z can measure the displacement of substrate carrier 40 or 440 (for more detail, X frame 42x) in the Z-axis direction with apparatus main body 18 (see FIG. 1) serving as a reference, with a desired accuracy (resolution) and in a noncontact manner.

Although the position information of each of substrate P and Y sliders 76 within the XY plane is obtained by X encoder heads 78x and Y encoder heads 78y, Z-tilt position information of each of substrate P and Y sliders 76 may also be obtained together with the position information of each of substrate P and Y sliders 76 within the XY plane, by using, for example, a two-dimensional encoder head (an XZ encoder head or a YZ encoder head) that is capable of measuring displacement amount information in the Z-axis direction. In this case, Z-tilt position measurement system 58 and Z sensor heads 78z for obtaining the Z-tilt position information of substrate P can be omitted. Note that, in this case, since two downward Z heads need to constantly face scale plate 46 in order to obtain the Z-tilt position information of substrate P, it is preferable that scale plate 46 is configured of one long scale plate with a length that is about the same as the length of X frame 42x, or for example, three or more of the two-dimensional encoder heads described above are disposed at a predetermined spacing in the X-axis direction.

Although, in each of the embodiments described above, a plurality of scale plates 46 are disposed at a predetermined spacing in the X-axis direction, this is not intended to be limiting, and for example, one long scale plate formed with a length about the same as the length of substrate carrier 40 or the like in the X-axis direction may be used. In this case, since the facing state between the scale plate and the heads is constantly maintained, each head unit 72 only has to have one each of X head 78x and Y head 78y. The same can be said for scale plate 82. In the case where a plurality of scale plates 46 are provided, the respective lengths of the plurality of scale plates 46 may be different from each other. For example, the length of a scale plate extending in the X-axis direction is set longer than the length of a shot area in the X-axis direction, and thereby the position control of substrate P by head unit 72 that is located across the different scale plates 46 can be avoided at the time of scanning exposure operations. Further (for example, in the case of preparing four areas and the case of preparing six areas), a scale disposed on one side of projection optical system 16 and a scale disposed on the other side may have the respective lengths different from each other.

Further, although, in each of the embodiments described above, the position measurement of substrate carrier 40 or the like within the horizontal plane is performed using the encoder systems, this is not intended to be limiting, and for example, bar mirrors each extending in the X-axis direction and the Y-axis direction are attached to substrate carrier 40, and the position measurement of substrate carrier 40 or the like may be performed by an interferometer system using the bar mirrors. Further, although, in the encoder systems in each of the embodiments described above, a configuration, in which substrate carrier 40 or the like has scale plates (diffraction gratings) and head units 72 have the measurement heads, is employed, this not intended to be limiting, and substrate carrier 40 or the like may have the measurement heads and scale plates that are moved synchronously with the measurement heads may be attached to apparatus main body 18 (the placement reversed to that in each of the embodiments described above may be employed).

Further, although in each of the embodiments described above, noncontact holder 32 supports substrate P in a noncontact manner, this is not intended to be limiting as far as the relative movement between substrate P and noncontact holder 32 in directions parallel to the horizontal plane is not disturbed, and substrate P may be supported in a contact state via a rolling element such as, for example, a ball.

Third Embodiment

Next, a liquid crystal exposure apparatus related to a third embodiment will be described using FIGS. 27 to 48. Only the differences from the first embodiment described above will be described below, and elements that have the same configurations and functions as those in the first embodiment described above will be provided with the same reference signs as those in the first embodiment described above, and the description thereof will be omitted.

Figure 27:
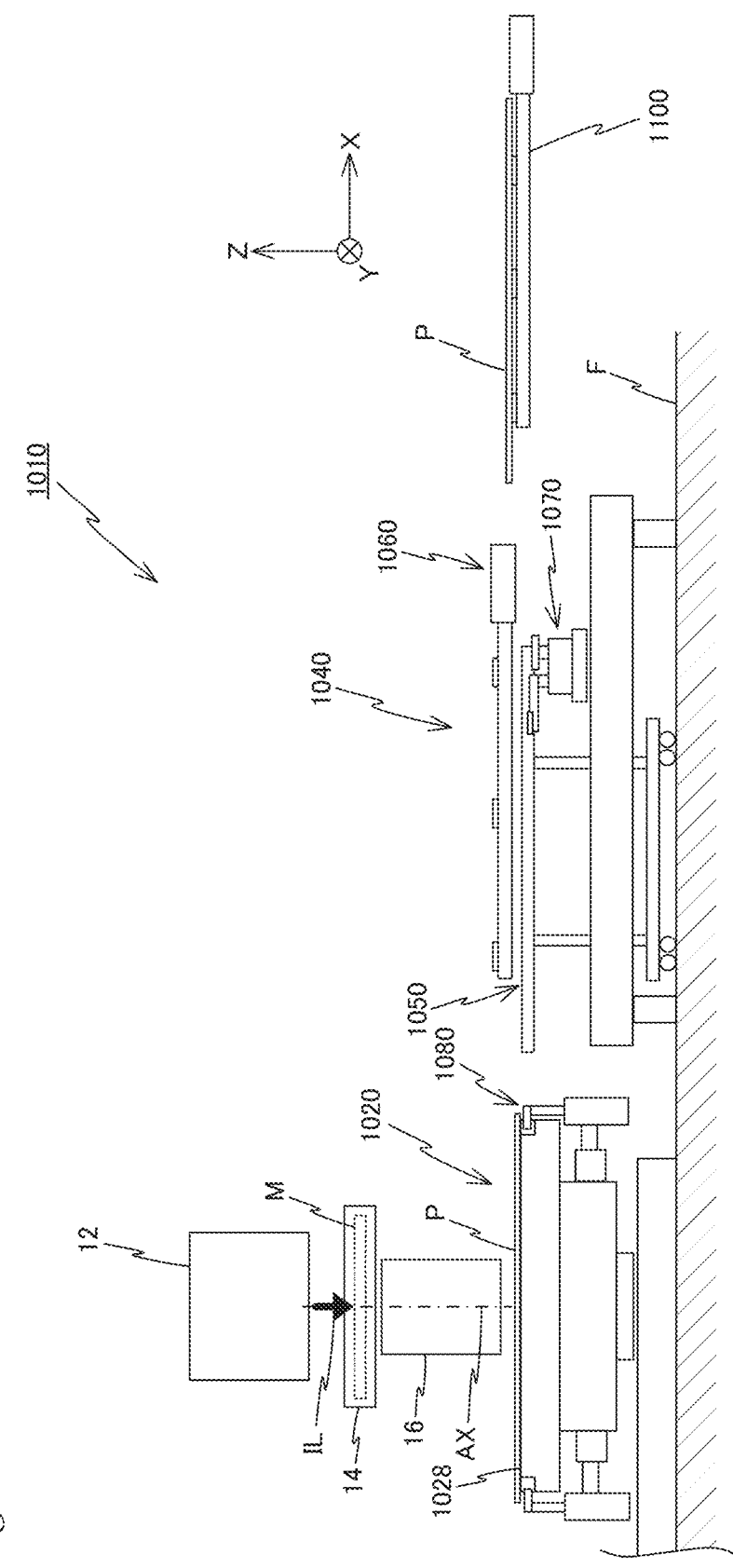
FIG. 27 is a view schematically showing a configuration of a liquid crystal exposure apparatus related a third embodiment.

As illustrated in FIG. 27, a liquid crystal exposure apparatus 1010 has illumination system 12, mask stage 14, projection optical system 16, a substrate stage device 1020, a substrate exchange device 1040, and a control system thereof and the like. Since illumination system 12, mask stage 14 and projection optical system 16 are the same as those in the first embodiment described above, the description thereof will be omitted.

Figure 29A:
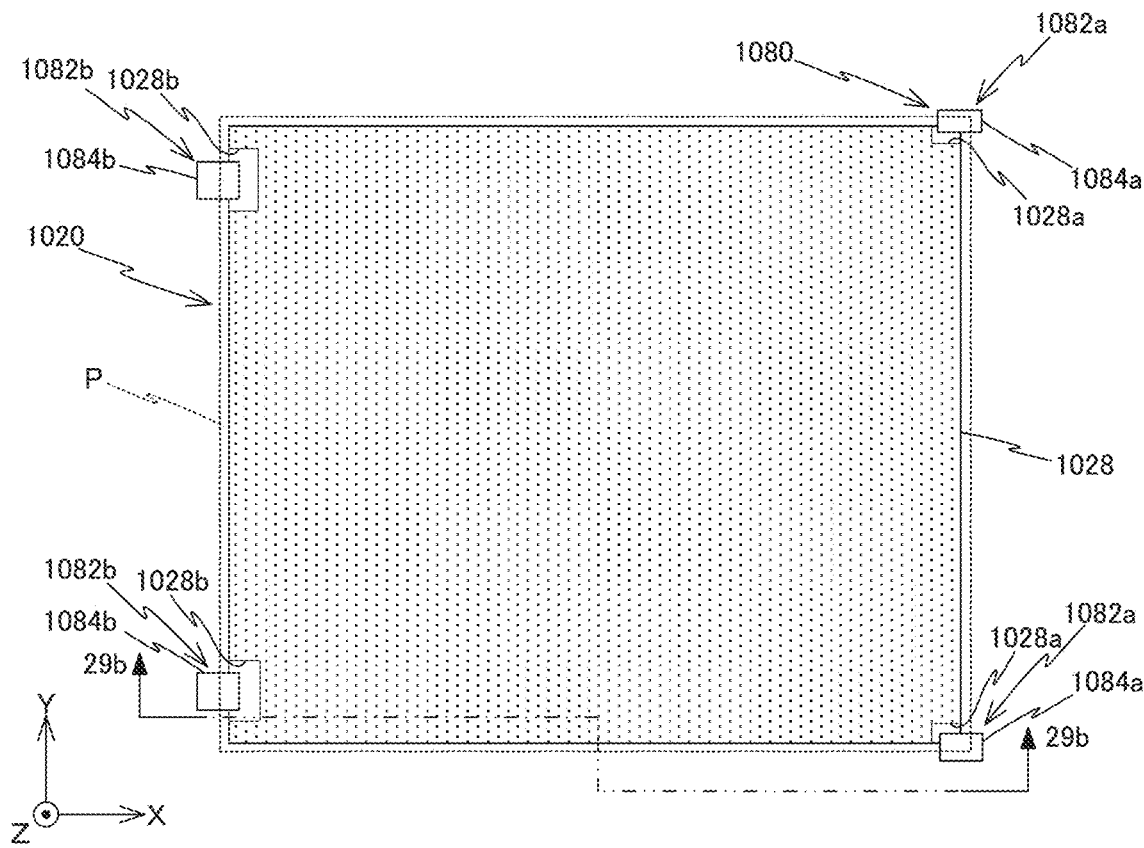
FIG. 29*a* is a plan view of the substrate stage device.
Figure 29B:
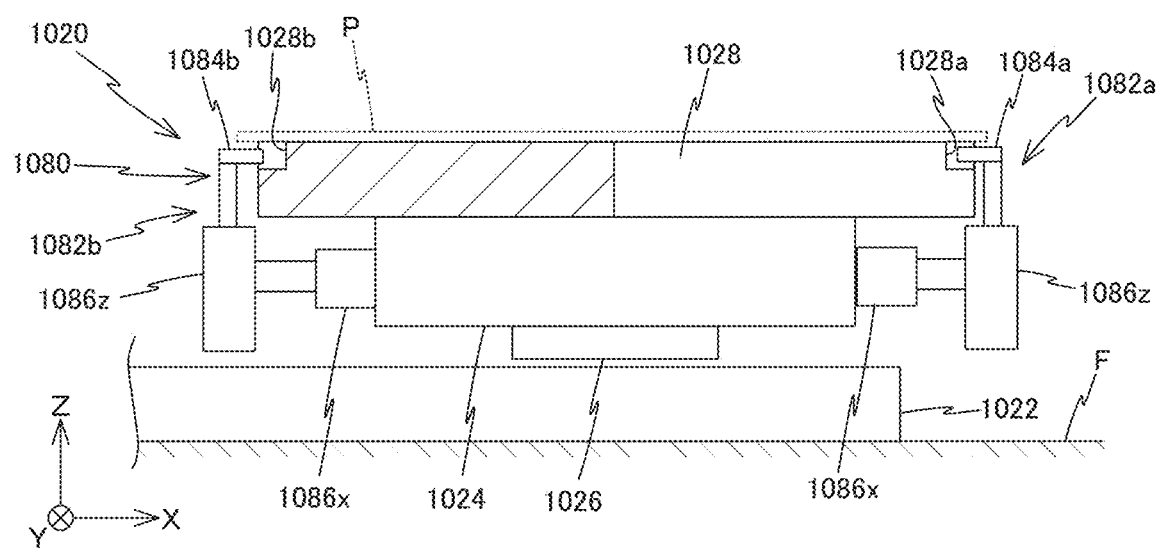
FIG. 29*b* is a cross-sectional view taken along the line 29*b*-29*b* shown in FIG. 29*a*.

As illustrated in FIG. 29b, substrate stage device 1020 is equipped with a surface plate 1022, a substrate table 1024, an empty weight supporting device 1026 and substrate holder 1028.

Surface plate 1022 is made up of, for example, a plate-like member with a rectangular shape in planar view (when viewed from the +Z side) that is disposed so that the upper surface (+Z surface) of surface plate 1022 is parallel to the XY plane, and is installed on floor F via a vibration isolation device (not illustrated). Substrate table 1024 is made up of a thin box-like member having a rectangular shape in planar view. Empty weight supporting device 1026 is placed on surface plate 1022 in a noncontact state and supports the empty weight of substrate table 1024 from below. Further, although not illustrated, substrate stage device 1020 is equipped with: a substrate stage drive system that includes, for example, a linear motor or the like and drives substrate table 1024 with a predetermined long stroke in the X-axis direction and the Y-axis direction (along the XY plane), and finely drives substrate table 1024 in the directions of six degrees of freedom (the X-axis, the Y-axis, the Z-axis, the θx, the θy and the θz); a substrate stage measurement system including, for example, an optical interferometer system or the like, for obtaining position information of substrate table 1024 in the foregoing directions of six degrees of freedom; and the like.

Substrate holder 1028 is made up of a plate-like member with a rectangular shape in planar view, and substrate P is placed on its upper surface (the surface on the +Z side). As illustrated in FIG. 29a, the upper surface of substrate holder 1028 is formed into a rectangular shape with the X-axis direction serving as a longitudinal direction, and its aspect ratio is substantially the same as that of substrate P. However, the length of a long side and the length of a short side of the upper surface of substrate holder 1028 are set slightly shorter than the length of a long side and the length of a short side of substrate P, respectively, and the end vicinity parts of the four sides of substrate P protrude outward from substrate holder 1028 in a state where substrate P is placed on the upper surface of substrate holder 1028. This is because there is a possibility that the resist coated on the surface of substrate P adheres also on the back surface side of the end vicinity parts of substrate P and such the resist should be prevented from adhering on substrate holder 1028.

The upper surface of substrate holder 1028 is finished to be extremely flat across the entire surface. And, on the upper surface of substrate holder 1028, a plurality of minute hole sections (not illustrated) for air blowing out and/or vacuum suction are formed. Substrate holder 1028 can perform flatness correction of the substantially entire surface of substrate P following (according to) the upper surface of substrate holder 1028, by suctioning air between the upper surface and substrate P via the plurality of hole sections referred to above, using a vacuum suction force supplied from a vacuum device (not illustrated). Further, substrate holder 1028 can move the back surface of substrate P apart from (levitate substrate P from) the upper surface of substrate holder 1028 by exhausting (jetting) pressurized gas (e.g. air) supplied from a pressurized gas supply device (not illustrate) to the back surface of substrate P via the foregoing hole sections. Furthermore, it is possible to optimize the grounded state of substrate P (e.g., to prevent air stagnation from being generated between the back surface of substrate P and the upper surface of substrate holder 1028) by, for example, causing the time difference in timing of exhausting pressurized gas, exchanging the location of the hole section for performing vacuum suction and the hole section for exhausting the pressurized gas as needed, and changing the air pressure between the suction and the exhaust as needed.

At the +X side end vicinity part of the upper surface of substrate holder 1028, for example, two cutouts 1028a are formed, spaced apart in the Y-axis direction. Further, at the −X side end vicinity part of the upper surface of substrate holder 1028, for example, two cutouts 1028b are formed, spaced apart in the Y-axis direction.

To be more specific, cutout 1028a is formed at the corner on the +X side and the +Y side of substrate holder 1028, and at the corner on the +X side and the −Y side of substrate holder 1028, and cutouts 1028a are open toward the upper surface (the surface on the +Z side) and the side surface on the +X side and the side surface on the +Y side (or the −Y side) of substrate holder 1028. In contrast, cutouts 1028b are open only toward the upper surface and the side surface on the −X side of substrate holder 1028.

Figure 28:
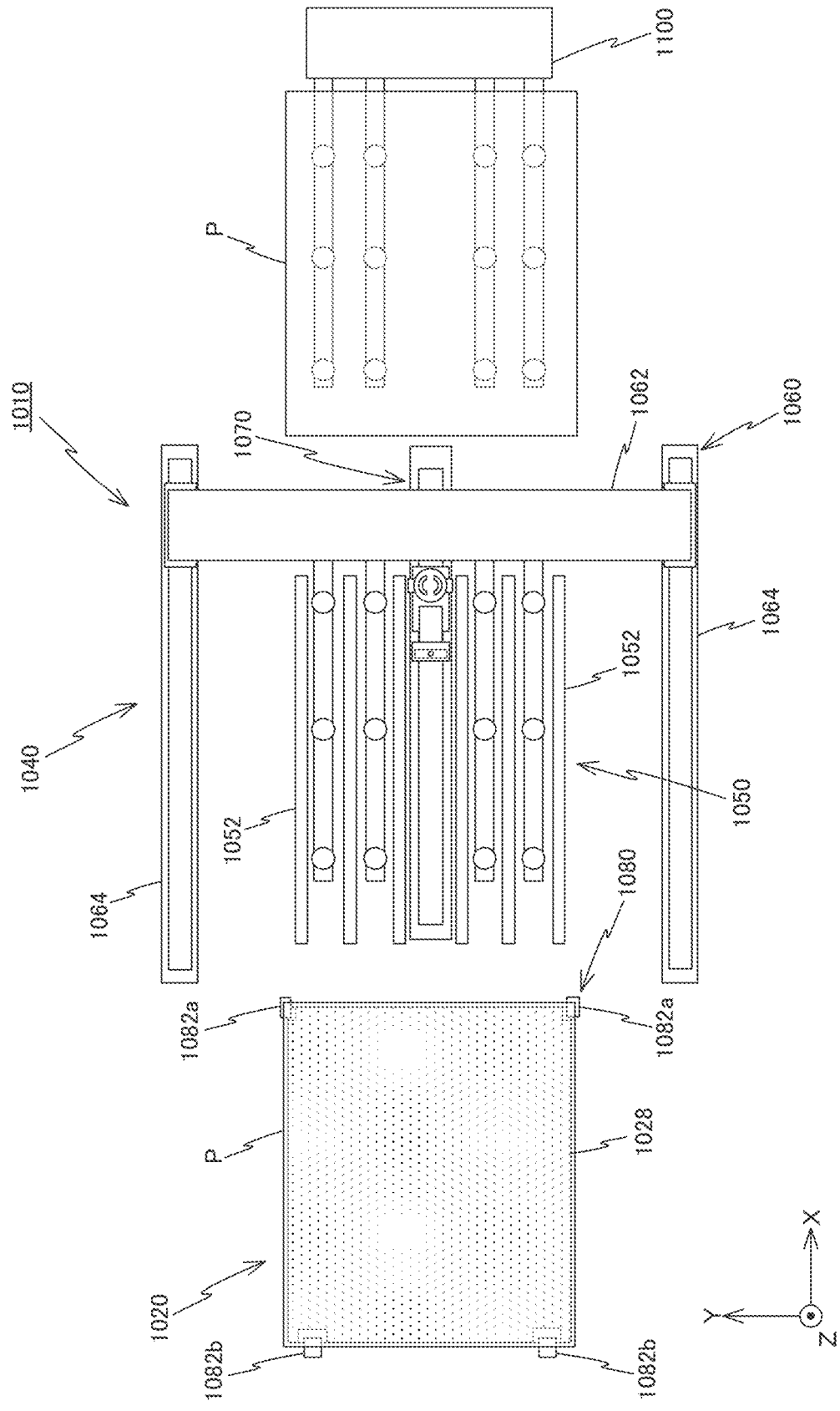
FIG. 28 is a plan view of a substrate stage device and a substrate exchange device that the liquid crystal exposure apparatus shown in FIG. 27 has.

As illustrated in FIG. 28, substrate exchange device 1040 has a beam unit 1050, a substrate carry-in device 1060, a substrate carry-out device 1070 and a substrate assist device 1080. Beam unit 1050, substrate carry-in device 1060 and substrate carry-out device 1070 are installed at predetermined positions on the +X side of substrate stage device 1020. Hereinafter, the explanation is given, referring to the location where beam unit 1050, substrate carry-in device 1060 and substrate carry-out device 1070, of substrate exchange device 1040, as a port section. For example, the delivery of substrate P between an external device such as a coater/developer and liquid crystal exposure apparatus 1010 is performed at the port section. Substrate carry-in device 1060 is a device for carrying a new substrate P before exposure from the port section to substrate holder 1028. On the other hand, substrate carry-out device 1070 is a device for carrying a substrate P that has been exposed from substrate holder 1028 to the port section.

Further, the delivery between the external device (not illustrated) and liquid crystal exposure apparatus 1010 is performed by an external carrier device 1100 that is disposed external to a chamber (not illustrated) that accommodates illumination system 12, mask stage 14, projection optical system 16, substrate stage device 1020, substrate exchange device 1040 and the like that are described above. External carrier device 1100 has a robot hand with a fork shape and can mount substrate P on the robot hand, and transport substrate P from the external device to the port section in liquid crystal exposure apparatus 1010 and transport substrate P from the port section to the external device.

Figure 30A:
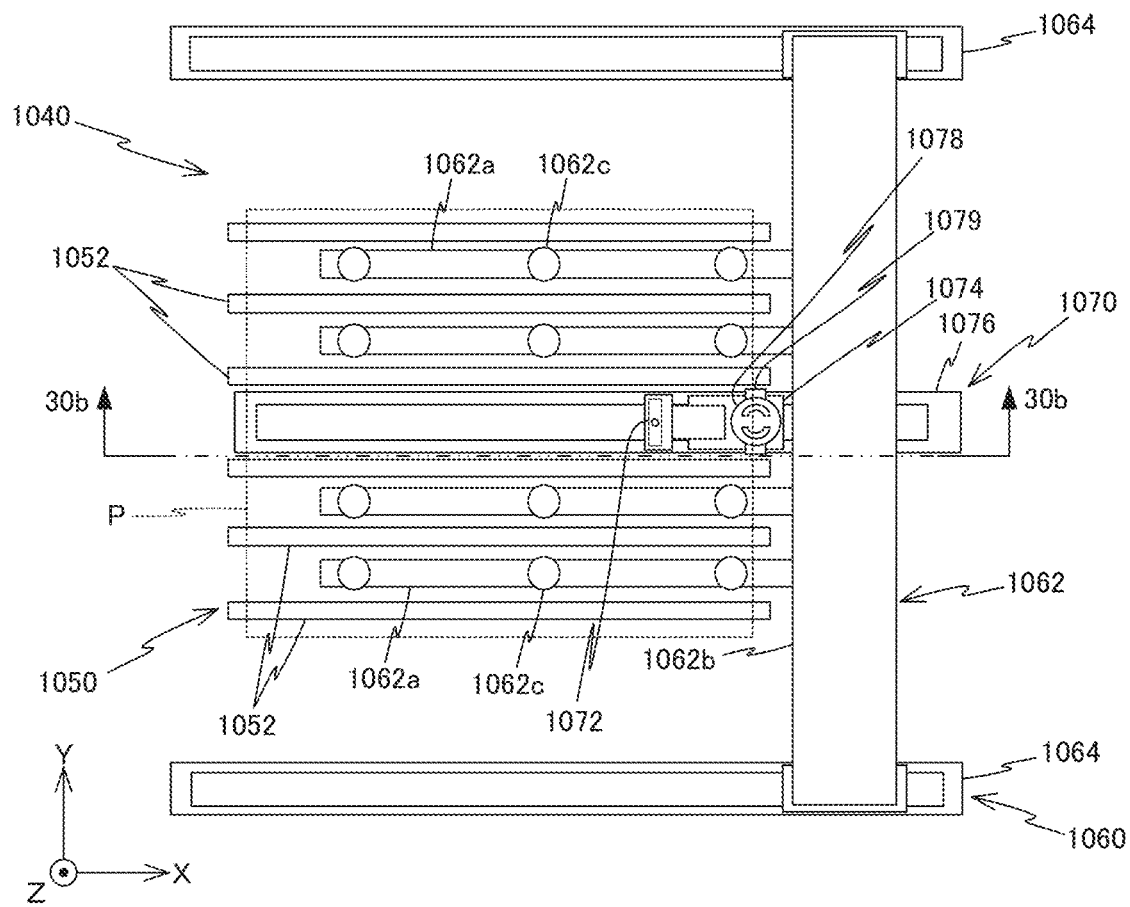
FIG. 30*a* is a plan view of the substrate exchange device.

As illustrated in FIG. 30a, beam unit 1050 has a plurality (e.g. six in the present embodiment) of balance beams 1052 that are disposed at a predetermined spacing in the Y-axis direction. Balance beam 1052 includes an elongated air bearing extending parallel to the X-axis direction that serves as a carrying direction of substrate P at the time of substrate exchange. The spacing between the plurality of balance beams 1052 in the Y-axis direction is set so that substrate P can be supported from below with good balance using the plurality of balance beams 1052, and as illustrated in FIGS.

32*a* and 32*b*, the plurality of balance beams 1052 do not overlap, in a vertical direction, with a plurality of finger sections that the fork hand of external carrier device 1100 has, when the fork hand is placed above beam unit 1050.

Referring back to FIG. 30*a*, the length in the longitudinal direction (the X-axis direction) of one balance beam 1052 is set slightly longer than the length in the longitudinal direction of substrate P, and the length in the width direction of one balance beam 1052 is set to, for example, about 1/50 of the length in the width direction of substrate P, or set to, for example, about 10 to 50 times the thickness of substrate P.

Figure 30B:
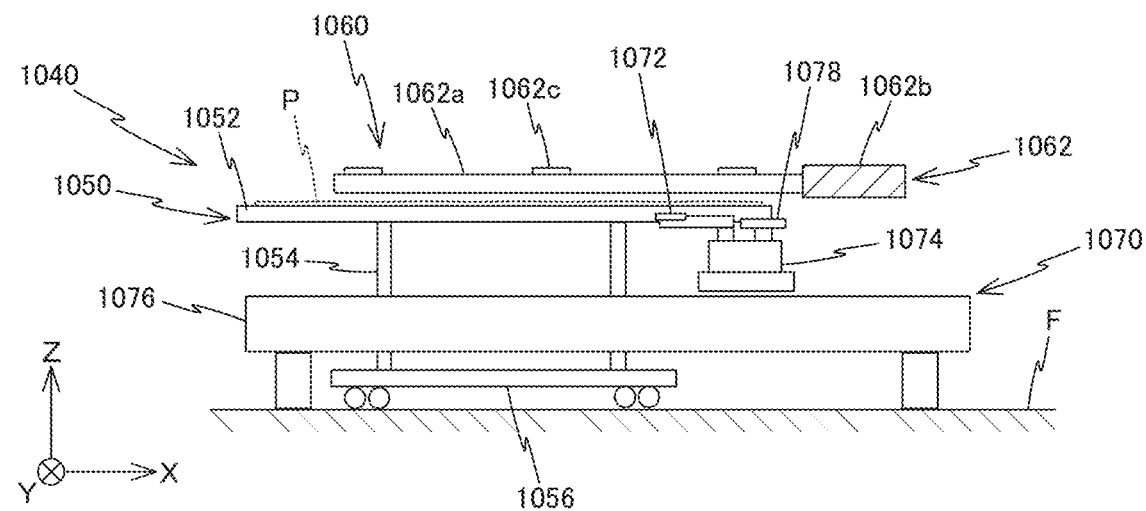
FIG. 30*b* is a cross-sectional view taken along the line 30*b*-30*b* shown in FIG. 30*a*.

As illustrated in FIG. 30*b*, each of the plurality of balance beams 1052 (overlapping in the depth direction of the page surface in FIG. 30*b*) is supported from below at a position on an inner side than the both ends in the X-axis direction, by a plurality (e.g. two) of bar-shaped legs 1054 extending in the Z-axis direction. The plurality of legs 1054 that support each balance beam 1052 have the lower end vicinity parts coupled to each other by a base plate 1056 (base plate 1056 is not illustrated in FIG. 30*a*). In substrate exchange device 1040, the plurality of balance beams 1052 integrally move with a predetermined stroke in the X-axis direction by base plate 1056 being driven with a predetermined stroke in the X-axis direction by an X actuator (not illustrated). Further, the Z-positions of the upper surfaces (the air bearing surfaces) of the plurality of balance beams 1052 are set to substantially the same position (height) as the Z-position of the upper surface of substrate holder 1028.

Referring back to FIG. 30*a*, substrate carry-in device 1060 has a hand 1062 with a fork shape (hereinafter, referred to as a substrate carry-in hand 1062), similar to that of external carrier device 1100 described above (see FIGS. 27 and 28). Substrate carry-in hand 1062 has a plurality (e.g. four in the present embodiment) of finger sections 1062*a* extending parallel to the X-axis direction that serves as the carrying direction of substrate P when substrate P is carried in from the port section to substrate holder 1028. The plurality of finger sections 1062*a* have the +X side end vicinity parts coupled to each other by a coupling member 1062*b*. In contrast, the −X side ends (on the substrate holder 1028 (see the drawings such as FIG. 28) side) of the plurality of finger sections 1062*a* are free ends, and a space between the adjacent finger sections 1062*a* is open toward the substrate holder 1028 side. Note that substrate carry-in hand 1062 may suppress substrate P from hanging down between the adjacent finger sections 1062*a*, by jetting air to between the adjacent finger sections 1062*a*. The same can be said for the robot hand of external carrier device 1100.

Finger sections 1062*a* that substrate carry-in hand 1062 has are each disposed so that the positions of finger sections 1062*a* do not overlap with the positions of the plurality of balance beams 1052 in the Y-axis direction in planar view, similarly to the robot hand of external carrier device 1100 described above (see FIG. 28). Further, a plurality of supporting pads 1062*c* for supporting the back surface of substrate P are attached to the upper surface of each finger section 1062*a*. Coupling member 1062*b* is made up of a thin hollow member with a rectangular shape in planar view, and extends in the Y-axis direction that is a direction perpendicular to each finger section 1062*a* (and balance beams 1052 described above).

Each of both end vicinity parts of coupling member 1062*b* in the Y-axis direction is coupled to a pair of X-axis drive devices 1064 for driving substrate carry-in hand 1062 in the X-axis direction. Note that the pair of X-axis drive devices 1064 may be driven independently from each other, or may be mechanically coupled by a gear or a belt to be simultaneously driven by one drive motor. Further, although not illustrated, a pair of X-axis drive devices 1064 is vertically movable by a Z-axis drive device. Therefore, substrate carry-in hand 1062 can be moved between a position higher (on the +Z side) than the upper surface of balance beams 1052 and a position lower (on the −Z side) than balance beams 1052. Note that if substrate carry-in hand 1062 is structured capable of performing the vertical movement (±Z-axis direction) and the horizontal motion in a substrate carry-in direction (movement toward the ±X-axis direction), then for example, the placement of X-axis drive devices 1064 and the Z-axis drive device may be a reversed placement (the Z-axis drive device is on X-axis drive devices 1064) to the foregoing placement.

Substrate carry-out device 1070 is disposed in the center part of the port section in the Y-axis direction. For example, three of the six balance beams 1052 described above are disposed on the +Y side of substrate carry-out device 1070 and the other three are disposed on the −Y side of substrate carry-out device 1070. Further, for example, two of the four finger sections 1062*a* of substrate carry-in hand 1062 equipped in substrate carry-in device 1060 are disposed on the +Y side of substrate carry-out device 1070 and the other two are disposed on the −Y side of substrate carry-out device 1070. That is, substrate carry-out device 1070, the plurality of finger sections 1062*a* equipped in substrate carry-in hand 1062, and the plurality of balance beams 1052 are disposed so that their positions do not overlap with each other in the Y-axis direction.

Substrate carry-out device 1070 has, for example, one substrate carry-out hand 1072. As illustrated in FIG. 30*b*, substrate carry-out hand 1072 is attached to a Z-axis drive unit 1074, and Z-axis drive unit 1074 is mounted on an X-axis drive unit 1076. Substrate carry-out hand 1072 can absorb and grip (hold) substrate P using a vacuum suction force supplied from a vacuum device (not illustrated). Accordingly, substrate carry-out device 1070 can cause substrate carry-out hand 1072 to adsorb and grip the lower surface of the +X side end vicinity part of substrate P from below, and to move in the X-axis direction. Referring back to FIG. 30*a*, the width (the Y-axis direction size) of substrate carry-out hand 1072 is set slightly wider than the width (the Y-axis direction size) of one finger section 1062*a* of substrate carry-in hand 1062, and set smaller than, for example, the spacing between the two in the center of the six balance beams 1052.

The drive stroke of substrate carry-out hand 1072 by X-axis drive unit 1076 is set longer than the length of substrate P in the X-axis direction, and equal to or slightly shorter than the length of balance beam 1052 in the X-axis direction. As illustrated in FIG. 30*b*, X-axis drive unit 1076 is installed at a position that is below the plurality of balance beams 1052 and does not disturb the movement of beam unit 1050 (base plate 1056) in the X-axis direction.

Further, substrate carry-out device 1070 has an alignment pad 1078 that is an alignment device. Alignment pad 1078 is attached to Z-axis drive unit 1074 via a fine driving unit 1079 (not illustrated in FIG. 30*b*). Substrate carry-out hand 1072 and alignment pad 1078 are integrally moved in the X-axis direction, whereas the drive controls thereof in the Z-axis direction can be performed independently. Fine driving unit 1079 finely drives alignment pad 1078 in the Y-axis direction and the θz direction. Similarly to substrate carry-out hand 1072 described above, alignment pad 1078 can also adsorb and grip (hold) the lower surface of substrate P using a vacuum suction force supplied from a vacuum device (not illustrated). Accordingly, substrate carry-out device 1070 can cause alignment pad 1078 to adsorb and grip the lower surface of the center part of substrate P from below, to move with a long stroke (or a fine stroke) in the X-axis direction, and to finely move in the Y-axis direction and the θz direction.

Note that the configuration of substrate carry-out device 1070 can be changed as needed. For example, a plurality of substrate carry-out hands 1072 may be provided at a predetermined spacing in the Y-axis direction. Further, substrate carry-out hand 1072 and alignment pad 1078 may be attached to X-axis drive units 1076 that are independent. That is, for example, an X drive unit for alignment pad 1078 may be disposed at the center part in the Y-axis direction of the port section, and another X drive unit for substrate carry-out hand 1072 may be disposed on both sides (on the +Y side and the −Y side) of the X drive unit for alignment pad 1078 so that the Y-positions of these X drive units do not overlap with the Y-positions of the plurality of balance beams 1052. Further, the plurality of balance beams 1052 that beam unit 1050 has may be configured movable not only in the X-axis direction but also in the Z-axis direction. Accordingly, the height of the plurality of balance beams 1052 can be changed in accordance with an operation at the time of delivering substrate P to/from external carrier device 1100 or an operation at the time of delivering substrate P to/from substrate holder 1028 (see FIG. 27)

Referring back to FIG. 27, substrate assist device 1080 is a device that assists operations of substrate carry-in device 1060 and substrate carry-out device 1070, at the time of substrate exchange. Further, substrate assist device 1080 is also used for the positioning of substrate P when substrate P is placed onto substrate holder 1028.

As illustrated in FIGS. 29a and 29b, substrate stage device 1020 has substrate assist device 1080. Substrate assist device 1080 is equipped with a pair of substrate carry-out bearer devices 1082a and a pair of substrate carry-in bearer devices 1082b. The pair of substrate carry-out bearer devices 1082a assist (or aid) a carry-out operation of substrate P by substrate carry-out device 1070 (see the drawings such as FIG. 27), and the pair of substrate carry-in bearer devices 1082b assist (or aid) a carry-in operation of substrate P by substrate carry-in device 1060 (see the drawings such as FIG. 27).

As illustrated in FIG. 29b, substrate carry-in bearer device 1082b is equipped with a holding pad 1084b, a Z actuator 1086z and an X actuator 1086x. As illustrated in FIG. 29a, a part of holding pad 1084b of one substrate carry-in bearer device 1082b (on the +Y side) is inserted in one cutout 1028b (on the +Y side) of, for example, the two cutouts 1028b. And, a part of holding pad 1084b of the other substrate carry-in bearer device 1082b (on the −Y side) is inserted in the other cutout 1028b (on the −Y side).

Holding pad 1084b is made up of a plate-like member with a rectangular shape in planar view, and is capable of adsorbing and holding the lower surface of substrate P by a vacuum suction force supplied from a vacuum device (not illustrated).

As illustrated in FIG. 29b, holding pad 1084b can be driven in the Z-axis direction by Z actuator 1086z. Further, holding pad 1084b and Z actuator 1086z can be integrally driven in the X-axis direction by X actuator 1086x attached to substrate table 1024. Z actuator 1086z includes a support column that supports holding pad 1084 and the support column is disposed external to substrate holder 1028. Holding pad 1084b is movable between a position in contact with the lower surface of substrate P and a position spaced apart from the lower surface of substrate P, by being driven within cutout 1028b by Z actuator 1086z. Further, holding pad 1084b can be driven with a long stroke, by Z actuator 1086z, between a position where a part of holding pad 1084b is accommodated inside cutout 1028b and a position higher than the upper surface of substrate holder 1028. In addition, holding pad 1084b is movable in the X-axis direction by being driven integrally with Z actuator 1086z by X actuator 1086x.

The mechanical structure of substrate carry-out bearer device 1082a is generally the same as that of substrate carry-in bearer device 1082b described above. That is, as illustrated in FIG. 29b, substrate carry-out bearer device 1082a is equipped with a holding pad 1084a a part of which is inserted in cutout 1028a, a Z actuator 1086z for driving holding pad 1084a in the Z-axis direction, and an X actuator 1086x for driving holding pad 1084a in the X-axis direction. Note that a movable amount in the X-axis direction of holding pad 1084a of substrate carry-out bearer device 1082a is set longer than a movable amount in the X-axis direction of holding pad 1084b of substrate carry-in bearer device 1082b. In contrast, a movable amount in the Z-axis direction of holding pad 1084a of substrate carry-out bearer device 1082a is set shorter than a movable amount in the Z-axis direction of holding pad 1084b of substrate carry-in bearer device 1082b.

Substrate assist device 1080 assists as follows at the time of carrying out substrate P (the exposed substrate) from substrate holder 1028. First of all, the respective holding pads 1084a of the pair of substrate carry-out bearer devices 1082a adsorb and hold, for example, two points of the +X side end vicinity part of substrate P on substrate holder 1028. Next, in a state of maintaining the holding by adsorption of substrate P levitated and supported on substrate holder 1028, the pair of holding pads 1084a are driven only with a predetermined stroke (e.g. about 50 mm to 100 mm) in the X-axis direction (toward the +X direction). With this driving of holding pads 1084a, substrate P is moved with a predetermined stroke in the X-axis direction relative to substrate holder 1028. Accordingly, the pair of substrate carry-out bearer devices 1082a assist the carry-out operation of substrate P by substrate carry-out device 1070 described above (see the drawings such as FIG. 27).

Although the derails will be described later, substrate assist device 1080 also assist at the time of carrying in substrate P that is to be placed onto substrate holder 1028. The outline of this assist is described now referring to FIGS. 41 to 44 to be described later. First of all, the respective holding pads 1084b of the pair of substrate carry-in bearer devices 1082b adsorb and hold, for example, two points of the −X side end vicinity part of a substrate $P_2$ supported on substrate carry-in hand 1062 (finger sections 1062a) of substrate carry-in device 1060 (see FIG. 41). Next, when substrate carry-in hand 1062 (finger sections 1062a) is moved toward the +X direction and leave a position below substrate $P_2$, the pair of holding pads 1084b are moved only with a predetermined stroke in the Z-axis direction (toward the −Z direction) in a state of maintaining the holding by adsorption of substrate $P_2$ (the drawings such as FIG. 42b). According to this movement of holding pads 1084b, substrate $P_2$ is placed onto substrate holder 1028 (the drawings such as FIG. 43b). Accordingly, the pair of substrate carry-in bearer devices 1082b assist the carry-in operation of substrate P by substrate carry-in device 1060 described above (see the drawings such as FIG. 27).

Note that the configurations of substrate carry-out bearer devices 1082a and substrate carry-in bearer devices 1082b can be changed as needed. For example, although each of bearer devices 1082a and 1082b is attached to substrate table 1024 in the present embodiment, this is not intended to be limiting, and for example, the bearer devices may be attached to substrate holder 1028 or an XY stage device (not illustrated) for driving substrate table 1024 within the XY plane. Further, the positions and the number of bearer devices 1082a and 1082b are not limited to those of the present embodiment, and for example, the bearer devices may be attached to the side surface on the +Y side and the side surface on the −Y side of substrate table 1024.

In liquid crystal exposure apparatus 1010 (see FIG. 27) configured as described above, under the control of the main controller (not illustrated), mask M is loaded onto mask stage 14 by a mask loader (not illustrated) and also substrate P is loaded onto substrate holder 1028 by substrate exchange device 1040. After that, the main controller implements alignment measurement using an alignment detection system (not illustrated), and after the alignment measurement is finished, the exposure operations of a step-and-scan method are sequentially performed with respect to a plurality of shot areas set on substrate P. Since the exposure operations are similar to exposure operations of a step-and-scan method that have been conventionally performed, the detailed description thereof will be omitted. Then, substrate P to which the exposure processing is finished is carried out from substrate holder 1028 by substrate exchange device 1040 and another substrate P to be exposed next is carried to substrate holder 1028, and thereby the exchange of substrate P on substrate holder 1028 is performed, and the exposure operations and the like are continuously performed with respect to a plurality of substrates P.

The exchange operations of substrate P (for the sake of convenience, a plurality of substrates P are referred to as a substrate $P_1$, a substrate $P_2$ and a substrate $P_3$) on substrate holder 1028 in liquid crystal exposure apparatus 1010 will be described below using FIGS. 31a to 47b. The substrate exchange operations as described below are performed under the control of the main controller (not illustrated). Note that in each of side views used to explain the substrate exchange operations (the drawings such as FIGS. 31b and 32b), the illustration of balance beams 1052, finger sections 1062a of substrate carry-in hand 1062 and X-axis drive devices 1064 (see FIG. 30a for each of them) that are located on the further −Y side (the nearer side) than substrate carry-out device 1070 is omitted, in order to facilitate the understanding of the operations of substrate carry-out device 1070.

Further, in the description below, substrate $P_1$ that has been exposed is placed in advance on substrate holder 1028 of substrate stage device 1020, and the operations of carrying out the exposed substrate $P_1$ and then placing a new substrate $P_2$ (different from the substrate $P_1$) onto substrate holder 1028 will be described. Furthermore, it is assumed that before the substrate exchange operations, substrate carry-in hand 1062 that substrate exchange device 1040 has and beam unit 1050 are positioned so that the X-position of coupling member 1062b and the X-positions of the plurality of balance beams 1052 do not overlap with each other, as illustrated in FIGS. 30a and 30b.

As illustrated in FIGS. 31a and 31b, when the new substrate $P_2$ is transported to the port section by external carrier device 1100 (see arrows in the respective drawings for the operations of respective elements. The same applies hereinafter), substrate exchange device 1040 lowers (−Z drives) the substrate carry-in hand and positions the upper surface of substrate carry-in hand 1062 lower than the lower surface of the plurality of balance beams 1052. On this operation, the Z-position of the uppermost part of substrate carry-in hand 1062 including coupling member 1062b (the portion at the highest +Z position, e.g. the upper surface of coupling member 1062b) is set so that a spacing, which allows the insertion of the robot hand of external carrier device 1100, is formed in the Z-axis direction between the upper surfaces of the plurality of balance beams 1052 and the uppermost part of substrate carry-in hand 1062.

Further, beam unit 1050 is driven toward the +X direction. On this driving, beam unit 1050 is stopped at a position where leg 1054 on the +X side does not come into contact with coupling member 1062b of substrate carry-in hand 1062. Accordingly, parts (the +X side end vicinity parts) of the plurality of balance beams 1052 are positioned above (on the +Z side of) coupling member 1062b of substrate carry-in hand 1062. This position serves as the substrate devilry position between beam unit 1050 and external carrier device 1100.

Next, as illustrated in FIGS. 32a and 32b, the robot hand, on which substrate $P_2$ is placed, of external carrier device 1100 is moved toward the −X direction, and substrate $P_2$ is positioned in a space above (on the +Z side of) the plurality of balance beams 1052. On this operation, the Y-position of the robot hand of external carrier device 1100 is positioned so that each of the finger sections of the robot hand with a fork shape that external carrier device 1100 has passes between (does not come into contact with) a pair of balance beams 1052 adjacent to each other.

Further, as illustrated in FIGS. 33a and 33b, the robot hand of external carrier device 1100 descends, thereby delivering substrate $P_2$ onto the plurality of balance beams 1052. The Z-position of the robot hand of external carrier device 1100 is controlled so that the robot hand does not come into contact with substrate carry-in hand 1062 standing by below balance beams 1052. On this operation, the +X side end vicinity part of substrate $P_2$ protrudes toward +X side further than the +X side ends of the plurality of balance beams 1052. After that, the robot hand of external carrier device 1100 is driven toward the +X direction, thereby being withdrawn from the port section (from the inside of the liquid crystal exposure apparatus).

Further, in substrate exchange device 1040, alignment pad 1078 of substrate carry-out device 1070 is driven toward the −X direction below substrate $P_2$, and positioned at a position facing the center part of substrate $P_2$. In this state, alignment pad 1078 is driven upward (toward the +Z direction) and adsorbs and grips the lower surface of substrate $P_2$ between the pair of balance beams 1052 in the center.

After that, as illustrated in FIGS. 34a and 34b, pressurized gas is supplied to each of the plurality of balance beams 1052 of beam unit 1050, and the pressurized gas is jetted from the upper surface of each of the plurality of balance beams 1052 toward the lower surface of substrate $P_2$. Accordingly, substrate $P_2$ is levitated via a minute gap (e.g., of several tens micrometers to several hundreds micrometers) with respect to the plurality of balance beams 1052.

Here, in substrate exchange device 1040, a pre-alignment operation is performed on the plurality of balance beams 1052. The pre-alignment operation is performed, while the position of substrate $P_2$ is measured in a noncontact manner by a substrate position measurement device (not illustrated) that is disposed, for example, in each of a space above substrate $P_2$ and a space below substrate $P_2$. At the time of the pre-alignment operation, alignment pad 1078 that adsorbs and grips the center part of the lower surface of substrate $P_2$ is finely driven in the X-axis direction, the Y-axis direction and the θz direction (the directions of three degrees of freedom within the horizontal plane). Since substrate $P_2$ is supported in a noncontact manner by the plurality of balance beams 1052, the position correction (the fine positioning) of substrate $P_2$ in the directions of three degrees of freedom within the horizontal plane can be performed with low friction. Further, in parallel with this pre-alignment operation, alignment pad 1078 is driven toward the −X direction, and substrate $P_2$ is moved to the center part of the substrate placing surface formed by the plurality of balance beams 1052.

After that, as illustrated in FIGS. 35*a* and 35*b*, the supply of the pressurized gas to the plurality of balance beams 1052 is stopped and also the supply of the vacuum suction force to alignment pad 1078 is stopped. Further, alignment pad 1078 is driven downward so as to move apart from the lower surface of substrate $P_2$. Accordingly, substrate $P_2$ is placed onto the plurality of balance beams 1052. In this state, beam unit 1050 is driven toward the −X direction (toward the substrate stage device 1020 side). On this operation, substrate $P_2$ and the plurality of balance beams are positioned so that the +X side ends do not overlap with coupling member 1062*b* of substrate carry-in hand 1062 in the X-axis direction (do not overlap in the vertical direction).

In this state, as illustrated in FIGS. 36*a* and 36*b*, substrate carry-in hand 1062 is driven upward. Accordingly, substrate $P_2$ on the plurality of balance beams 1052 is scooped out from below to above, by substrate carry-in hand 1062 (delivered to substrate carry-in hand 1062).

Further, in parallel with the foregoing delivery operation of substrate $P_2$ from external carrier device 1100 to substrate carry-in hand 1062 via beam unit 1050 (including the pre-alignment operation), substrate table 1024 is driven toward the +X direction so that substrate holder 1028 on which the exposed substrate $P_1$ is placed is located at a predetermined substrate exchange position (a substrate delivery position) in substrate stage device 1020. In the present embodiment, the substrate exchange position is a position on the −X side of the port section. Note that, although substrate holder 1028 is illustrated to be at the same position in FIGS. 31*a* to 35*b* in order to facilitate the understanding, actually the exposure operation with respect to substrate $P_1$ is performed in parallel with the foregoing delivery operation of substrate $P_2$ from external carrier device 1100 to substrate carry-in hand 1062, and substrate holder 1028 is being moved within the XY plane.

Further, in parallel with the movement operation of substrate holder 1028 to the substrate exchange position, the respective holding pads 1084*a* of the pair of substrate carry-out bearer devices 1082*a* disposed on the +X side of substrate holder 1028 are driven upward. Holding pads 1084*a* adsorb and grip, from the back surface, a part (portions placed on cutouts 1028*a* (see FIGS. 29*a* and 29*b*)) of substrate $P_1$ held by vacuum adsorption on the upper surface of substrate holder 1028.

Figure 37A:
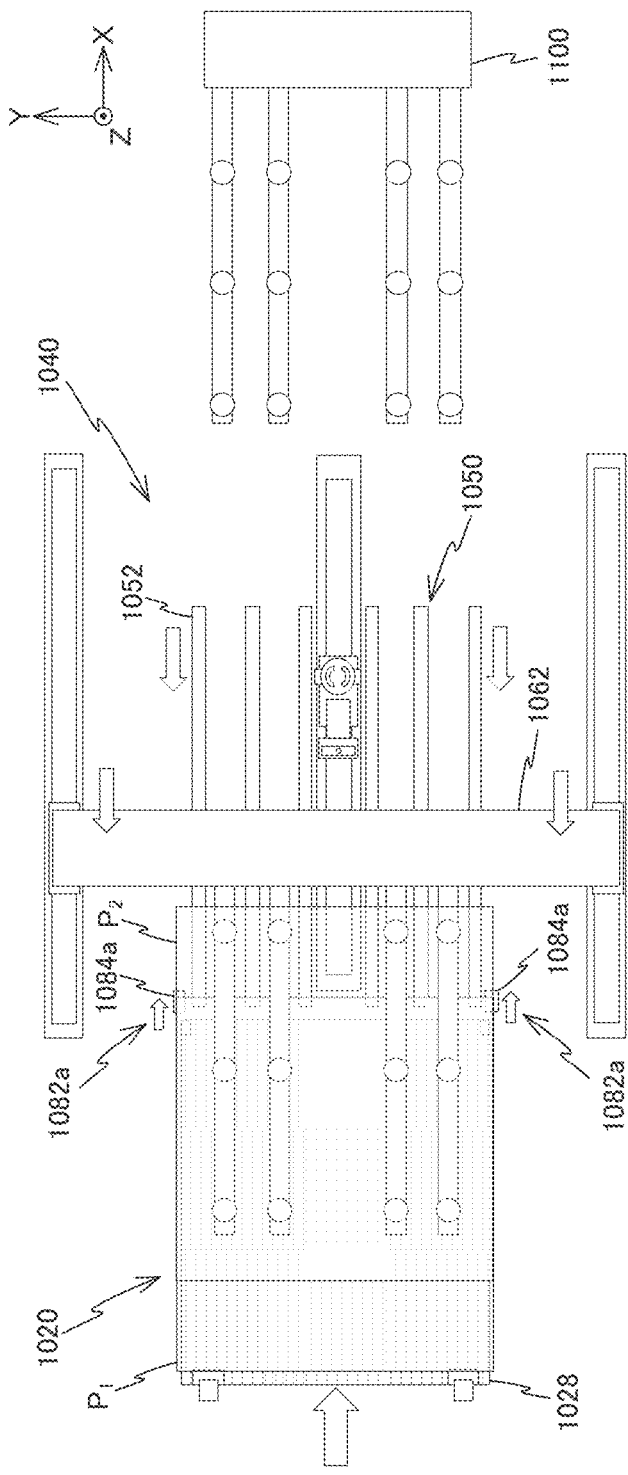
FIGS. 37*a* and 37*b* are a plan view and a side view of the liquid crystal exposure apparatus, respectively, used to explain a substrate exchange operation (No. 7).
Figure 37B:
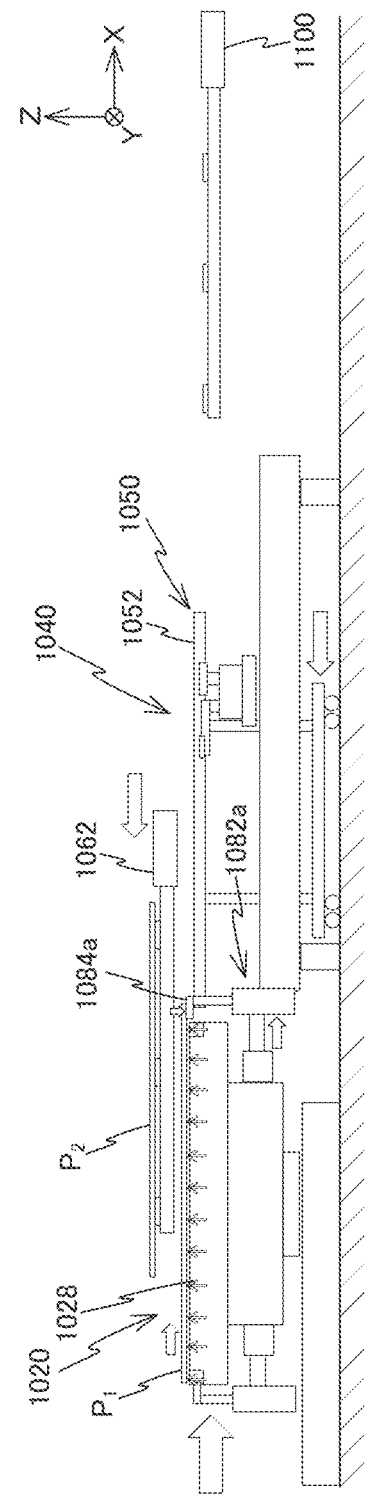

After that, as illustrated in FIGS. 37*a* and 37*b*, substrate carry-in hand 1062 supporting substrate $P_2$ from below is driven toward the −X direction. Accordingly, substrate $P_2$ is carried toward a space above substrate holder 1028 positioned at the substrate exchange position. Further, in substrate exchange device 1040, beam unit 1050 is driven toward the −X direction (a direction for coming close to substrate holder 1028). Beam unit 1050 is stopped at a predetermined position so that the −X side end of each of the plurality of balance beams 1052 and substrate holder 1028 do not come into contact with each other. As is described above, the Z-position of the upper surface of each of the plurality of balance beams 1052 and the Z-position of the upper surface of substrate holder 1028 are set to be almost the same height.

Further, in substrate stage device 1020, the pressurized gas is jetted from the upper surface of substrate holder 1028 to the lower surface of substrate $P_1$. Accordingly, substrate $P_1$ is levitated from the upper surface of substrate holder 1028, and the friction between the lower surface of substrate $P_1$ and the upper surface of substrate holder 1028 is reduced to the level that can be ignored (the low friction state).

Moreover, in substrate stage device 1020, holding pads 1084*a* of substrate carry-out bearer devices 1082*a* are slightly driven upward toward the +Z direction so as to follow the foregoing levitation operation of substrate $P_1$, and are also driven with a predetermined stroke toward the +X direction (toward the port section side) in a state of adsorbing and gripping the part of substrate $P_1$. Although the movement amount of holding pads 1084*a* (i.e. substrate $P_1$) also varies depending on the size of substrate $P_1$, the movement amount is set to, for example, about 50 mm to 100 mm. Accordingly, the +X side end vicinity part of substrate $P_1$ protrudes (overhangs) from the +X side end of substrate holder 1028 toward the +X direction (toward the port section side). Here, the foregoing portion of substrate $P_1$ protruding from substrate holder 1028 is supported from below by the −X side end vicinity parts of the plurality of balance beams 1052, and therefore it is favorable that the pressurized gas is jetted beforehand also from balance beams 1052 when causing substrate $P_1$ to overhang from substrate holder 1028.

Figure 38A:
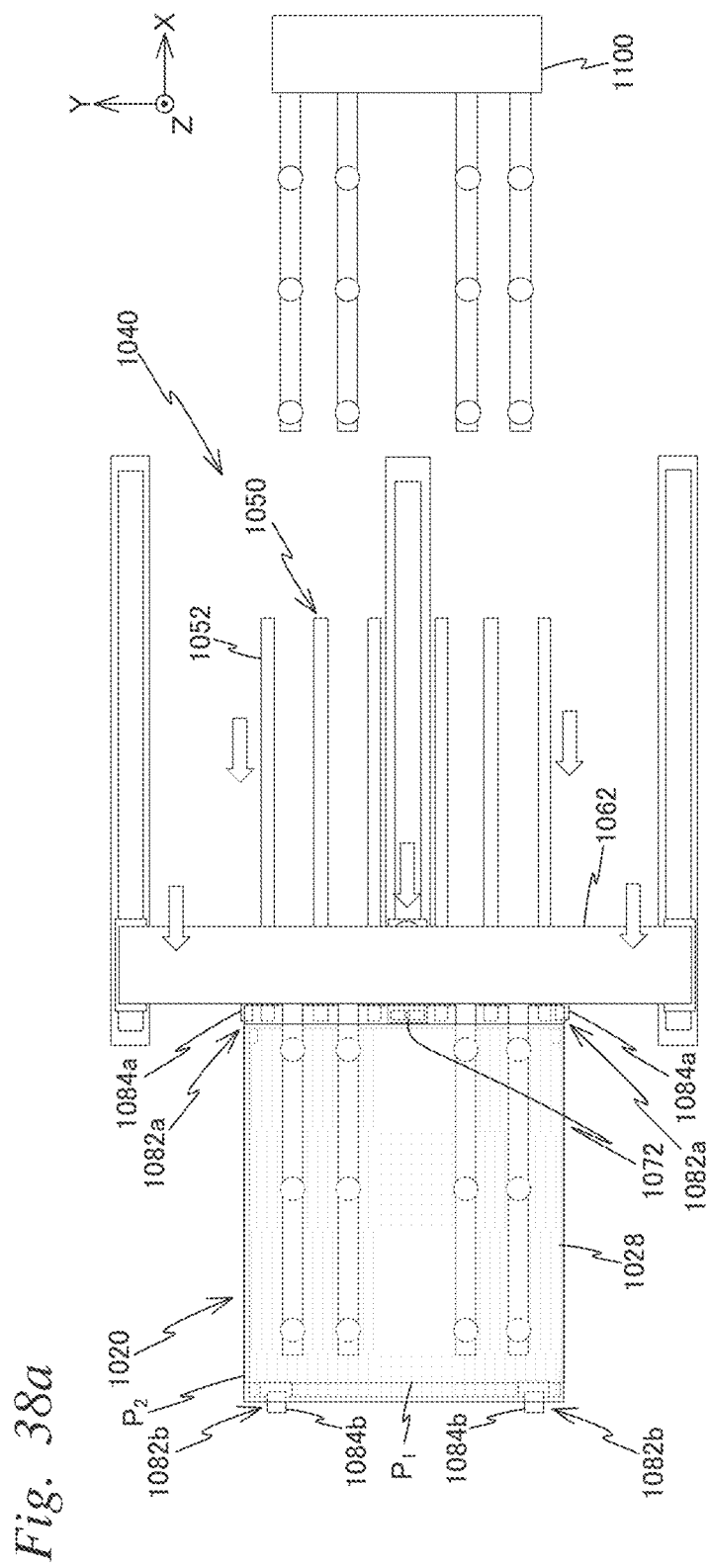
FIGS. 38*a* and 38*b* are a plan view and a side view of the liquid crystal exposure apparatus, respectively, used to explain a substrate exchange operation (No. 8).
Figure 38B:
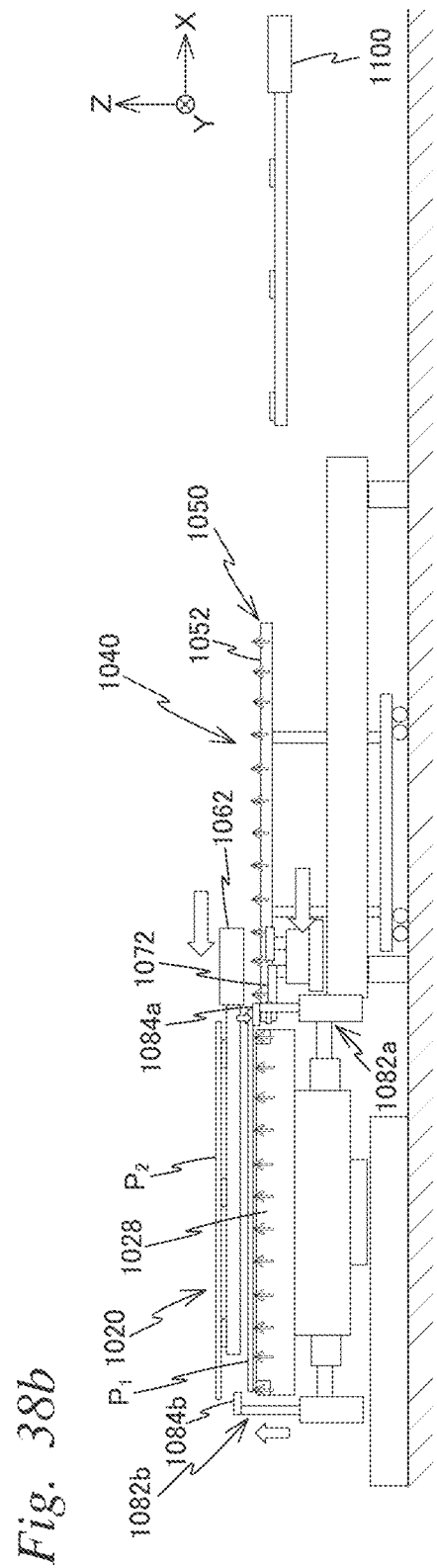

As illustrated in FIGS. 38*a* and 38*b*, substrate carry-in hand 1062 supporting substrate $P_2$ from below is stopped at a predetermined position in a space above substrate holder 1028. At this stop position, substrate $P_2$ is located almost directly above substrate holder 1028 positioned at the substrate exchange position. Further, substrate stage device 1020 performs the positioning of substrate holder 1028 so that the Y-position of substrate $P_1$ and the Y-position of substrate $P_2$ almost coincide with each other. In contrast, the X-position of substrate $P_1$ and the X-position of substrate $P_2$ are different at the stop position described above by the quantity overhanging from substrate holder 1028 of the +X side end vicinity part of substrate $P_1$, and the −X side end of substrate $P_2$ protrudes toward the −X side further than the −X side end of substrate $P_1$.

In parallel with the positioning of substrate carry-in hand 1062, substrate carry-out hand 1072 is driven toward the −X direction and is positioned below the portion of substrate $P_1$ overhanging from substrate holder 1028 toward the +X side, in substrate carry-out device 1070. Furthermore, in substrate stage device 1020, the respective holding pads 1084*b* of the pair of substrate carry-in bearer devices 1082*b* are driven upward with a predetermined stroke (e.g. about 50 mm to 100 mm).

As illustrated in FIGS. 39*a* and 39*b*, holding pads 1084*b* of substrate carry-in bearer devices 1082*b* come into contact, from below, with substrate $P_2$ on substrate carry-in hand 1062 that stands by above substrate holder 1028, and adsorb and hold the −X side end vicinity part of substrate $P_2$.

Further, in parallel with the adsorbing and holding operation of substrate $P_2$ by holding pads 1084*b*, in substrate carry-out device 1070, substrate carry-out hand 1072 is driven upward, and grips by vacuum adsorption the portion, overhanging from substrate holder 1028 toward the +X side, of the exposed substrate $P_1$, from the back surface. And, when substrate carry-out hand 1072 adsorbs and grips substrate $P_1$, the supply of the vacuum suction force to the respective holding pads 1084*a* of the pair of substrate carry-out bearer devices 1082*a* is stopped. Accordingly, the gripping by adsorption of substrate $P_1$ by holding pads 1084*a* is released. Holding pads 1084*a* are driven downward so as to move apart from the back surface of substrate $P_1$.

Note that, in the present embodiment, in order for substrate carry-out hand 1072 to adsorb and grip the center part of the +X side end vicinity part of the exposed substrate $P_1$ from the back surface, substrate $P_1$ is caused to overhang (be offset) from substrate holder 1028 using substrate carry-out bearer devices 1082*a*, but this is not intended to be limiting. Substrate carry-out hand 1072 may adsorb and grip substrate $P_1$ without causing substrate $P_1$ to be offset, by forming a cutout open toward the +Z side and the +X side, at the +X side end vicinity part of the upper surface of substrate holder 1028, and by inserting substrate carry-out hand 1072 into the cutout.

After that, as illustrated in FIGS. 40*a* and 40*b*, substrate carry-out hand 1072 is driven toward the +X direction in a state of holding substrate $P_1$. Accordingly, substrate $P_1$ is moved from substrate holder 1028 onto beam unit 1050 (the plurality of balance beams 1052). On this operation, the pressurized gas is jetted from the upper surface of each of the plurality of balance beams 1052. Accordingly, substrate $P_1$ is levitated and carried in a noncontact state on substrate holder 1028 and beam unit 1050 (except for the portion held by substrate carry-out hand 1072). Further, holding pads 1084*a* of the pair of substrate carry-out bearer devices 1082*a* are driven toward the −X direction so that the respective parts of holding pads 1084*a* are accommodated in cutouts 1028*a* of substrate holder 1028 (see FIGS. 29*a* and 29*b*).

Further, in parallel with the foregoing carry-out operation of substrate $P_1$ from substrate holder 1028 by substrate carry-out hand 1072, supporting pads 1062*c* of substrate carry-in hand 1062 jet the pressurized gas to the lower surface of substrate $P_2$, in substrate carry-in device 1060. Accordingly, substrate $P_2$ comes into a levitated (or semi-levitated) state on substrate carry-in hand 1062.

FIGS. 41*a* and 41*b* show a state where substrate $P_1$ has been completely carried out (delivered) from substrate holder 1028 onto beam unit 1050 by substrate carry-out hand 1072. Here, even after substrate $P_1$ has been carried out from substrate holder 1028, substrate holder 1028 continues to jet the pressurized gas.

In parallel with this carry-out operation of substrate $P_1$, substrate carry-in hand 1062 is driven toward the +X direction at high speed and high acceleration (e.g. 1G or more) and is withdrawn from below substrate $P_2$, in substrate carry-in device 1060. When substrate carry-in hand 1062 is withdrawn from below substrate $P_2$, substrate $P_2$ is left above substrate holder 1028 because the −X side end vicinity part of substrate $P_2$ is adsorbed and gripped by a pair of holding pads 1084*b*.

Here, since substrate carry-in bearer devices 1082*b* are disposed, spaced apart in the Y-axis direction and adsorb and hold the two points, spaced apart in the Y-axis direction, of the −X side end of substrate P, it can be said that the movement direction at the time of withdrawn of substrate carry-in hand 1062 is a direction opposed to substrate carry-in bearer devices 1082*b*. The "direction opposed to substrate carry-in bearer devices 1082*b*" roughly means a direction on an opposite side (which is the +X side in this case) to the end (on the −X side in this case) of substrate P adsorbed and held by substrate carry-in bearer devices 1082*b*.

Then, as illustrated in FIGS. 42*a* and 42*b*, when substrate carry-in hand 1062 has been completely withdrawn from below substrate $P_2$, substrate $P_2$ starts free fall due to the gravity (the self-weight) except for the portions adsorbed and gripped by holding pads 1084*b*. On this free-fall, sudden drop of substrate $P_2$ is hindered by air resistance between the back surface of substrate $P_2$ and the upper surface of substrate holder 1028, and therefore, substrate $P_2$ falls onto substrate holder 1028 slowly (with an acceleration smaller than the gravitational acceleration). Further, in parallel with the falling operation of substrate $P_2$, also the respective holding pads 1084*b* of the pair of substrate carry-in bearer devices 1082*b* simultaneously descend (are moved toward the −Z direction).

The means of lowering holding pads 1084*b* is not particularly limited, and for example, position control in the Z-axis direction may be performed using a drive device such as a motor, or burden control in the Z-axis direction (e.g., control that causes a force of raising holding pads 1084*b* (a force toward the +Z direction) against the gravity force to be smaller than a downward force (a force toward the −Z direction) due to the self-weight of substrate P) may be performed using an air cylinder or the like. Further, holding pads 1084*b* are caused to fall freely together with substrate $P_2$, by releasing (nulling) a force toward the +Z direction acting on holding pads 1084*b* of substrate carry-in bearer devices 1082*b* after adsorbing and gripping the back surface of substrate $P_2$.

In parallel with the foregoing carry-in operation of substrate $P_2$ using substrate carry-in bearer devices 1082*b*, each of the plurality of balance beams 1052 stops the jet of the pressurized gas. Further, substrate carry-out device 1070 releases the holding by adsorption of substrate $P_1$ with substrate carry-out hand 1072 (not illustrated in FIG. 42*a*), and also drives substrate carry-out hand 1072 downward to move apart from the back surface of substrate $P_1$. Accordingly, substrate $P_1$ is placed on the plurality of balance beams 1052. Also after delivering substrate $P_2$ to substrate holder 1028, substrate carry-in hand 1062 is driven toward the +X direction (the substrate carry-in hand may be decelerated after being withdrawn from below substrate $P_1$).

Figure 48:
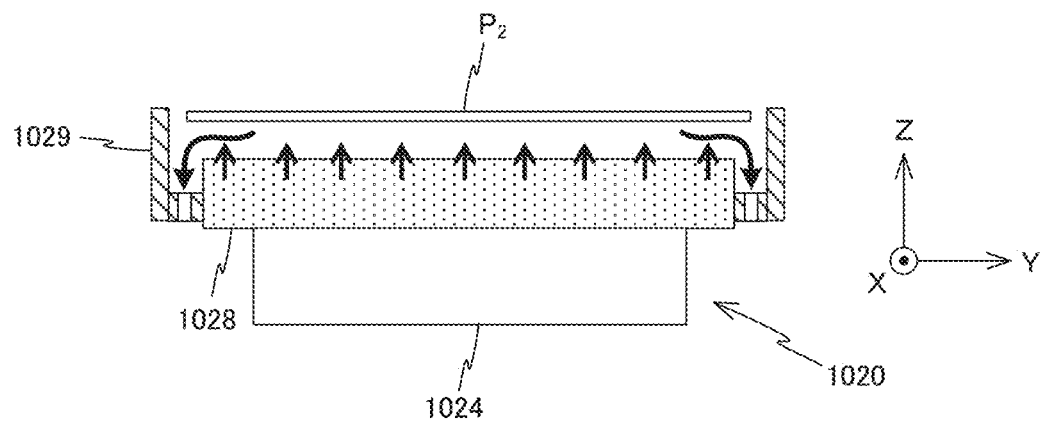
FIG. 48 is a view used to explain the third embodiment.

Note that, on the foregoing carry-in operation (free fall) of substrate $P_2$ to substrate holder 1028, as illustrated in FIG. 48, a frame-shaped member 1029 (or a control wall) that surrounds the outer periphery of substrate holder 1028 and has the height position (the position in the Z-axis direction) set higher than the upper surface of substrate holder 1028 may be disposed, thereby preventing air between substrate $P_2$ and substrate holder 1028 from easily escaping (thereby forming air stagnation) and adjusting the falling velocity of substrate $P_2$. Note that the generation of the foregoing air stagnation may be positively controlled by controlling the jet of the air from the upper surface of substrate holder 1028 and the suction of the air.

FIGS. 43*a* and 43*b* show a state where the respective holding pads 1084*b* of the pair of substrate carry-in bearer devices 1082*b* descend, and the parts thereof are inserted in cutouts 1028*b* (see FIG. 29*a*) of substrate holder 1028. Here, substrate $P_2$ (except for the portions gripped by holding pads 1084*b*) naturally falls due to the self-weight onto substrate holder 1028, but the pressurized gas is jetted from the upper surface of substrate holder 1028 and the back surface of substrate $P_2$ that has descended does not come into contact with the upper surface of substrate holder 1028 by the static pressure of the pressurized gas. Accordingly, a state where substrate $P_2$ is levitated above substrate holder 1028 via a minute gap is kept.

In this state, the position of substrate $P_2$ relative to substrate stage device 1020 (or substrate holder 1028) is measured by a substrate position measurement device (not illustrated) provided at substrate stage device 1020 (substrate holder 1028 or substrate table 1024) or provided external to substrate stage device 1020. On the basis of the measurement result, the respective holding pads 1084*b* of the pair of substrate carry-in bearer devices 1082*b* are independently driven in the X-axis direction. Accordingly, the position of substrate $P_2$ relative to substrate stage device 1020 (or substrate holder 1028) in the X-axis direction and the θz direction is corrected.

In parallel with the foregoing position correction operation (the fine alignment operation) of substrate $P_2$, beam unit 1050 on which substrate $P_1$ is placed is driven toward the +X direction and also alignment pad 1078 of substrate carry-out device 1070 is driven toward the −X direction to be positioned at a position facing the center of substrate $P_1$, in the port section.

After that, as illustrated in FIGS. 44*a* and 44*b*, the jet of the pressurized gas from substrate holder 1028 is stopped and substrate $P_2$ lands on (comes into contact with) the upper surface of substrate holder 1028. In this manner, in the present embodiment, the accurate positioning (the fine alignment) of substrate $P_2$ is performed in a low friction (levitated) state immediately before landing substrate $P_2$ on substrate holder 1028, and therefore, it is not necessary to take into account the falling (landing) position and/or the attitude of substrate $P_2$ when substrate $P_2$ falls, and in addition, there is no risk that it becomes necessary to perform the re-placement (re-loading) of substrate $P_2$ after the landing of substrate $P_2$.

Further, since the falling operation of substrate $P_2$ is tentatively stopped at a position in a space above substrate holder 1028 with a minute gap (e.g., of several tens micrometers to several hundreds micrometers) formed between substrate $P_2$ and substrate holder 1028, local air stagnation is prevented from generating between substrate $P_2$ and substrate holder 1028. Consequently, when causing substrate holder 1028 to hold substrate $P_2$, the deformation of substrate $P_2$ can be suppressed. Note that, when substrate $P_2$ is placed onto substrate holder 1028, the deformation of substrate $P_2$ may be suppressed by controlling the location or the time of stopping the jet of the pressurized gas from substrate holder 1028, and further by using together the vacuum suction of substrate $P_2$ from substrate holder 1028.

Note that, in substrate carry-in bearer devices 1082*b*, holding pads 1084*b* may be configured finely drivable in the Y-axis direction so that the positioning (the fine alignment) in the Y-axis direction of substrate $P_2$, serving as a carry-in target, relative to substrate holder 1028 can be performed. Further, in the present embodiment, holding pads 1084*b* are configured to be driven only in the X-direction within the horizontal plane. However, actually, holding pads 1084*b* are finely displaceable in the θz direction and the Y-axis direction relative to the support column of Z actuator 1086*z* (see FIG. 29*b*) by an elastic deformation or the like, though not illustrated, so that substrate $P_2$ is finely rotatable in the θz direction.

In substrate stage device 1020, when substrate $P_2$ is placed onto substrate holder 1028, substrate holder 1028 adsorbs and holds substrate $P_2$ and moves to a predetermined exposure starting position. The description of operations of substrate stage device 1020 at the time of exposure operations with respect to substrate $P_2$ will be omitted.

Further, in parallel with the foregoing adsorbing and holding operation of substrate $P_2$ by substrate holder 1028, alignment pad 1078 is driven upward, and adsorbs and grips the center part of the back surface of substrate $P_1$ from below, in substrate carry-out device 1070. Further, when alignment pad 1078 adsorbs and grips substrate $P_1$, the pressurized gas is jetted from each of the plurality of balance beams 1052, and accordingly substrate $P_1$ is levitated on the plurality of balance beams 1052. After that, substrate $P_1$ is moved to the substrate exchange position with respect to external carrier device 1100 by driving alignment pad 1078 toward the +X direction. At this time, the position within the horizontal plane (the position in the X-axis direction and the Y-axis direction and the attitude in the θz direction) of substrate $P_1$ may be corrected by alignment pad 1078, at a predetermined location.

FIGS. 45*a* and 45*b* show a state where substrate $P_1$ is positioned at the substrate exchange position with respect to external carrier device 1100. At the substrate exchange position, alignment pad 1078 of substrate carry-out device 1070 releases the holding by adsorption of substrate $P_1$, and is driven downward so as to move apart from substrate $P_1$.

After that, the robot hand of external carrier device 1100 is moved toward the −X direction at the height position lower than the upper surfaces of the plurality of balance beams 1052, and ascends to scoop out substrate $P_1$ from below, on the plurality of balance beams 1052. The plurality of balance beams 1052 stop the jet of the pressurized gas.

As illustrated in FIGS. 46*a* and 46*b*, the robot hand of external carrier device 1100 holding the exposed substrate $P_1$ is moved toward the +X direction to leave the port section.

In the port section, in order to avoid the contact with substrate carry-in hand 1062, beam unit 1050 (the plurality of balance beams 1052) is moved toward the −X direction, and then substrate carry-in hand 1062 is driven downward.

After the exposed substrate $P_1$ is delivered to an external device (not illustrated) such as, for example, a coater/developer, the robot hand of external carrier device 1100 holding substrate $P_3$ to be exposed next to substrate $P_2$ is moved toward the port section, as illustrated in FIGS. 47*a* and 47*b*. Further, in the port section, substrate carry-in hand 1062 is moved to a position lower than the plurality of balance beams 1052, and the plurality of balance beams 1052 are moved toward the +X direction and are positioned at the substrate receipt position for receiving substrate $P_3$ from the robot hand of external carrier device 1100. Accordingly, the state returns to the initial state as shown in FIGS. 31*a* and 31*b*.

According to the present embodiment described so far, substrate P is carried in onto substrate stage device 1020 by causing substrate P serving as a carry-in target to freely fall, and therefore the apparatus configuration is simple, compared to the case of using, for example, a device (e.g. a lift pin device or the like) for receiving substrate P from substrate carry-in device 1060. Further, since the operations of movable members at the time of substrate delivery operations from substrate carry-in device 1060 to substrate holder 1028 are fewer, it becomes possible to swiftly perform the carry-in of substrate P. In addition, since the dust generation can be suppressed, compared to the case of, for example, using the lift pin device or the like, the adhesion of dust to substrate P can be suppressed.

Further, in substrate stage device 1020, a device such as, for example, the lift pin device used to receive substrate P from substrate carry-in device 1060, or a hole section (or a recessed section) for accommodating a member (such as a so-called substrate tray) on which substrate P is placed at the time of carrying substrate P do not have to be formed at substrate holder 1028. Consequently, almost the entire surface of the upper surface of substrate holder 1028 can be flattened except for minute hole sections for jetting gas and suctioning gas. Accordingly, the flatness correction of substrate P placed on substrate holder 1028 can be reliably performed, and the exposure accuracy is improved. Further, since the hole section or the recessed section does not have to be formed on substrate holder 1028, the change in reflectivity and in reflection quantity of exposure beams caused by the hole section or the recessed section can be suppressed. Consequently, uneven transfer of the mask pattern with respect to substrate P can be suppressed.

Further, when substrate P serving as a carry-in target is fallen freely, the position of substrate P within the horizontal plane is restrained by the pair of substrate carry-in bearer devices 1082b provided separately from substrate carry-in device 1060 that supported substrate P at the time of substrate carry-in, and therefore, the positional shift of substrate P within the horizontal plane due to influence of air resistance at the time of free fall can be suppressed. Consequently, substrate P can be fallen onto substrate holder 1028 without fail.

Further, before substrate P is placed onto substrate holder 1028, the free fall of substrate P is stopped once, and therefore, the generation of the so-called air stagnation between substrate P and substrate holder 1028 and the deformation of substrate P caused by the air stagnation can be suppressed when substrate holder 1028 is made to adsorb and hold substrate P. In addition, when substrate P is fallen onto substrate holder 1028, substrate holder 1028 functions like an air bearing, and therefore the impact at the time of falling can be suppressed.

Further, before substrate P is placed onto substrate holder 1028, the positioning of the substrate with respect to substrate holder 1028 is performed by the pair of substrate carry-in bearer devices 1082b, and therefore, the possibility can be reduced that it becomes necessary (e.g., due to the shift of the placement position) to perform the re-placement (re-loading) of substrate P once placed on substrate holder 1028. Consequently, the carry-in operation speed of substrate P is improved, and the overall throughput is improved.

Further, in recent years, the thickness and the weight of substrate P have tended to be reduced. When substrate P is made thinner and lighter in weight, a downward force in the gravity direction acting on substrate P is decreased, and therefore, the impact applied when substrate P is freely fallen by the self-weight and delivered to substrate holder 1028 can be reduced. In this manner, substrate exchange device 1040 related to the present embodiment is particularly suitable for the exchange of a large size substrate P that is made thinner and lighter in weight. Note that, in the present embodiment, the sudden drop of substrate P is suppressed by air resistance acting on substrate P at the time of falling, and thus the impact applied when substrate P is placed onto substrate holder 1028 is suppressed, and therefore it is preferable that the upper surface of substrate holder 1028 has a lot of flat areas on which any recessed sections, hole sections and the like are not formed.

Note that the configuration of the third embodiment described above can be changed as needed. For example, in the third embodiment described above, as illustrated in FIG. 29a, cutouts 1028a are formed on the +X side of substrate holder 1028 and the parts of holding pads 1084a of substrate carry-out bearer devices 1082a are accommodated in cutouts 1028a. However, the configuration is not limited thereto, and for example, substrate carry-out bearer devices 1082a may be omitted, and the pair of substrate carry-in bearer devices 1082b disposed on the −X side of substrate holder 1028 may assist the substrate carry-out operation.

That is, in the exchange operations of substrate P on substrate holder 1028 related to a present modified example, first of all, substrate carry-in bearer devices 1082b grip substrate P and move substrate P toward the +X direction in a noncontact manner on substrate holder 1028, and causes substrate P to be offset (overhang) from substrate holder 1028 (see FIGS. 37a and 37b), then the jet of the pressurized gas from substrate holder 1028 is stopped, and substrate P is placed onto substrate holder 1028 again. Substrate carry-in bearer devices 1082b release the adsorption of substrate P and slightly descend, and are again moved toward the −X direction, and then ascend high and adsorb and grip a new substrate P, from below, that stands by in a space above substrate holder 1028. In substrate carry-out device 1070, substrate carry-out hand 1072 adsorbs and grips the end vicinity part of substrate P, from below, placed and offset on substrate holder 1028 (see FIGS. 38a and 38b). After that, the pressurized gas is jetted from substrate holder 1028 and balance beams 1052, and substrate P except for the portion gripped by substrate carry-out hand 1072 is carried out to the port section in a noncontact state. In this manner, according to the present modified example, since substrate carry-out bearer devices 1082a are omitted (an assist device for substrate carry-in and an assist device for substrate carry-out are made common), the structure becomes simple and the cost can be reduced.

Further, alignment pad 1078 may be capable of rotating substrate P in the θz direction, for example, at a 90 degree angle. In this case, in the port section, the orientation of substrate P can be changed (the longitudinal direction can be parallel to the X-axis or the Y-axis) using alignment pad 1078, and therefore, for example, substrate P that is carried, in a state where the longitudinal direction is parallel to the X-axis (the laterally long state), from external carrier device 1100, can be rotated at, for example, a 90 degree angle to come into a state where the longitudinal direction is parallel to the Y-axis (a longitudinally long state). Consequently, when substrate P is carried into substrate stage device 1020, carrying in substrate P in the laterally long state or carrying in substrate P in the longitudinally long state can be arbitrarily selected. Also, substrate P carried in the longitudinally long state to the port section by external carrier device 1100 can be rotated at, for example, a 90 degree angle to come into the laterally long state in the port section. In this case, the finger sections of the robot hand of external carrier device 1100 can be shortened.

Further, in the third embodiment described above, the two points disposed spaced apart in the Y-axis direction of substrate P are held using the respective holding pads 1084b of the pair of substrate carry-in bearer devices 1082b disposed spaced apart in the Y-axis direction, but the held points of substrate P are not limited thereto and, for example, one point of substrate P may be held by one holding pad 1084b. In this case, in order to secure the contact area between holding pad 1084b and substrate P, the holding surface of holding pad 1084b should be formed into a shape extending in the Y-axis direction.

Further, although substrate carry-in bearer devices 1082b are configured to restrain (hold) the −X direction side end of substrate P in the third embodiment described above, the restrained (held) part is not limited thereto. For example, substrate carry-in bearer devices 1082b may be configured to restrain (hold) the +Y direction side end and/or the −Y direction side end of substrate P, or the corner between the −X direction side end and the +Y direction side end and/or the corner between the −X direction side end and the −Y direction side end. The point (the location) of substrate P restrained by substrate carry-in bearer devices 1082b may be any one of the ends described above or the corners described above, or any combination thereof, as far as the part (the location) can be set so as not to obstruct the operations of substrate carry-out bearer devices 1082a, substrate carry-out device 1070 and substrate carry-in device 1060.

Further, although the respective holding pads 1084b of the pair of substrate carry-in bearer devices 1082b are accommodated in the corresponding cutouts 1028b in the third embodiment described above, this is not intended to be limiting, and for example, holding pads 1084b may adsorb and hold a portion, sticking out from the end vicinity part of substrate holder 1028, of substrate P beforehand. In this case, cutouts 1028b need not be formed at substrate holder 1028. Note that, since an area of the sticking-out portion referred to above is small, the holding surface of holding pad 1084b should be formed into a shape extending in the Y-axis direction in order to secure the contact area between holding pad 1084b and substrate P. Further, when substrate P is placed onto the upper surface of substrate holder 1028, holding pads 1084b may be inserted between the back surface of substrate P and the upper surface of substrate holder 1028, and then holding pads 1084b may pulled out. In this case as well, cutouts 1028b need not be formed at substrate holder 1028. On this operation, it is favorable that a part of substrate P is adsorbed and held beforehand to prevent substrate P from being moved when holding pad 1084b is pulled out.

Although in the third embodiment described above, substrate P serving as a carry-out target is made into an offset state (a state where a part of substrate P protrudes from substrate holder 1028) by substrate carry-out bearer devices 1082a, this is not intended to be limiting, and substrate holder 1028 may be tilted around the Y-axis to incline the upper surface of substrate holder 1028, and substrate P may be made into the offset state by the self-weight. Further, substrate carry-out device 1070 holds the offset end vicinity part of substrate P and carries out substrate P, but substrate carry-out device 1070 may adsorb and hold the portion sticking out from the end vicinity part of substrate holder 1028 beforehand. Further, the operation of causing substrate P to be into the offset state by substrate carry-out bearer devices 1082a may be performed in the midst of substrate holder 1028 moving toward the substrate exchange position (in parallel with the movement of substrate holder 1028).

Further, in the third embodiment described above, substrate carry-in device 1060 carries substrate P using substrate carry-in hand 1062 that supports substrate P from below in the gravity direction. The configuration of a carrier device for carry-in is not limited thereto, however, as far as the free fall of substrate P at the time of carriage can be prevented, and substrate P may be carried while being supported in a suspended manner from above in the gravity direction, for example, using a Bernoulli chuck known to public or the like. In this case, it is possible to cause substrate P to fall due to the self-weight, by releasing the support in a suspended manner of substrate P by the Bernoulli chuck.

Note that, also in the case of using this Bernoulli chuck method, a certain carrier assist mechanism is needed that takes place of substrate carry-in bearer devices 1082b in the embodiment described above, in order to restrain the position of substrate P within the XY plane in a space above substrate holder 1028. As this carrier assist mechanism, for example, a wall member for physically restricting the side surface of substrate P may be configured on the periphery of the Bernoulli chuck. Alternatively, a mechanism that blows air for position restraint within the XY plane against the side surface of substrate P may be provided at the Bernoulli chuck.

Further, in the operation sequences at the time of substrate exchange in the third embodiment described above, the description has been made assuming that after the driving of substrate carry-out hand 1072 toward the +X direction (a carry-out operation of substrate $P_1$ from substrate holder 1028 by substrate carry-out hand 1072, which is referred to as a "pulling-out operation" of substrate carry-out hand 1072) is started, the driving of substrate carry-in hand 1062 toward the +X direction (a withdrawal operation from below substrate $P_2$ of substrate carry-in hand 1062, in other words, a carry-in operation of substrate $P_2$ to substrate holder 1028 by substrate carry-in hand 1062, which is referred to as "pulling-out operation" of substrate carry-in hand 1062) is started, as illustrated in FIGS. 40 to 42. However, the timing for these pulling-out operations is not limited thereto. As far as the operation timing is controlled so that substrate $P_2$ that falls due to the self-weight entailed by the foregoing pulling-out operation of substrate carry-in hand 1062 does not come into contact with both hands 1062 and 1072 and substrate $P_1$, either one of the foregoing puling-out operation of hand 1062 and the foregoing puling-out operation of hand 1072 may be started first or the puling-out operations of both hands 1062 and 1072 may be started simultaneously.

Further, although in the third embodiment described above, substrate holder 1028 is configured to adsorb and hold substrate P, the configuration is not limited thereto, and for example, the substrate holder may hold substrate P in a noncontact state.

Further, although in the third embodiment described above, substrate carry-in bearer devices 1082b for restraining the position of substrate P within the XY plane in a space above substrate holder 1028 are equipped in substrate holder 1028 (substrate stage device 1020), this is not intended to be limiting, and for example, substrate carry-in device 1060 may have substrate carry-in bearer devices 82b. Alternatively, above the substrate exchange position, for example, substrate carry-in bearer devices 1082b may be supported in a suspended manner by a frame member that configures a chamber for accommodating substrate stage device 1020 and the like.

Further, although in the third embodiment described above, after the robot hand of external carrier device 1100 delivers substrate P serving as a carry-in target to the port section, substrate carry-in device 1060 carries substrate P to a space above substrate holder 1028. However, this is not intended to be limiting, and the robot hand of external carrier device 1100 carries substrate P serving as a carry-in target to a space above substrate holder 1028 and delivers substrate P directly to substrate carry-in bearer devices 1082b.

Fourth Embodiment

Next, a liquid crystal exposure apparatus related to a fourth embodiment will be described using FIGS. 49a to 56b. In the present fourth embodiment, in the exchange operations of substrates in a liquid crystal exposure apparatus having a substrate stage device with a configuration similar to substrate stage device 20 (see the drawings such as FIG. 2) related to the first embodiment described above, a substrate exchange device with a configuration similar to substrate exchange device 1040 (see the drawings such as FIG. 27) in the third embodiment described above is used. In the description below of the present fourth embodiment, elements that have the same configurations and functions as those in the first embodiment or the third embodiment described above will be provided with the same reference signs as those in the first embodiment or the third embodiment described above, and the description thereof will be omitted.

As illustrated in FIGS. 49a and 49b, substrate stage device 20 is equipped with coarse movement stage 24, weight cancelling device 26, X guide bar 28, substrate table 30, noncontact holder 32, a pair of auxiliary tables 34, a substrate carrier 40 and the like (refer to the first embodiment described above for the details of each element). Substrate carrier 40 adsorbs and holds the four corner vicinity parts of substrate $P_1$ supported in a noncontact manner by noncontact holder 32.

Further, substrate exchange device 1040 has beam unit 1050, substrate carry-in device 1060, substrate carry-out device 1070 (alignment pad 1078 is omitted) and substrate assist device 1080 (refer to the third embodiment described above for the details of each element). Substrate $P_2$ to be exposed next to substrate $P_1$ is placed on the robot hand of external carrier device 1100. Of a pair of Y frames 42y configuring substrate carrier 40, the Z-position of Y frame 42y on the +X side is disposed at a position lower than the Z-position of the lower surface of substrate $P_1$ (see the drawings such as FIG. 3).

Although, in substrate stage device 20 of the present fourth embodiment, a pair of substrate carry-out bearer devices 1082a and a pair of substrate carry-in bearer devices 1082b that configure substrate assist device 1080 are attached to coarse movement stage 24 (the same reference signs are used for the sake of convenience), the pair of substrate carry-out bearer devices 1082a and the pair of substrate carry-in bearer devices 1082b may be attached to substrate table 30 (or noncontact holder 32), similarly to the third embodiment described above.

The exchange operations of substrate P in the present fourth embodiment are generally the same as those in the third embodiment described above. The exchange operations will be briefly described below. In FIGS. 50a and 50b, the robot hand of external carrier device 1100 carries substrate $P_2$ to above beam unit 1050 of the port section. Subsequently, as illustrated in FIGS. 51a and 51b, the robot hand of external carrier device 1100 places (delivers) substrate $P_2$ to beam unit 1050. Subsequently, as illustrated in FIGS. 52a and 52b, after beam unit 1050 supporting substrate $P_2$ is moved toward the −X direction, substrate carry-in hand 1062 of substrate carry-in deice 1060 ascends, and scoops out $P_2$ on beam unit 1050. Further, in parallel with this operation, in substrate stage device 20, substrate carry-out bearer devices 1082a move the exposed substrate $P_1$ (cause the exposed substrate $P_1$ to be offset), by a predetermined amount toward the +X direction with respect to noncontact holder 32.

Figure 54A:
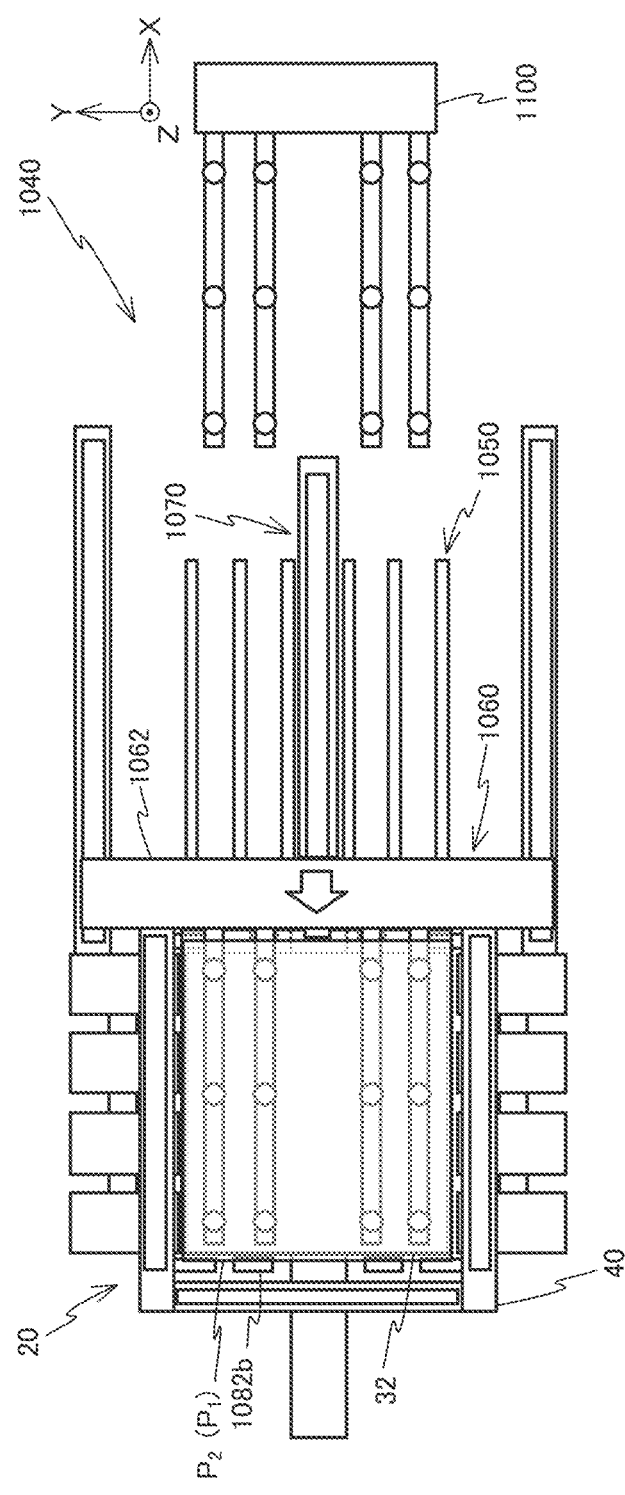
FIGS. 54*a* and 54*b* are views (No. 6) used to explain the fourth embodiment.
Figure 54B:
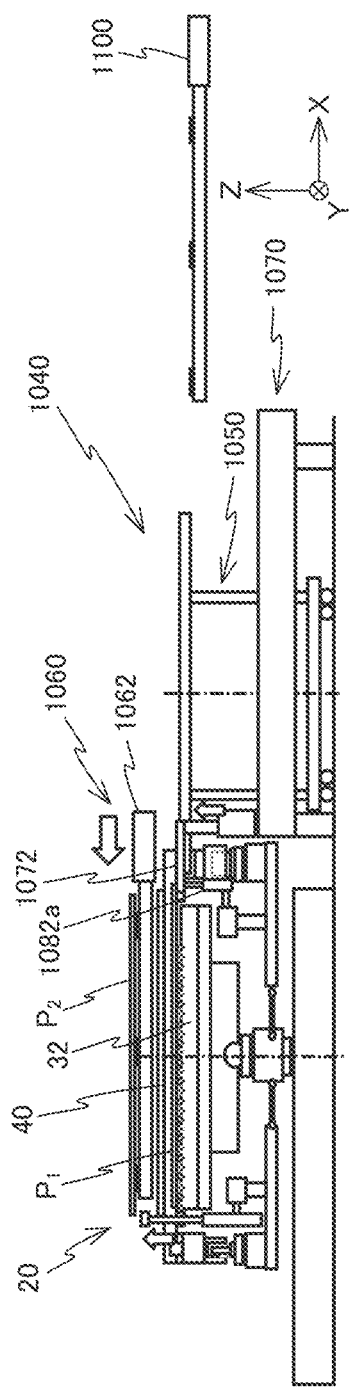

Subsequently, as illustrated in FIGS. 53a and 53b, substrate carry-in hand 1062 holding substrate $P_2$ starts to move toward a space above the substrate exchange position (toward the −X direction). In parallel with this operation, in substrate carry-out device 1070, substrate carry-out hand 1072 is moved toward the −X direction, and also in the substrate stage device 20, noncontact holder 32, substrate carrier 40 and the like are moved toward substrate exchange position (toward the +X direction). Subsequently, as illustrated in FIGS. 54a and 54b, substrate carry-in hand 1062 is stopped in a space above the substrate exchange position. Then, in substrate stage device 20, substrate carry-in bearer devices 1082b perform an ascending operation. Further, in parallel with each of the foregoing operations, in substrate carry-out device 1070, substrate carry-out hand 1072 grips (adsorbs and holds) the +X side end vicinity part of substrate $P_1$, from below, that is offset with respect to noncontact holder 32.

Subsequently, as illustrated in FIGS. 55a and 55b, substrate carry-out hand 1072 is moved toward the +X direction and pulls out the exposed substrate $P_1$ toward the port section. Further, substrate carry-in bearer devices 1082b grip (adsorb and hold) the −X side end vicinity part of substrate $P_2$, from below, on substrate carry-in hand 1062. When substrate $P_2$ is held by substrate carry-in bearer devices 1082b, substrate carry-in hand 1062 is withdrawn toward the +X direction leaving substrate $P_2$ in a space above noncontact holder 32. In other words, when substrate $P_2$ is held by substrate carry-in bearer devices 1082b, substrate carry-in hand 1062 releases the holding of substrate $P_2$.

Subsequently, as illustrated in FIGS. 56a and 56b, substrate carry-out hand 1072 releases the exposed substrate $P_1$ and descends. Further, substrate carry-in hand 1062 has been completely withdrawn from a space above substrate stage device 20. In parallel with each of the foregoing operations, substrate carry-in bearer devices 1082b are lowered in a state of holding the new substrate $P_2$, and then correct (perform pre-alignment of) the position of the substrate $P_2$ and give the substrate $P_2$ to adsorption pads 44 (see FIG. 3) of substrate carrier 40. Substrate carry-in bearer devices 1082b may descend while holding the substrate $P_2$, thereby causing substrate $P_2$ to be supported by noncontact holder 32, and correcting (performing pre-alignment of) the position of the substrate $P_2$ in this state, and then may give the substrate $P_2$ to adsorption pads 44 (see FIG. 3) of substrate carrier 40.

Figure 87A:
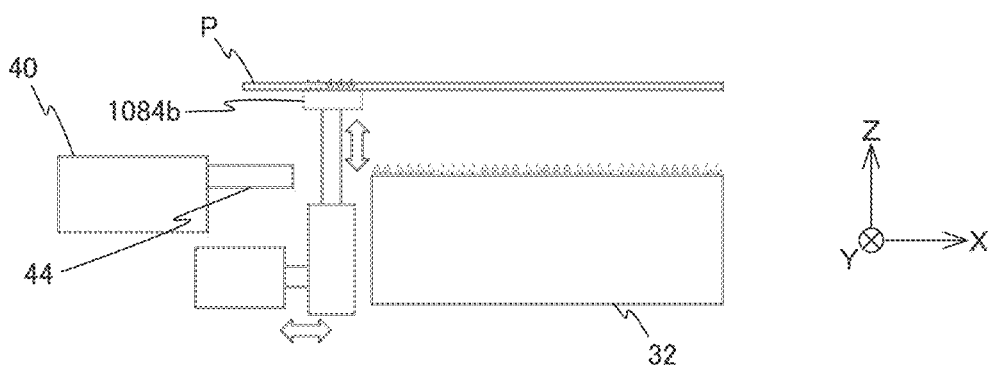
FIGS. 87*a* and 87*b* are views (No. 1 and No. 2) used to explain a carry-in operation of a substrate in the fourth embodiment.
Figure 87B:
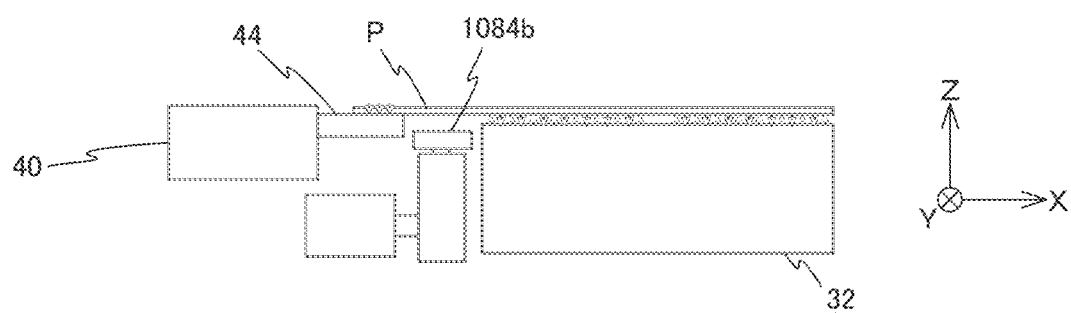

Here, as illustrated in FIGS. 87a and 87b, the Z-positions of holding pads 1084b are set in advance so that substrate P is delivered from holding pads 1084b to adsorption pads 44 within a range where substrate P can be levitated from noncontact holder 32 (can be spaced apart from the upper surface of noncontact holder 32) in the Z-axis direction. Substrate P may be delivered from holding pads 1084b to adsorption pads 44 in a state where substrate P is levitated in the Z-axis direction by air supplied from noncontact holder 32, or the delivery of substrate P may be performed in a state where substrate P is levitated above noncontact holder 32 not by air supplied from noncontact holder 32, but by air intervening between the lower surface of substrate P and the upper surface of noncontact holder 32, i.e., by air stagnation. Note that substrate P only has to be levitated, and therefore in the case of levitating substrate P by the air stagnation, an adsorption type holder may be used, not noncontact holder 32. Note that the levitation of substrate P above noncontact holder 32 by air intervening between the lower surface of substrate P and the upper surface of noncontact holder 32, which is the so-called air stagnation, is applicable not only to the present embodiment but also to all the embodiments including those described earlier and to be described later. In the present embodiment, since a configuration, in which substrate P is delivered from holding pads 1084b to adsorption pads 44 by holding pads 1084b being lowered, is employed, the upper surfaces of holding pads 1084b are disposed on the further +Z side than the upper surface of noncontact holder 32. Accordingly, when holding pads 1084b holding substrate P are moved toward the −Z direction, the lower surface of substrate P comes into contact with adsorption pads 44, and a member to support substrate P from below is automatically switched from holding pads 1084b to adsorption pads 44 while maintaining the levitated state of substrate P from noncontact holder 32.

In order to deliver substrate P from holding pads 1084b to adsorption pads 44, the points of substrate P held by adsorption pads 44 and the points of substrate P held by holding pads 1084b are different from each other. Note that holding pads 1084b holding substrate P may stop suctioning air at the lower surface of substrate P in order to release the adsorption of substrate P by holding pads 1084b, when delivering substrate P to adsorption pads 44. Moreover, the adsorption of substrate P by holding pads 1084b may be positively released by supplying air to the lower surface of substrate P from holding pads 1084b. Further, a little before the lower surface of substrate P comes into contact with adsorption pads 44, namely, before substrate P is delivered from holding pads 1084b to adsorption pads 44, air may be supplied from adsorption pads 44 to the lower surface of substrate P thereby to cushion the impact when the adsorption pads 44 and substrate P come into contact with each other, so that the breakage of substrate P may be suppressed.

Note that the operations performed when holding pads 1084b of substrate carry-in bearer devices 1082b deliver substrate P to adsorption pads 44 of substrate carrier 40 are not limited to those described above. That is, since the foregoing delivery of substrate P can be performed by holding pads 1084b and adsorption pads 44 being relatively moved in the Z-axis direction, adsorption pads 44 of substrate carrier 40 (the receiving substrate P side) may be moved in the Z-axis direction to receive substrate P from holding pads 1084b of substrate carry-in bearer devices 1082b (the delivering substrate P side). In this case, holding pads 1084b may be static or adsorption pads 44 and holding pads 1084b may be moved together in the Z-axis direction (holding pads 1084b may descend and adsorption pads 44 may ascend). In other words, if the movable range of holding pads 1084b and the movable range of adsorption pads 44 in the Z-axis direction are arranged to overlap with each other at least partially, then the delivery of substrate P between holding pads 1084b and adsorption pads 44 is possible. Further, although a holding state is changed from a state where one of holding pads 1084b and adsorption pads 44 holds substrate P to a state where the other of holding pads 1084b and adsorption pads 44 holds substrate P, via a state where both of them hold substrate P, this is not intended to be limiting. The holding state may be changed from a state where one of holding pads 1084b and adsorption pads 44 holds substrate P to a state where the other holds substrate P, via a state where none of them holds the substrate. This is possible because, substrate P is not broken by colliding with noncontact holder 32 owing to air supplied from noncontact holder 32 or the air stagnation at the lower surface of substrate P, even if substrate P is not supported by any one of holding pads 1084b and adsorption pads 44. However, in the case where substrate P is not supported by any one of holding pads 1084b and adsorption pads 44, nothing sets the position of substrate P that is levitated, and therefore the position of substrate P should be corrected (pre-alignment of the position should be performed) more carefully.

Figure 57A:
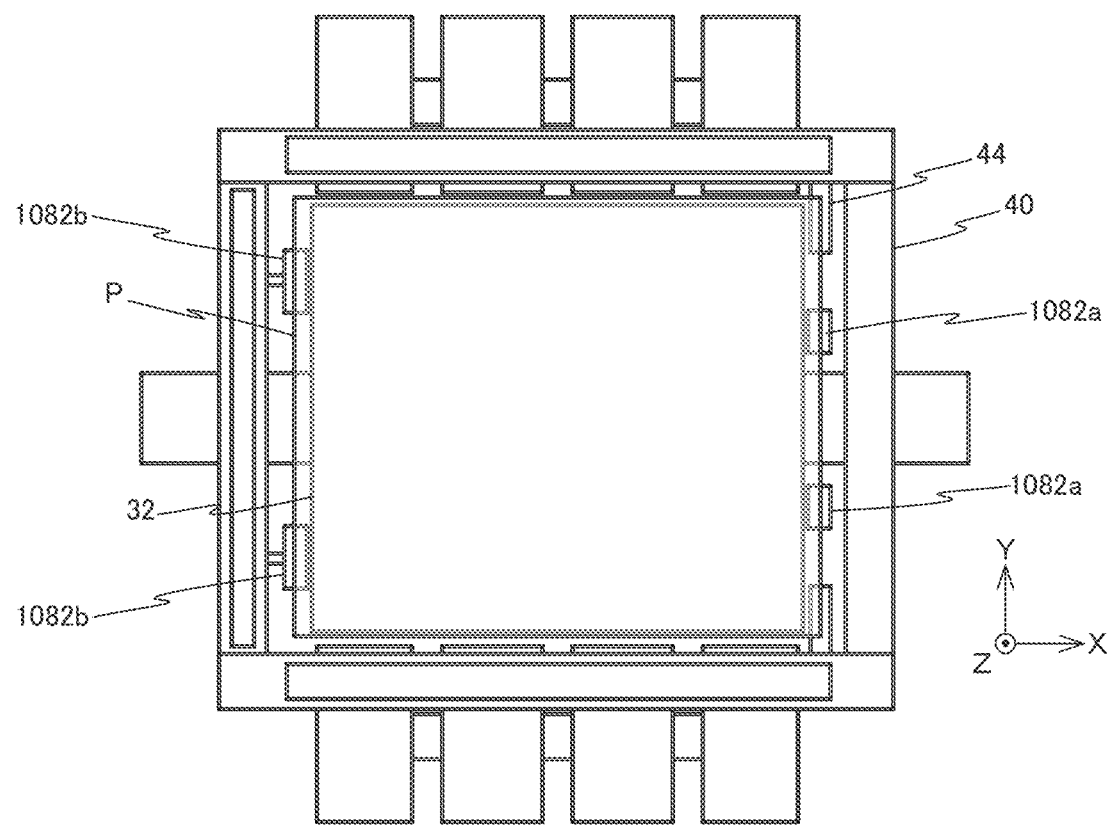
FIGS. 57*a* and 57*b* are views used to explain a modified example of the fourth embodiment.
Figure 57B:
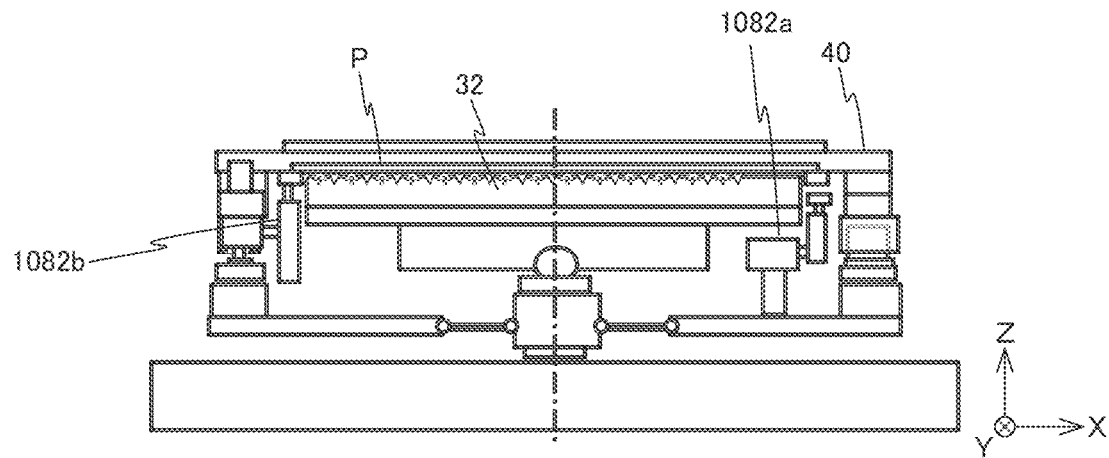
Figure 58:
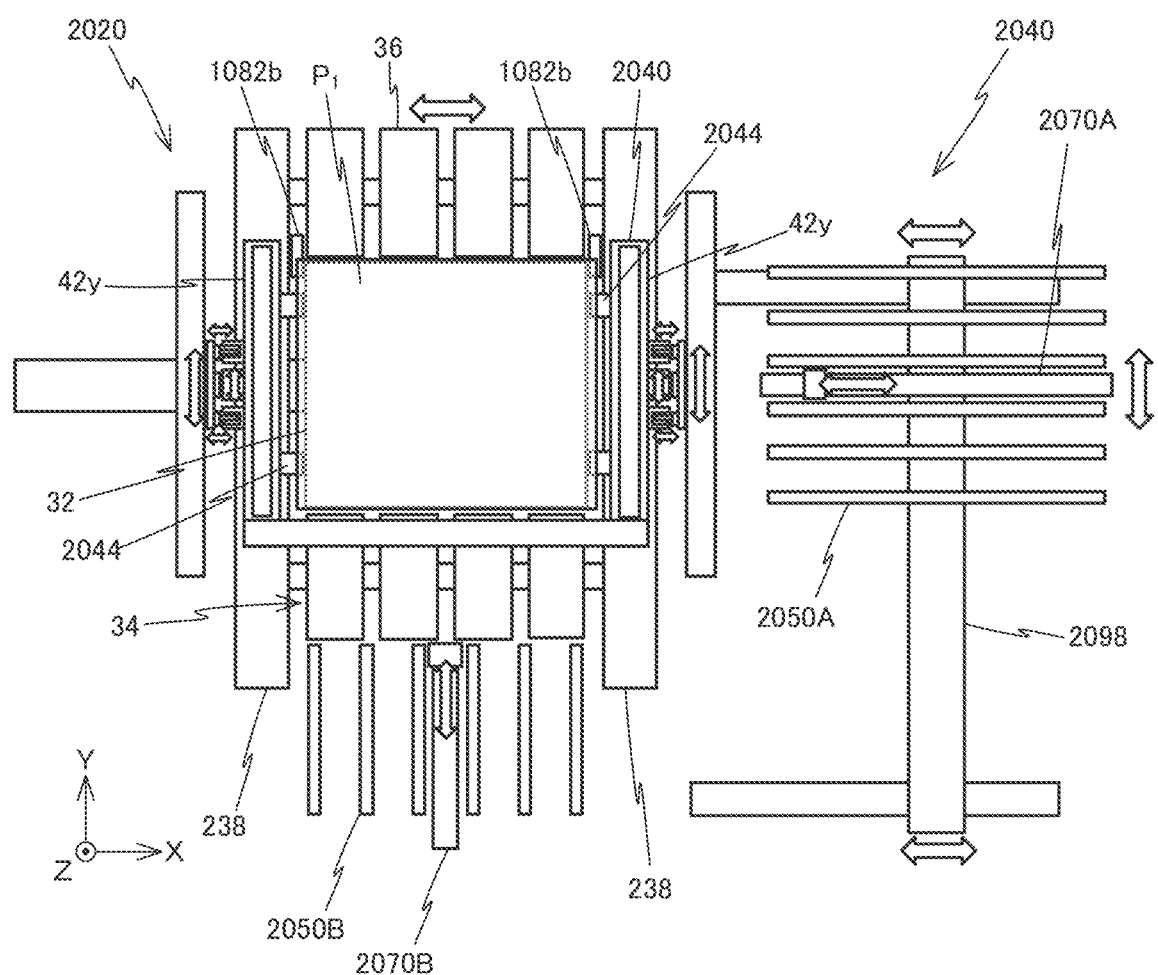
FIG. 58 is a view (No. 1) used to explain a fifth embodiment.

Also with the fourth embodiment described so far, the effect similar to the third embodiment described above can be obtained. Note that, as illustrated in FIGS. 57a and 57b, in substrate stage device 20, substrate carry-in bearer devices 1082b may be attached to substrate carrier 40 and substrate carrier 40 may hold substrate P by such substrate carry-in bearer devices 1082b (the adsorption pads may be made common). In this case, the two adsorption pads 44 (see FIG. 3) on the −X side attached to substrate carrier 40 can be omitted. Further, although not illustrated, substrate carry-out bearer devices 1082a may similarly be attached to substrate carrier 40. In this case, the two adsorption pads 44 on the +X side attached to substrate carrier 40 can also be omitted. In this case, substrate carry-in bearer devices 1082b are relatively driven upward with respect to substrate carrier 40, and grip (adsorb and hold) the −X side end vicinity part of substrate $P_2$, from below, on substrate carry-in hand 1062, and substrate carry-in hand 1062 is withdrawn from below substrate $P_2$, and then substrate $P_2$ is driven downward to be placed onto the noncontact holder, by substrate carry-in bearer devices 1082b.

Fifth Embodiment

Next, a fifth embodiment will be described using FIGS. 58 to 65. Compared to the fourth embodiment described above, the present fifth embodiment is different in a part of the configuration of a substrate stage device and a part of the configuration of a substrate exchange device. In the description below of the present fifth embodiment, elements that have the similar configurations and functions to those in the fourth embodiment described above will be provided with the same reference signs as those in the fourth embodiment described above, and the description thereof will be omitted.

A substrate carrier 2040 that a substrate stage device 2020 related to the present fifth embodiment is different from the fourth embodiment described above in that substrate carrier 2040 is formed into a U-like shape open toward the +Y side, and in that adsorption pads 2044 to adsorb and hold substrate P are attached to a pair of Y frames 42y. And, similarly to substrate stage device 220 as illustrated in FIGS. 13a and 13b, substrate carrier 2040 is supported from below by air levitation units 238. X frame 42X on the −Y side of substrate P is attached to a position higher than substrate P. Further, a pair of substrate carry-in bearer devices 1082b are disposed at a predetermined spacing in the X-axis direction so as to be capable of holding the +X side end vicinity part and the −X side end vicinity part of substrate P, respectively. The pair of substrate carry-in bearer devices 1082b are attached to a coarse movement stage (not illustrated). The operations per se of substrate carry-in bearer devices 1082b are similar to those in the fourth embodiment described above.

Here, while substrate carrier 2040 is moved relative to noncontact holder 32, air levitation units 36 and air levitation units 238 within the horizontal plane, substrate carry-in bearer devices 1082b are disposed outside the movement trajectory of substrate carrier 2040 holding substrate P (and substrate P). Specifically, the pair of substrate carry-in bearer devices 1082b are disposed spaced apart in the X-axis direction, and each of them is disposed between air levitation unit 36 and air levitation unit 238. Holding pads 1084b (see FIG. 29b) that substrate carry-in bearer devices 1082b have are movable in the Z-axis direction, and therefore, when substrate carrier 2040 is moved relative to noncontact holder 32 and the like within the horizontal plane, holding pads 1084b are controlled to be moved toward the −Z direction and withdrawn to outside the movement trajectory of substrate carrier 2040 (and substrate P).

In substrate exchange device 1040, a beam unit 2050A and a substrate carry-out device 2070A disposed at the port section (on the +X side of the substrate exchange position) are movable in the X-axis direction and the Y-axis direction by a drive device 2098 (the illustration is omitted in FIGS. 59 to 64). Further, substrate exchange device 1040 also has a beam unit 2050B and a substrate carry-out device 2070B on the −Y side of the substrate exchange position. The configurations of beam units 2050A and 2050B and the configurations of substrate carry-out device 2070A and 2070B are roughly the same as those of beam unit 1050 and substrate carry-out device 1070 (see the drawings such as FIGS. 30a and 30b) of the fourth embodiment described above, respectively.

Figure 59:
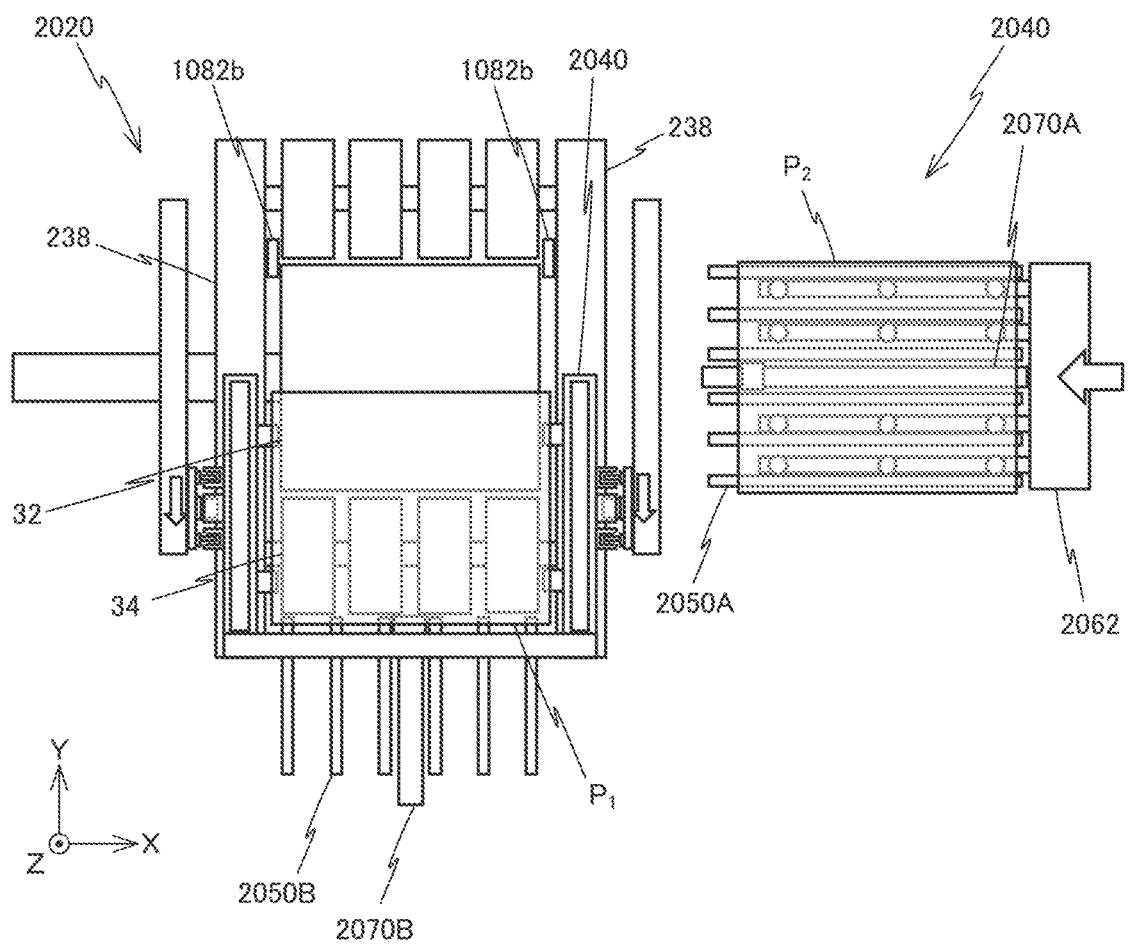
FIG. 59 is a view (No. 2) used to explain the fifth embodiment.

Next, the substrate exchange operations related to the present fifth embodiment will be described. In FIG. 59, noncontact holder 32 is located at the substrate exchange position. In this state, substrate carrier 2040 is driven toward the −Y side, and thereby the −Y side half area of substrate $P_1$ that has been exposed is supported from below by auxiliary table 34 on the −Y side. In parallel with this operation, a substrate carry-in hand 2062 carries substrate $P_2$ to the port section. Substrate carry-in hand 2062 scoops out, from below, substrate $P_2$ carried to the port section by a robot hand (not illustrated) of an external carrier device.

Figure 60:
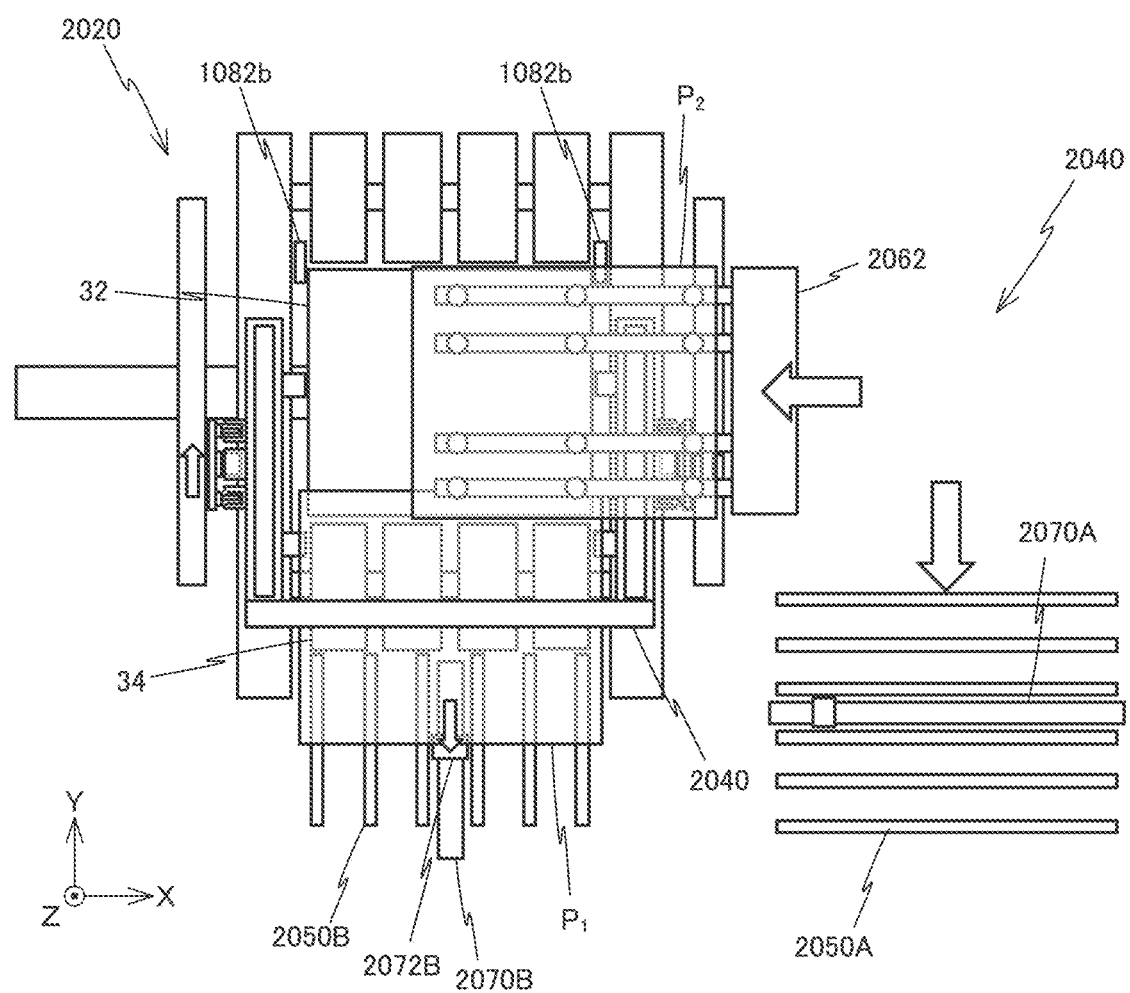
FIG. 60 is a view (No. 3) used to explain the fifth embodiment.

Subsequently, as illustrated in FIG. 60, substrate carry-in hand 2062 carries substrate $P_2$ toward a space above noncontact holder 32. In parallel therewith, a substrate carry-out hand 2072B of substrate carry-out device 2070B grips the −Y side end vicinity part of substrate $P_1$, and in such a state, is moved toward the −Y direction. Further, in parallel with the movement of substrate carry-out hand 2072B (substrate $P_1$), substrate carrier 2040 is moved toward the +Y direction (in a direction opposite to substrate $P_1$). Furthermore, in parallel with each of the above operations, beam unit 2050A and substrate carry-out device 2070A are integrally moved toward the −Y direction.

Figure 61:
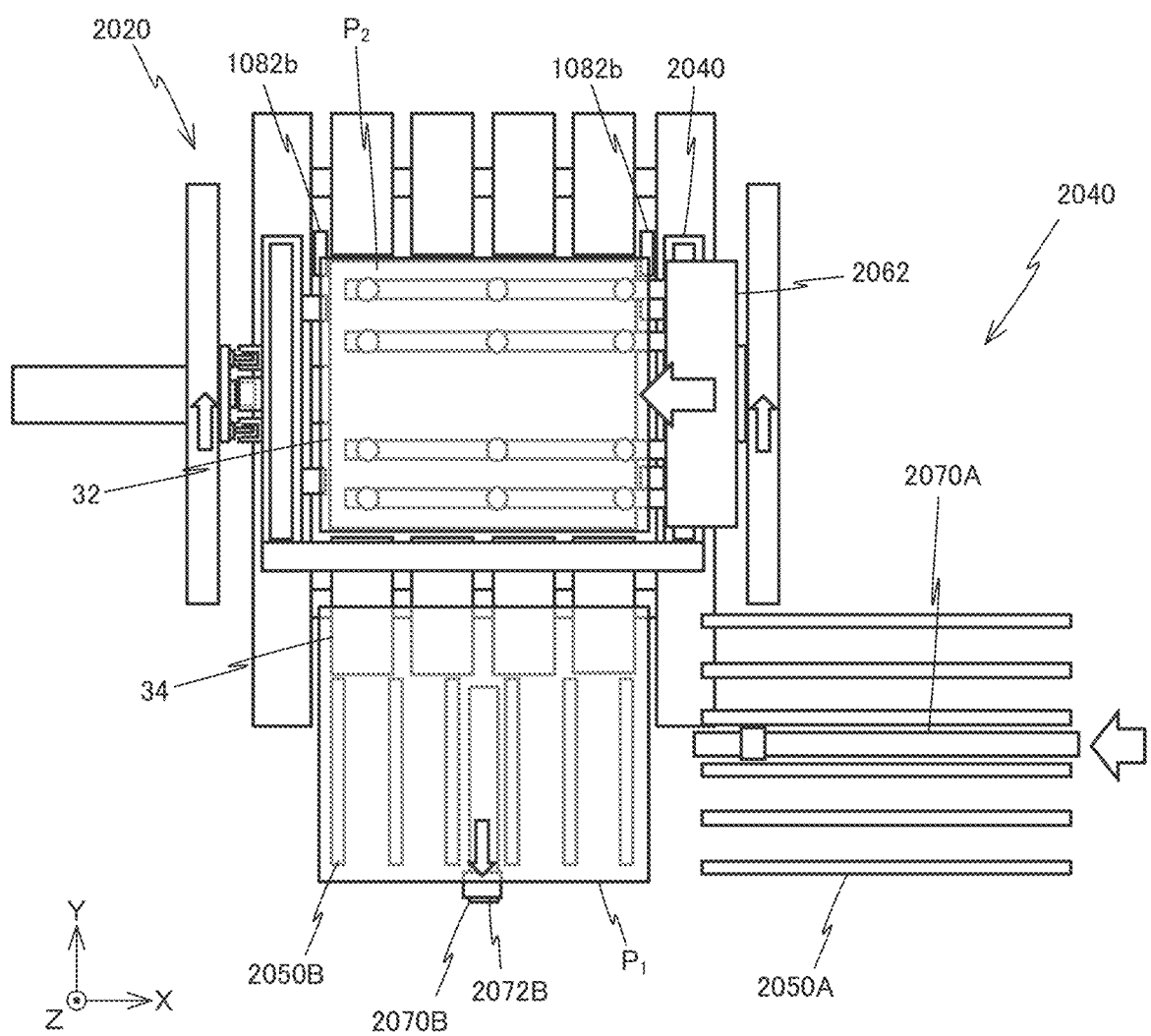
FIG. 61 is a view (No. 4) used to explain the fifth embodiment.

Subsequently, as illustrated in FIG. 61, substrate carry-in bearer devices 1082b are driven upward, and adsorb and hold two points of the +Y side end vicinity part of substrate $P_2$ on substrate carry-in hand 2062. Substrate carrier 2040 is restored to a normal position (a position where substrate carrier 2040 can hold substrate P on noncontact holder 32), and in this state, substrate carrier 2040 and substrate $P_1$ do not overlap with each other in positions within the XY plane.

Figure 62:
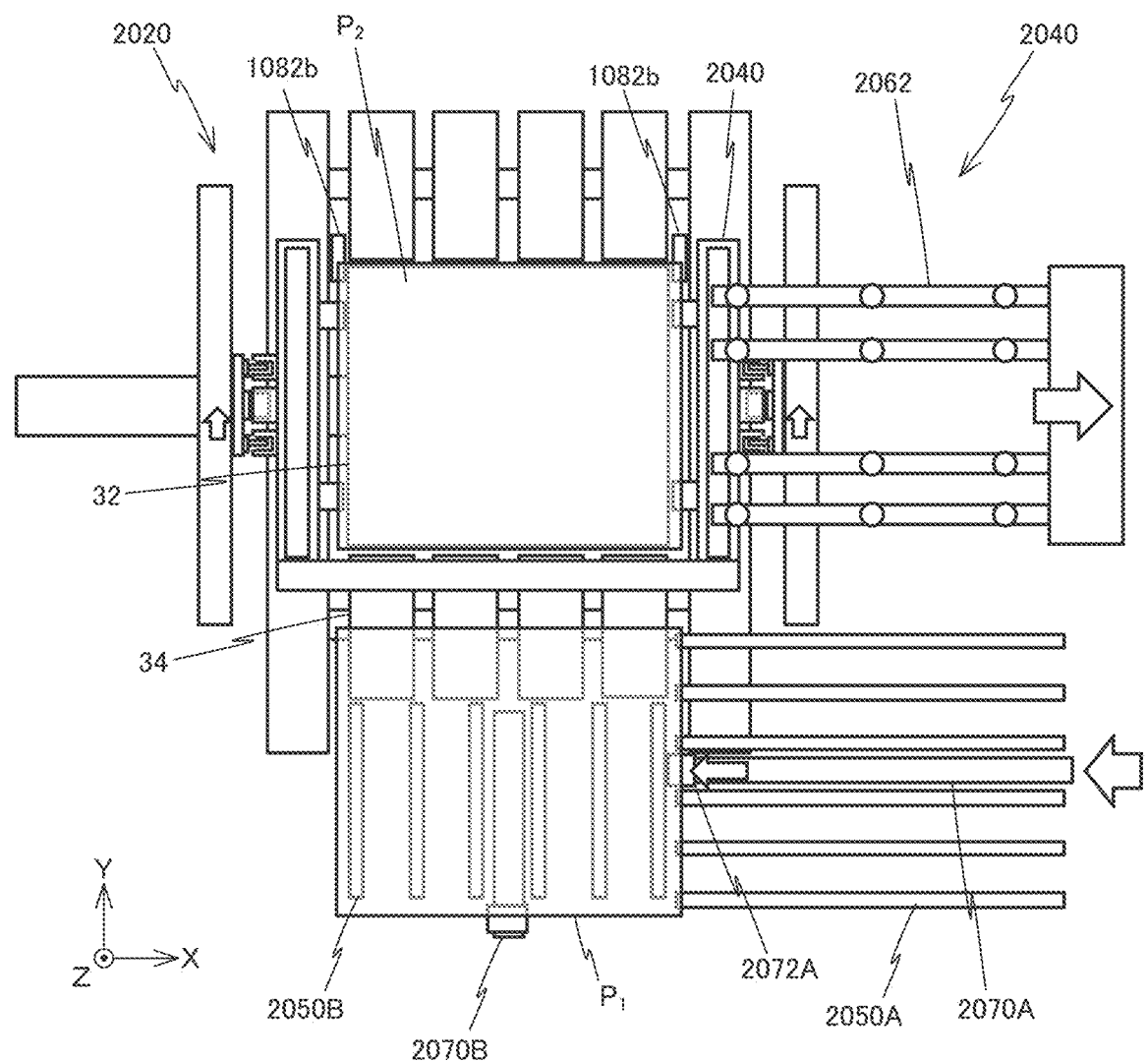
FIG. 62 is a view (No. 5) used to explain the fifth embodiment.
Figure 65:
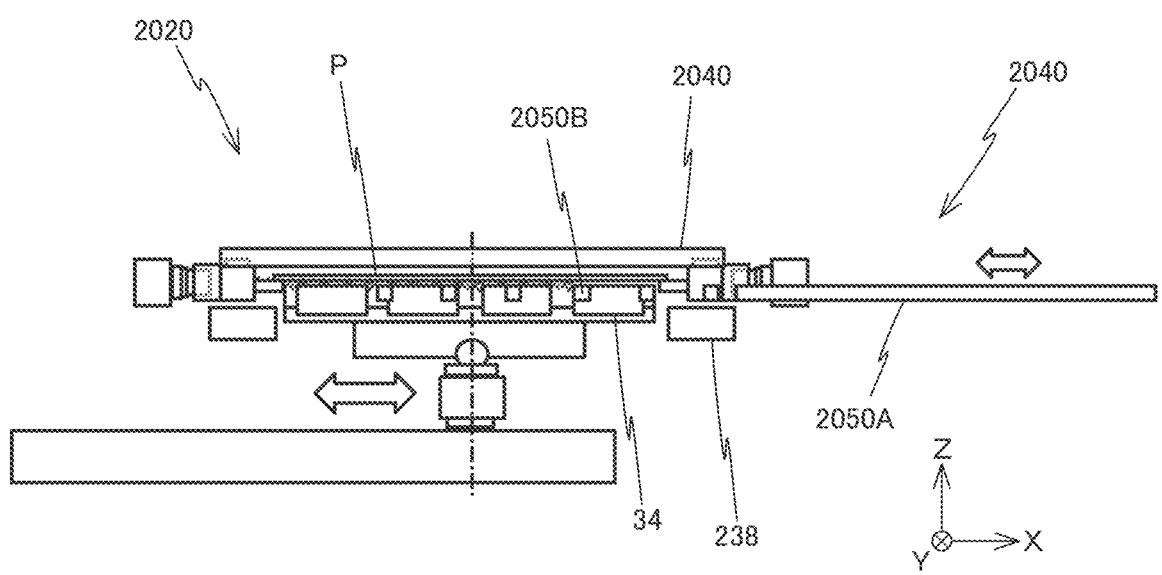
FIG. 65 is a view (No. 8) used to explain the fifth embodiment.

Subsequently, as illustrated in FIG. 62, substrate carry-in hand 2062 is withdrawn from a space above noncontact holder 32 toward the +X direction at high speed and high acceleration. Since substrate $P_2$ is adsorbed and held by substrate carry-in bearer devices 1082b, substrate $P_2$ is left in a space above noncontact holder 32. In parallel with the foregoing operation, beam unit 2050A and substrate carry-out device 2070A are moved toward the −X direction. As illustrated in FIG. 65, the height positions of beam unit 2050A and substrate carry-out device 2070A are set so that they pass through a space above air levitation unit 238 on the +X side (they do not come into contact with air levitation unit 238). Referring back to FIG. 62, in substrate carry-out device 2070A, substrate carry-out hand 2072A is moved toward the −X direction.

Here, the acceleration of substrate carry-in hand 2062 at the time of withdrawal is set to an acceleration higher than the descending acceleration (not more than 1G) of substrate P, e.g., to an acceleration of about 3G.

Figure 63:
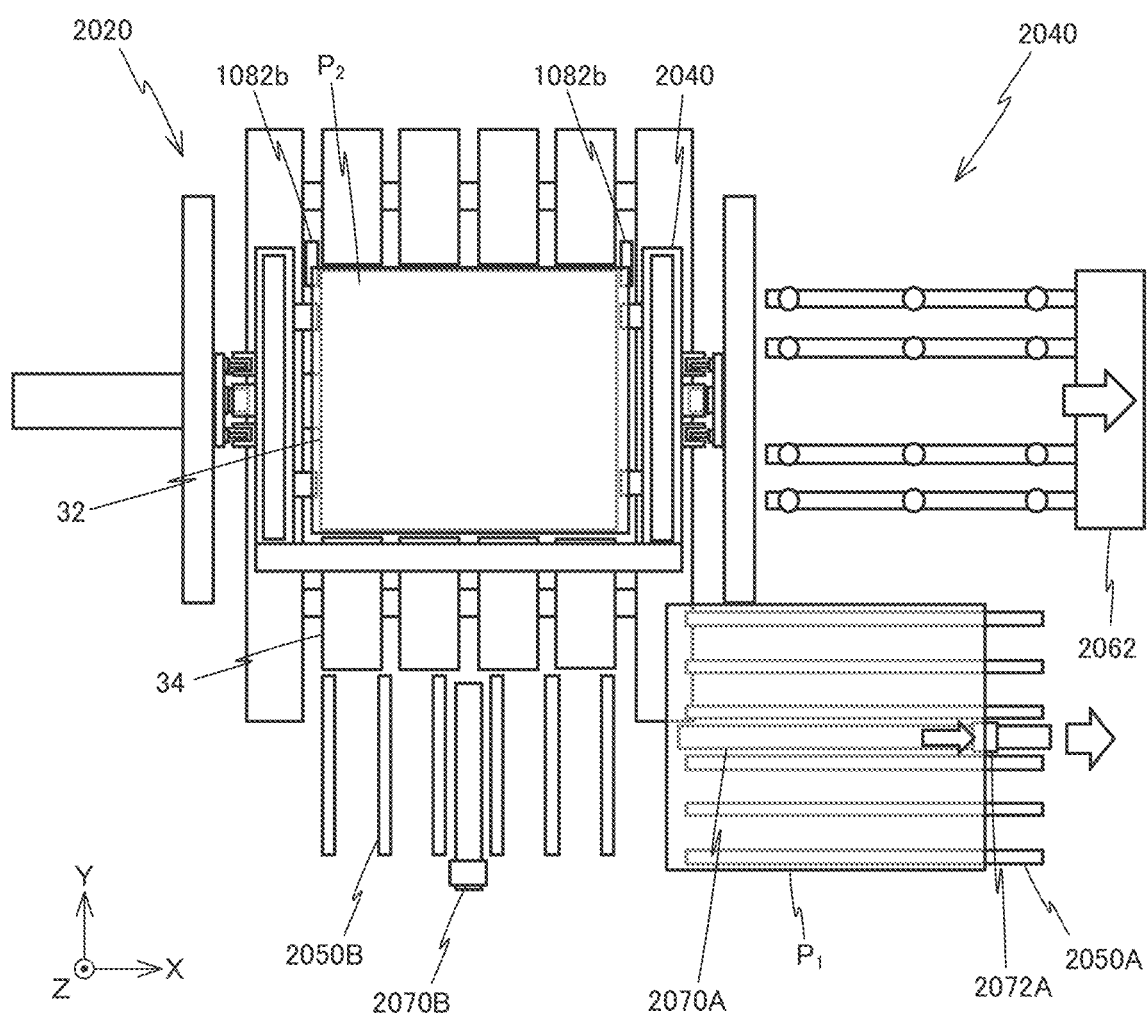
FIG. 63 is a view (No. 6) used to explain the fifth embodiment.

Subsequently, as illustrated in FIG. 63, substrate carry-out hand 2072A grips the exposed substrate $P_1$ and is moved toward the +X direction. The height position of the upper surfaces of beam units 2050A and 2050B are set to be roughly the same (see FIG. 65), and substrate $P_1$ is moved along a flat surface (a guide surface) formed by beam units 2050A and 2050B. When substrate $P_1$ is supported by beam unit 2050A, beam unit 2050A and substrate carry-out device 2070A are moved toward the +X direction. In parallel with each of the foregoing operations, substrate carry-in bearer devices 1082b descends in a state of gripping (holding) substrate $P_2$, in substrate stage device 2020.

Figure 64:
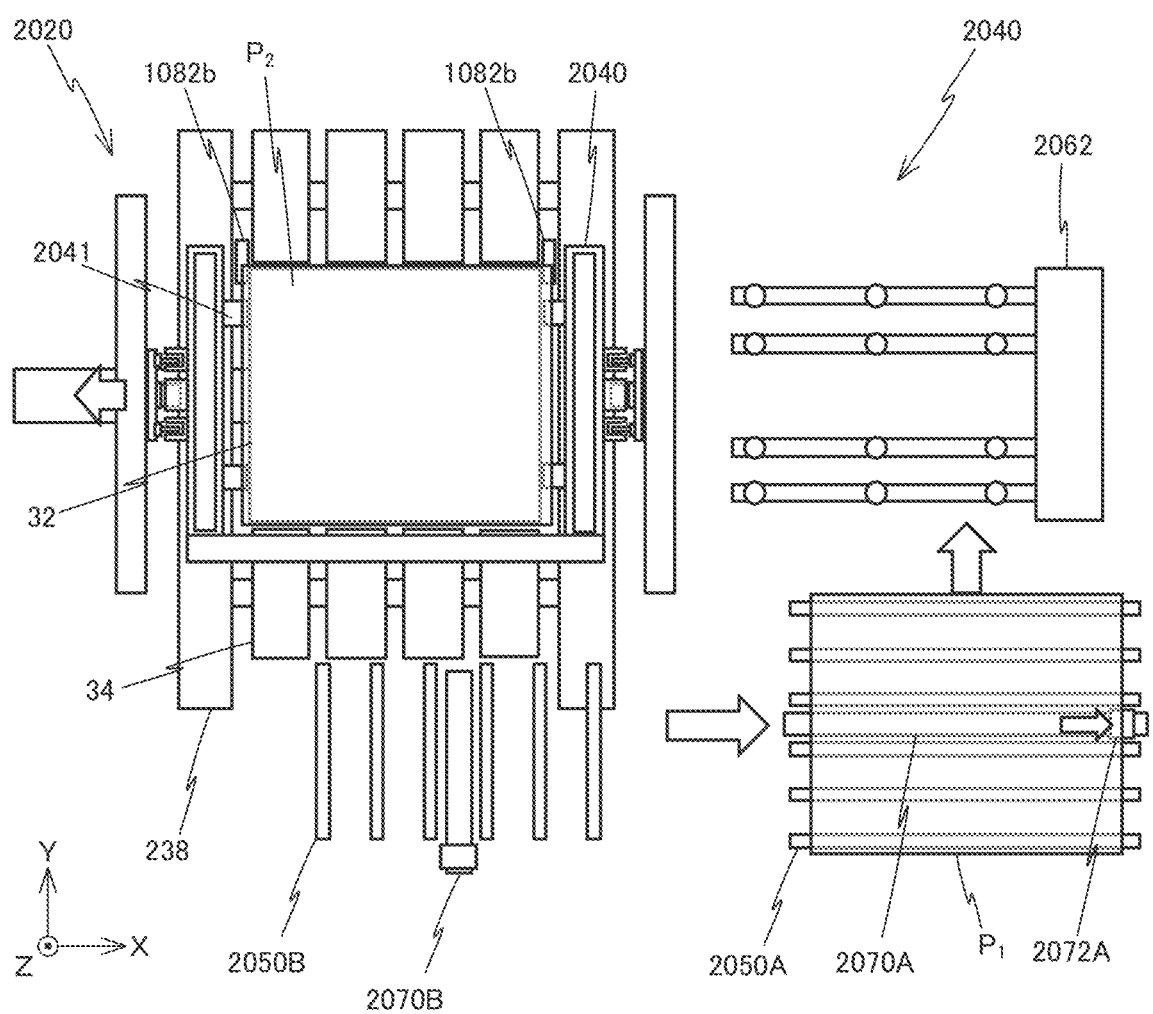
FIG. 64 is a view (No. 7) used to explain the fifth embodiment.

Subsequently, as illustrated in FIG. 64, beam unit 2050A and substrate carry-out device 2070A holding substrate $P_1$ are moved toward the +Y direction. Note that beam unit 2050A and substrate carry-out device 2070A may continue to be moved toward the +X direction and carry out substrate $P_1$ toward an external device. In parallel with the foregoing operation, substrate carry-in bearer devices 1082b deliver substrate $P_2$ to adsorption pads 2044 of substrate carrier 2040, and noncontact holder 32 supports substrate $P_2$ from below in a noncontact manner, in substrate stage device 2020. In this state, substrate carrier 2040 and noncontact holder 32 are moved to a predetermined exposure starting position.

Also with the fifth embodiment described so far, the effect similar to that of the third embodiment described above can be obtained. Further, since substrate $P_1$ and substrate carrier 2040 are moved in directions opposite to each other at the time of carry-out operation of substrate $P_1$, the carry-out operation of substrate $P_1$ can be performed swiftly.

Note that, in the fifth embodiment described above, a configuration is employed, in which substrate P ($P_2$) serving as a carry-in target is carried in by being moved from the +X side toward the −X side (toward the −X direction), and substrate P ($P_1$) serving as a carry-out target is carried out from the same place as the carry-in, by being shifted and moved toward the −Y direction and then moved toward the +X direction and toward the +Y direction. However, this is not intended to be limiting, and for example, substrate P may be carried in from the +X side toward the −X side (toward the −X direction) and also may be carried out toward the −Y direction, or alternatively substrate P may be carried in from the −Y side toward the +Y side (toward the +Y direction) and also may be carried out toward the −Y direction. Further, although the timing when substrate carry-in bearer devices 1082b descends while gripping a new substrate P (substrate $P_2$) is substantially the same as the timing when substrate carrier 2040 returns toward the +Y direction, either one of them may be performed earlier than the other. However, in the case of performing the descending of substrate P earlier, it is necessary to prevent adsorption pads 2044 and substrate P from coming into contact with each other when substrate carrier 2040 returns to a normal position.

Sixth Embodiment

Next, a sixth embodiment will be described using FIGS. 66a to 70b. In the present sixth embodiment, in the exchange operations of substrates P in a liquid crystal exposure apparatus having a substrate stage device with a configuration similar to substrate stage device 520 (see the drawings such as FIG. 21) related to the modified example of the second embodiment described above, a substrate carry-in bearer device is used that has a configuration similar to substrate carry-in bearer device 1082b (see the drawings such as FIGS. 29a and 29b) in the third embodiment described above. In the description below of the present sixth embodiment, elements that have the similar configurations and functions to those in the second embodiment or the third embodiment described above will be provided with the same reference signs as those in the second embodiment or the third embodiment described above, and the description thereof will be omitted.

Figure 66A:
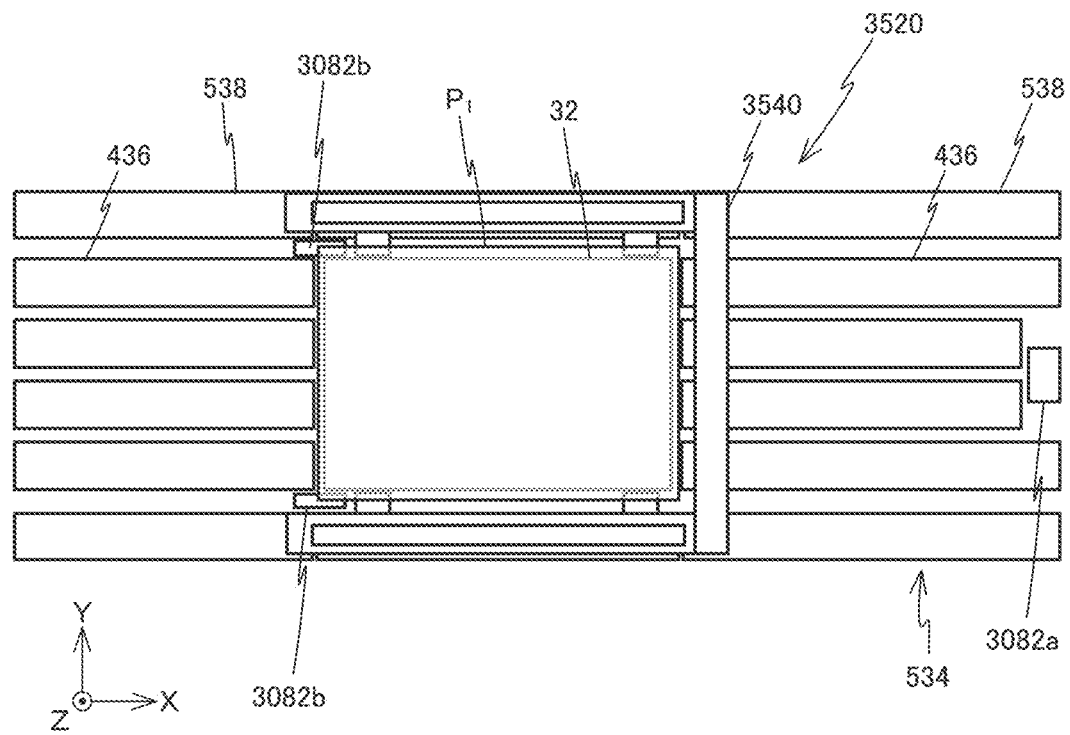
FIGS. 66*a* and 66*b* are views (No. 1) used to explain a sixth embodiment.
Figure 66B:
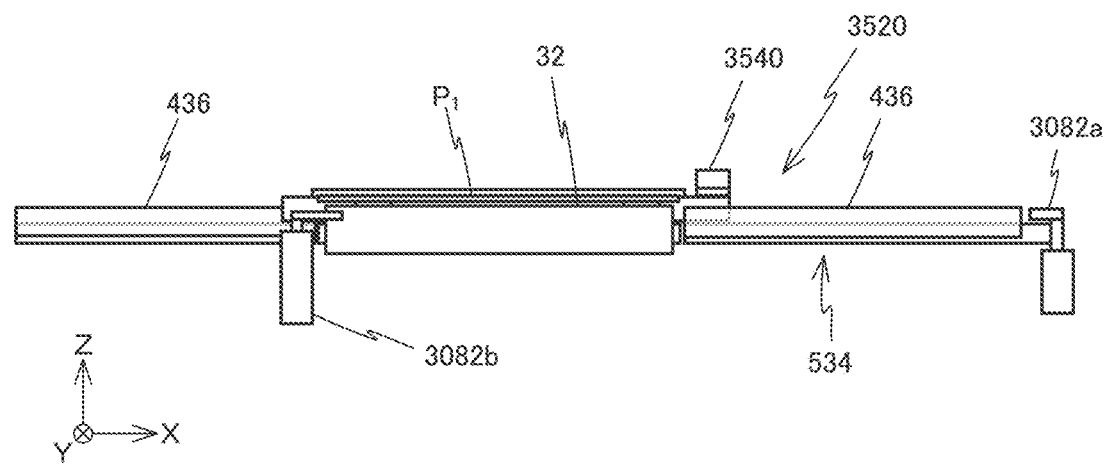

As illustrated in FIGS. 66a and 66b, a substrate stage device 3520 has a substrate carrier 3540 that is formed into a U-like shape open toward the −X side in planar view. Substrate carrier 3540 holds the end vicinity part of substrate P supported by noncontact holder 32. The present sixth embodiment is the same as the modified example of the second embodiment described above in that substrate P is moved in a noncontact manner on a guide surface formed by noncontact holder 32 and a plurality of air levitation units 436 when substrate carrier 3540 is moved in the X-axis direction at the time of scan exposure operations. Drive systems of noncontact holder 32, the plurality of air levitation units 436, substrate carrier 3540 and the like are the same as those in the modified example of the second embodiment described above (see the drawings such as FIGS. 21 to 25b), and therefore the description thereof will be omitted.

Substrate stage device 3520 has substrate carry-in bearer devices 3082b and a substrate carry-out bearer device 3082a. The position within the XY-plane of each of bearer devices 3082a and 3082b relative to noncontact holder 32 is fixed (holding pads are movable relative to noncontact holder 32 only in the Z-axis direction). Substrate carry-in bearer devices 3082b are disposed at a position where substrate carry-in bearer device 3082b can hold the −X side end vicinity part of substrate P, and substrate carry-out bearer device 3082a is disposed in auxiliary table 534 on the +X side.

Figure 67A:
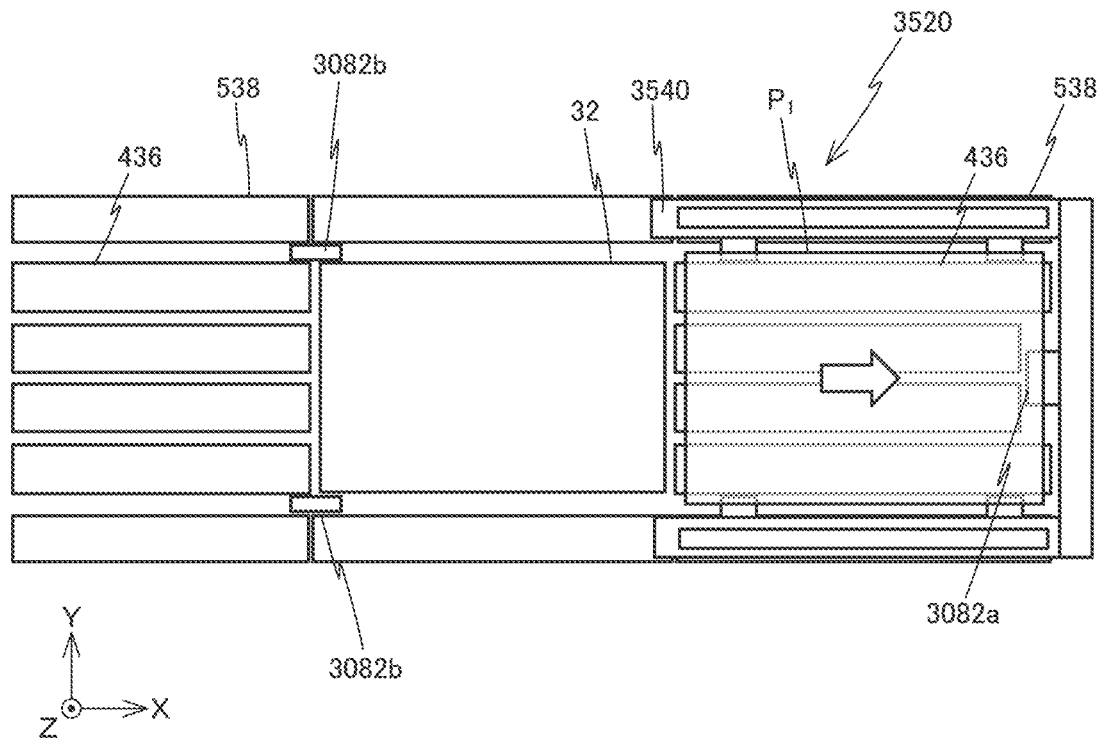
FIGS. 67*a* and 67*b* are views (No. 2) used to explain the sixth embodiment.
Figure 67B:
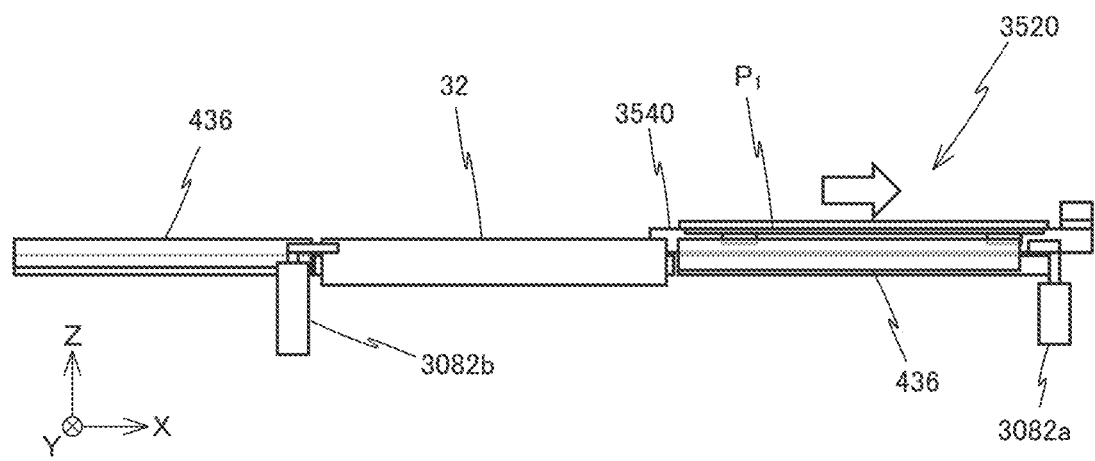

The substrate exchange operations in substrate stage device 3520 will be described below. When the exposure operations are finished, substrate carrier 3540 is moved toward the +X direction in a state of holding substrate $P_1$ so that substrate $P_1$ that has been exposed is supported by a plurality of air levitation units 436 on the +X side, as illustrated in FIGS. 67a and 67b.

Figure 68A:
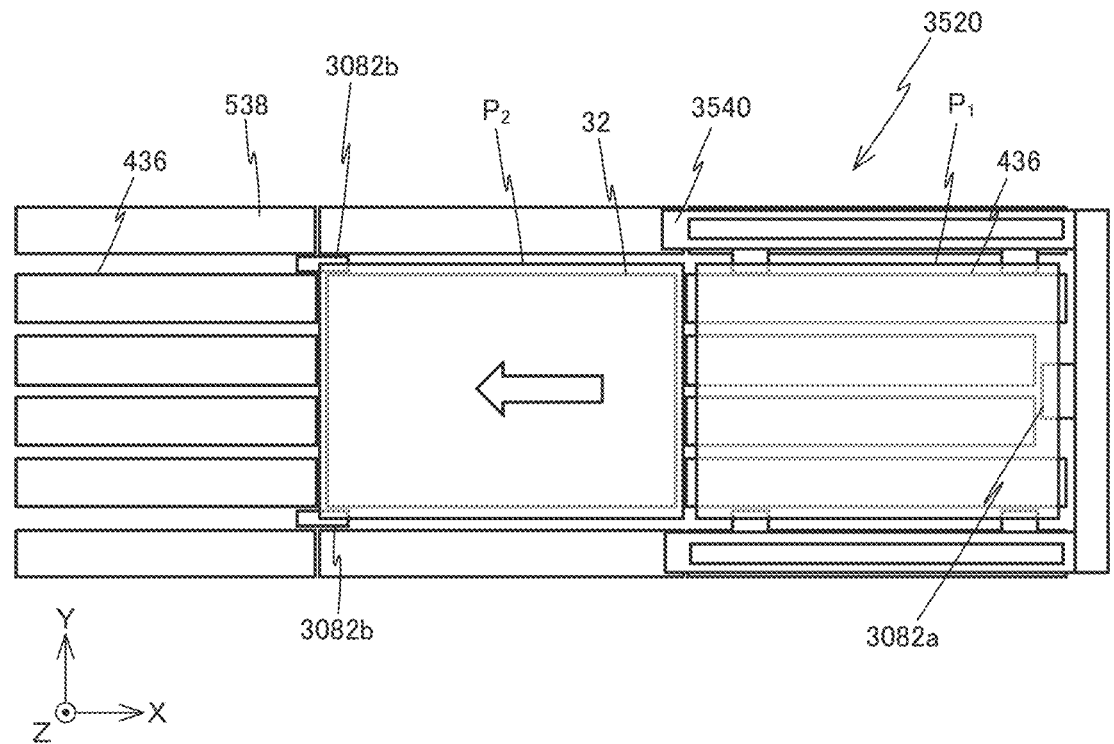
FIGS. 68*a* and 68*b* are views (No. 3) used to explain the sixth embodiment.
Figure 68B:
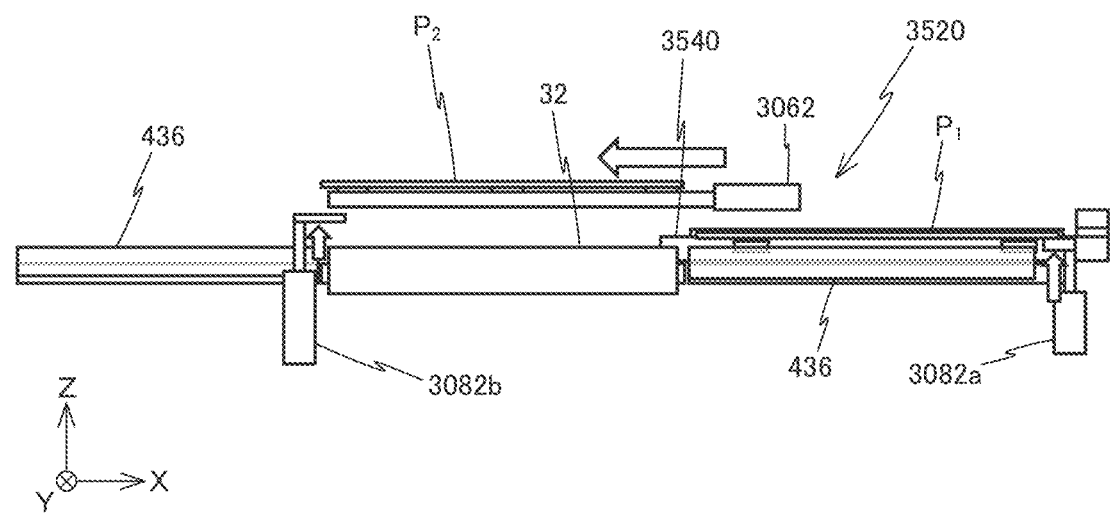

Subsequently, as illustrated in FIGS. 68a and 68b, a substrate carry-in hand 3062 (not illustrated in FIG. 68a) holding a new substrate $P_2$ enters a space above noncontact holder 32. Further, substrate carry-out bearer device 3082a ascends, and adsorbs and grips the exposed substrate $P_1$, from below, held by substrate carrier 3540. Furthermore, in parallel with each of the foregoing operations, substrate carry-in bearer devices 3082b start to ascend.

Figure 69A:
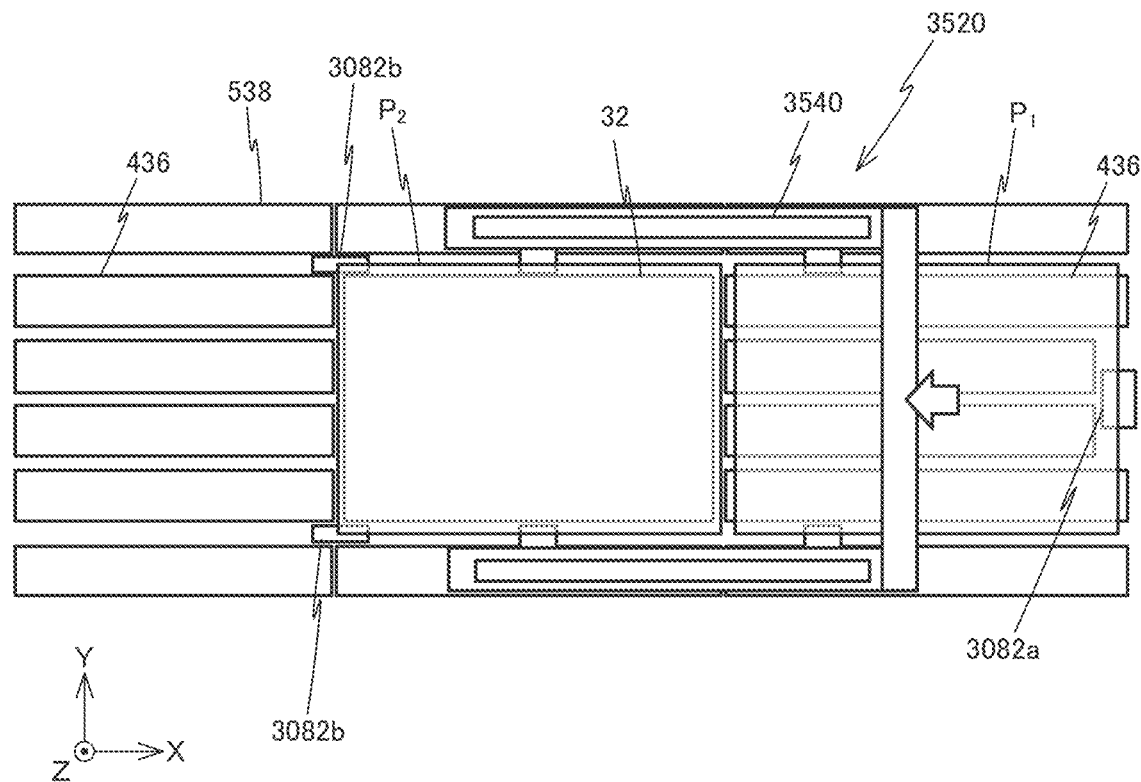
FIGS. 69*a* and 69*b* are views (No. 4) used to explain the sixth embodiment.
Figure 69B:
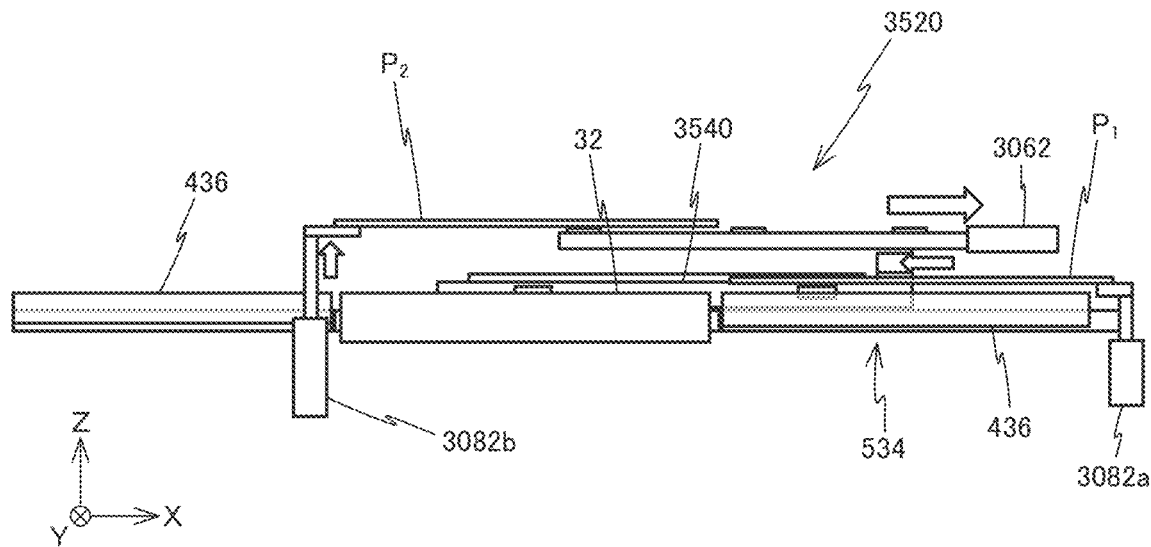

Subsequently, as illustrated in FIGS. 69a and 69b, substrate carry-in bearer devices 3082b ascend, and adsorb and hold the −X side end vicinity part of substrate $P_2$. In this state, substrate carry-in hand 3062 is moved at high speed toward the +X direction, and withdrawn from below substrate $P_2$. In parallel with each of the foregoing operations, substrate carrier 3540 releases the holding by adsorption of substrate $P_1$, and then is moved toward the −X direction.

Figure 70A:
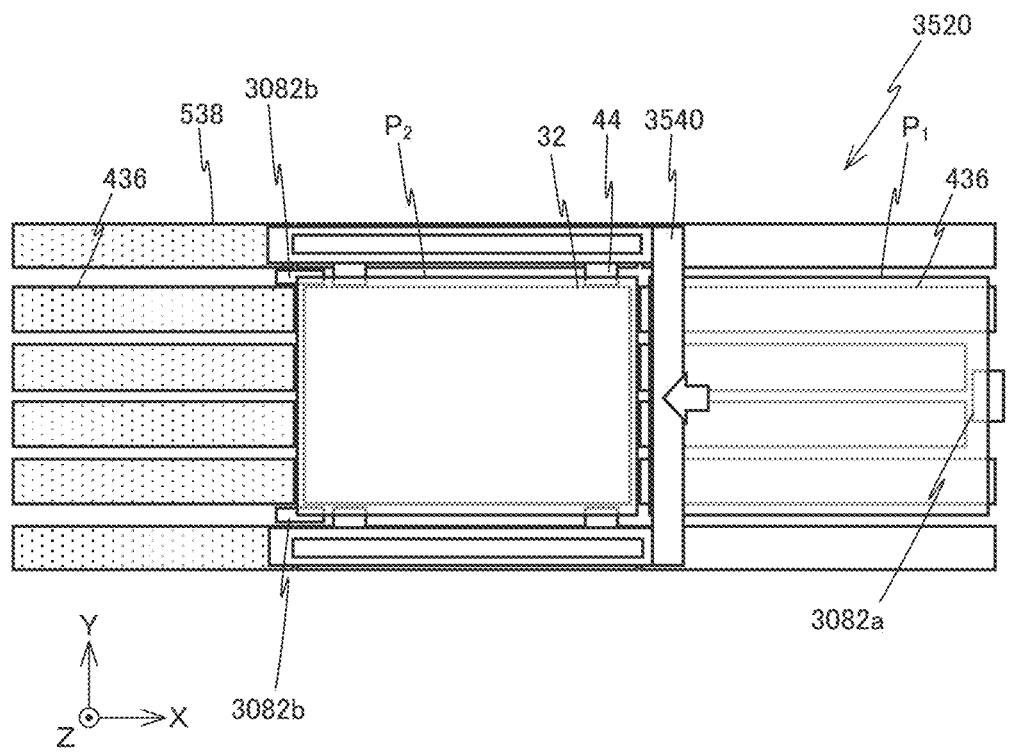
FIGS. 70*a* and 70*b* are views (No. 5) used to explain the sixth embodiment.
Figure 70B:
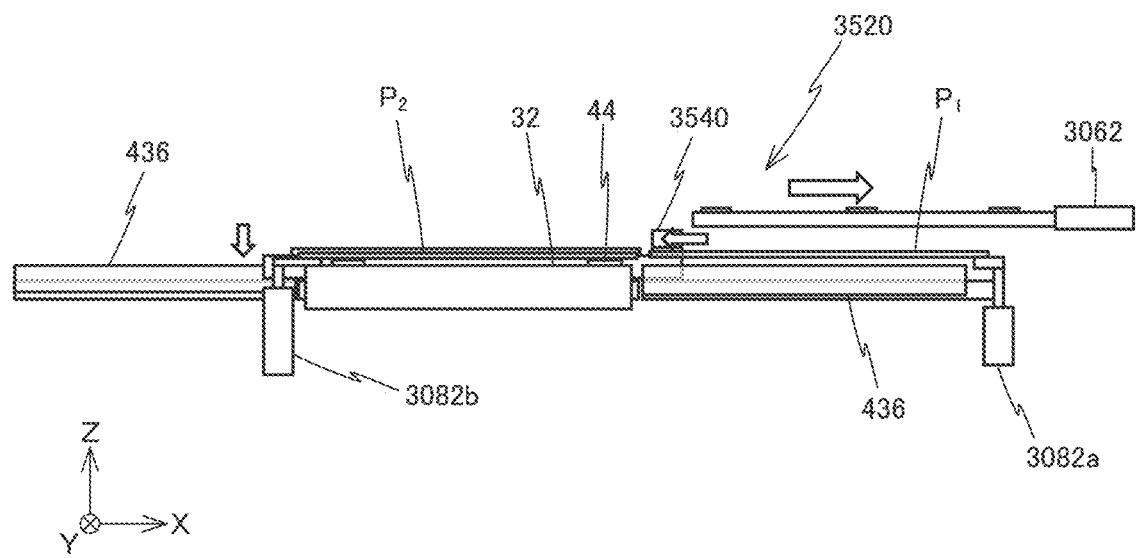

Subsequently, as illustrated in FIGS. 70a and 70b, substrate carry-in bearer devices 3082b descend in a state of gripping substrate $P_2$. Further, substrate carrier 3540 is moved toward the −X direction to be restored to a normal position. Substrate carry-in bearer devices 3082b perform rough alignment by finely driving substrate $P_2$ relative to noncontact holder 32 in the directions of three degrees of freedom within the horizontal plane, and then deliver substrate $P_2$ to adsorption pads 44 of substrate carrier 3540.

Also with the sixth embodiment described so far, the effect similar to the third embodiment described above can be obtained. Further, a configuration is employed, in which the exposed substrate $P_1$ is moved to a position (on auxiliary table 534 on the +X side) that is completely withdrawn from a space above noncontact holder 32 and only substrate carrier 3540 returns to a normal position (on noncontact holder 32) leaving the exposed substrate $P_1$ at such a position, and therefore substrate carry-out bearer device 3082a is to perform only the vertical movement and its configuration is simple. Note that this is not intended to be limiting, and in a similar manner to the fifth embodiment described above, a carry-out device (substrate carry-out bearer device 3082a may be configured drivable in the X-direction, and such substrate carry-out bearer device 3082a may be used) having a configuration similar to substrate carry-out hand 2072B (see FIG. 61) may be caused to grip the exposed substrate $P_1$ at a position where about a half of the exposed substrate $P_1$ is supported by noncontact holder 32 (the overlapping position), and, at the same time as substrate carrier 3540 returning (being moved toward the −X direction), the exposed substrate $P_1$ may be moved toward a direction (toward the +X direction) reversed to substrate carrier 3540. In this case, the length of auxiliary table 534 on the +X side can be shortened, and also the time for withdrawing substrate $P_1$ from substrate carrier 3540 can be halved, which decreases the substrate exchange time.

Further, the carry-in timing of substrate $P_2$ may be any timing as long as the exposed substrate $P_1$ no longer exists on noncontact holder 32, but in the case of placing substrate $P_2$ onto noncontact holder 32 earlier than substrate carrier 3540, it is necessary to prevent adsorption pads 44 of substrate carrier 3540 and the new substrate $P_2$ from coming into contact with each other in the midway of substrate carrier 3540 returning. Further, the carry-in direction of substrate $P_2$ and the carry-out direction of substrate $P_1$ may be any directions.

Seventh Embodiment

Next, a seventh embodiment will be described using FIGS. 71 to 75C. In the present seventh embodiment, in a liquid crystal exposure apparatus having a substrate stage device with a configuration similar to substrate stage device 1020 (see the drawings such as FIG. 27) related to the third embodiment described above, the configuration and the operations of a substrate carry-in bearer device are different from those in the third embodiment described above. In the description below of the present seventh embodiment, elements that have the similar configurations and functions to those in the third embodiment described above will be provided with the same reference signs as those in the third embodiment described above, and the description thereof will be omitted.

Figure 71:
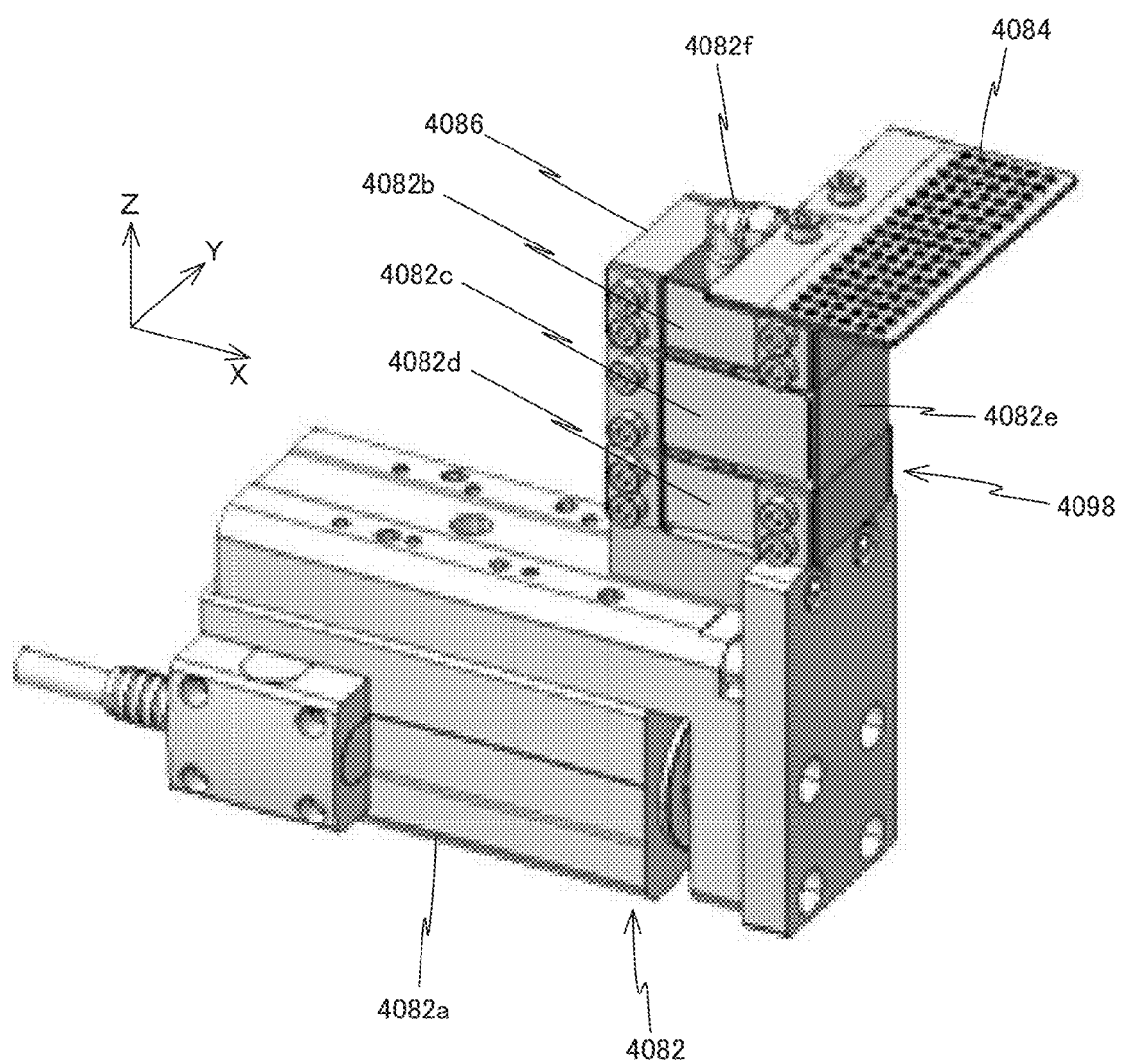
FIG. 71 is a view (No. 1) used to explain a seventh embodiment.

In FIG. 71, a substrate carry-in bearer device 4082 related to the seventh embodiment is illustrated with a part thereof omitted. While substrate carry-in bearer device 4082 related to the present seventh embodiment is a device for performing operations similar to those of substrate carry-in bearer device 1082b (see FIG. 29b) related to the third embodiment described above, improvement in the adsorption force of substrate P and improvement in the rigidity at the time of pre-alignment operation (in the X-axis direction and the θz direction) of substrate P are intended.

Although substrate carry-in bearer device 1082b (see FIG. 29b) related to the third embodiment described above has a configuration in which holding pads 1084b are inserted into cutouts 1028b formed at substrate holder 1028, it is preferable that recessed sections such as cutouts are small (or there are no recessed sections) on the upper surface of the holder, from the viewpoint of holding force (flatness correction force) of substrate P by substrate holder 1028. However, if the cutouts are made smaller, the holding pads need to be downsized accordingly, which may causes the risk that the adsorption force of substrate P decreases. In the present embodiment, as illustrated in FIG. 71, a holding pad 4084 of substrate carry-in bearer device 4082 is made thinner and also any cutouts (recessed sections) are not formed at a substrate holder (not illustrated). Holing pad 4084 is made larger than that in the third embodiment described above and the adsorption force of substrate P is improved.

Figure 72:
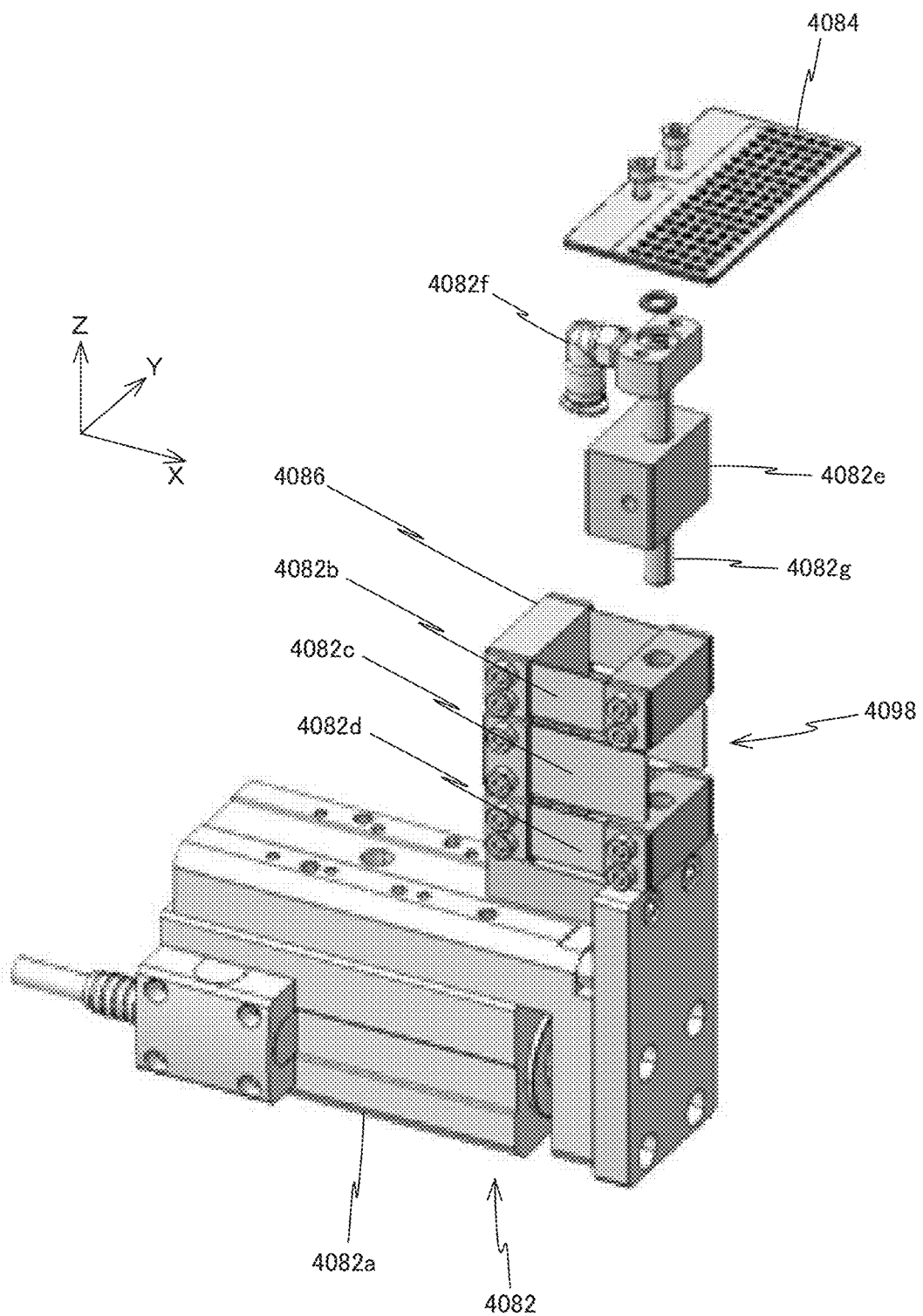
FIG. 72 is a view (No. 2) used to explain the seventh embodiment.
Figure 73:
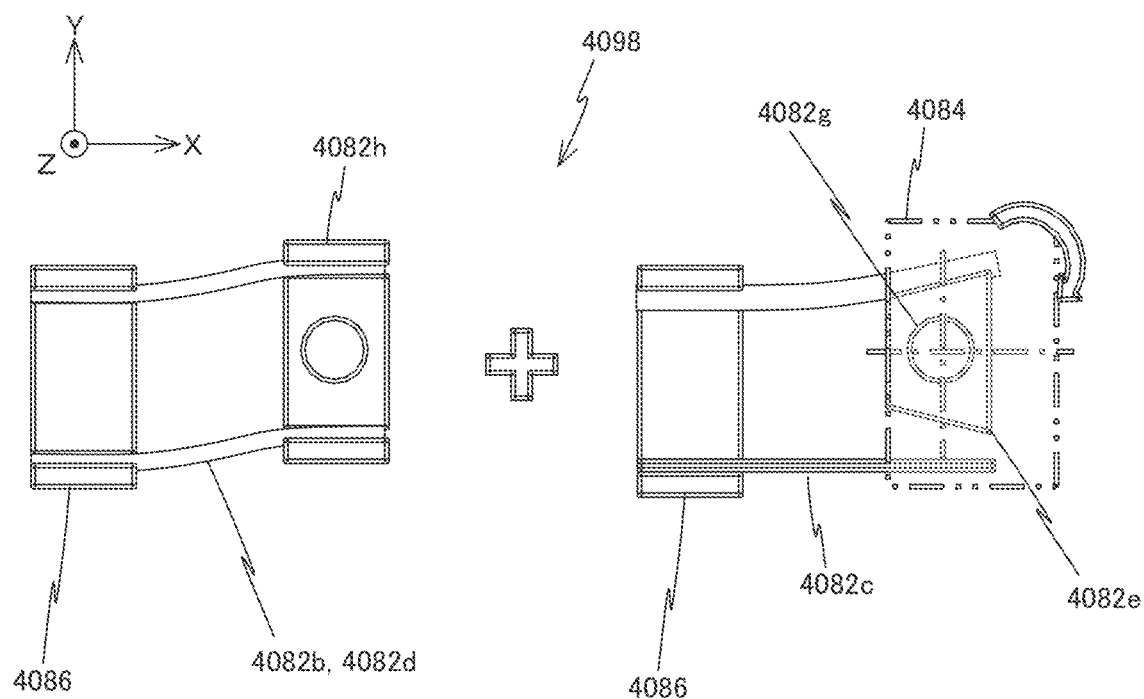
FIG. 73 is a view (No. 3) used to explain the seventh embodiment.

Further, substrate carry-in bearer device 4082 has a guide mechanism 4098 that is capable of finely moving holding pad 4084 only in the Y-axis direction and the θz direction. The exploded view of substrate carry-in bearer device 4082 is illustrated in FIG. 72, and the concept view of guide mechanism 4098 is illustrated in FIG. 73. A joint 4082f is connected to holding pad 4084. Holding pad 4084 is fixed to an oscillation block 4082e with a trapezoidal shape in planar view (viewed from the Z-axis direction) via bolts or the like. A rotating shaft 4082g protrudes from the upper surface and the lower surface of oscillation block 4082e. Holding pad 4084 is attached to a main body section 4086 via rotating shaft 4082g, a first fine movement guide 4082b and a second fine movement guide 4082d. Fine movement guides 4082b and 4082d include a parallel plate spring device stretched between main body section 4086 and a bearing block 4082h. A θz position control guide 4082c is attached to main body section 4086. θz position control guide 4082c has a pair of plate springs and oscillation block 4082e is inserted between the pair of plate springs. θz position control guide 4082c restores oscillation block 4082e to a neutral position. Holding pad 4084, main body section 4086 and the like are integrally driven by an X linear actuator 4082a in the X-axis direction.

As illustrated in FIG. 73, in guide mechanism 4098, bearing block 4082h that supports rotating shaft 4082g is finely movable relative to main body section 4086, by fine movement guides 4082b and 4082d, and holding pad 4084 is freely oscillated with respect to bearing block 4082h at a minute angle in the θz direction. The range where holding pad 4084 can oscillate is defined by the pair of plate springs that θz position control guide 4082c has.

Figure 74:
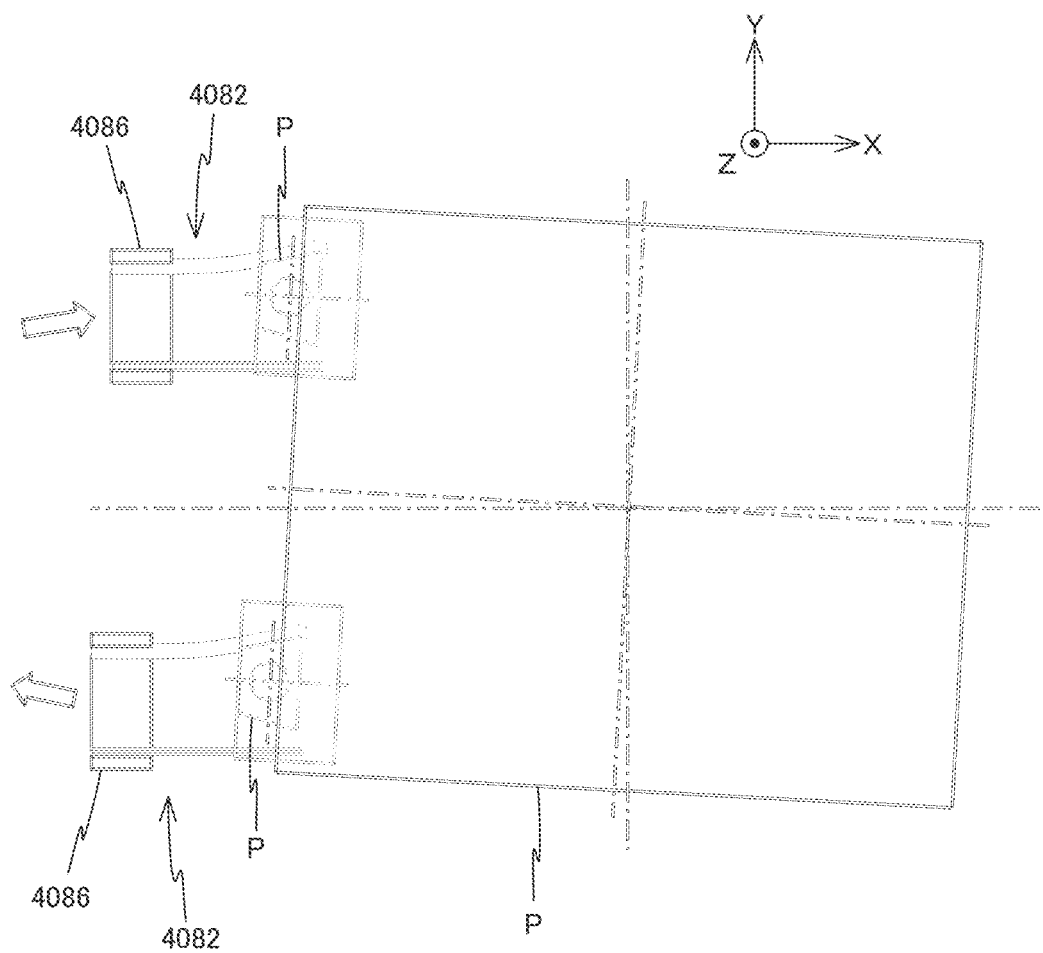
FIG. 74 is a view (No. 4) used to explain the seventh embodiment.

As illustrated in FIG. 74, at the time of pre-alignment operation of substrate P, the respective main body sections 4086 of a pair of substrate carry-in bearer devices 4082 are driven in directions opposite to each other, in order to rotate substrate P in the θz direction. On this operation, guide mechanism 4098 (see FIG. 73) of the present embodiment allows the positioning operations of substrate P to be performed with the simple structure as well as the high rigidity and high accuracy.

Figure 75A:
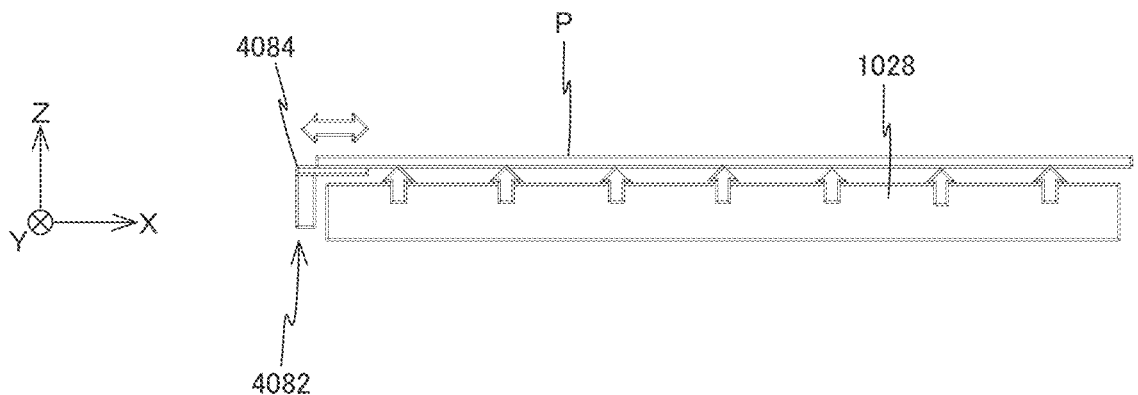
FIGS. 75*a* to 75*c* are views (No. 5 to No. 7) used to explain the seventh embodiment.
Figure 75B:
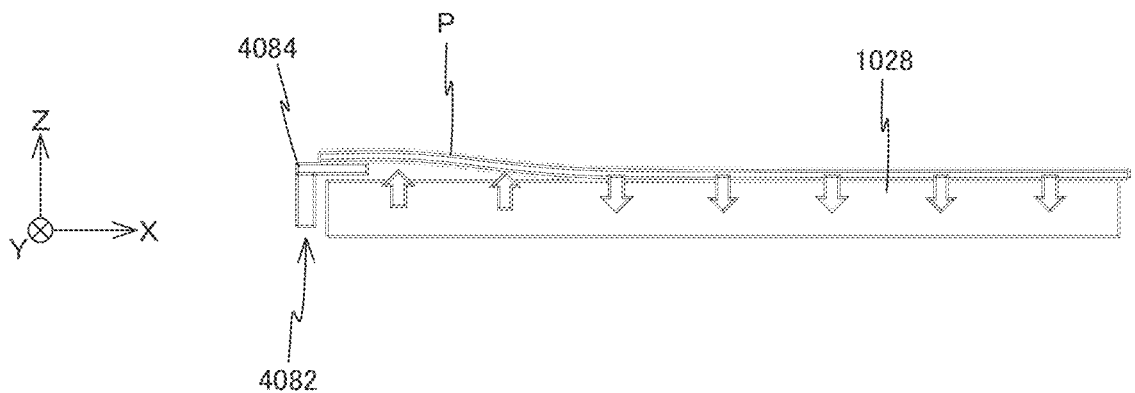
Figure 75C:
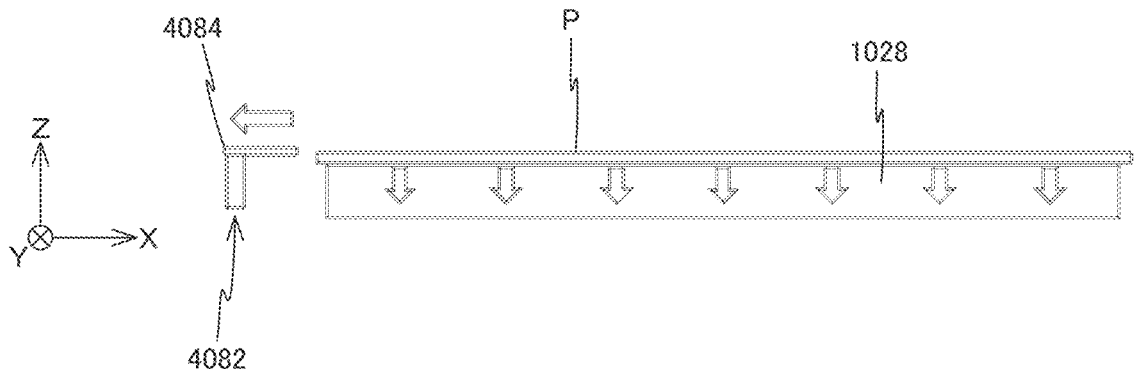

In FIGS. 75a to 75c, the carry-in operations of substrate P related to the seventh embodiment are shown. The carry-in operations of substrate P are generally the same as those in the second embodiment described above. After substrate P is delivered from the substrate carry-in hand (not illustrated) to holding pads 4084 of substrate carry-in bearer devices 4082 in a space above substrate holder 1028, substrate P and holding pads 4084 descend, and substrate P is supported in a noncontact manner by substrate holder 1028 via a minute gap. In the present seventh embodiment, any recessed sections for housing holdings 4084 are not formed on the upper surface of substrate holder 1028, and the thickness of holding pad 4084 is set thinner than a spacing between the lower surface of substrate P and the upper surface of substrate holder 1028.

In this state, the pre-alignment operation of substrate P is performed by independently driving the pair of holding pads 4084 in the X-axis direction, as illustrated in FIG. 75a. Subsequently, as illustrated in FIG. 75b, substrate holder 1028 causes the vacuum suction force to act on substrate P in the order from the +X side toward the −X side (toward the −X direction). When the holding by adsorption of the most part of substrate P has been completed, the pair of holding pads 4084 that have released the holding by adsorption of substrate P are driven toward the −X direction and withdrawn (pulled out) from below substrate P, as illustrated in FIG. 75c. Note that gas at high pressure may be jetted from holding pads 4084 and thereby the contact with substrate P may be reduced, i.e., the frictional force may be reduced. Thereafter, substrate holder 1028 adsorbs and holds the entirety of substrate P, though not illustrated.

According to substrate carry-in bearer devices 4082 of the present seventh embodiment, while the holding force of substrate P is maintained, the flatness degree of substrate holder 1028 is not deteriorated. Further, the rigidity in the operation direction at the time of pre-alignment operation is improved, and thereby the pre-alignment accuracy can be improved. Substrate carry-in bearer devices 4082 of the present seventh embodiment described so far may be applied to the fourth embodiment described above.

Eighth Embodiment

Figure 76:
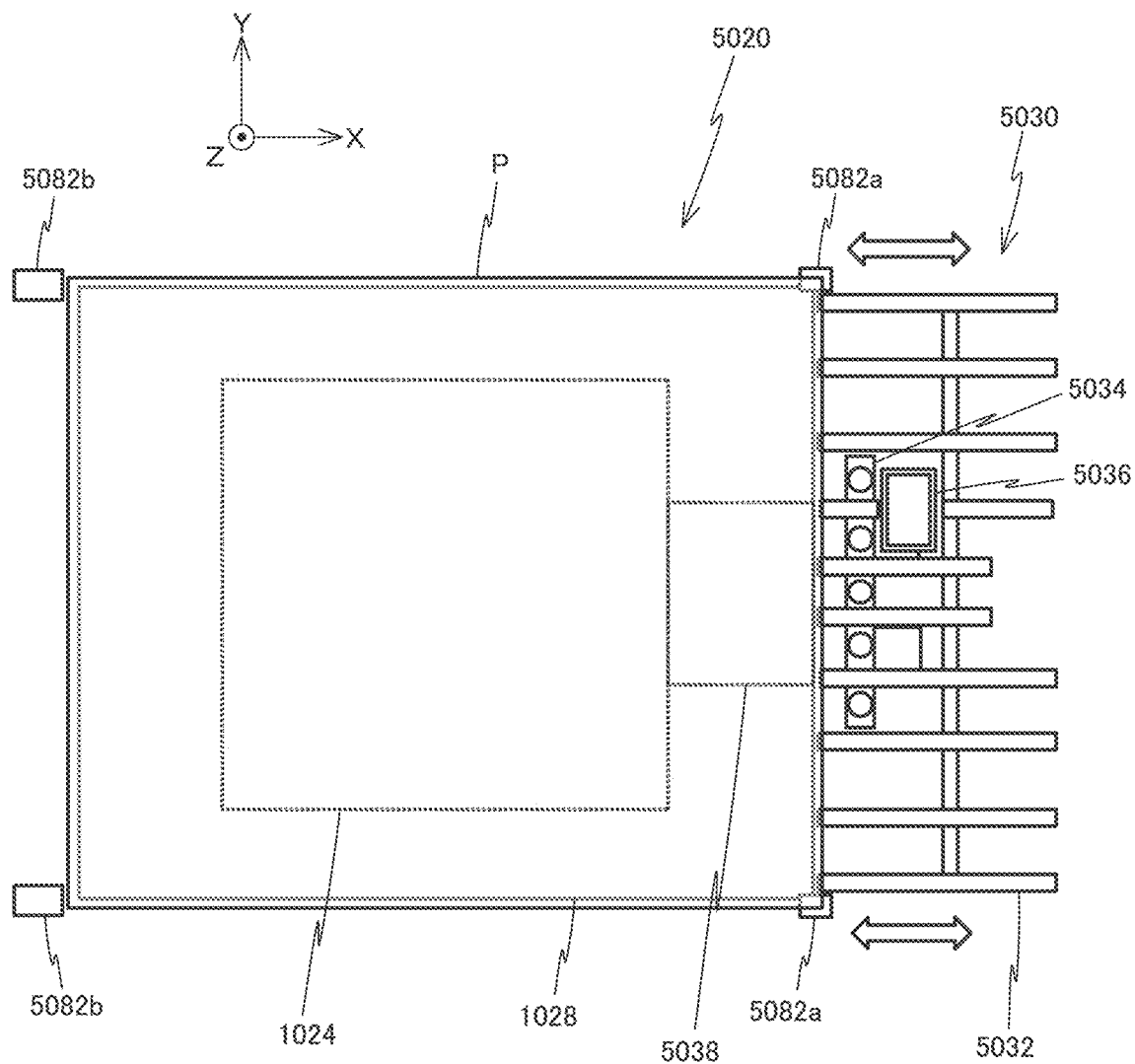
FIG. 76 is a view (No. 1) used to explain an eighth embodiment.
Figure 77A:
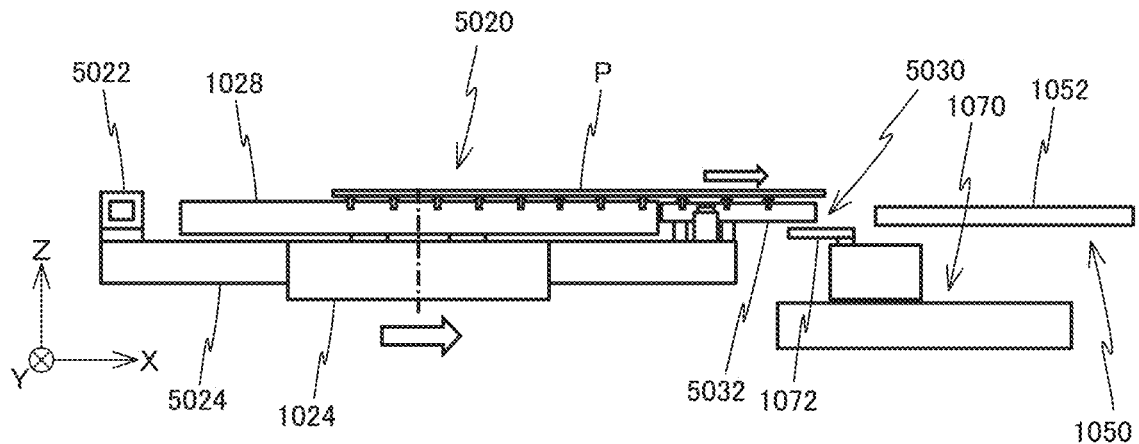
FIGS. 77*a* to 77*c* are views (No. 2 to No. 4) used to explain the eighth embodiment.
Figure 77B:
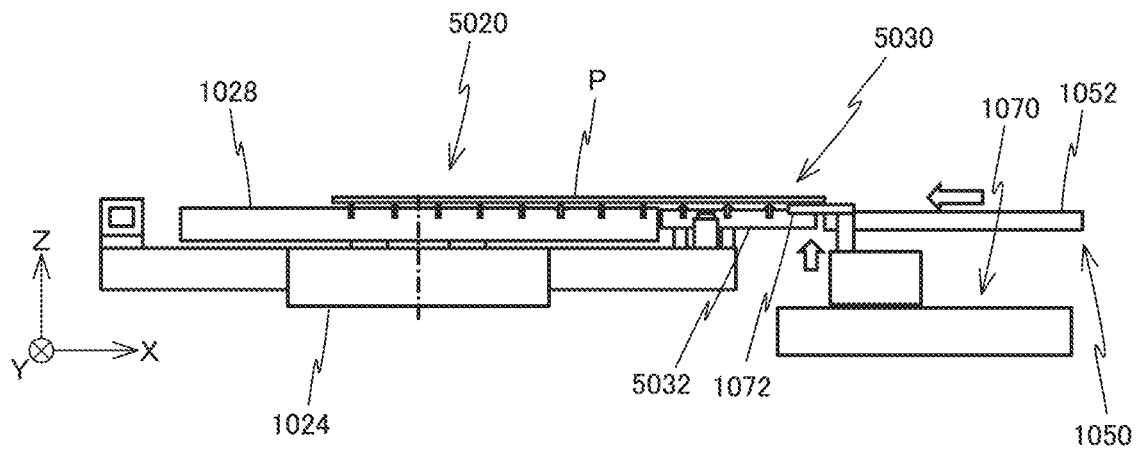
Figure 77C:
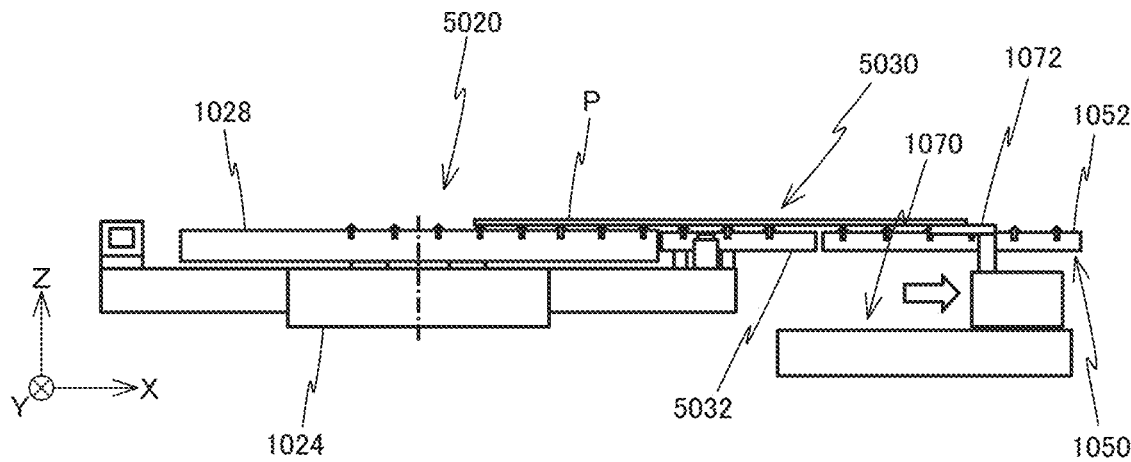

Next, an eighth embodiment will be described using FIGS. 76 to 77C. In the present eighth embodiment, in a liquid crystal exposure apparatus having a substrate stage device with a configuration similar to substrate stage device 1020 (see the drawings such as FIG. 27) related to the third embodiment described above, the configuration and the operations of a substrate exchange device are different from those in the third embodiment described above. In the description below of the present eighth embodiment, elements that have the similar configurations and functions to those in the third embodiment described above will be provided with the same reference signs as those in the third embodiment described above, and the description thereof will be omitted.

A substrate stage device 5020 has substrate carry-out bearer devices 5082a in the vicinity of both corners on the +X side of substrate holder 1028, and substrate carry-in bearer devices 5082b in the vicinity of both corners on the −X side of substrate holder 1028. The configurations of bearer devices 5082a and 5082b are generally the same as those of substrate carry-in bearer devices 4082 (see the drawings such as FIG. 71) related to the seventh embodiment described above. That is, bearer devices 5082a and 5082b each have holding pad 4084 of thin type (see the drawings such as FIG. 71) that is movable with a predetermined stroke in the X-axis direction. Therefore, any recessed sections for pad housing are not formed at the upper surface of substrate holder 1028. The stroke of substrate carry-out bearer device 5082a in the X-axis direction is set longer than that of the third embodiment described above. Bearer devices 5082a and 5082b may be attached to substrate table 1024 or may be attached to a coarse movement stage (not illustrated).

Substrate stage device 5020 has a platform for carry-out 5030. Platform for carry-out 5030 has a plurality (e.g. ten in the present embodiment) of balance beams 5032. The plurality of balance beams 5032 are connected to the side surface on the +X side of substrate table 1024 via a platform base 5038. Balance beams 5032 are members having the same functions as those of balance beams 1052 (see FIG. 28) in the third embodiment described above, except that their lengths are different from those of balance beams 1052. The Z-positions of the upper surfaces of balance beams 5032 are set to be substantially the same as (or slightly lower than) the Z-position of the upper surface of substrate holder 1028. Further, the Z-positions of the upper surfaces of balance beams 5032 are set to be substantially the same as the Z-positions of the upper surfaces of balance beams 1052 that beam unit 1050 (see FIG. 77*a*) has. Platform for carry-out 5030 may be attached to the side surface or the lower surface of substrate holder 1028.

A plurality of illuminance sensors 5034, a reference index 5036, a reference illuminance meter (not illustrated) and the like (hereinafter, referred to as sensors) are attached onto platform base 5038. The Z-positions of the upper surfaces of the sensors are set lower than the Z-positions of the upper surfaces of balance beams 5032. Platform for carry-out 5030 including the plurality of balance beams 5032 and the sensors are moved integrally with substrate holder 1028 with a long stroke within the XY plane in the operations such as the scanning exposure operation. As illustrated in FIG. 77*a*, a bar mirror 5022 is attached to the side surface on the −X side of substrate table 1024, via a mirror base 5024.

Next, the carry-out operations of substrate P in substrate stage device 5020 will be described. As illustrated in FIG. 76, both corner vicinity parts on the +X side of substrate P that has been exposed are gripped (held) by substrate carry-out bearer devices 5082*a*. Substrate carry-out bearer devices 5082*a* move substrate P (causes substrate P to be offset) toward the +X side relative to substrate holder 1028. In the offset state, the +X side end vicinity part of substrate P protrudes from the end of substrate holder 1028 and this protruding portion is supported from below by the plurality of balance beams 5032. Since balance beams 5032 forma system integral with substrate holder 1028 as is described above, the offset operation of substrate P by substrate carry-out bearer devices 5082*a* can be performed in parallel with an operation in which substrate holder 1028 is moved toward a predetermined substrate exchange position after the exposure operations are finished. On this operation, substrate carry-out hand 1072 of substrate carry-out device 1070 stands by at a lower position than balance beams 5032 so that substrate carry-out hand 1072 and balance beams 5032 do not come into contact with each other, even if substrate stage device 5020 becomes uncontrollable.

The present eighth embodiment is the same as the third embodiment described above in that the +X side end vicinity part of substrate P is gripped (held) by substrate carry-out hand 1072 after substrate holder 1028 is placed at the substrate exchange position (see FIG. 77*b*), and in that substrate carry-out hand 1072 gripping substrate P is driven toward the +X direction, and thereby substrate P is carried out onto beam unit 1050 (see FIG. 77*c*), and therefore, the description thereof will be omitted. Further, the carry-in operations of the substrate using substrate carry-in bearer devices 5082*b* are the same as those in the seventh embodiment described above, and therefore, the description thereof will be omitted.

According to the eighth embodiment described so far, since the carry-out operations of substrate P can be started before substrate holder 1028 reaches the substrate exchange position, the substrate exchange operations can be performed swiftly. Further, the length of balance beams 1052 that beam unit 1050 has and the stroke in the X-axis direction of substrate carry-out hand 1072 of substrate carry-out device 1070 can each be shortened.

Ninth Embodiment

Next, a ninth embodiment will be described using FIGS. 78 to 83. In the present ninth embodiment, in a liquid crystal exposure apparatus having a substrate stage device with a configuration similar to that of substrate stage device 5020 (see the drawings such as FIG. 76) related to the eighth embodiment described above, the configuration and the operations of a substrate exchange device are different from those in the eighth embodiment described above. In the description below of the present ninth embodiment, elements that have the similar configurations and functions to those in the eighth embodiment described above will be provided with the same reference signs as those in the eighth embodiment described above, and the description thereof will be omitted.

Figure 78:
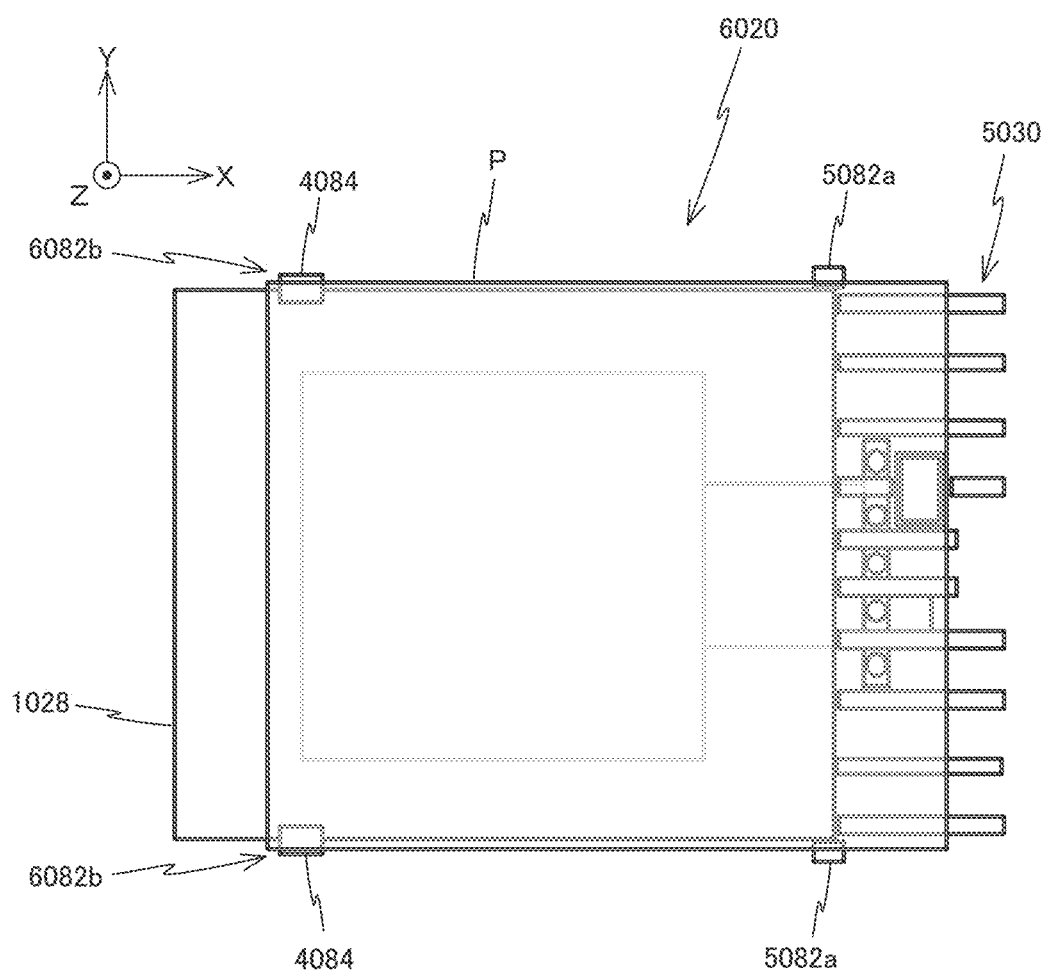
FIG. 78 is a view (No. 1) used to explain a ninth embodiment.

As illustrated in FIG. 78, a substrate stage device 6020 related to the ninth embodiment is configured similarly to substrate stage device 5020 (see the drawings such as FIG. 76) of the eighth embodiment described above, except for the placement and operations of substrate carry-in bearer devices 6082*b*. Of a pair of substrate carry-in bearer devices 6082*b*, one substrate carry-in bearer device 6082*b* is disposed on the +Y side of substrate holder 1028 and the other is disposed on the −Y side of substrate holder 1028. Substrate carry-in bearer devices 6082*b* are similar to substrate carry-in bearer devices 4082 (see the drawings such as FIG. 71) related to the seventh embodiment described above, but is different from substrate carry-in bearer devices 4082 in that the stroke in the X-axis direction of holding pads 4084 of thin type is set longer than that in the seventh embodiment described above. In the present embodiment, holding pads 4084 of substrate carry-in bearer devices 6082*b* are movable with a long stroke along the +Y side (or −Y side) end of substrate holder 1028. Further, holding pads 4084 are also movable with a predetermined stroke in the Y-axis direction.

Figure 79A:
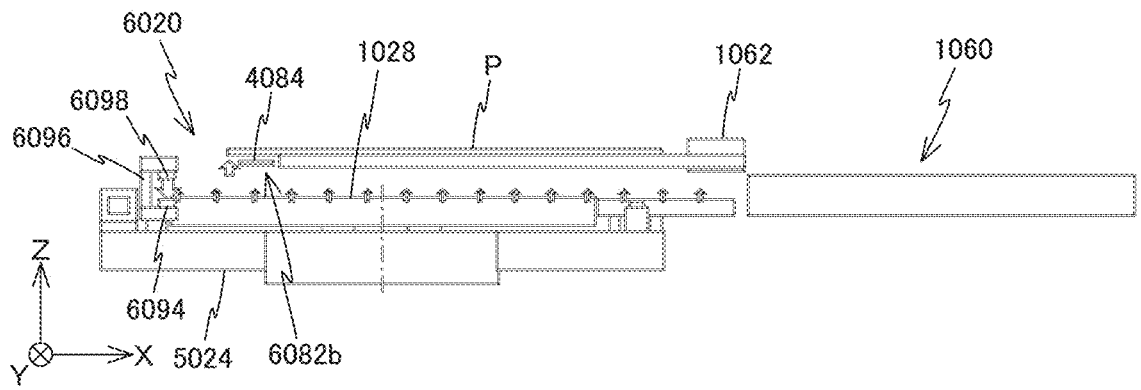
FIGS. 79*a* to 79*d* are views (No. 2 to No. 5) used to explain the ninth embodiment.
Figure 80:
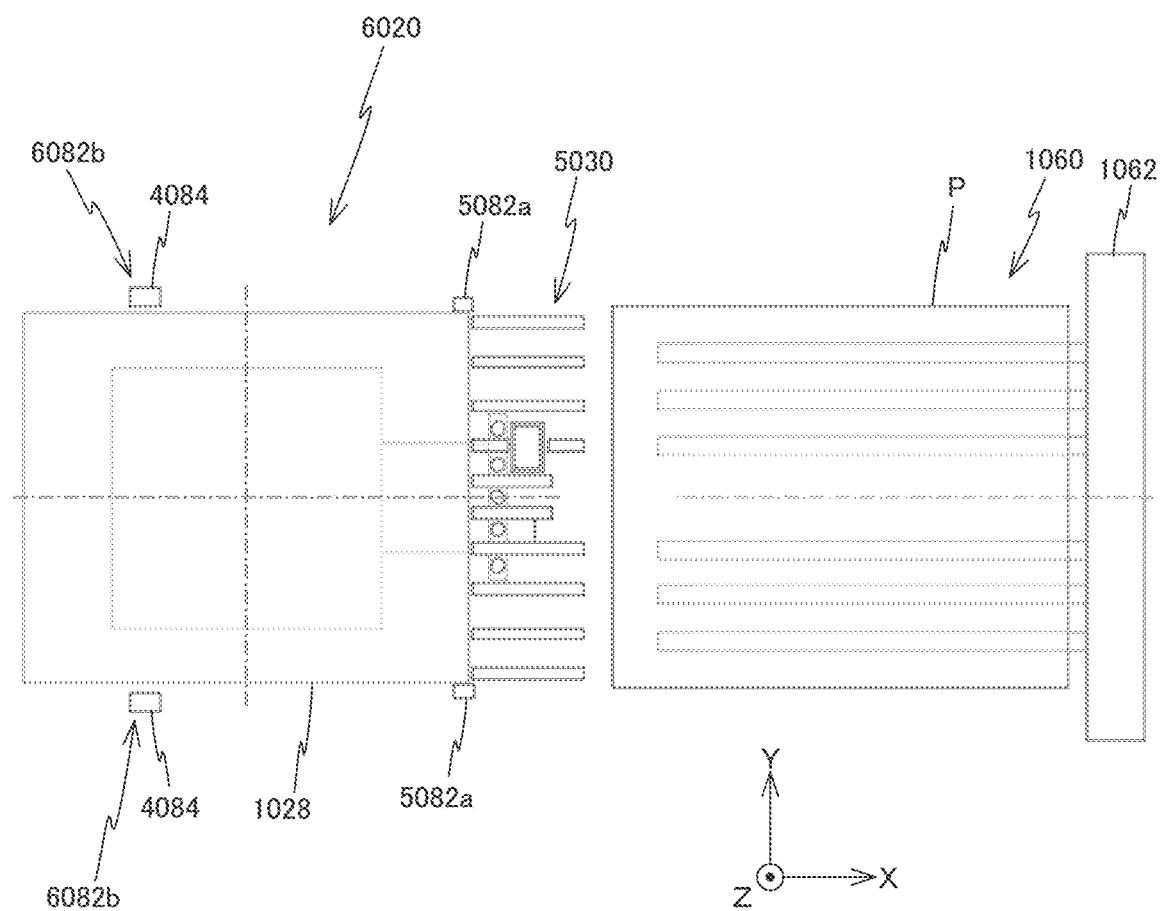
FIG. 80 is a view (No. 6) used to explain the ninth embodiment.
Figure 81:
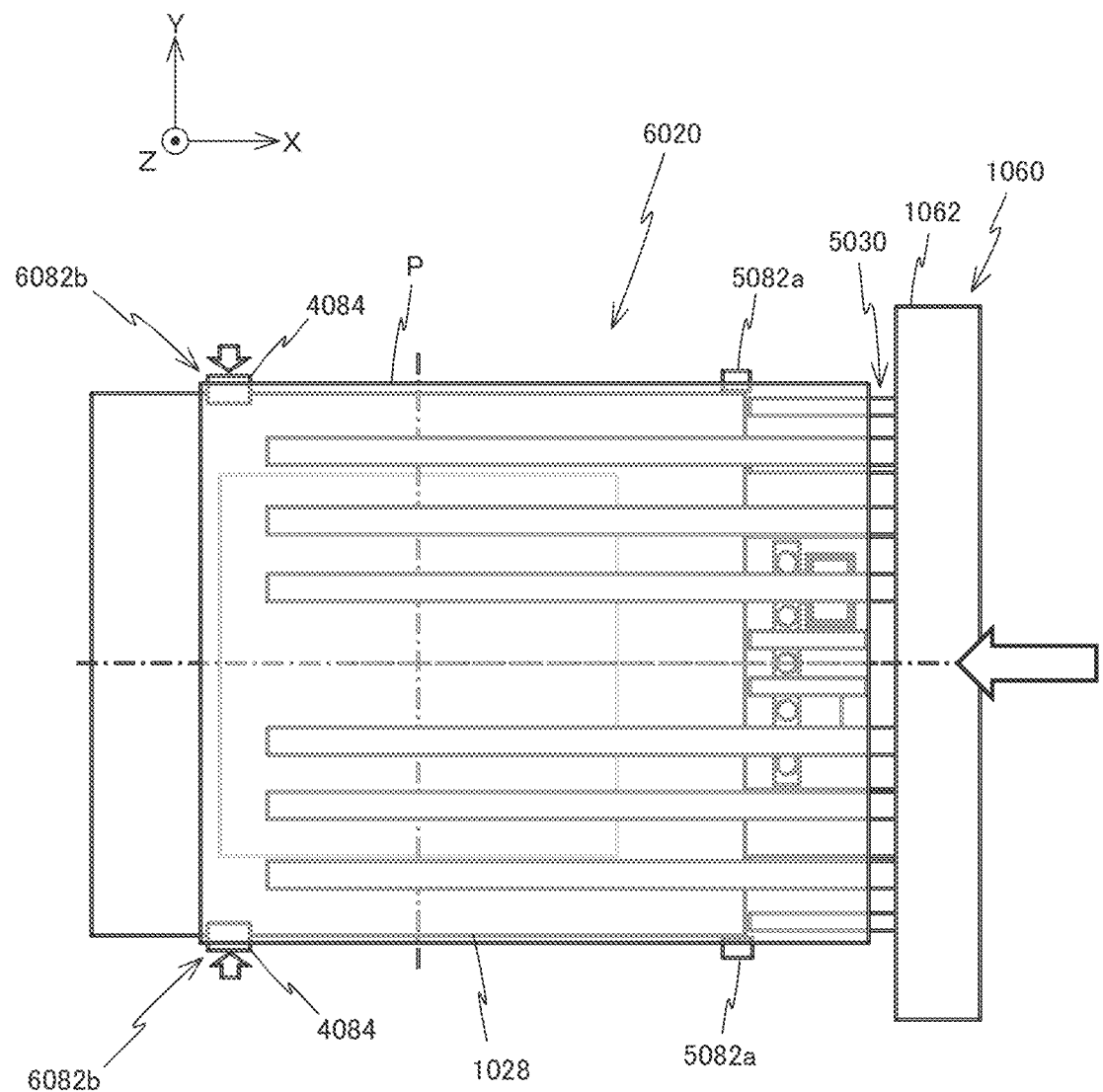
FIG. 81 is a view (No. 7) used to explain the ninth embodiment.

The carry-in operations of substrate P related to the ninth embodiment will be described below. As illustrated in FIG. 80, substrate P is carried in by substrate carry-in device 1060 similar to that in the third embodiment described above. As illustrated in FIGS. 79*a* and 81, substrate P placed on substrate carry-in hand 1062 of substrate carry-in device 1060 is carried to a space above substrate holder 1028. On this operation, substrate P is offset toward the +X side relative to substrate holder 1028, which is different from the third embodiment described above.

Figure 79B:
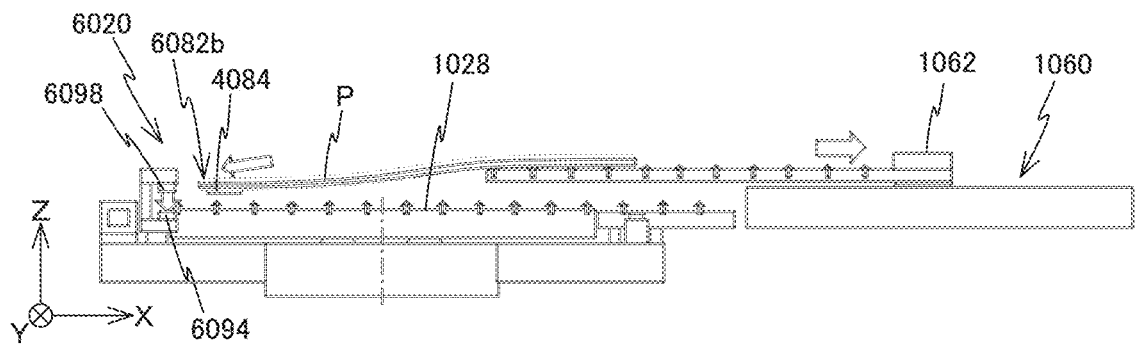
Figure 82:
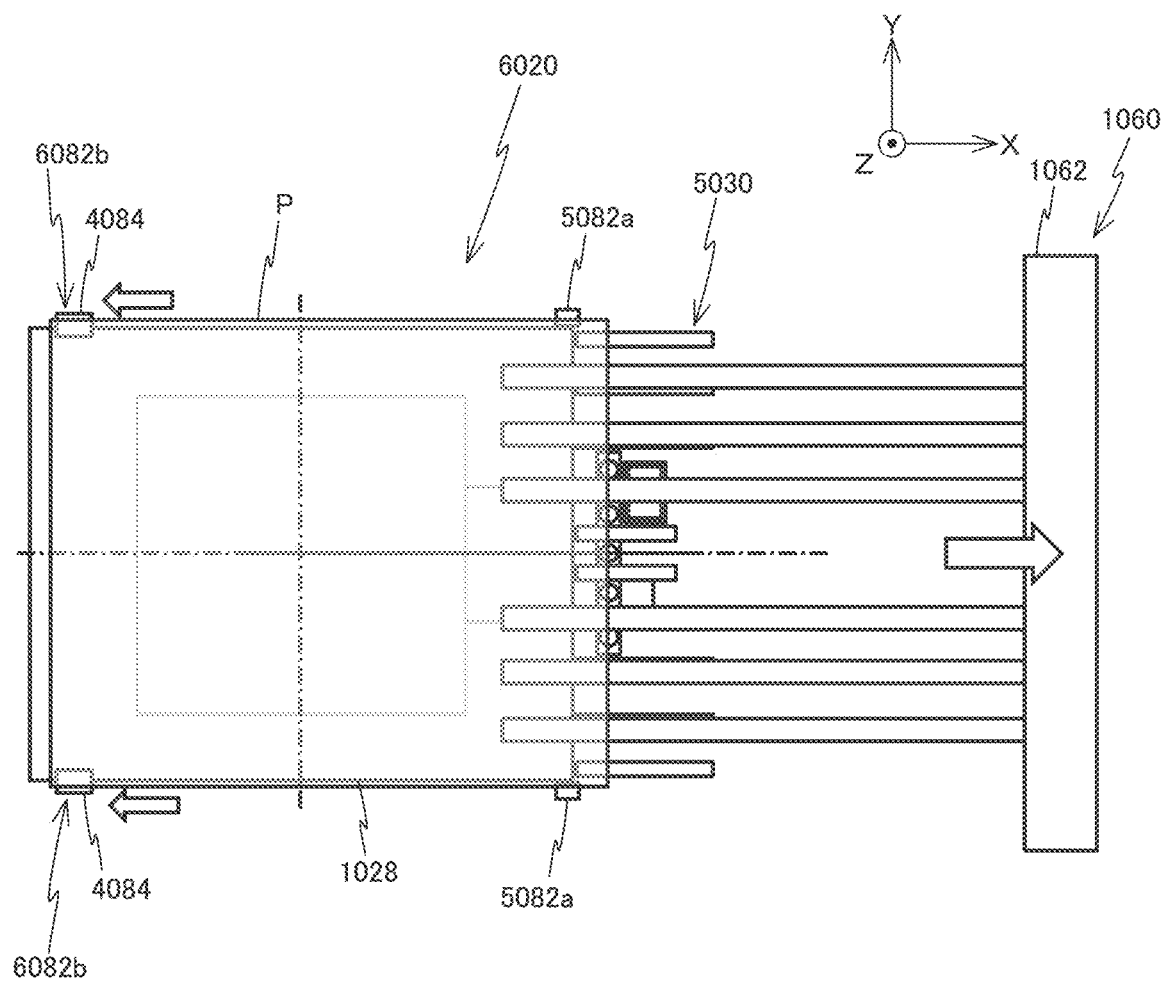
FIG. 82 is a view (No. 8) used to explain the ninth embodiment.

Subsequently, as illustrated in FIG. 81, the pair of substrate carry-in bearer devices 6082*b* grip (hold) the −X side end vicinity part of substrate P. Holding pads 4084 are located at a position (outside substrate holder 1028) that does not overlap with substrate P within the XY plane, at the time of exposure operations and the like, and when gripping substrate P, one holding pad 4084 (on the +Y side) is driven toward the −Y direction and other holding pad 4084 (on the −Y side) is driven toward the +Y direction, and thereby holding pads 4084 are inserted between substrate P and substrate holder 1028. After that, as illustrated in FIGS. 79*b* and 82, substrate carry-in hand 1062 is moved toward the +X direction and withdrawn from a space above substrate holder 1028. In parallel with this withdrawal operation of substrate carry-in hand 1062, holding pads 4084 are driven downward along with substrate P descending due to the self-weight. Further, along with the descending operation, holding pads 4084 are driven toward the −X direction (a direction reversed to the movement direction of substrate carry-in hand 1062 at the time of the withdrawal operation).

Figure 83:
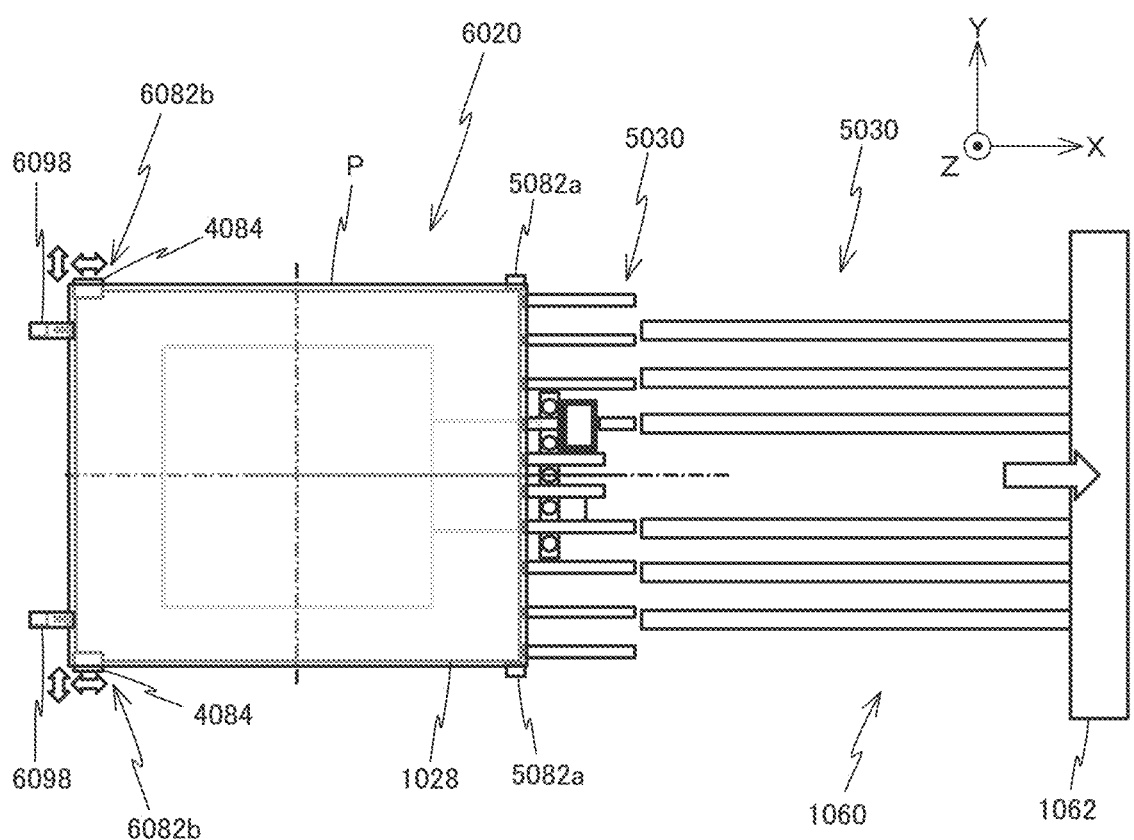
FIG. 83 is a view (No. 9) used to explain the ninth embodiment.

As illustrated in FIG. 83, on the −X side of substrate holder 1028, a pair of edge sensors 6098 are disposed spaced apart in the Y-axis direction (not illustrated in FIGS. 78 and 80 to 82). As illustrated in FIG. 79*a*, edge sensors 6098 are attached to mirror base 5024 via a bracket 6096 with an L-like shape in side view. A target 6094 is disposed below edge sensors 6098. Edge sensors 6098 detect the position in the X-axis direction of the −X side end of substrate P inserted between edge sensors 6098 and target 6094, relative to substrate holder 1028.

Figure 79C:
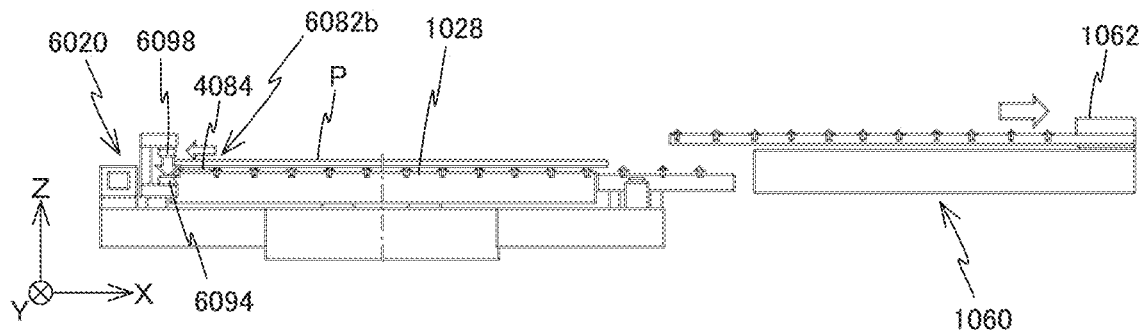

Holding pads 4084 perform the descending operation and the moving operation toward the −X direction in parallel, and thereby, as illustrated in FIG. 79c, the −X side end vicinity part of substrate P is inserted between edge sensors 6098 and target 6094. At this time, pressurized gas is jetted from substrate holder 1028 to the lower surface of substrate P, and substrate P is levitated on substrate holder 1028, which is the same as the third embodiment described above.

Figure 79D:
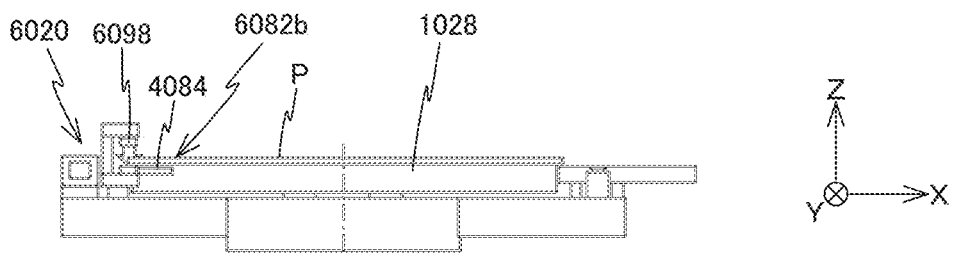

As illustrated in FIG. 83, holding pads 4084 are finely driven as needed in the X-axis direction and the Y-axis direction on the basis of the outputs of the pair of edge sensors 6098. Accordingly, the pre-alignment operation of substrate P is performed. After the pre-alignment operation is finished, the holding by adsorption of substrate P by substrate holder 1028 and the withdrawal operation of holding pads 4084 from below substrate P are performed, as illustrated in FIG. 79d, which is similar to the seventh embodiment described above.

According to the ninth embodiment described so far, the stroke in the X-direction of substrate carry-in hand 1062 of substrate carry-in device 1060 can be shortened. Further, holding pads 4084 and substrate carry-in hand 1062 are moved in directions opposite to each other, and thereby the separation between substrate P and substrate carry-in hand 1062 can be performed swiftly, which allows the substrate exchange time in total to be decreased. Further, since edge sensors 6098 and target 6094 can be together installed at substrate stage device 6020, detection of the edges can be performed easily, for example, compared to the case of installing only the edge sensors at device main body 18 (see FIG. 1). Furthermore, by the moving operations of holding pads 4084 toward the −X direction, the X side ends of substrate P can be detected by edge sensors 6098, which decreases the time required for the pre-alignment operation of performing position adjustment of substrate P relative to substrate holder 1028.

Figure 84:
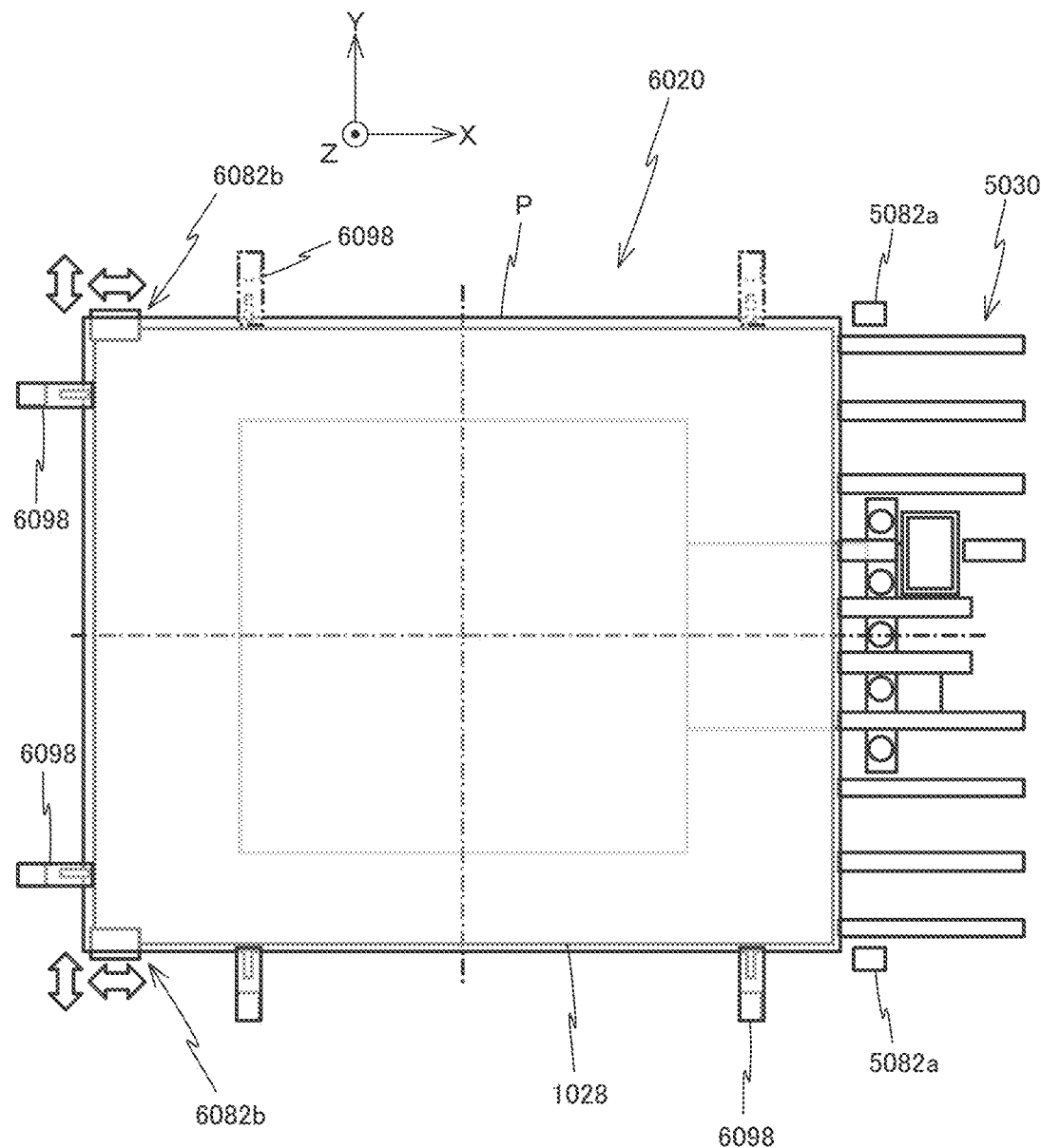
FIG. 84 is a view used to explain a modified example of the ninth embodiment.

Note that, although two points of the end in one direction (on the −X side in the present embodiment) of substrate P are detected by edge sensors 6098 in the present embodiment, this is not intended to be limiting, and as illustrated in FIG. 84, the detection of ends on three-directions (the +Y direction, the −Y direction and the −X direction) sides may be performed using respective pairs of edge sensors 6098. Note that in the case where a reference side is on the +X side, substrate P should be rotated at a 180 degree angle around the Z-axis and carried into substrate holder 1028.

Note that the configurations of the liquid exposure apparatuses, the substrate stage devices and the substrate exchange devices related to the first embodiment to the ninth embodiment described so far are examples, and can be changed as needed. Modified examples will be described below.

Figure 85A:
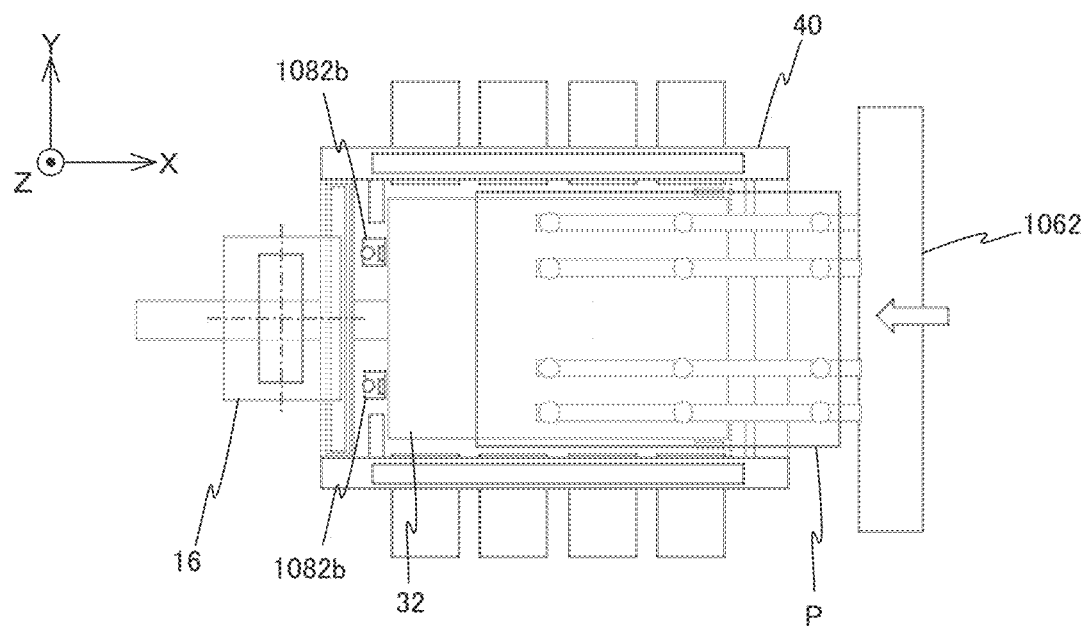
FIGS. 85*a* and 85*b* are views (No. 1 and No. 2) used to explain a first modified example.
Figure 85B:
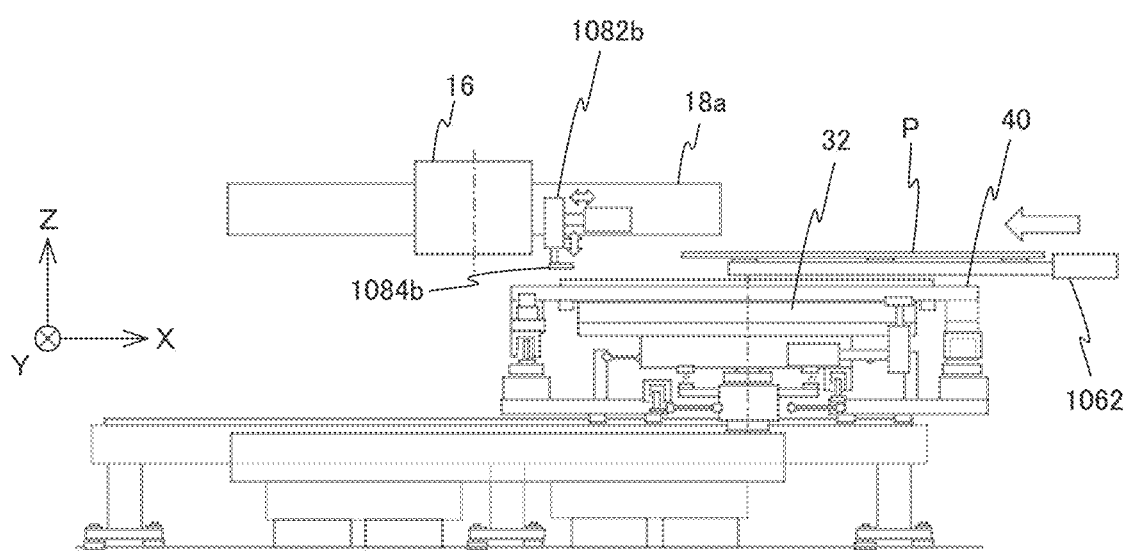

A first modified example as shown in FIGS. 85a and 85b provides an embodiment in which the pair of substrate carry-in bearer devices 1082b are fixed, in a suspended state, to upper mount section 18a of apparatus main body 18 in the fourth embodiment described above. Holding pads 1084b of substrate carry-in bearer devices 1082b are movable in the Z-axis direction and the X-axis direction (or the Z-axis direction, the X-axis direction, and the Y-axis direction). The structure of substrate carry-in bearer device 1082b may use direct-operated actuators similar to those in the fourth embodiment described above, or may use a publicly known parallel link mechanism as disclosed in, for example, U.S. Pat. No. 6,516,681. In this case, recessed sections (cutouts) for housing holdings pads 1084b need not be formed at noncontact holder 32.

Figure 86A:
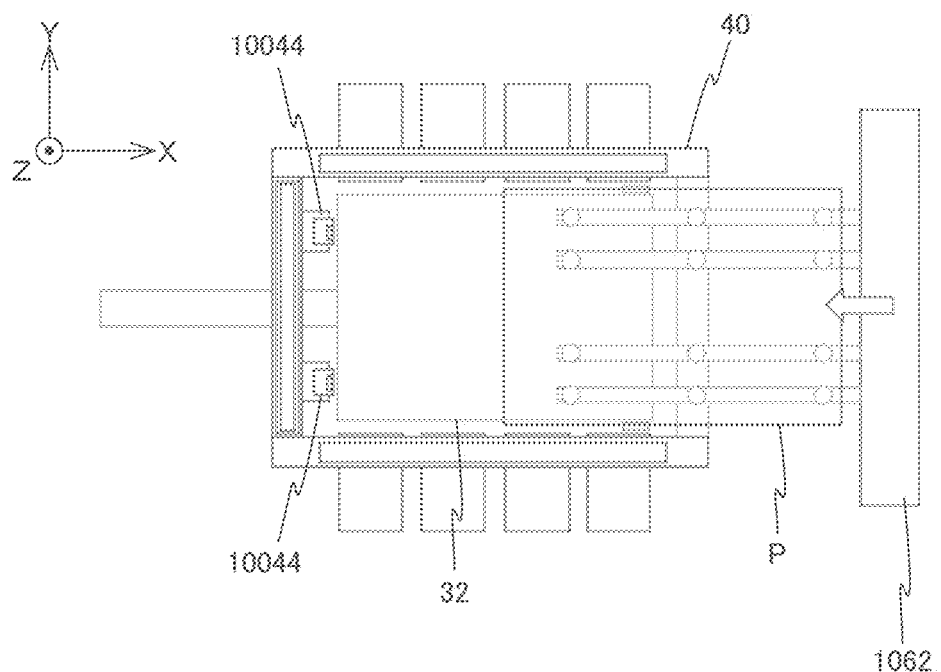
FIGS. 86*a* and 86*b* are views (No. 1 and No. 2) used to explain a second modified example.
Figure 86B:
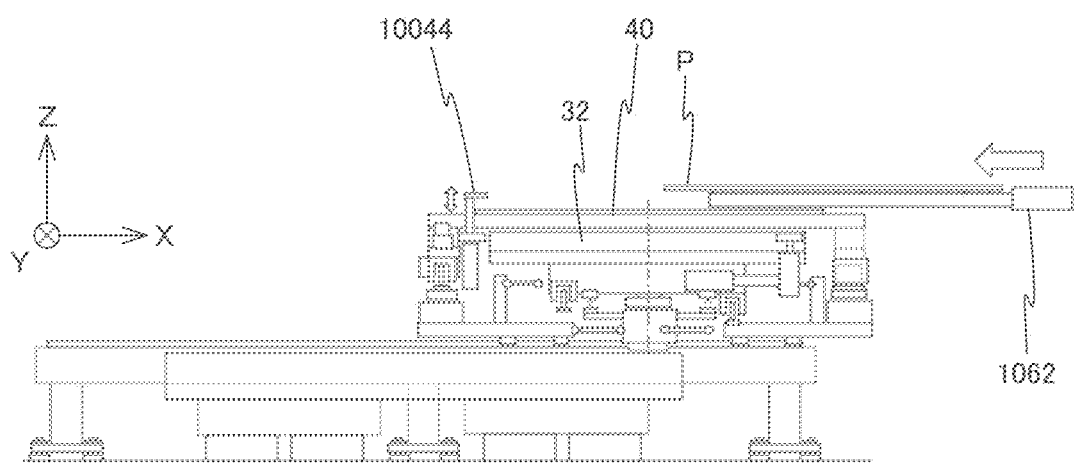
Figure 87C:
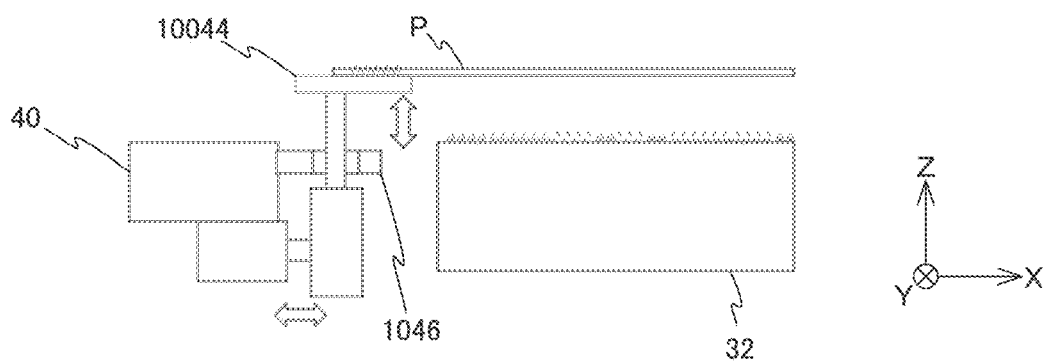
FIGS. 87*c* and 87*d* are views (No. 1 and No. 2) showing an example of shift preventing structure of holding pads in the second modified example.
Figure 87D:
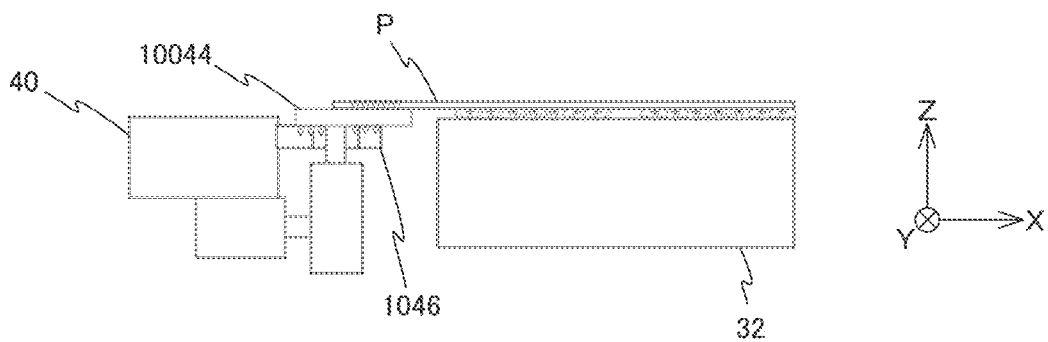

A second modified example as shown in FIGS. 86a and 86b provides an embodiment in which holding pads 10044 usable as holding pads 1084b (see FIG. 29b) of substrate carry-in bearer devices 1082b and also as adsorption pads 44 (see FIG. 3) of substrate carrier 40 in the fourth embodiment described above are attached to substrate carrier 40. Holdings pads 10044 are movable in the Z-axis direction and the X-axis direction (or the Z-axis direction, the X-axis direction, and the Y-axis direction) relative to the main body section (the frame-like member) of substrate carrier 40. In this case, the delivery operations of substrate P between the holding pads as in the fourth embodiment described above are not necessary. A sensor (an interferometer or an encoder) to measure the position of substrate P is attached to substrate carrier 40, and therefore, in the case where pad members for substrate carry-in also serve as pad members for substrate holding as in the present modified example, it is necessary to prevent holding pads 10044 from shifting relative to the main body section of substrate carrier 40, after the attitude adjustment of substrate P. As an example, as illustrated in FIGS. 87c and 87d, adsorption pads 1046 should be attached to substrate carrier 40, and the relative movement of holding pads 10044 with respect to substrate carrier 40 should be restricted by adsorbing and holding the back surface of holdings pads 10044 by holding pads 1046, after substrate P is delivered to noncontact holder 32. As a method of restricting the relative movement between adsorption pads 1046 and the main body section of substrate carrier 40, adsorption pads 1046 and the main body section of substrate carrier 40 may be mechanically locked (e.g., the adsorption pads and substrate carrier 40 may be coupled). After substrate P is supported in a noncontact manner by noncontact holder 32, adsorption pads 1046 that drives substrate P and substrate carrier 40 may be electrically locked. As a method of electrically locking them, a driving force (electric power) for driving adsorption pads 1046 in a vertical direction may be OFF, to prevent the relative driving of adsorption pads 1046 with respect to substrate carrier 40. As another method of electrically locking them, the position control may be performed to prevent adsorption pads 1046 from shifting with respect to substrate carrier 40, thereby controlling the relative positional relationship between them not to be changed. A measurement system that measures the relative positional relationship between substrate carrier 40 and the holding pads may be further provided. Although such a measurement system may restrict the relative movement between holdings pads 10044 and substrate carrier 40, the measurement system is a system for monitoring whether or not the relative positional relationship between them is maintained within a predetermined range. The measurement by the measurement system may be performed intermittently, or may be performed at each predetermined time.

Figure 88A:
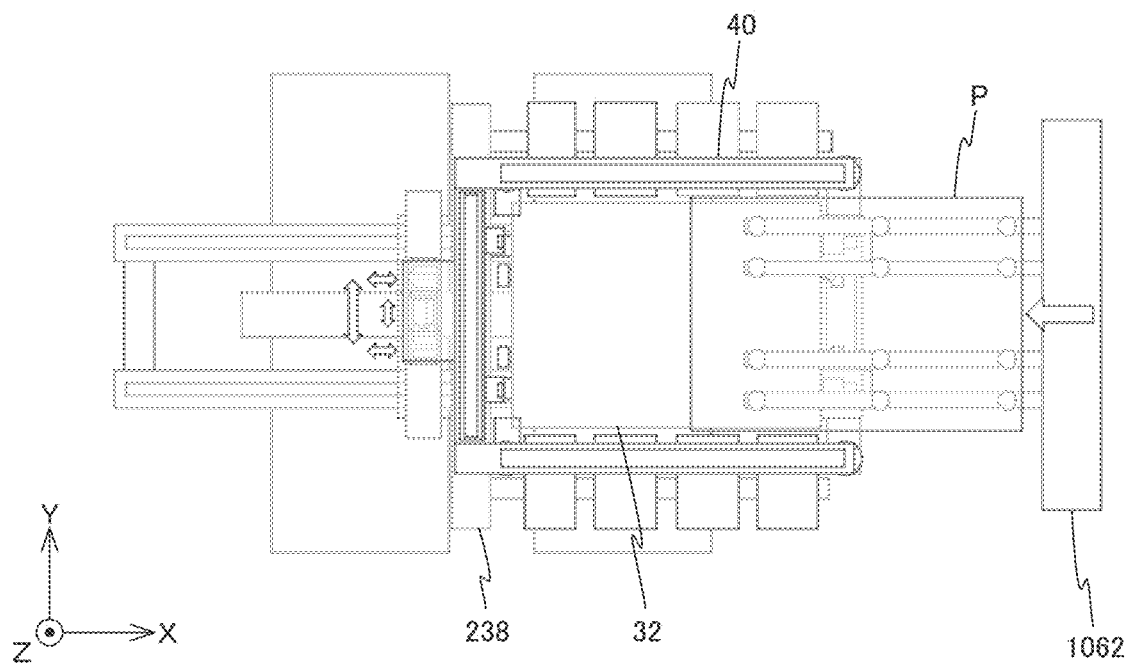
FIGS. 88*a* and 88*b* are views (No. 1 and No. 2) used to explain a third modified example.
Figure 88B:
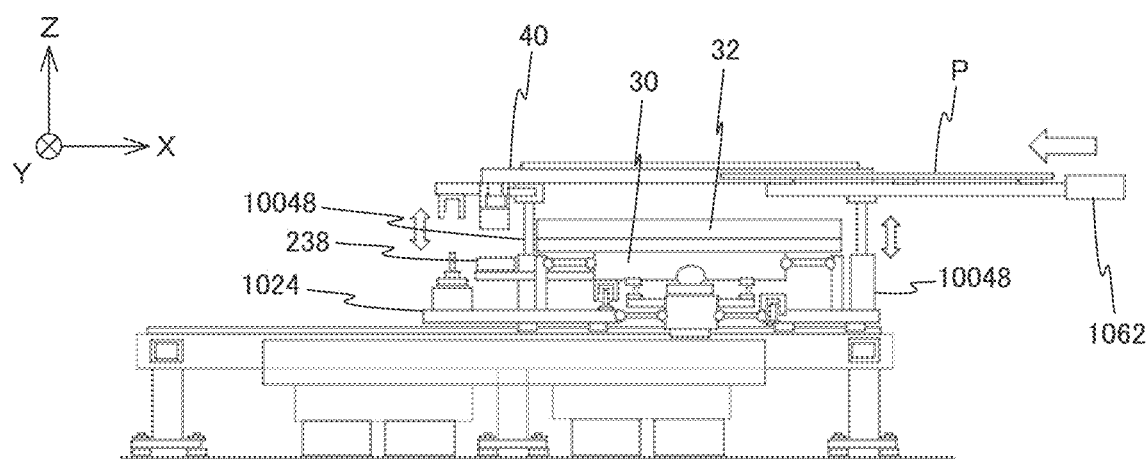

A third modified example as shown in FIGS. 88a and 88b provides an embodiment in which the substrate stage device does not have elements corresponding to substrate carry-in bearer devices 1082b (see FIG. 49) in the fourth embodiment described above. In the present modified example, substrate carrier 40 as a whole is vertically moved by a plurality of lifters 10048 attached to coarse movement stage 24, thereby to receive substrate P that stands by in a space above noncontact holder 32 from substrate carry-in hand 1062, and descend. Therefore, substrate carrier 40 has, for example, a shape without a frame member on the +X side (a U-like shape in planar view) to prevent substrate carrier 40 from interfering with substrate P that is carried in. Note that lifters 10048 may be finely movable in the XY directions, or one lifter 10048 may adsorb and fix the back surface of substrate carrier 40 and capable of rotating substrate carrier 40 around the Z-axis. In this case, rough alignment of substrate P relative to substrate carrier 40 can be performed. In the present modified example, linear motors (voice coil motors) for finely driving substrate carrier 40 are disposed so that stators and movers can be separated in the Z-direction, as illustrated in FIGS. 1 and 2, and therefore substrate carrier 40 can be easily separated from or linked with coarse movement stage 24 and the like. Note that in the present modified example, the frame member on the +X side is not provided, and therefore, of the linear motors for finely driving substrate carrier 40, a pair of X linear motors are disposed spaced apart in the Y-axis direction and one Y linear motor is disposed in the center part in the Y-axis direction, which are each disposed on the −Y side of substrate carrier 40, and the fine rotation control around the Z-axis of substrate carrier 40 can also be performed. Further, similarly to the modified example as shown in FIG. 13*a*, substrate carrier 40 is placed on air levitation units 238 attached to substrate table 30 that is vibrationally (physically) separated from coarse movement stage 24.

Figure 89A:
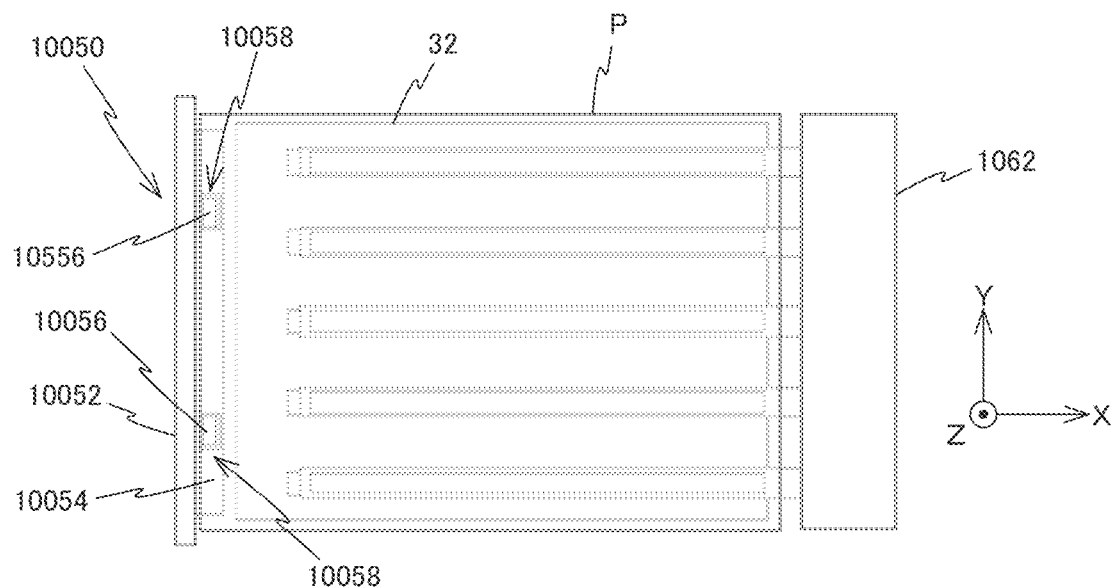
FIGS. 89*a* to 89*c* are views (No. 1 to No. 3) used to explain a fourth modified example.
Figure 89B:
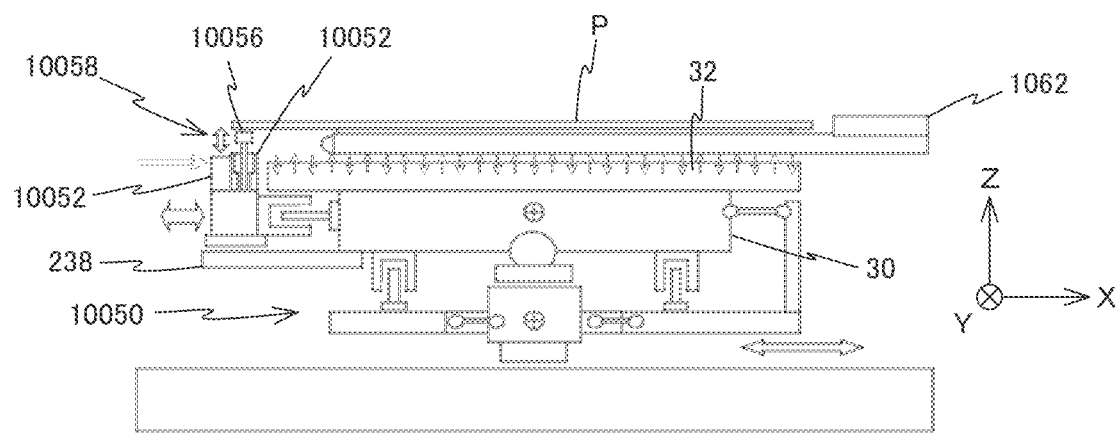
Figure 89C:
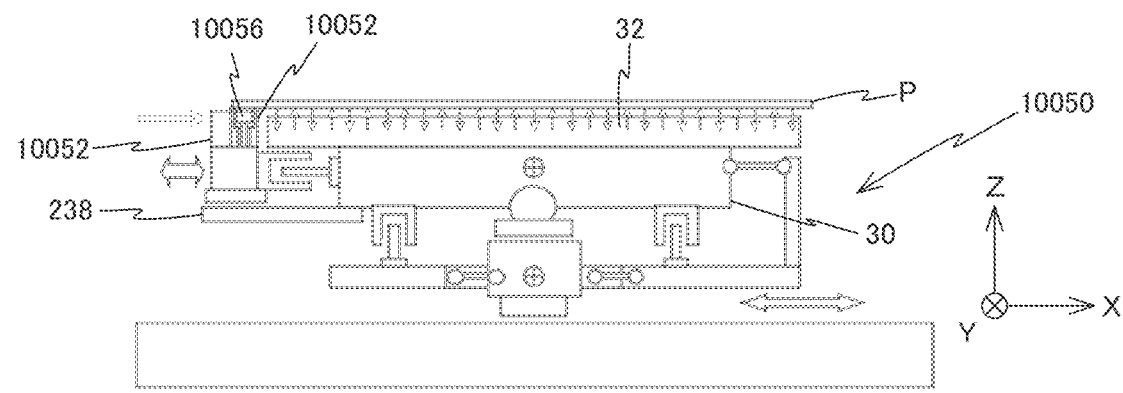

A fourth modified example as shown in FIGS. 89*a* to 89*c* provides an embodiment in which the configuration of a substrate stage device 10050 is different from that in the fourth embodiment described above. Substrate stage device 10050 is similar to the fourth embodiment described above in that a member (a substrate carrier 10052) that holds substrate P and noncontact holder 32 are separated, but is different from the fourth embodiment described above in that substrate carrier 10052 and noncontact holder 32 are both movable with a long stroke within the XY plane and substrate carrier 10052 is finely movable relative to noncontact holder 32. Substrate carrier 10052 has a holding pad 10054 that is formed into a bar-like shape extending in the Y-axis direction and adsorbs and holds the −X side end vicinity part of substrate P from below. Substrate carrier 10052 is placed in a noncontact manner on air levitation unit 238 attached to substrate table 30, and is finely movable relative to noncontact holder 32 in the directions of three degrees of freedom within the horizontal plane. A pair of openings spaced apart in the Y-axis direction are formed at the holding surface of holding pad 10054, and holding pads 10056 are housed in the openings. Holdings pads 10056 are a part of a bearer device for substrate carry-in 10058, and are driven at least in the Z-axis direction relative to the main body section (the bar-like member) of substrate carrier 10052. In the present modified example, as illustrated in FIG. 89*b*, when substrate carry-in hand 1062 carries substrate P to a space above noncontact holder 32, holding pads 10056 are driven upward, and adsorb and hold the −X side end vicinity part of substrate P. The present fourth modified example is the same as the fourth embodiment described above in that substrate carry-in hand 1062 is then withdrawn toward the +X direction, and in that holding pads 10056 are driven downward along with the falling operation of substrate P due to the self-weight, as illustrated in FIG. 89*c*. At this time, the upper surfaces of holding pads for carry-in 10056 are positioned to be lower in position than the upper surface of holding pad 10054 for adsorbing and holding (so that holding pads 10056 are separated from substrate P).

Figure 90A:
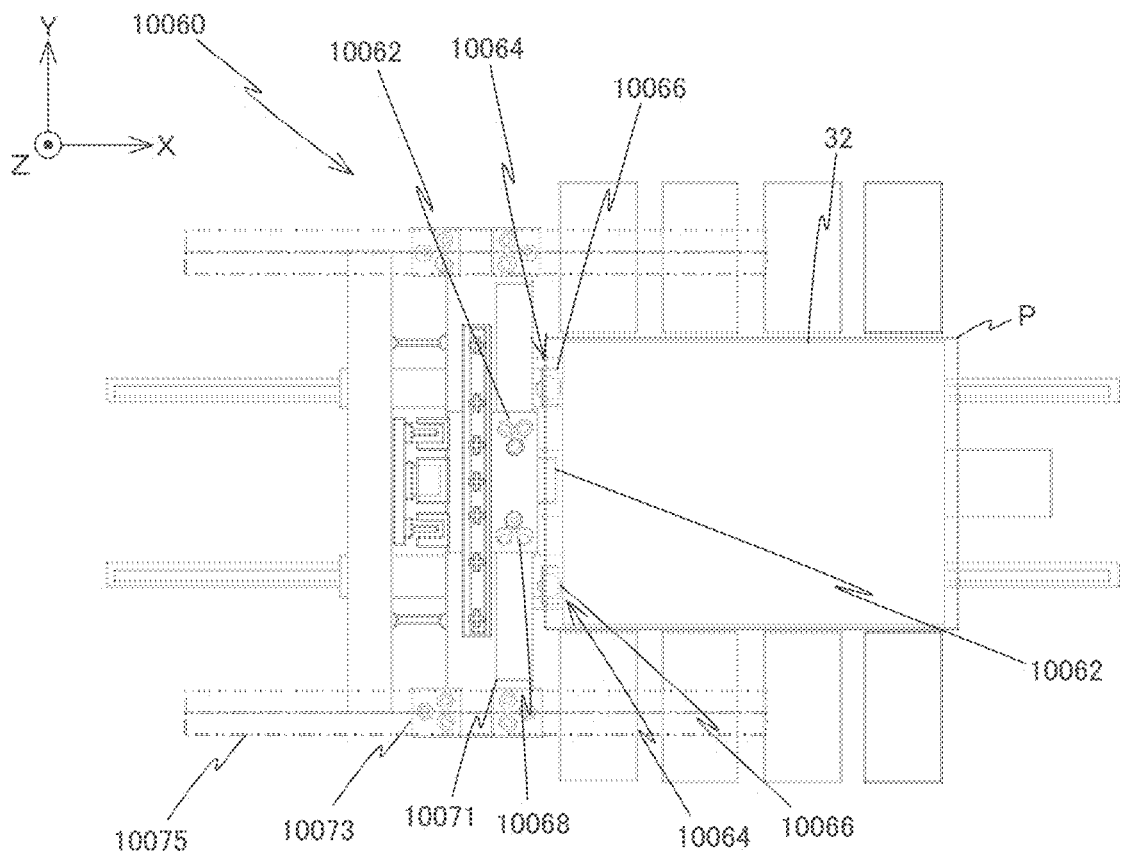
FIGS. 90*a* and 90*b* are views (No. 1 and No. 2) used to explain a fifth modified example.
Figure 90B:
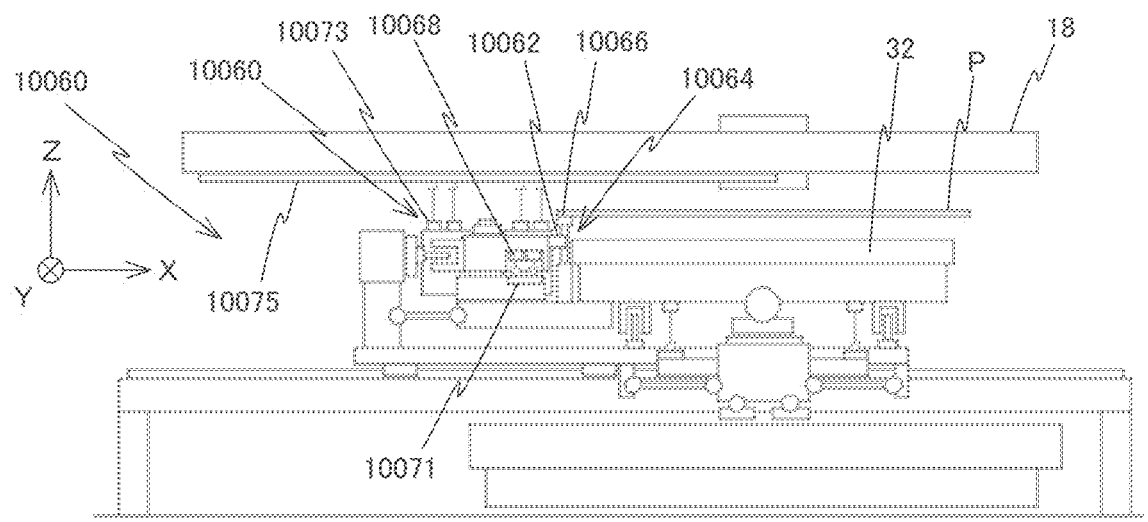

A fifth modified example as shown in FIGS. 90*a* and 90*b* provides an embodiment in which the configuration of a substrate stage device 10060 is different from that in the fourth embodiment described above. While substrate carrier 40 (see FIG. 49) of the fourth embodiment described above is a frame-like member with a rectangular shape in planar view, a substrate carrier 10062 of the present modified example is a bar-like member extending in the Y-axis direction, and adsorbs and holds the center part (one point) on the −X side of substrate P. Substrate carrier 10062 is placed in a noncontact manner on air levitation unit 238 attached to substrate table 30, and is finely movable relative to noncontact holder 32 in the directions of three degrees of freedom within the horizontal plane. Substrate carrier 10062 has a plurality of encoder heads 10068 and movement amount information relative to coarse movement stage 24 is obtained by an encoder system that uses a scale 10071 attached to coarse movement stage 24. Further, coarse movement stage 24 also has a plurality of encoder heads 10073 and movement amount information relative to apparatus main body 18 is obtained by an encoder system using a scale 10075 attached to apparatus main body 18. In this manner, in substrate stage device 10060 of the present modified example, position information of substrate carrier 10062 (substrate P) is obtained by the encoder systems in two steps, via coarse movement stage 24, with apparatus main body 18 serving as a reference. A pair of substrate carry-in bearer devices 10064 spaced apart in the Y-axis direction are attached to substrate table 30. Substrate carry-in bearer devices 10064 have holding pads 10066 that are movable relative to noncontact holder 32 at least in the Z-axis direction. The carry-in operations of substrate P using holding pads 10066 are the same as those in the fourth embodiment described above.

Figure 91:
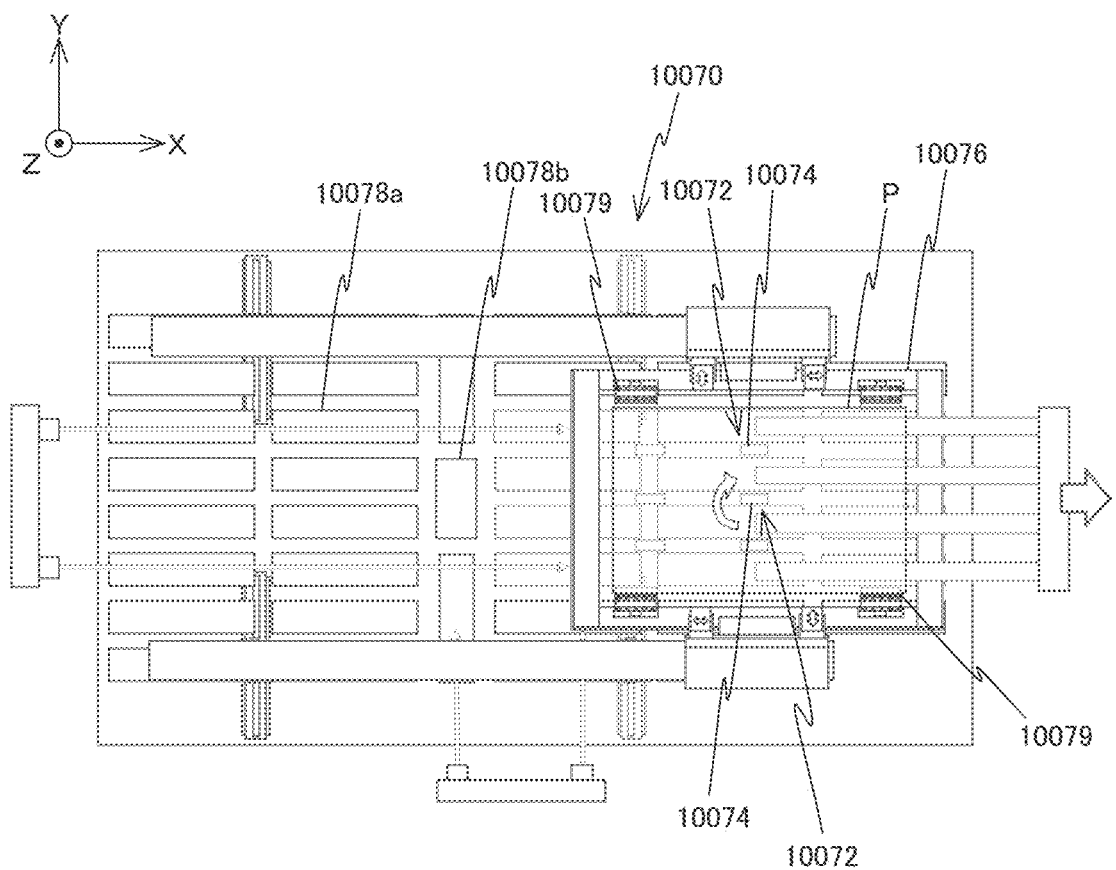
FIG. 91 is a view (No. 1) used to explain a sixth modified example.
Figure 102A:
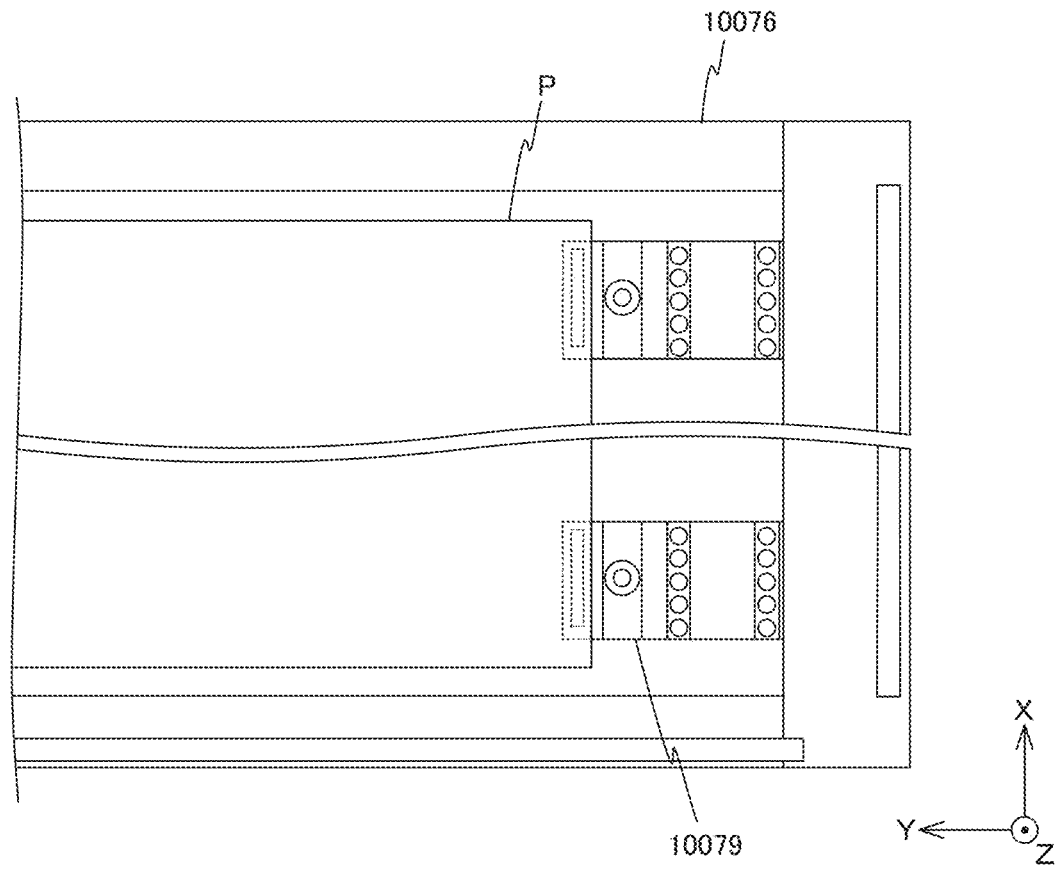
FIGS. 102*a* and 102*b* are views (No. 2 and No. 3) used to explain the sixth modified example.
Figure 102B:
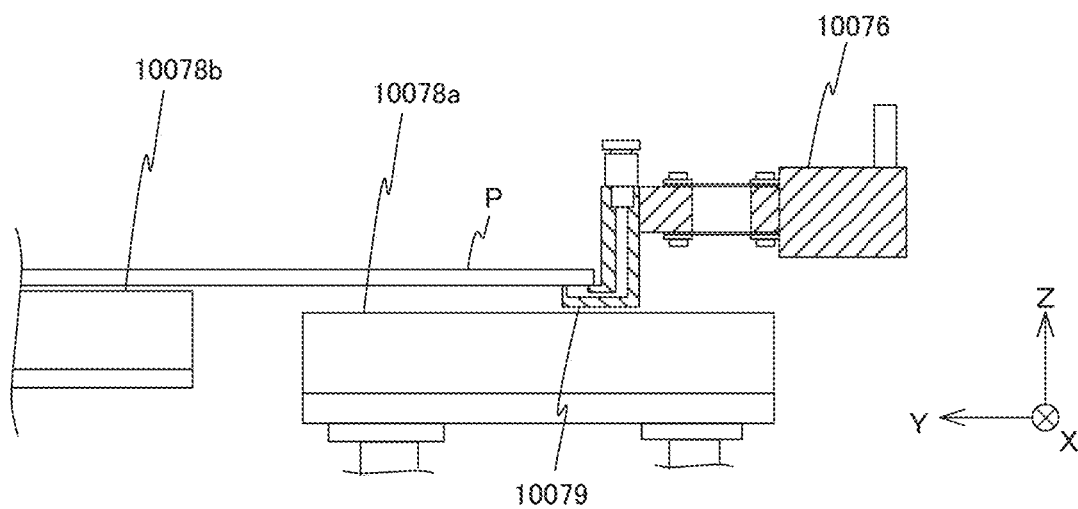

A sixth modified example as shown in FIGS. 91, 102*a* and 102*b* provides an embodiment in which bearer devices for substrate carry-in 10072 are disposed in a substrate stage device 10070 of a type disclosed in the U.S. Patent Application Publication No. 2011/0053092. Substrate stage device 10070 is the same as the substrate stage device of the fourth embodiment described above in that substrate P is held by a substrate holding frame 10076 that is a frame-shaped member, but is different from the fourth embodiment described above in that the positions within the horizontal plane of members (air levitation units 10078*a* and fixed-point stages 10078*b*) that support substrate P from below are fixed. A total of six bearer devices for substrate carry-in 10072 are disposed in FIG. 91, but substrate P is not placed on fixed-point stages 10078*b* at the time of substrate exchange in substrate stage device 10070, and therefore a plurality of bearer devices for substrate carry-in 10072 can be disposed at arbitrary positions below substrate P. Bearer devices for substrate carry-in 10072 have holding pads 10074 that are movable at least in the Z-axis direction, which is the same as each of the embodiments and the modified examples described above. Further, holding pad 10074 capable of facing the center part of substrate P is movable also in a direction around the Z-axis. Accordingly, rotation correction (rough alignment) of substrate P can be performed using the holding pad 10074. The present sixth modified example is the same as the fourth modified example described above in that holdings pads 10074 descend and deliver substrate P to holding pads 10079 of substrate holding frame 10076, and in that holding pads 10074 are driven downward to a lower position than holding pads 10079 after this delivery operation. Substrate holding frame 10076 does not have to be equipped with holdings pads 10079 for holding substrate P, as is disclosed in U.S. Patent Application Publication No. 2011/0053092. Substrate holding frame 10076 may hold substrate P by a pressing member attached via a compression coil spring.

Figure 92A:
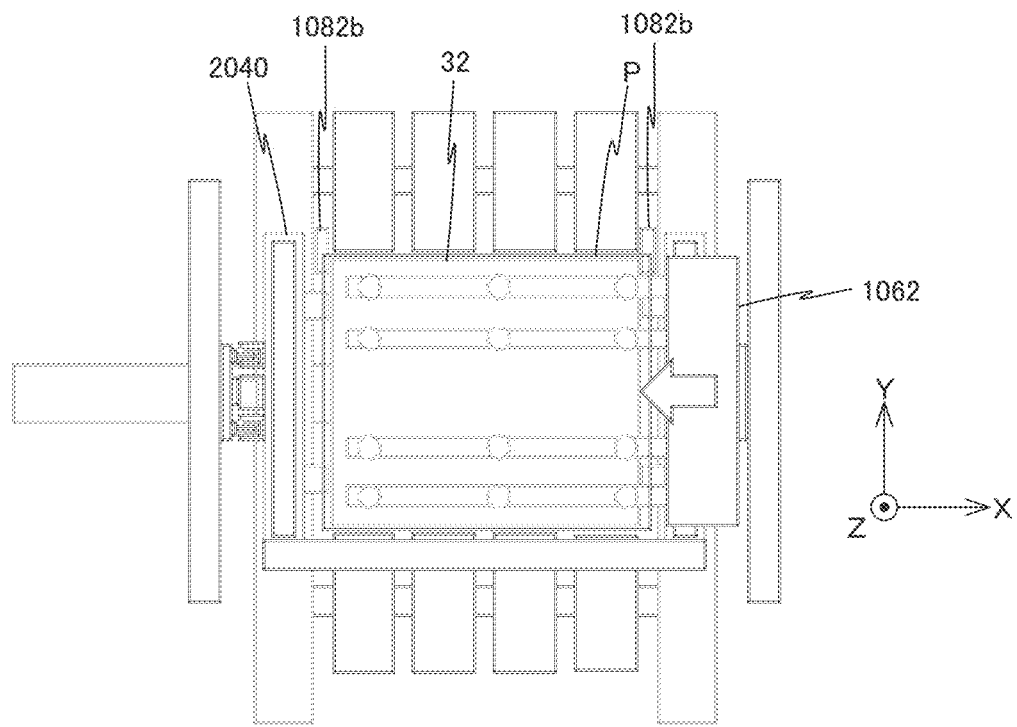
FIGS. 92*a* and 92*b* are views (No. 1 and No. 2) used to explain a seventh modified example.
Figure 92B:
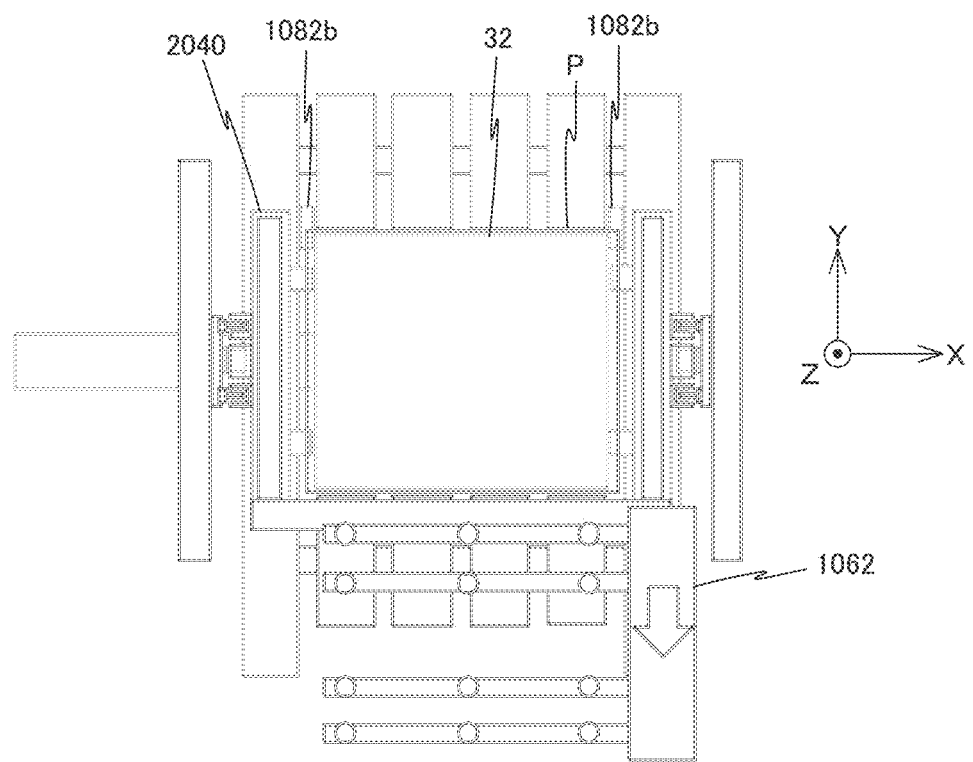

A seventh modified example as shown in FIGS. 92a and 92b provides an embodiment in which a withdrawal direction of substrate carry-in hand 1062 after delivering substrate P to substrate carry-in bearer devices 1082b is different from that in the fifth embodiment described above. As is described above, in the third embodiment and the fourth embodiment, substrate carry-in hand 1062 is withdrawn toward a direction opposed to substrate carry-in bearer devices 1082b. In the present seventh modified example, a pair of substrate carry-in bearer devices 1082b are disposed spaced apart in the X-axis direction, and adsorb and hold two points spaced apart in the X-axis direction of the +Y side end of substrate P, and therefore, similarly to the third embodiment and the fourth embodiment described above, substrate carry-in hand 1062 is moved toward a direction opposed to substrate carry-in bearer devices 1082b, i.e., toward the −Y side, thereby being withdrawn from below substrate P. In this case, since finger section 1062a (see FIG. 30a) on the utmost +Y side of substrate carry-hand 1062 supports substrate P from below until the withdrawn operation is finished, the hanging-down of substrate P (in particular, the hanging-down of the corner on the −Y side and the −X side of substrate P) can be suppressed. Further, although finger sections 1062a jet air to substrate P to support substrate P in a noncontact manner, the air may be jetted in a normal direction with respect to substrate P as the jetting direction, or the air may be jetted from an oblique direction with respect to P in order to increase an area to which the air is jetted of substrate P.

Figure 93A:
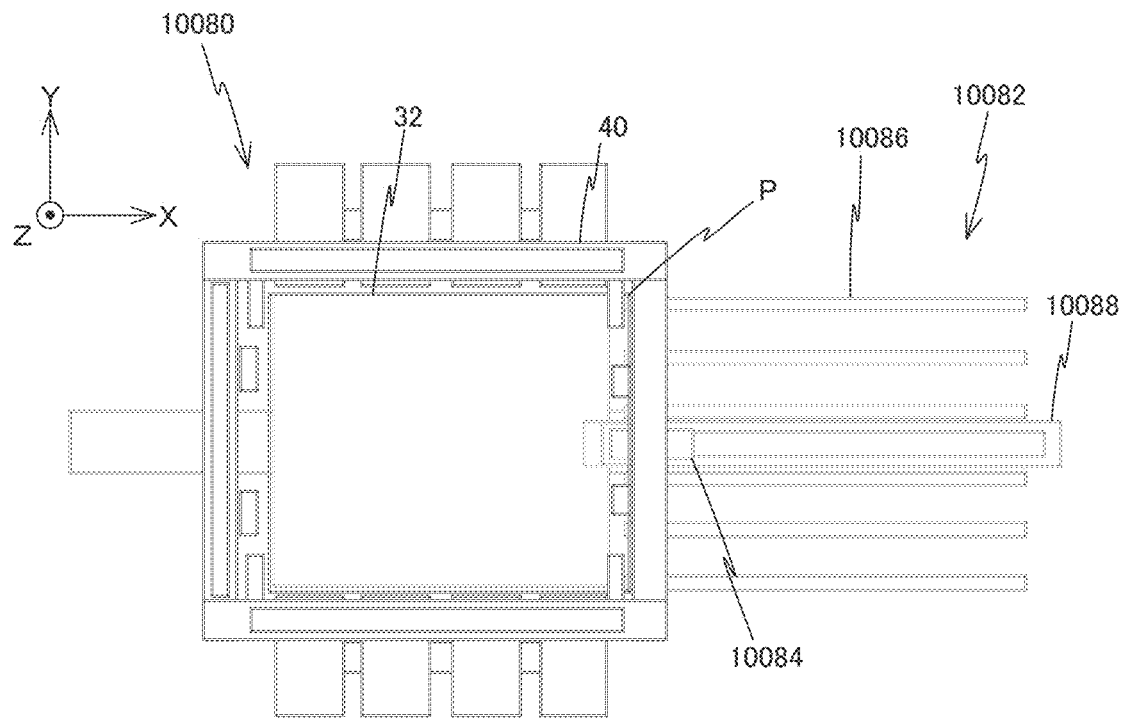
FIGS. 93*a* and 93*b* are views (No. 1 and No. 2) used to explain an eighth modified example.
Figure 93B:
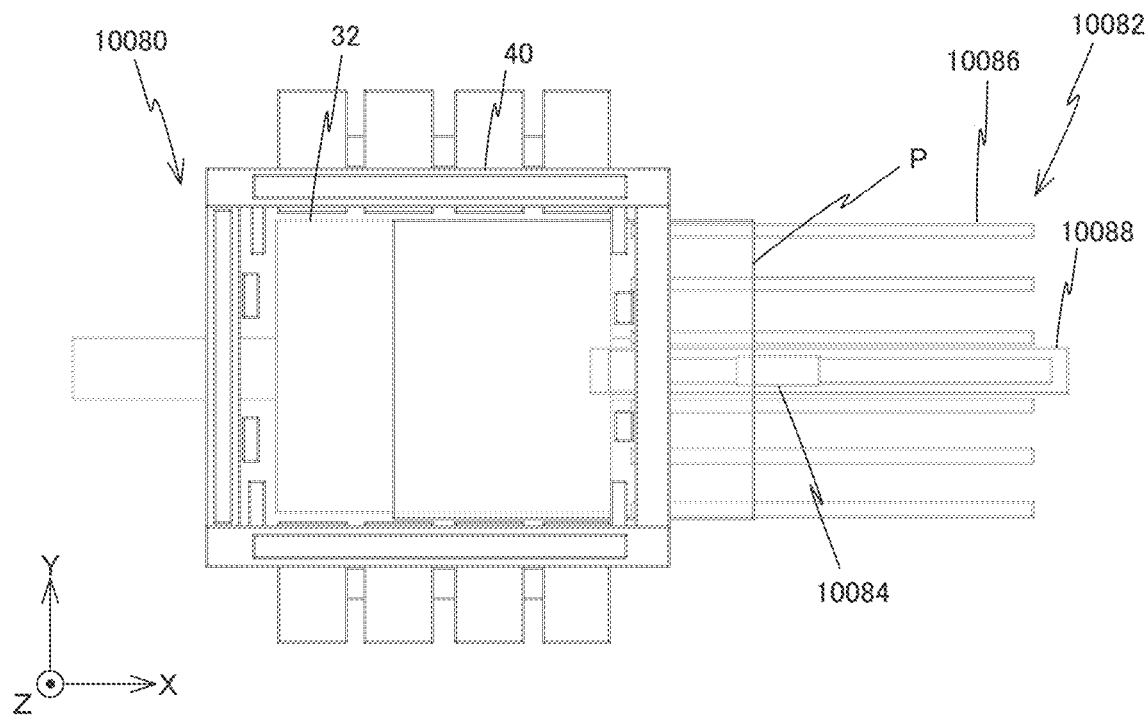

An eighth modified example as shown in FIGS. 93a and 93b provides an embodiment in which a substrate stage device 10080 has a platform for carry-out 10082 similar to the eighth embodiment described above and further platform for carry-out 10082 also has a substrate carry-out hand 10084, in the fourth embodiment described above. Platform for carry-out 10082 is connected to noncontact holder 32 and moved integrally with noncontact holder 32 with a long stroke in the X-axis direction. The length of balance beam 10086 that platform for carry-out 10082 has is set to a length that is longer than that of balance beam 5032 (see FIG. 76) of the eighth embodiment described above, and enough to support the entirety of substrate P from below. Platform for carry-out 10082 has a drive device 10088 for driving substrate carry-out hand 10084. Therefore, substrate stage device 10080 is capable of carrying out substrate P from substrate carrier 40 (noncontact holder 32) by only platform for carry-out 10082. Consequently, the carry-out operation of substrate P can be started before substrate stage device 10080 reaches the substrate exchange position (during the movement). Further, substrate P can be carried out from substrate carrier 40 at higher velocity than the moving velocity of substrate stage device 10080 to the substrate exchange position.

Figure 94A:
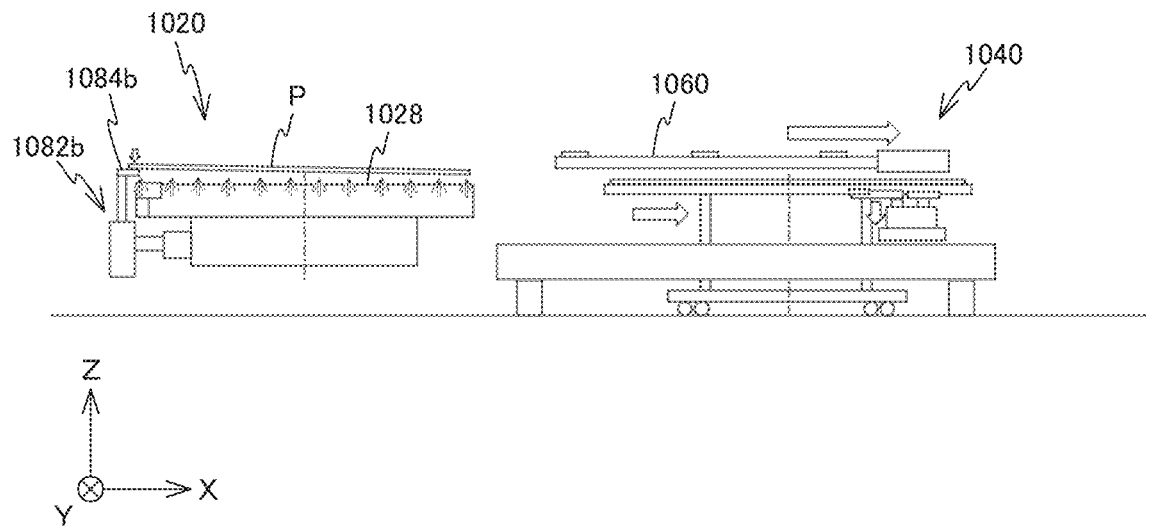
FIGS. 94*a* to 94*c* are views (No. 1 to No. 3) used to explain a ninth modified example.
Figure 94B:
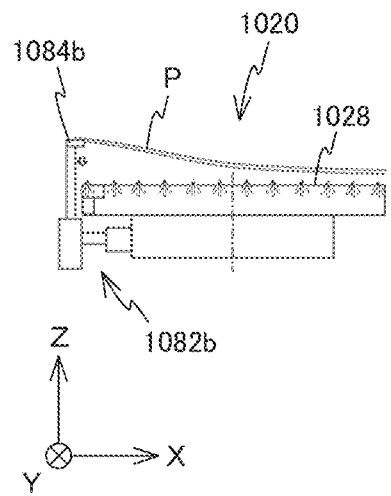
Figure 94C:
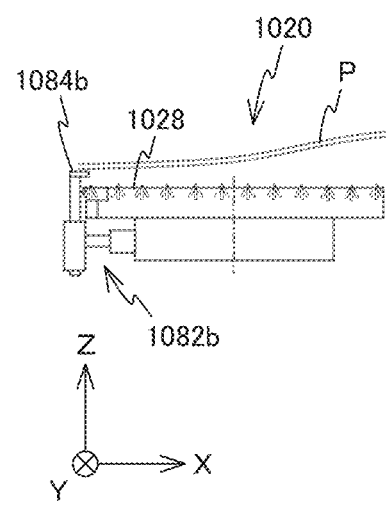

A ninth modified example as shown in FIGS. 94a to 94c provides an embodiment in which holdings pads 1084b that substrate carry-in bearer devices 1082b have are controlled irrespective of the descending velocity (or the acceleration) of substrate P, in the third embodiment described above. As is described above, substrate P freely falls (actually, falls at the acceleration smaller than the gravity acceleration) onto substrate holder 1028, except for the portions gripped by substrate carry-in bearer devices 1082b (the side on which the collision force to substrate holder 1028 is buffered). In an example as shown in FIG. 94b, holding pads 1084b are lowered after the descending operation of the free end side of substrate P is started, and in an example as shown in FIG. 94c, holding pads 1084b are lowered before the descending operation of the free end side of substrate P is started.

Figure 95:
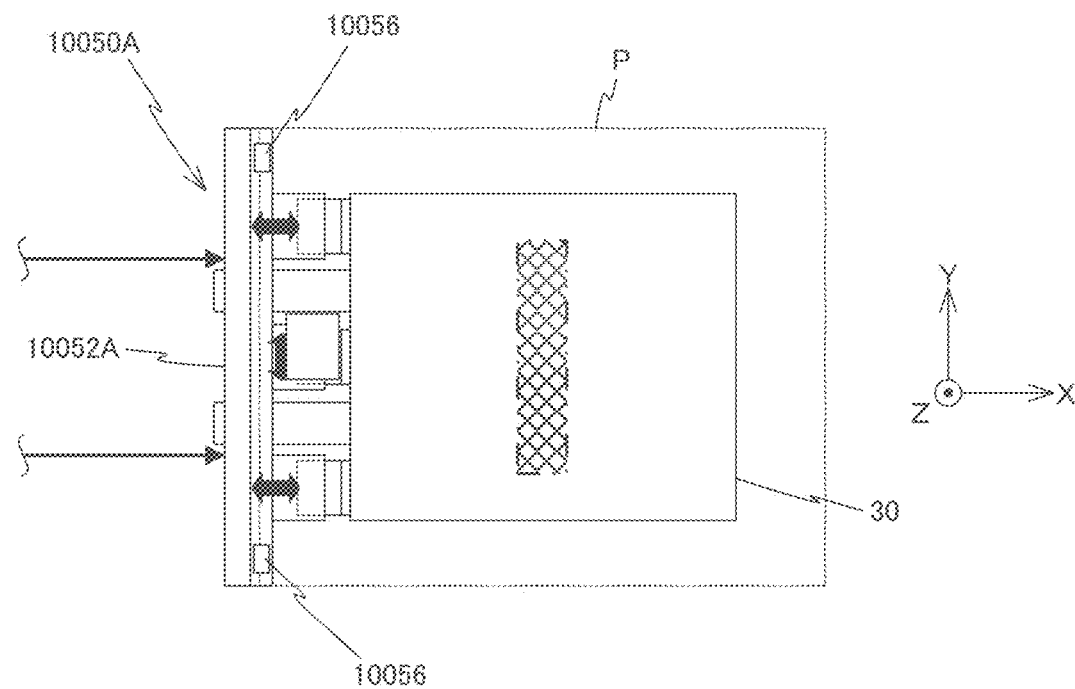
FIG. 95 is a view used to explain a tenth modified example.
Figure 96:
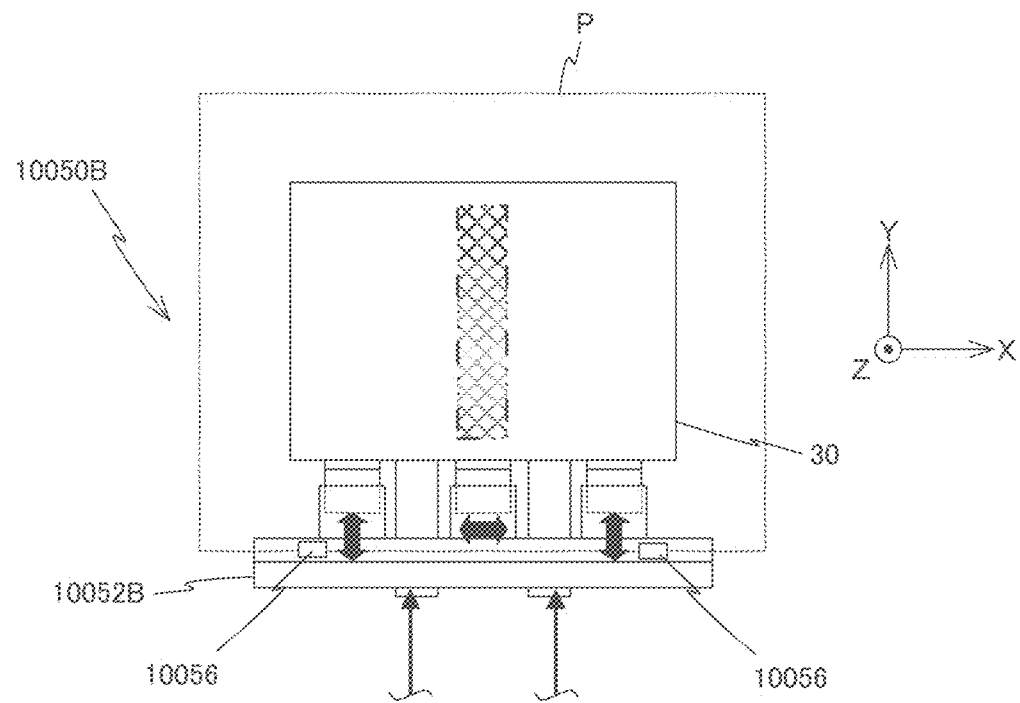
FIG. 96 is a view used to explain an eleventh modified example.

FIGS. 95 to 100 show modified examples (tenth to fifteenth modified examples) of the fourth embodiment as shown in FIGS. 89a to 89c (noncontact holder 32 is not illustrated in FIGS. 95 to 100). While a substrate carrier 10052A that a substrate stage device 10050A has as illustrated in FIG. 95 is formed into a bar-like shape extending in the Y-axis direction similarly to the fourth modified examples, substrate carrier 10052A itself has a function of directly adsorbing and holding substrate P. Then, holding pads for substrate carry-in 10056 are incorporated in substrate carrier 10052A, which is similar to the fourth modified example described above. In a substrate stage device 10050B as illustrated in FIG. 96, a substrate carrier 10052B is formed into a bar-like shape extending in the X-axis direction, and directly adsorbs and holds the −Y side end vicinity part of substrate P from below. A pair of holding pads for substrate carry-in 10056 are incorporated in substrate carrier 10052B, which is the same as the modified example as shown in FIG. 95.

Figure 97:
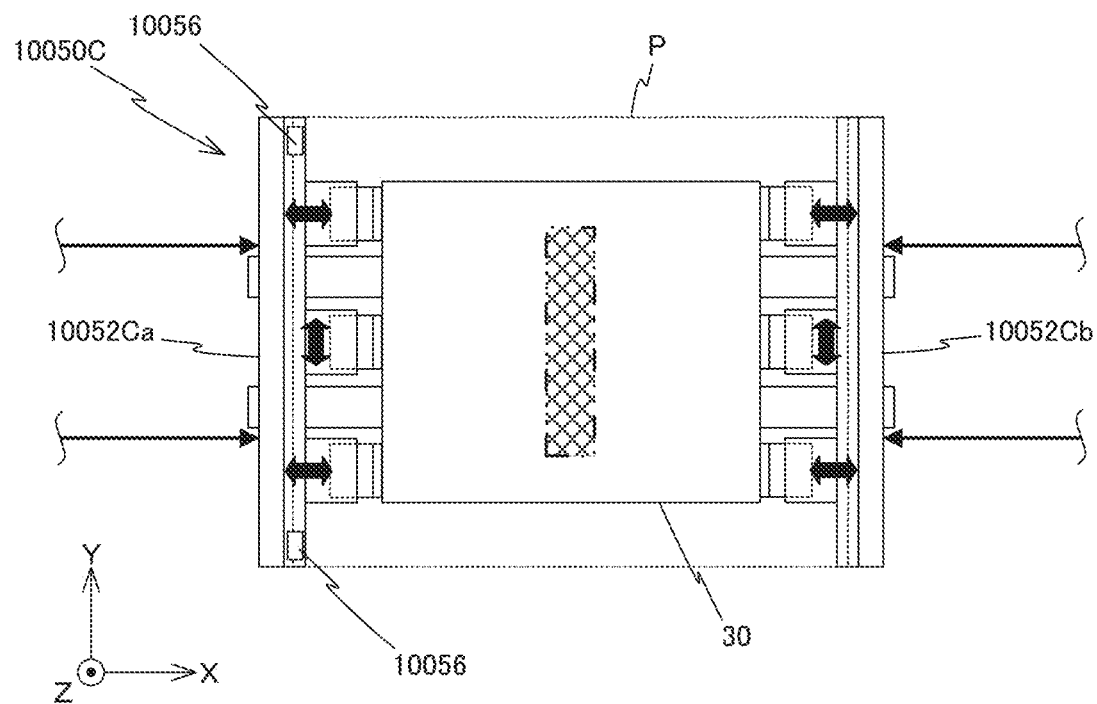
FIG. 97 is a view used to explain a twelfth modified example.
Figure 98:
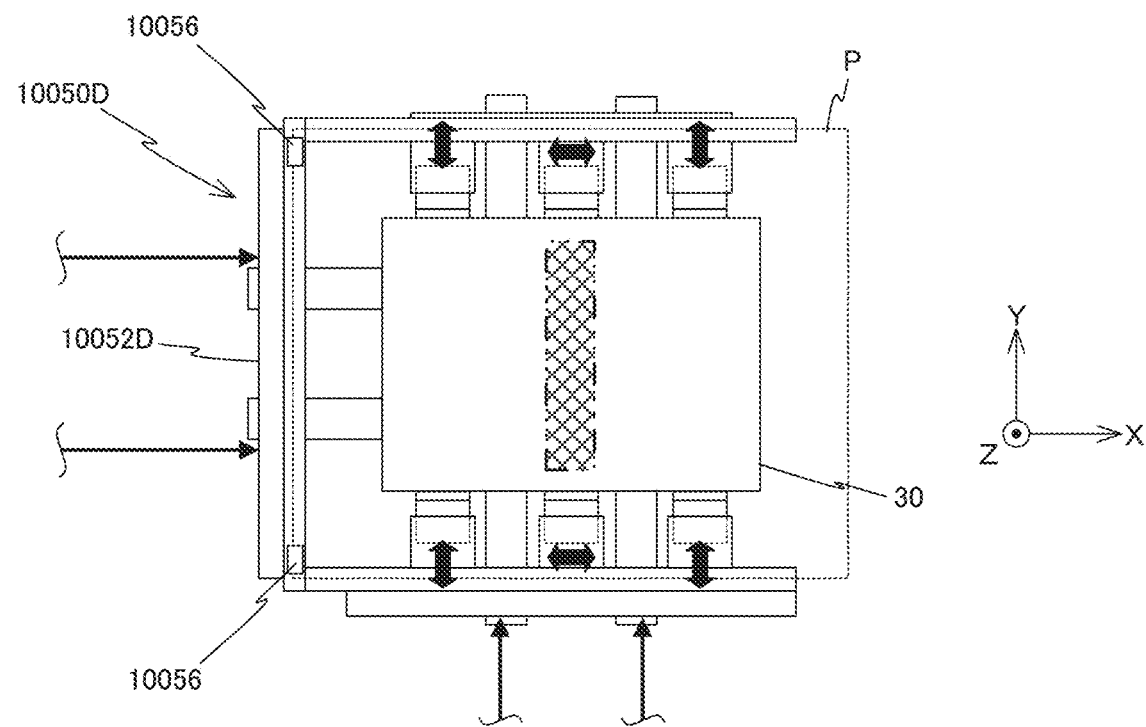
FIG. 98 is a view used to explain a thirteenth modified example.

In a substrate stage device 10050C as illustrated in FIG. 97, substrate P is directly held by a substrate carrier 10052Ca that holds the −X side end vicinity part of substrate P and a substrate carrier 10052Cb that holds the +X side end vicinity part of substrate P. Substrate carriers 10052Ca and 10052Cb are each formed into a bar-like shape extending in the Y-axis direction. A pair of holding pads for substrate carry-in 10056 are incorporated in substrate carrier 10052Ca disposed on the −X side, which is the same as the modified example as shown in FIG. 95. In a substrate stage device 10050D as illustrated in FIG. 98, substrate P is directly held by a substrate carrier 10052D that is formed into a U-like shape in planar view. A pair of holding pads for substrate carry-in 10056 are incorporated in a part, extending in the Y-axis direction along the −X side end of substrate P, of substrate carrier 10052D, which is the same as the modified example as shown in FIG. 95.

Figure 99:
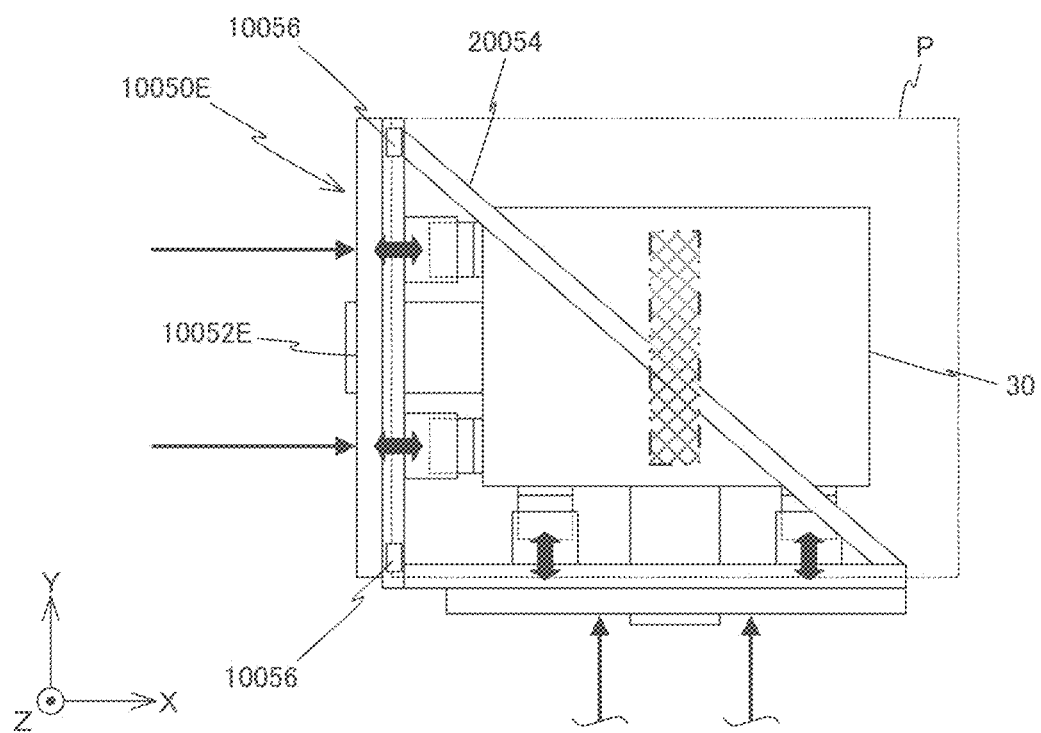
FIG. 99 is a view used to explain a fourteenth modified example.
Figure 100:
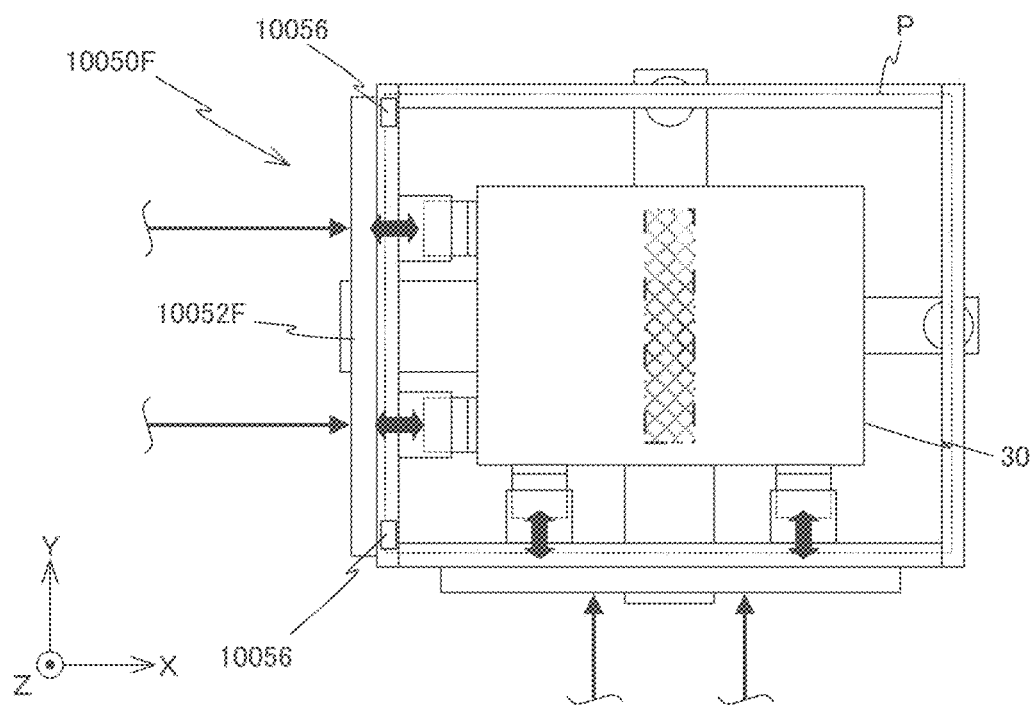
FIG. 100 is a view used to explain a fifteenth modified example.

Ina substrate stage device 10050E as illustrated in FIG. 99, substrate P is directly held by a substrate carrier 10052E that is formed into an L-like shape in planar view. A stiffening brace 20054 is connected to substrate carrier 10052E, and this brace 20054 is housed in a groove formed at substrate table 30 so that brace 20054 does not disturb the relative movement between substrate carrier 10052E and substrate table 30. A pair of holding pads for substrate carry-in 10056 are incorporated in a part, extending in the Y-axis direction along the −X side end of substrate P, of substrate carrier 10052E, which is the same as the modified example as shown in FIG. 95. In substrate stage device 10050F as illustrated in FIG. 100, a substrate carrier 10052F is formed into a rectangular frame shape surrounding the outer periphery of substrate P, similarly to the fourth embodiment described above. However, differently from the fourth embodiment described above, substrate carrier 10052F is movable together with substrate table 30 (a substrate holder that is not illustrated), with a predetermined long stroke within the horizontal plane, and also is finely drivable with respect to substrate table 30. A pair of holding pads for substrate carry-in 10056 are incorporated in a part, extending in the Y-axis direction along the −X side end of substrate P, of substrate carrier 10052F, which is the same as the modified example as shown in FIG. 95.

Figure 101:
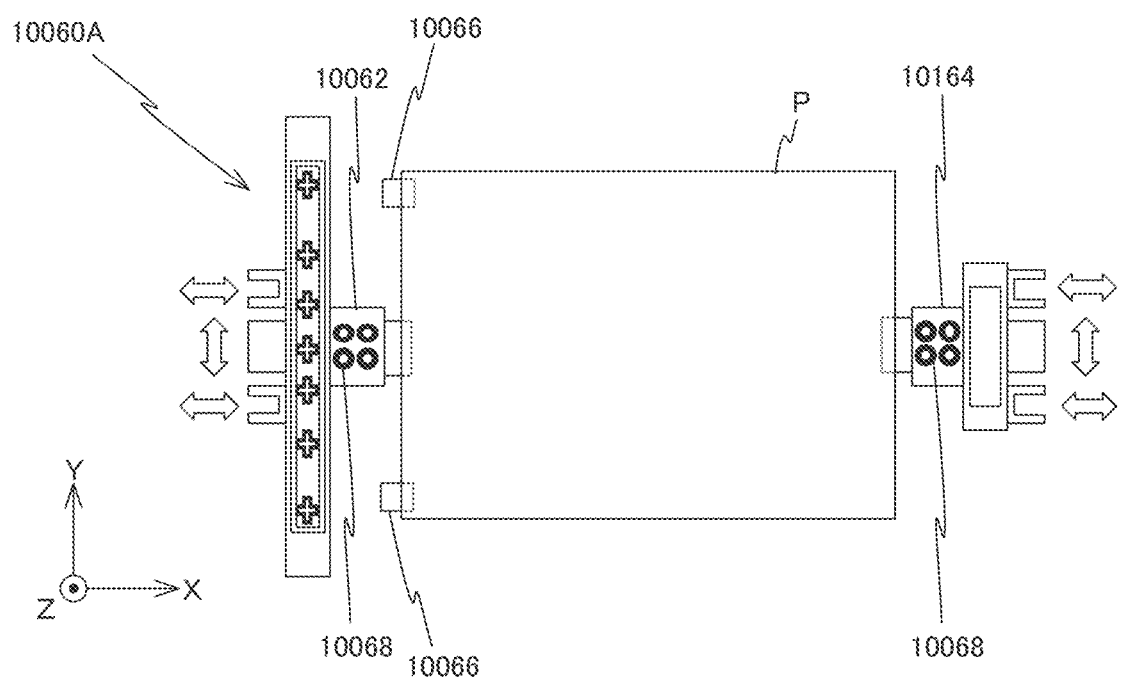
FIG. 101 is a view used to explain a sixteenth modified example.

FIG. 101 shows a substrate stage device 10060A of a modified example (a sixteenth modified example) of the fifth modified example as shown in FIGS. 90a and 90b. Substrate carrier 10062 (see FIG. 90a) holds the −X side end vicinity part of substrate P in the fifth modified example described above, whereas substrate stage device 10060A of the present modified example has a substrate carrier 10164 that holds the +X side end vicinity part of substrate P, along with substrate carrier 10062. Substrate carrier 10164 on the +X side has encoder heads for position measurement 10068, which is the same as substrate carrier 10062 on the −X side. Substrate stage device 10060A has holding pads for substrate carry-in 10066 that hold the −X side end vicinity part of substrate P, which is similar to the fifth modified example described above.

Further, a light source used in illumination system 12 and the wavelength of illumination light IL irradiated from the light source are not particularly limited, and for example, may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm).

Further, although in each of the embodiments described above, an unmagnification system is used as projection optical system 16, the projection optical system is not limited thereto, and a reduction system or a magnifying system may be used.

Further, the use of the exposure apparatus is not limited to the exposure apparatus used for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as a wafer, a ceramic substrate, a film member, or a mask blank. Further, in the case where the exposure target object is a substrate for flat-panel display, the thickness of the substrate is not particularly limited, and for example, a film-like member (a sheet-like member that is flexible) is also included. Note that the exposure apparatus of the present embodiments is especially effective in the case where a substrate whose one side or diagonal line has a length of 500 mm or greater is the exposure target object.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching has been completed is removed; a device assembly step; and an inspection step. In this case, in the lithography step, the exposure method described previously is implemented using the exposure apparatus in the embodiments described above and a device pattern is formed on the glass substrate, and therefore, the devices with a high integration degree can be manufactured with high productivity.

Incidentally, a plurality of components of each of the embodiments described above can be combined as needed. Accordingly, a part of the plurality of components may not be used.

Incidentally, the disclosures of all the Patent Application Publications, the International Publications, the U.S. Patent Application Publications and the U.S. Patents related to exposure apparatuses and the like that are cited in the embodiments described above are each incorporated herein by reference.

INDUSTRIAL APPLICABILITY

As is described so far, the carrier device and the carrying method of the present invention are suitable for carrying objects. Further, the exposure apparatus and the exposure method of the present invention are suitable for exposing objects. Further, the manufacturing method of flat-panel displays of the present invention is suitable for production of flat-panel displays. Further, the device manufacturing method of the present invention is suitable for production of microdevices.

REFERENCE SIGNS LIST

10 . . . liquid crystal exposure apparatus,
20 . . . substrate stage device,
22 . . . base frame,
24 . . . coarse movement stage,
26 . . . weight cancelling device,
28 . . . X guide bar,
32 . . . noncontact holder,
34 . . . auxiliary tables,
40 . . . substrate carrier,
P . . . substrate.

The invention claimed is:

1. A carrier device that carries an object to a support section configured to support a first region of the object in a noncontact manner, the carrier device comprising:
    a first holding section that holds a part of the object at a first position located above the support section, the first holding section holding the part of the object from below the object in a contact manner;
    a drive section that moves downward the first holding section holding the part of the object so that the first region of the object is supported in a noncontact manner by the support section; and
    a second holding section that holds a second region of the object in a contact manner while the first region of the object is supported in a noncontact manner by the support section, the second region being a region other than the first region,
    wherein the drive section moves the first holding section from the first position to a second position where the first holding section can deliver the object to the second holding section.

2. The carrier device according to claim 1, wherein
    the first holding section is moved to a position lower than the second position by the drive section, and the first holding section delivers the object to the second holding section.

3. The carrier device according to claim 1, wherein the second holding section holds an area of the object that is different from an area of the object held by the first holding section.

4. The carrier device according to claim 1, wherein the second holding section performs position adjustment of the object delivered from the first holding section, with respect to the support section.

5. The carrier device according to claim 4, wherein in the position adjustment, the support section supports the first region of the object in a noncontact manner by interposing gas between the support section and the object.

6. The carrier device according to claim 1, wherein the first holding section performs position adjustment of the object with respect to the support section, and delivers the object to the second holding section.

7. The carrier device according to claim 6, wherein in the position adjustment, the support section supports the first region of the object in a noncontact manner by interposing gas between the support section and the object.

8. The carrier device according to claim 1, wherein the first holding section delivers the object to the second holding section at the second position that is located higher than the support section.

9. The carrier device according to claim 1, further comprising:
a drive system that moves the second holding section to the second position so that the second holding section receives the object located at the second position from the first holding section.

10. The carrier device according to claim 9, wherein the drive system moves the second holding section within a range that partly overlaps with a movable range of the first holding section.

11. The carrier device according to claim 9, wherein the drive system relatively moves the second holding section with respect to the support section.

12. The carrier device according to claim 1, further comprising:
a third holding section that holds another part of the object at the first position located above the support section; and
a drive device that moves the third holding section from the first position along an intersecting direction that intersects a vertical direction so that holding of the another part of the object is released in a state where the object is held by the first holding section and the third holding section at the first position, wherein
when the third holding section is moved in the intersecting direction by the drive device and the holding of the another part of the object is released, the drive section moves the first holding section holding the object downward.

13. The carrier device according to claim 12, wherein the third holding section holds the another part of the object so that the another part can be levitated and held, and the third holding section is moved in the intersecting direction by the drive device so that the third holding section is withdrawn from the another part of the object in a state where the another part of the object is levitated and held.

14. The carrier device according to claim 12, wherein the drive device moves the third holding section to the first position.

15. The carrier device according to claim 14, further comprising:
a carry-out device that carries out another object supported on the support section, wherein
the drive device withdraws the third holding section from below the object, at least partly in parallel with an operation in which the carry-out device carries out the another object.

16. The carrier device according to claim 15, wherein the drive section moves downward the first holding section holding the part of the object, at least partly in parallel with the operation in which the carry-out device carries out the another object.

17. The carrier device according to claim 15, further comprising:
a fourth holding section that holds a part of the another object, wherein the fourth holding section delivers the another object to the carry-out device.

18. The carrier device according to claim 17, wherein the support section has a first accommodating section that accommodates the fourth holding section.

19. The carrier device according to claim 1, wherein the drive section moves the first holding section so that the object is not deformed by gas intervening between the object and the support section.

20. The carrier device according to claim 1, wherein the support section has a supply hole that supplies gas from the support section to the object, and
an amount of the gas between the object held by the first holding section and the support section is changed.

21. The carrier device according to claim 1, wherein the support section has a suction hole that suctions gas between the support section and the object, and
an amount of the gas between the object held by the first holding section and the support section is changed.

22. The carrier device according to claim 1, further comprising:
a first drive section that moves the support section, wherein
the first drive section is movable along a plane parallel to a surface of the support section, and
the first holding section is movable along the plane in a predetermined positional relationship with the support section.

23. The carrier device according to claim 22, wherein the drive section moves the first holding section when the support section is moved by the first drive section.

24. The carrier device according to claim 22, wherein the first drive section moves the support section from one of a position and another position to the other of the position and the another position, in the position the object supported by the support section being processed, and in the another position the object being supported by the support section.

25. The carrier device according to claim 1, wherein the support section has a second accommodating section that accommodates the first holding section.

26. The carrier device according to claim 1, wherein the first holding section adsorbs and holds the part of the object.

27. The carrier device according to claim 1, wherein the first holding section holds one end side of an outer periphery edge of the object.

28. An exposure apparatus, comprising:
the carrier device according to claim 1; and
a pattern forming device that forms a predetermined pattern on the object using an energy beam.

29. The exposure apparatus according to claim 28, wherein the object is a substrate used in a flat-panel display.

30. The exposure apparatus according to claim 29, wherein at least a length of a side or a diagonal line of the substrate is 500 mm or greater.

31. A manufacturing method of a flat-panel display, comprising:

exposing the object using the exposure apparatus according to claim 29; and developing the object that has been exposed.

32. A device manufacturing method, comprising:

exposing the object using the exposure apparatus according to claim 28; and developing the object that has been exposed.

33. A carrying method of carrying an object to a support section for supporting a first region of the object in a noncontact manner, the method comprising:

moving a first holding section that holds a part of the object at a first position located above the support section so that the first region of the object is supported in a noncontact manner by the support section, the first holding section holding the part of the object from below the object in a contact manner; and holding a second region of the object, that is supported in a noncontact manner by the support section by the moving, with a second holding section, the second region being a region other than the first region, wherein in the moving, the object is moved from the first position to a second position where the object can be delivered to the second holding section.

34. An exposure method, comprising:

carrying the object to the support section with the carrying method according to claim 33; and exposing the object that has been carried to the support section.

* * * * *